United States Patent
Tanigaki et al.

(10) Patent No.: US 10,409,163 B2
(45) Date of Patent: Sep. 10, 2019

(54) PHOTOSENSITIVE RESIN COMPOSITION, CURED FILM, ELEMENT PROVIDED WITH CURED FILM, AND METHOD FOR MANUFACTURING SEMICONDUCTOR DEVICE

(71) Applicant: TORAY INDUSTRIES, INC., Tokyo (JP)

(72) Inventors: Yugo Tanigaki, Otsu (JP); Takenori Fujiwara, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 98 days.

(21) Appl. No.: 15/509,171

(22) PCT Filed: Sep. 18, 2015

(86) PCT No.: PCT/JP2015/076713
§ 371 (c)(1),
(2) Date: Mar. 6, 2017

(87) PCT Pub. No.: WO2016/052268
PCT Pub. Date: Apr. 7, 2016

(65) Prior Publication Data
US 2017/0285477 A1 Oct. 5, 2017

(30) Foreign Application Priority Data

Sep. 30, 2014 (JP) .................................. 2014-200268

(51) Int. Cl.

| | |
|---|---|
| G03F 7/095 | (2006.01) |
| C08K 3/36 | (2006.01) |
| C08K 5/28 | (2006.01) |
| C08L 83/06 | (2006.01) |
| G03F 7/40 | (2006.01) |
| H01L 21/027 | (2006.01) |
| H01L 21/3065 | (2006.01) |
| G03F 7/004 | (2006.01) |
| G03F 7/039 | (2006.01) |
| G03F 7/023 | (2006.01) |
| G03F 7/032 | (2006.01) |
| G03F 7/075 | (2006.01) |

(52) U.S. Cl.
CPC .............. *G03F 7/095* (2013.01); *C08K 3/36* (2013.01); *C08K 5/28* (2013.01); *C08L 83/06* (2013.01); *G03F 7/0042* (2013.01); *G03F 7/0047* (2013.01); *G03F 7/0233* (2013.01); *G03F 7/032* (2013.01); *G03F 7/039* (2013.01); *G03F 7/0758* (2013.01); *G03F 7/40* (2013.01); *H01L 21/027* (2013.01); *H01L 21/3065* (2013.01)

(58) Field of Classification Search
CPC ...................................................... C07F 7/184
See application file for complete search history.

(56) References Cited

U.S. PATENT DOCUMENTS

| | | | |
|---|---|---|---|
| 2009/0105360 A1* | 4/2009 | Niwa | .................... G03F 7/0757 522/47 |
| 2011/0008589 A1 | 1/2011 | Kimura et al. | |
| 2014/0242787 A1 | 8/2014 | Fujiwara et al. | |

FOREIGN PATENT DOCUMENTS

| | | |
|---|---|---|
| EP | 1942150 A1 | 7/2008 |
| EP | 2485091 A1 | 8/2012 |
| EP | 3125274 A1 | 2/2017 |
| JP | 2004-59737 A | 2/2004 |
| JP | 2006-293337 A | 10/2006 |
| JP | 2006293337 * | 10/2006 |
| JP | 2007-163720 A | 6/2007 |
| JP | 2007-248885 A | 9/2007 |
| JP | 2007-264462 A | 10/2007 |
| JP | 2008-202033 A | 9/2008 |
| JP | 2010-262133 A | 11/2010 |
| JP | 2011-22173 A | 2/2011 |
| JP | 2012-511740 A | 5/2012 |
| JP | 2015-132814 A | 7/2015 |
| WO | WO 2007/049440 A1 | 5/2007 |
| WO | WO 2013/099785 A1 | 7/2013 |

OTHER PUBLICATIONS

JP 2006 293337 (machine translation)(2006).*
International Search Report for PCT/JP2015/076713 (PCT/ISA/210) dated Nov. 2, 2015.
Written Opinion of the International Searching Authority for PCT/JP2015/076713 (PCT/ISA/237) dated Nov. 2, 2015.

* cited by examiner

*Primary Examiner* — Kuo Liang Peng
(74) *Attorney, Agent, or Firm* — Birch, Stewart, Kolasch & Birch LLP

(57) ABSTRACT

To provide a photosensitive resin composition which is capable of forming a pattern with high resolution and obtaining a cured film having excellent heat resistance and cracking resistance, and is also alkali developable; and a method capable of shortening the step required to remove a cured film of the composition after formation of an impurity region on a semiconductor substrate; and a method for manufacturing a semiconductor device using the same. Disclosed is a photosensitive resin composition including a polysiloxane (A).

22 Claims, 3 Drawing Sheets

PHOTOSENSITIVE RESIN COMPOSITION, CURED FILM, ELEMENT PROVIDED WITH CURED FILM, AND METHOD FOR MANUFACTURING SEMICONDUCTOR DEVICE

TECHNICAL FIELD

The present invention relates to a photosensitive resin composition and a cured film using the same, an element, and a method for manufacturing a semiconductor device.

BACKGROUND ART

In the manufacturing process of a semiconductor device, a resist such as a photoresist is used since an impurity region is formed in a semiconductor substrate. The method for forming an impurity region includes, for example, a method in which an element capable of forming the impurity region is ionized from a compound containing the element and ions thus obtained are allowed to collide with a semiconductor substrate (hereinafter referred to as "ion implantation") or a method in which a compound containing an element capable of forming the impurity region is exposed to a semiconductor substrate (hereinafter referred to as "dopant exposure"). For example, a resist film formed on a semiconductor substrate is irradiated with active chemical rays through a mask or reticle having a desired pattern, developed with a developing solution, and then cured by heating (hereinafter referred to as "thermal curing") to form a cured pattern of the resist film. The cured pattern thus formed is allowed to undergo ion implantation or dopant exposure through an ion implantation mask or a dopant exposure mask to form an impurity region having a desired pattern shape.

When the impurity region is formed in the semiconductor substrate by ion implantation or dopant exposure, the impurity region is formed in a desired pattern shape, so that the ion implantation mask and the dopant exposure mask are required to have patternability with high resolution. Low ion implantation temperature during ion implantation may lead damage to a crystal structure of the substrate due to ions collided with the substrate, thus failing to forma low resistance layer. Likewise, low dopant exposure temperature during dopant exposure may lead insufficient diffusion of ions into the substrate, thus failing to form a low resistance layer. Therefore, the ion implantation mask and the dopant exposure mask are required to have high heat resistance and cracking resistance. Particularly, during ion implantation, ions accelerated by high energy collide, so that surplus heat is generated by collision energy. Therefore, the ion implantation mask is required to have enough heat resistance and cracking resistance to withstand impact during ion implantation.

In general, a photoresist has excellent patternability with high resolution, but has poor heat resistance. A silicon dioxide ($SiO_2$) film formed by a chemical vapor deposition (CVD) method is required to be patterned by dry etching using a photoresist so as to form a fine pattern. Therefore, there arises a problem that the step becomes complicated. Accordingly, there has been required a photosensitive resin composition which is capable of forming a pattern with high resolution, and also has high heat resistance and high cracking resistance.

When an impurity region is formed in a semiconductor substrate, a resist film sometimes deteriorates by a reaction between a liquid or gas and a resist film to be used in dopant exposure, or ion implantation or dopant exposure to the resist film. Furthermore, an organic substance in a resist film sometimes deteriorates to form a slightly soluble compound, depending on the composition of the resist film. Such deterioration of the resist film in formation of the impurity region leads to deterioration of solubility of the resist film in a resist peeling liquid, thus causing formation of residues after removal of the resist film. Therefore, there has been required a method in which a resist film and a cured film deteriorated in formation of the impurity region are removed without forming residues.

There has been known, as a photosensitive resin composition having high heat resistance, a photosensitive resin composition containing a polysiloxane, and the photosensitive resin composition has been used as a cured film such as an insulating film. The photosensitive resin composition includes, for example, a positive or negative photosensitive resin composition containing a polysiloxane, a naphthoquinone azide compound, or a photoacid generator or a photocrosslinking agent (see, for example, Patent Literature 1), and a positive photosensitive resin composition containing a polysiloxane and a naphthoquinone azide compound (see, for example, Patent Literature 2).

CITATION LIST

Patent Literature

[Patent Literature 1]
    PCT International Publication No. WO 2007/49440
[Patent Literature 2]
    Japanese Unexamined Patent Publication (Kokai) No. 2012-511740

SUMMARY OF INVENTION

Technical Problem

However, properties of any of conventionally known photosensitive resin compositions containing a polysiloxane exhibited were not enough for use as an ion implantation mask material. Specifically, these photosensitive resin compositions lacked in high resolution, heat resistance, or cracking resistance.

Thus, an object of the present invention is to provide a photosensitive resin composition which is capable of forming a pattern with high resolution and obtaining a cured film having excellent heat resistance and cracking resistance, and is also alkali developable.

There was another problem that, when a cured film of a composition containing a polysiloxane cannot be easily removed, a complicated step was sometimes required to remove the cured film.

Thus, an object of the present invention is to provide a method capable of easily removing a cured film of a composition without forming residues after formation of an impurity region on a semiconductor substrate, and also shortening the step required to remove the cured film; and a method for manufacturing a semiconductor device using the same.

Solution to Problem

In order to achieve the above object, the present invention includes the following structures.

A photosensitive resin composition comprising a polysiloxane (A), wherein the polysiloxane (A) is a polysiloxane represented by the general formula (1):

[Chemical Formula 1]

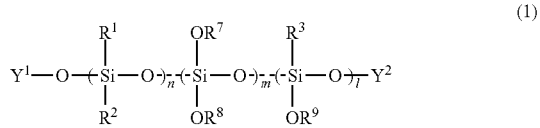
(1)

wherein $R^1$ to $R^3$, in the general formula (1), each independently represents hydrogen, an alkyl group, a cycloalkyl group, an alkenyl group, or an aryl group, $R^7$ to $R^9$, $Y^1$, and $Y^2$ each independently represents hydrogen, an alkyl group, an acyl group, an aryl group, a polymer chain of the polysiloxane, or a substituent represented by the general formula (7), n and m each independently represents an integer of 1 or more, and l represents an integer of 0 or more:

[Chemical Formula 2]

(7)

wherein $R^4$ to $R^6$, in the general formula (7), each independently represents hydrogen, an alkyl group, a cycloalkyl group, an alkenyl group, or an aryl group; and wherein the content ratio of an organosilane unit represented by the general formula (2) in the polysiloxane (A) is (X) mol % in terms of a molar ratio of Si atoms, and the content ratio of an organosilane unit represented by the general formula (3) is (Y) mol % in terms of a molar ratio of Si atoms:

[Chemical Formula 3]

(2)

(3)

wherein $R^1$ and $R^2$, in the general formula (2), each independently represents hydrogen, an alkyl group, a cycloalkyl group, an alkenyl group, or an aryl group;
wherein $R^7$ and $R^8$, in the general formula (3), each independently represents hydrogen, an alkyl group, an acyl group, an aryl group, a polymer chain of the polysiloxane, or a substituent represented by the general formula (7); and
wherein (X) and (Y) are represented by the general formulas (4) to (6).

$7.5 \leq (X) \leq 75$ (4)

$2.5 \leq (Y) \leq 40$ (5)

$1.5 \times (Y) \leq (X) \leq 3 \times (Y)$ (6)

Advantageous Effects of Invention

According to the photosensitive resin composition of the present invention, it is possible to form a pattern with high resolution and to obtain a cured film having excellent heat resistance and cracking resistance. In addition, according to the method for manufacturing a semiconductor device of the present invention, it is possible to form a pattern with high resolution and to obtain a cured film having excellent heat resistance and cracking resistance. Therefore, it becomes possible to shorten the step required to remove the cured film of the composition after formation of an impurity region on a semiconductor substrate, thus enabling shortening in process time.

DESCRIPTION OF EMBODIMENTS

Figure 1:
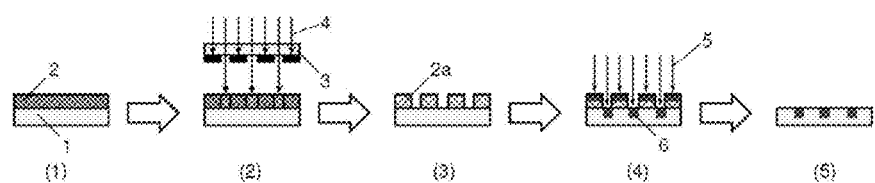
FIG. 1 is a process chart showing an ion implantation process when a photosensitive resin composition of the present invention is used as an ion implantation mask resist.

The photosensitive resin composition of the present invention is a photosensitive resin composition including a polysiloxane (A), wherein the polysiloxane (A) is a polysiloxane represented by the general formula (1), and wherein the content ratio of an organosilane unit represented by the general formula (2) in the polysiloxane (A) is (X) mol % in terms of a molar ratio of Si atoms, and the content ratio of an organosilane unit represented by the general formula (3) is (Y) mol % in terms of a molar ratio of Si atoms, and wherein (X) and (Y) are represented by the general formulas (4) to (6).

$7.5 \leq (X) \leq 75$ (4)

$2.5 \leq (Y) \leq 40$ (5)

$1.5 \times (Y) \leq (X) \leq 3 \times (Y)$ (6)

[Chemical Formula 4]

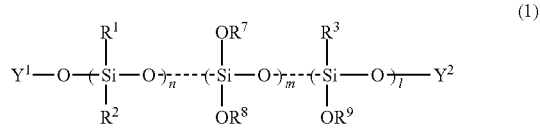
(1)

In the general formula (1), $R^1$ to $R^3$ each independently represents hydrogen, an alkyl group, a cycloalkyl group, an alkenyl group, or an aryl group, $R^7$ to $R^9$, $Y^1$, and $Y^2$ each independently represents hydrogen, an alkyl group, an acyl group, an aryl group, a polymer chain of the polysiloxane, or a substituent represented by the general formula (7). n and m each independently represents an integer of 1 or more, and l represents an integer of 0 or more.

[Chemical Formula 5]

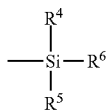
(7)

In the general formula (7), $R^4$ to $R^6$ each independently represents hydrogen, an alkyl group, a cycloalkyl group, an alkenyl group, or an aryl group.

[Chemial Formula 6]

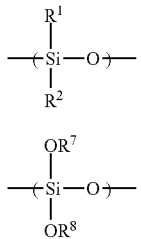

In the general formula (2), $R^1$ and $R^2$ each independently represents hydrogen, an alkyl group, a cycloalkyl group, an alkenyl group, or an aryl group.

In the general formula (3), $R^7$ and $R^8$ each independently represents hydrogen, an alkyl group, an acyl group, an aryl group, a polymer chain of the polysiloxane, or a substituent represented by the general formula (7).

<(A) Polysiloxane>

The photosensitive resin composition of the present invention includes a polysiloxane (A). The polysiloxane (A) is a thermally curable resin, and is allowed to undergo dehydration condensation by thermally curing at high temperature to form a high heat-resistant siloxane bond (Si—O). Therefore, inclusion of the polysiloxane (A) having a siloxane bond having high heat resistance in the resin composition enables an improvement in heat resistance and cracking resistance of the resulting cured film. Therefore, it is suitable for the case where the cured film is used as an ion implantation mask, a dopant exposure mask, a dry etching mask, or a wet etching mask.

The polysiloxane (A) used in the present invention is a polysiloxane represented by the general formula (1).

[Chemical Formula 7]

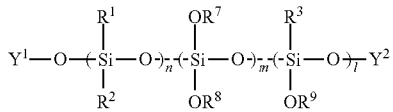
(1)

In the general formula (1), $R^1$ to $R^3$ each independently represents hydrogen, an alkyl group, a cycloalkyl group, an alkenyl group, or an aryl group, and $R^7$ to $R^9$, $Y^1$, and $Y^2$ each independently represents hydrogen, an alkyl group, an acyl group, an aryl group, a polymer chain of the polysiloxane, or a substituent represented by the general formula (7). n and m each independently represents an integer of 1 or more, and l represents an integer of 0 or more.

In the general formula (1), $R^1$ to $R^3$ each independently is preferably hydrogen, an alkyl group having 1 to 10 carbon atoms, a cycloalkyl group having 4 to 10 carbon atoms, an alkenyl group having 2 to 10 carbon atoms, or an aryl group having 6 to 15 carbon atoms, and more preferably hydrogen, an alkyl group having 1 to 6 carbon atoms, a cycloalkyl group having 4 to 7 carbon atoms, an alkenyl group having 2 to 8 carbon atoms, or an aryl group having 6 to 10 carbon atoms. $R^7$ to $R^9$, $Y^1$, and $Y^2$ each independently is preferably hydrogen, an alkyl group having 1 to 6 carbon atoms, an acyl group having 2 to 6 carbon atoms, an aryl group having 6 to 15 carbon atoms, a polymer chain of the polysiloxane, or a substituent represented by the general formula (7), and more preferably hydrogen, an alkyl group having 1 to 4 carbon atoms, an acyl group having 2 to 4 carbon atoms, an aryl group having 6 to 10 carbon atoms, a polymer chain of the polysiloxane, or a substituent represented by the general formula (7).

The alkyl group, the cycloalkyl group, the alkenyl group, the aryl group, and the acyl group may be either a non-substitution product or a substitution product.

Examples of the alkyl group as for $R^1$ to $R^3$ of the general formula (1) include a methyl group, an ethyl group, an n-propyl group, an isopropyl group, an n-butyl group, a t-butyl group, an n-hexyl group, or an n-decyl group. Examples of the substituent thereof include a halogen atom, an epoxy group, a glycidyl group, an oxetanyl group, an amino group, a mercapto group, or an isocyanate group. When the alkyl group is a substitution product, examples of $R^1$ to $R^3$ include a trifluoromethyl group, a 3,3,3-trifluoropropyl group, a 3-glycidoxypropyl group, a 2-(3, 4-epoxycyclohexyl)ethyl group, a 3-[(3-ethyl-3-oxetanyl)methoxy]propyl group, a 3-aminopropyl group, a 3-mercaptopropyl group, or a 3-isocyanatepropyl group.

Examples of the cycloalkyl group as for $R^1$ to $R^3$ of the general formula (1) include a cyclopentyl group or a cyclohexyl group. Examples of the substituent thereof include a halogen atom, an epoxy group, a glycidyl group, an oxetanyl group, an amino group, a mercapto group, or an isocyanate group.

Examples of the alkenyl group as for $R^1$ to $R^3$ of the general formula (1), and the substitution product thereof include a vinyl group, an allyl group, a 3-(meth)acryloxypropyl group, or a 2-(meth)acryloxyethyl group.

Examples of the aryl group as for $R^1$ to $R^3$ of the general formula (1) and the substitution product thereof include a phenyl group, a 4-tolyl group, a 4-hydroxyphenyl group, a 4-methoxyphenyl group, a 4-t-butylphenyl group, a 1-naphthyl group, a 2-naphthyl group, a 4-styryl group, a 2-phenylethyl group, a 1-(4-hydroxyphenyl)ethyl group, a 2-(4-hydroxyphenyl)ethyl group, or a 4-hydroxy-5-(4-hydroxyphenylcarbonyloxy)pentyl group.

Examples of the alkyl group as for $R^7$ to $R^9$, $Y^1$, and $Y^2$ of the general formula (1) include a methyl group, an ethyl group, an n-propyl group, an isopropyl group, or an n-butyl group. Examples of the acyl group as for $R^7$ to $R^9$, $Y^1$, and $Y^2$ of the general formula (1) include an acetyl group. Examples of the aryl group as for $R^7$ to $R^9$, $Y^1$, and $Y^2$ of the general formula (1) include a phenyl group, a 4-tolyl group, a 4-hydroxyphenyl group, a 4-methoxyphenyl group, a 4-t-butylphenyl group, or a 1-naphthyl group.

[Chemical Formula 8]

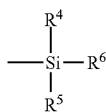

(7)

In the general formula (7), $R^4$ to $R^6$ each independently represents hydrogen, an alkyl group, a cycloalkyl group, an alkenyl group, or an aryl group. In the general formula (7), $R^4$ to $R^6$ each independently is preferably hydrogen, an alkyl group having 1 to 10 carbon atoms, a cycloalkyl group having 4 to 10 carbon atoms, an alkenyl group having 2 to 10 carbon atoms, or an aryl group having 6 to 15 carbon atoms, and more preferably hydrogen, an alkyl group having 1 to 6 carbon atoms, a cycloalkyl group having 4 to 7 carbon atoms, an alkenyl group having 2 to 8 carbon atoms, or an aryl group having 6 to 10 carbon atoms. The alkyl group, the cycloalkyl group, the alkenyl group, and the aryl group may be either a non-substitution product or a substitution product.

The content ratio of an organosilane unit represented by the general formula (2) in the polysiloxane (A) is (X) mol % in terms of a molar ratio of Si atoms, the content ratio of an organosilane unit represented by the general formula (3) in the polysiloxane (A) is (Y) mol % in terms of a molar ratio of Si atoms, and (X) and (Y) are content ratios represented by the general formulas (4) to (6).

$$7.5 \leq (X) \leq 75 \quad (4)$$

$$2.5 \leq (Y) \leq 40 \quad (5)$$

$$1.5 \times (Y) \leq (X) \leq 3 \times (Y) \quad (6)$$

[Chemical Formula 9]

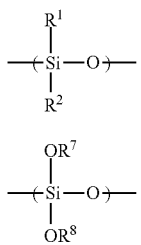

(2)

(3)

In the general formula (2), $R^1$ and $R^2$ each independently represents hydrogen, an alkyl group, a cycloalkyl group, an alkenyl group, or an aryl group. In the general formula (3), $R^7$ and $R^8$ each independently represents hydrogen, an alkyl group, an acyl group, an aryl group, a polymer chain of the polysiloxane, or a substituent represented by the general formula (7).

In the general formula (2), $R^1$ and $R^2$ each independently is preferably hydrogen, an alkyl group having 1 to 10 carbon atoms, a cycloalkyl group having 4 to 10 carbon atoms, an alkenyl group having 2 to 10 carbon atoms, or an aryl group having 6 to 15 carbon atoms, and more preferably hydrogen, an alkyl group having 1 to 6 carbon atoms, a cycloalkyl group having 4 to 7 carbon atoms, an alkenyl group having 2 to 8 carbon atoms, or an aryl group having 6 to 10 carbon atoms.

In the general formula (3), $R^7$ and $R^8$ each independently is preferably hydrogen, an alkyl group having 1 to 6 carbon atoms, an acyl group having 2 to 6 carbon atoms, an aryl group having 6 to 15 carbon atoms, a polymer chain of the polysiloxane, or a substituent represented by the general formula (7), and more preferably hydrogen, an alkyl group having 1 to 4 carbon atoms, an acyl group having 2 to 4 carbon atoms, an aryl group having 6 to 10 carbon atoms, a polymer chain of the polysiloxane, or a substituent represented by the general formula (7). The alkyl group, the cycloalkyl group, the alkenyl group, the aryl group, and the acyl group may be either a non-substitution product or a substitution product.

Examples of the alkyl group as for $R^1$ and $R^2$ of the general formula (2) include a methyl group, an ethyl group, an n-propyl group, an isopropyl group, an n-butyl group, a t-butyl group, an n-hexyl group, or an n-decyl group. Examples of the substituent thereof include a halogen atom, an epoxy group, a glycidyl group, an oxetanyl group, an amino group, a mercapto group, or an isocyanate group. When the alkyl group is a substitution product, examples of $R^1$ and $R^2$ include a trifluoromethyl group, a 3,3,3-trifluoropropyl group, a 3-glycidoxypropyl group, a 2-(3,4-epoxycyclohexyl)ethyl group, a 3-[(3-ethyl-3-oxetanyl)methoxy]propyl group, a 3-aminopropyl group, a 3-mercaptopropyl group, or a 3-isocyanatepropyl group.

Examples of the cycloalkyl group as for $R^1$ and $R^2$ of the general formula (2) include a cyclopentyl group or a cyclohexyl group. Examples of the substituent thereof include a halogen atom, an epoxy group, a glycidyl group, an oxetanyl group, an amino group, a mercapto group, or an isocyanate group.

Examples of the alkenyl group as for $R^1$ and $R^2$ of the general formula (2) and the substitution product thereof include a vinyl group, an allyl group, a 3-(meth)acryloxypropyl group, or a 2-(meth)acryloxyethyl group.

Examples of the aryl group as for $R^1$ and $R^2$ of the general formula (2) and the substitution product thereof include a phenyl group, a 4-tolyl group, a 4-hydroxyphenyl group, a 4-methoxyphenyl group, a 4-t-butylphenyl group, a 1-naphthyl group, a 2-naphthyl group, a 4-styryl group, a 2-phenylethyl group, a 1-(4-hydroxyphenyl)ethyl group, a 2-(4-hydroxyphenyl)ethyl group, or a 4-hydroxy-5-(4-hydroxyphenylcarbonyloxy)pentyl group.

Examples of the alkyl group as for $R^7$ and $R^8$ of the general formula (3) include a methyl group, an ethyl group, an n-propyl group, an isopropyl group, or an n-butyl group. Examples of the acyl group as for $R^7$ and $R^8$ of the general formula (3) include an acetyl group. Examples of the aryl group as for $R^7$ and $R^8$ of the general formula (3) include a phenyl group, a 4-tolyl group, a 4-hydroxyphenyl group, a 4-methoxyphenyl group, a 4-t-butylphenyl group, or a 1-naphthyl group.

Inclusion of an organosilane unit represented by the general formula (2) enables an improvement in cracking resistance of a cured film obtained from the photosensitive resin composition of the present invention during thermal curing and ion implantation. Inclusion of an organosilane unit represented by the general formula (3) enables suppression of formation of residues after the development without deterioration of heat resistance and transparency of a cured film obtained from the photosensitive resin composition of the present invention, leading to an improvement in resolution after the development.

Examples of the organosilane including an organosilane unit represented by the general formula (2) include a difunctional silane such as dimethyldimethoxysilane, dimethyldiethoxysilane, dimethyldiacetoxysilane, diethyldimethoxysilane, diethyldiethoxysilane, di-n-propyldimethoxysilane, di-n-propyldiethoxysilane, diisopropyldimethoxysilane, diisopropyldiethoxysilane, di-n-butyldimethoxysilane, diisobutyldimethoxysilane, dicyclopentyldimethoxysilane, cyclohexylmethyldimethoxysilane, methylvinyldimethoxysilane, divinyldiethoxysilane, 3-methacryloxypropylmethyldimethoxysilane, 3-methacryloxypropylmethyldiethoxysilane, 3-acryloxypropylmethyldimethoxysilane, 3-acryloxypropylmethyldiethoxysilane, diphenyldimethoxysilane, diphenyldiethoxysilane, 3-glycidoxypropylmethyldimethoxysilane, 3-glycidoxypropylmethyldiethoxysilane, N-(2-aminoethyl)-3-aminopropylmethyldimethoxysilane, 3-mercaptopropylmethyldimethoxysilane, or 3-isocyanate propylmethyldiethoxysilane; and a difunctional silane oligomer such as 1,1,3,3-tetramethyl-1,3-dimethoxydisiloxane, 1,1,3,3-tetramethyl-1,3-diethoxydisiloxane, 1,1,3,3-tetraethyl-1,3-dimethoxydisiloxane or 1,1,3,3-tetraethyl-1,3-diethoxydisiloxane, or DMS-S12, DMS-S15, PDS-1615 or PDS-9931 (all of which are manufactured by Gelest). From the viewpoint of an improvement in cracking resistance of a cured film obtained from the photosensitive resin composition of the present invention during thermal curing and ion implantation, the organosilane is preferably dimethyldimethoxysilane, dimethyldiethoxysilane, dimethyldiacetoxysilane, diethyldimethoxysilane, diethyldiethoxysilane, di-n-propyldimethoxysilane, di-n-propyldiethoxysilane, diisopropyldimethoxysilane, diisopropyldiethoxysilane, di-n-butyldimethoxysilane, diisobutyldimethoxysilane, diphenyldimethoxysilane, diphenyldiethoxysilane, 1,1,3,3-tetramethyl-1,3-dimethoxydisiloxane, 1,1,3,3-tetramethyl-1,3-diethoxydisiloxane, 1,1,3,3-tetraethyl-1,3-dimethoxydisiloxane, or 1,1,3,3-tetraethyl-1,3-diethoxydisiloxane.

Examples of the organosilane including an organosilane unit represented by the general formula (3) include a tetrafunctional silane such as tetramethoxysilane, tetraethoxysilane, tetra-n-propoxysilane, tetraisopropoxysilane, tetra-n-butoxysilane, or tetraacetoxysilane; a silicate compound such as Methyl Silicate 51 (manufactured by Fuso Chemical Co., Ltd.), M Silicate 51, Silicate 40, or Silicate 45 (all of which are manufactured by Tama Chemicals Co., Ltd.), or Methyl Silicate 51, Methyl Silicate 53A, Ethyl Silicate 40, or Ethyl Silicate 48 (all of which are manufactured by COLCOAT CO., Ltd.). From the viewpoint of an improvement in resolution after the development and suppression of formation of residues after the development, the organosilane is preferably tetramethoxysilane, tetraethoxysilane, tetra-n-propoxysilane, Methyl Silicate 51 (manufactured by Fuso Chemical Co., Ltd.), M Silicate 51 (manufactured by Tama Chemicals Co., Ltd.), or Methyl Silicate 51 (manufactured by COLCOAT CO., Ltd.).

The content ratio of the organosilane unit represented by the general formula (2) in the polysiloxane (A) is 7.5 to 75 mol %, preferably 15 to 75 mol %, more preferably 24 to 75 mol %, and still more preferably 36 to 70 mol %, in terms of a molar ratio of Si atoms. When the molar ratio of Si atoms derived from the organosilane unit represented by the general formula (2) is within the above range, it is possible to satisfy both high resolution and cracking resistance. The content ratio of the organosilane unit represented by the general formula (2) of less than 7.5 mol % sometimes leads to an insufficient effect of improving cracking resistance of a cured film obtained from the photosensitive resin composition of the present invention during thermal curing or ion implantation. Meanwhile, the content ratio of more than 75 mol % may sometimes lead to deterioration of a pattern shape after thermal curing, deterioration of resolution after the development or thermal curing, and formation of residues after the development.

The content ratio of the organosilane unit represented by the general formula (3) in the polysiloxane (A) is 2.5 to 40 mol %, preferably 5 to 40 mol %, more preferably 8 to 40 mol %, and still more preferably 12 to 40 mol %, in terms of a molar ratio of Si atoms. When the molar ratio of Si atoms derived from the organosilane unit represented by the general formula (3) is within the above range, it is possible to satisfy both high resolution and cracking resistance. The content ratio of the organosilane unit represented by the general formula (3) of less than 2.5 mol % sometimes leads to an insufficient effect of improving resolution after the development, and formation of residues after the development. Meanwhile, the content ratio of more than 40 mol % may sometimes lead to deterioration of cracking resistance of a cured film obtained from the photosensitive resin composition of the present invention during thermal curing or ion implantation.

In order to suppress damage of a substrate during ion implantation on a crystal structure, it is necessary to implant ions while heating the substrate. Furthermore, since ions accelerated by high energy collide during ion implantation, surplus heat is sometimes generated by collision energy. If the cured film lacks in cracking resistance during ion implantation, cracking sometimes occurs in the cured film during ion implantation. If cracking occurs in the cured film during ion implantation, fragments of the cured film scatter in an ion implantation device, so that not only the device may be contaminated with particles, but also particles may be adhered to another wafer passed through the contaminated device. Therefore, the photosensitive resin composition of the present invention used as an ion implantation mask resist is required to have cracking resistance of a cured film obtained from the composition during ion implantation. During ion implantation, ions accelerated to higher energy must be suppressed. Therefore, it is preferred to have cracking resistance of a cured film having a larger film thickness during ion implantation.

(X) and (Y) are preferably within a range satisfying the inequality expression: $1.5 \times (Y) \leq (X) \leq 3 \times (Y)$, and preferably the inequality expression: $2 \times (Y) \leq (X) \leq 3 \times (Y)$. When (X) is within the above range, it is possible to satisfy both high resolution and cracking resistance. When (X) is less than $1.5 \times (Y)$, cracking resistance of a cured film obtained from the photosensitive resin composition of the present invention during thermal curing or ion implantation sometimes deteriorates. Meanwhile, (X) of more than $3 \times (Y)$ sometimes leads to deterioration of resolution after the development, and formation of residues after the development.

When the content ratio of an organosilane unit represented by the general formula (3) in the polysiloxane (A) is within the above range and also (X) and (Y) are within the above range, it is possible to improve resolution after the development and to improve cracking resistance during thermal curing or ion implantation. Therefore, it is preferred in view of applying a photosensitive resin composition including a polysiloxane (A) to the below-mentioned step (1-1a) of heating a pattern of the composition to 500 to 1,500° C. In addition, it is preferred in view of applying the composition to the below-mentioned step (3-A) of treating a pattern of the composition at from 0° C. to lower than 300° C. The steps (1-1a) and (3-A) enable shortening of the step required to remove a pattern of the composition, leading to shortening of the process time.

The polysiloxane (A) used in the present invention is preferably a polysiloxane (A) obtained by hydrolyzing at least an organosilane represented by the general formula (21) and an organosilane represented by the general formula (22), followed by dehydration condensation.

[Chemical Formula 10]

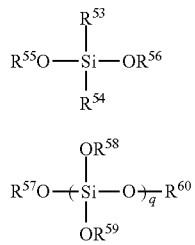
(21)

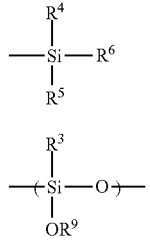
(22)

In the general formula (21), $R^{53}$ and $R^{54}$ each independently represents hydrogen, an alkyl group, a cycloalkyl group, an alkenyl group, or an aryl group, and $R^{55}$ and $R^{56}$ each independently represents hydrogen, an alkyl group, an acyl group, or an aryl group. In the general formula (22), $R^{57}$ to $R^{60}$ each independently represents hydrogen, an alkyl group, an acyl group, or an aryl group, and q represents an integer of 1 to 10.

In the general formula (21), $R^{53}$ and $R^{54}$ each independently is preferably hydrogen, an alkyl group having 1 to 10 carbon atoms, a cycloalkyl group having 4 to 10 carbon atoms, an alkenyl group having 2 to 10 carbon atoms, or an aryl group having 6 to 15 carbon atoms, and more preferably hydrogen, an alkyl group having 1 to 6 carbon atoms, a cycloalkyl group having 4 to 7 carbon atoms, an alkenyl group having 2 to 8 carbon atoms, or an aryl group having 6 to 10 carbon atoms. $R^{55}$ and $R^{56}$ each independently is preferably hydrogen, an alkyl group having 1 to 6 carbon atoms, an acyl group having 2 to 6 carbon atoms, or an aryl group having 6 to 15 carbon atoms, and more preferably, hydrogen, an alkyl group having 1 to 4 carbon atoms, an acyl group having 2 to 4 carbon atoms, or an aryl group having 6 to 10 carbon atoms.

In the general formula (22), $R^{57}$ to $R^{60}$ each independently is preferably hydrogen, an alkyl group having 1 to 6 carbon atoms, an acyl group having 2 to 6 carbon atoms, or an aryl group having 6 to 15 carbon atoms, and more preferably hydrogen, an alkyl group having 1 to 4 carbon atoms, an acyl group having 2 to 4 carbon atoms, or an aryl group having 6 to 10 carbon atoms. The alkyl group, the cycloalkyl group, the alkenyl group, the aryl group, and the acyl group may be either a non-substitution product or a substitution product.

The polysiloxane (A) is preferably a polysiloxane further including an organosilane unit represented by the general formula (7) and/or an organosilane unit represented by the general formula (8).

In the polysiloxane (A), an organosilane unit represented by the general formula (2), an organosilane unit represented by the general formula (3), an organosilane unit represented by the general formula (7), and an organosilane unit represented by the general formula (8) may be either a regular arrangement or an irregular arrangement. Examples of the regular arrangement include an alternating copolymer, a periodic copolymer, a block copolymer, or a graft copolymer. Examples of the irregular arrangement include a random copolymer, and the like.

In the polysiloxane (A), an organosilane unit represented by the general formula (2), an organosilane unit represented by the general formula (3), an organosilane unit represented by the general formula (7), and an organosilane unit represented by the general formula (8) may be either a two-dimension arrangement or a three-dimension arrangement. Examples of the two-dimension arrangement include a linear arrangement. Examples of the three-dimension arrangement include a ladder-like arrangement, a cage-like arrangement, or a network-like arrangement.

[Chemical Formula 11]

$$\begin{array}{c} R^4 \\ | \\ -Si-R^6 \\ | \\ R^5 \end{array} \quad (7)$$

$$\begin{array}{c} R^3 \\ | \\ -(Si-O)- \\ | \\ OR^9 \end{array} \quad (8)$$

In the general formula (7), $R^4$ to $R^6$ each independently represents hydrogen, an alkyl group, a cycloalkyl group, an alkenyl group, or an aryl group.

In the general formula (8), $R^3$ each independently represents hydrogen, an alkyl group, a cycloalkyl group, an alkenyl group, or an aryl group, and $R^9$ each independently represents hydrogen, an alkyl group, an acyl group, an aryl group, a polymer chain of the polysiloxane, or a substituent represented by the general formula (7).

In the general formula (7), $R^4$ to $R^6$ each independently is preferably hydrogen, an alkyl group having 1 to 10 carbon atoms, a cycloalkyl group having 4 to 10 carbon atoms, an alkenyl group having 2 to 10 carbon atoms, or an aryl group having 6 to 15 carbon atoms, and more preferably hydrogen, an alkyl group having 1 to 6 carbon atoms, a cycloalkyl group having 4 to 7 carbon atoms, an alkenyl group having 2 to 8 carbon atoms, or an aryl group having 6 to 10 carbon atoms. The alkyl group, the cycloalkyl group, the alkenyl group, the aryl group, and the acyl group may be either a non-substitution product or a substitution product.

In the general formula (8), $R^3$ each independently is preferably hydrogen, an alkyl group having 1 to 10 carbon atoms, a cycloalkyl group having 4 to 10 carbon atoms, an alkenyl group having 2 to 10 carbon atoms, or an aryl group having 6 to 15 carbon atoms, and more preferably hydrogen, an alkyl group having 1 to 6 carbon atoms, a cycloalkyl group having 4 to 7 carbon atoms, an alkenyl group having 2 to 8 carbon atoms, or an aryl group having 6 to 10 carbon atoms. $R^9$ each independently is preferably hydrogen, an alkyl group having 1 to 6 carbon atoms, an acyl group having 2 to 6 carbon atoms, an aryl group having 6 to 15 carbon atoms, a polymer chain of the polysiloxane, or a substituent represented by the general formula (7), and more preferably hydrogen, an alkyl group having 1 to 4 carbon atoms, an acyl group having 2 to 4 carbon atoms, an aryl group having 6 to 10 carbon atoms, a polymer chain of the polysiloxane, or a substituent represented by the general formula (7).

Examples of the alkyl group as for $R^3$ to $R^6$ of the general formulas (7) and (8) include a methyl group, an ethyl group, an n-propyl group, an isopropyl group, an n-butyl group, a t-butyl group, an n-hexyl group, or an n-decyl group.

Examples of the substituent thereof include a halogen atom, an epoxy group, a glycidyl group, an oxetanyl group, a carboxy group, an amino group, a mercapto group, an isocyanate group, or a succinic anhydride residue. When the alkyl group is a substitution product, examples of $R^3$ to $R^6$ include a trifluoromethyl group, a 3,3,3-trifluoropropyl group, a 3-glycidoxypropyl group, a 2-(3,4-epoxycyclohexyl)ethyl group, a 3-[(3-ethyl-3-oxetanyl)methoxy]propyl group, a 1-carboxy-2-carboxypentyl group, a 3-aminopropyl group, a 3-mercaptopropyl group, a 3-isocyanate propyl group, or a group having the following structure.

[Chemical Formula 12]

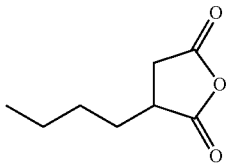

Examples of the cycloalkyl group as for $R^3$ to $R^6$ of the general formula (7) and (8) include a cyclopentyl group or a cyclohexyl group. Examples of the substituent thereof include a halogen atom, an epoxy group, a glycidyl group, an oxetanyl group, a carboxy group, an amino group, a mercapto group, an isocyanate group, or a succinic anhydride residue. Examples of the alkenyl group as for $R^3$ to $R^6$ of the general formulas (7) and (8) and the substitution product thereof include a vinyl group, an allyl group, a 3-(meth)acryloxypropyl group, or a 2-(meth)acryloxyethyl group.

Examples of the aryl group as for $R^3$ to $R^6$ of the general formulas (7) and (8) include a phenyl group, a 4-tolyl group, a 4-hydroxyphenyl group, a 4-methoxyphenyl group, a 4-t-butylphenyl group, a 1-naphthyl group, a 2-naphthyl group, a 4-styryl group, a 2-phenylethyl group, a 1-(4-hydroxyphenyl)ethyl group, a 2-(4-hydroxyphenyl)ethyl group, or a 4-hydroxy-5-(4-hydroxyphenylcarbonyloxy) pentyl group.

Examples of the acyl group as for $R^9$ of the general formula (7) include an acetyl group. Examples of the aryl group as for $R^9$ of the general formula (7) include a phenyl group, a 4-tolyl group, a 4-hydroxyphenyl group, a 4-methoxyphenyl group, a 4-t-butylphenyl group, or a 1-naphthyl group. Examples of the alkyl group as for $R^9$ of the general formula (8) include a methyl group, an ethyl group, an n-propyl group, an isopropyl group, or an n-butyl group.

Inclusion of the organosilane unit represented by the general formula (7) enables an improvement in cracking resistance of a cured film obtained from the photosensitive resin composition of the present invention during thermal curing and ion implantation. Inclusion of the organosilane unit represented by the general formula (8) enables an improvement in hardness of the cured film without causing deterioration of heat resistance and transparency of the cured film.

Examples of the organosilane including an organosilane unit represented by the general formula (7) include a monofunctional silane such as trimethylmethoxysilane, trimethylethoxysilane, triethylmethoxysilane, triethylethoxysilane, tri-n-propyltrimethoxysilane, tri-n-propyltriethoxysilane, tri-n-butyltrimethoxysilane, tri-n-butyltriethoxysilane, (3-glycidoxypropyl)dimethylmethoxysilane, (3-glycidoxypropyl)dimethylethoxysilane, 3-dimethylmethoxysilylpropionic acid, 3-dimethylethoxysilylpropionic acid, 4-dimethylmethoxysilylbutyric acid, 4-dimethylethoxysilylbutyric acid, 5-dimethylmethoxysilylvaleric acid, 5-dimethylethoxysilylvaleric acid, 3-dimethylmethoxysilylpropylsuccinic anhydride, 3-dimethylethoxysilylpropylsuccinic anhydride, 4-(3-dimethylmethoxysilylpropyl)cyclohexane-1,2-dicarboxylic anhydride, 4-(3-dimethylethoxysilylpropyl)cyclohexane-1,2-dicarboxylic anhydride, 4-(3-dimethylmethoxysilylpropyl)phthalic anhydride, or 4-(3-dimethylethoxysilyipropyl)phthalic anhydride.

Examples of the an organosilane including an organosilane unit represented by the general formula (8) include a trifunctional silane such as methyltrimethoxysilane, methyltriethoxysilane, methyltri-n-propoxysilane, methyltriisopropoxysilane, methyltri-n-butoxysilane, ethyltrimethoxysilane, ethyltriethoxysilane, ethyltri-n-propoxysilane, ethyltriisopropoxysilane, ethyltri-n-butoxysilane, n-propyltrimethoxysilane, n-propyltriethoxysilane, isopropyltrimethoxysilane, isopropyltriethoxysilane, n-butyltrimethoxysilane, n-butyltriethoxysilane, n-hexyltrimethoxysilane, n-hexyltriethoxysilane, n-octyltrimethoxysilane, n-decyltrimethoxysilane, cyclopentyltrimethoxysilane, cyclohexyltrimethoxysilane, vinyltrimethoxysilane, vinyltriethoxysilane, 3-methacryloxypropyltrimethoxysilane, 3-methacryloxypropyltriethoxysilane, 3-acryloxypropyltrimethoxysilane, 3-acryloxypropyltriethoxysilane, phenyltrimethoxysilane, phenyltriethoxysilane, 4-tolyltrimethoxysilane, 4-hydroxyphenyltrimethoxysilane, 4-methoxyphenyltrimethoxysilane, 4-t-butylphenyltrimethoxysilane, 1-naphthyltrimethoxysilane, 2-naphthyltrimethoxysilane, 4-styryltrimethoxysilane, 2-phenylethyltrimethoxysilane, 4-hydroxybenzyltrimethoxysilane, 1-(4-hydroxyphenyl)ethyltrimethoxysilane, 2-(4-hydroxyphenyl)ethyltrimethoxysilane, 4-hydroxy-5-(4-hydroxyphenylcarbonyloxy)pentyltrimethoxysilane, 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, 2-(3-trimethoxysilylpropyl)-4-(N-t-butyl)amino-4-oxabutanoic acid, 2-(3-triethoxysilylpropyl)-4-(N-t-butyl)amino-4-oxabutanoic acid, 3-(3-trimethoxysilylpropyl)-4-(N-t-butyl)amino-4-oxabutanoic acid, 3-(3-triethoxysilylpropyl)-4-(N-t-butyl)amino-4-oxabutanoic acid, 3-trimethoxysilylpropylsuccinic acid, 3-triethoxysilylpropylsuccinic acid, 3-trimethoxysilylpropionic acid, 3-triethoxysilylpropionic acid, 4-trimethoxysilylbutyric acid, 4-triethoxysilylbutyric acid, 5-trimethoxysilylvaleric acid, 5-triethoxysilylvaleric acid, 3-trimethoxysilylpropylsuccinic anhydride, 3-triethoxysilylpropylsuccinic anhydride, 4-(3-trimethoxysilylpropyl)cyclohexane-1,2-dicarboxylic anhydride, 4-(3-triethoxysilylpropyl)cyclohexane-1,2-dicarboxylic anhydride, 4-(3-trimethoxysilylpropyl)phthalic anhydride, 4-(3-triethoxysilylpropyl)phthalic anhydride, trifluoromethyltrimethoxysilane, trifluoromethyltriethoxysilane, 3,3,3-trifluoropropyltrimethoxysilane, 3-[(3-ethyl-3-oxetanyl)methoxy]propyltrimethoxysilane, 3-[(3-ethyl-3-oxetanyl)methoxy]propyltriethoxysilane, 3-aminopropyltrimethoxysilane, 3-aminopropyltriethoxysilane, N-(2-aminoethyl)-3-aminopropyltrimethoxysilane, N-(2-aminoethyl)-3-aminopropyltriethoxysilane, N-phenyl-3-aminopropyltrimethoxysilane, N-(vinylbenzyl)-2-aminoethyl-3-aminopropyltrimethoxysilane hydrochloride, 3-(4-aminophenyl)propyltrimethoxysilane, 1-[4-(3-trimethoxysilylpropyl)phenyl]urea, 1-(3-trimethoxysilylpropyl)urea, 1-(3-triethoxysilylpropyl)urea, 3-trimethoxysilyl-N-(1,3-dimethylbutylidene)propylamine, 3-triethoxysilyl-N-(1,3-dimethylbutylidene)propylamine, 3-mercaptopropyltrimethoxysilane, 3-mercaptopropyltriethoxysilane, 3-isocyanate propyltrimethoxysilane, 3-isocyanate propyltriethoxysilane, 1,3,5-tris(3-trimethoxysilylpropyl)isocyanuric acid, 1,3,5-tris(3-triethoxysilylpropyl) isocyanuric acid, N-t-butyl-2-(3-trimethoxysilylpropyl) succinic acid imide, or N-t-butyl-2-(3-triethoxysilylpropyl) succinic acid imide.

The content ratio of the organosilane unit represented by the general formula (7) in the polysiloxane (A) is preferably 0 to 10 mol %, and more preferably 0 to 5 mol %, in terms of a molar ratio of Si atoms. When the molar ratio of Si atoms derived from the organosilane unit represented by the general formula (7) is within the above range, it is possible to satisfy both high resolution and cracking resistance.

The content ratio of the organosilane unit represented by the general formula (8) in the polysiloxane (A) is 0 to 90 mol %, preferably 0 to 80 mol %, more preferably 0 to 68 mol %, and still more preferably 5 to 52 mol %, in terms of a molar ratio of Si atoms. When the molar ratio of Si atoms derived from the organosilane unit represented by the general formula (8) is within the above range, it is possible to improve hardness of the cured film without causing deterioration of high resolution and cracking resistance.

The total of the content ratio of the organosilane unit represented by the general formula (7) and the content ratio of the organosilane unit represented by the general formula (8) in the polysiloxane (A) is (Z) mol % in terms of a molar ratio of Si atoms, and (Z) is 0 to 90 mol %, preferably 0 to 80 mol %, more preferably 0 to 68 mol %, and still more preferably 5 to 52 mol %.

It is preferred that the polysiloxane (A) includes an organosilane unit having an aromatic group. Such polysiloxane is preferably obtained by using, as an organosilane including an organosilane unit represented by the general formula (2), an organosilane including an organosilane unit represented by the general formula (7), and an organosilane including an organosilane unit represented by the general formula (8), an organosilane having an aromatic group. When the polysiloxane (A) includes an organosilane unit having an aromatic group, it is possible to improve cracking resistance of a cured film obtained from the photosensitive resin composition of the present invention during thermal curing and ion implantation due to steric hindrance of an aromatic group.

Examples of the organosilane including an organosilane unit, which is represented by the general formula (2), the general formula (7), or the general formula (8), and also has an aromatic group, include a trifunctional silane such as phenyltrimethoxysilane, phenyltriethoxysilane, 4-tolyltrimethoxysilane, 4-hydroxyphenyltrimethoxysilane, 4-methoxyphenyltrimethoxysilane, 4-t-butylphenyltrimethoxysilane, 1-naphthyltrimethoxysilane, 2-naphthyltrimethoxysilane, 4-styryltrimethoxysilane, 2-phenylethyltrimethoxysilane, 4-hydroxybenzyltrimethoxysilane, 1-(4-hydroxyphenyl)ethyltrimethoxysilane, 2-(4-hydroxyphenyl)ethyltrimethoxysilane, or 4-hydroxy-5-(4-hydroxyphenylcarbonyloxy)pentyltrimethoxysilane, or a difunctional silane such as diphenyldimethoxysilane or diphenyldiethoxysilane. From the viewpoint of an improvement in cracking resistance of the cured film obtained from the photosensitive resin composition of the present invention during thermal curing and ion implantation, the organosilane is preferably phenyltrimethoxysilane, 4-tolyltrimethoxysilane, 4-hydroxyphenyltrimethoxysilane, 4-methoxyphenyltrimethoxysilane, 1-naphthyltrimethoxysilane, 2-naphthyltrimethoxysilane, 4-styryltrimethoxysilane, 2-phenylethyltrimethoxysilane, 4-hydroxybenzyltrimethoxysilane, diphenyldimethoxysilane, or diphenyldiethoxysilane, more preferably phenyltrimethoxysilane, 1-naphthyltrimethoxysilane, 2-naphthyltrimethoxysilane, diphenyldimethoxysilane, or diphenyldiethoxysilane, and still more preferably 1-naphthyltrimethoxysilane, 2-naphthyltrimethoxysilane, diphenyldimethoxysilane, or diphenyldiethoxysilane.

The content ratio of the organosilane unit having an aromatic group in the polysiloxane (A) is preferably 15 to 80 mol %, and more preferably 25 to 70 mol %, in terms of a molar ratio of Si atoms. It is particularly preferred that the molar ratio of Si atoms derived from an organosilane unit, which is represented by the general formula (2), the general formula (7), or the general formula (8), and also has an aromatic group is within the above range. Whereby, patternability in an alkali developing solution is improved, and also it is possible to improve cracking resistance of a cured film obtained from the photosensitive resin composition of the present invention during thermal curing and ion implantation.

Among the organosilanes including an organosilane unit, which is represented by the general formula (2), the general formula (7), or the general formula (8), and also has an aromatic group, from the viewpoint of an improvement in patternability of an alkali developing solution, suppression of formation of residues after the development, and an improvement in resolution after the development, the organosilane is preferably phenyltrimethoxysilane, 4-tolyltrimethoxysilane, 4-hydroxyphenyltrimethoxysilane, 4-methoxyphenyltrimethoxysilane, 1-naphthyltrimethoxysilane, 2-naphthyltrimethoxysilane, 4-styryltrimethoxysilane, 2-phenylethyltrimethoxysilane, 4-hydroxybenzyltrimethoxysilane, diphenyldimethoxysilane, or diphenyldiethoxysilane, more preferably phenyltrimethoxysilane, 1-naphthyltrimethoxysilane, 2-naphthyltrimethoxysilane, diphenyldimethoxysilane, or diphenyldiethoxysilane, and still more preferably 1-naphthyltrimethoxysilane or 2-naphthyltrimethoxysilane.

It is particularly preferred that the organosilane including an organosilane unit, which is represented by the general formula (2), the general formula (7), or the general formula (8), and also has an aromatic group, includes one or more units selected from the group consisting of an organosilane unit represented by the general formula (4a), an organosilane unit represented by the general formula (4b), and an organosilane unit represented by the general formula (4c) (hereinafter referred to as an "organosilane unit having naphthyl group").

[Chemical Formula 13]

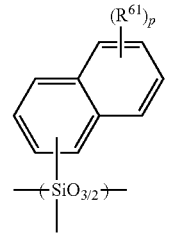

(4a)

-continued

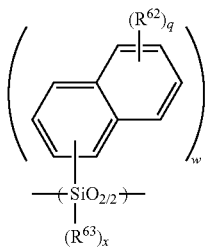
(4b)

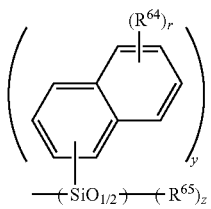
(4c)

In the general formula (4a), $R^{61}$ represents an alkyl group having 1 to 10 carbon atoms, a cycloalkyl group having 4 to 10 carbon atoms, an alkenyl group having 2 to 7 carbon atoms, or an aryl group having 6 to 15 carbon atoms. p represents an integer of 0 to 7.

In the general formula (4b), $R^{62}$ and $R^{63}$ represent an alkyl group having 1 to 10 carbon atoms, a cycloalkyl group having 4 to 10 carbon atoms, an alkenyl group having 2 to 7 carbon atoms, or an aryl group having 6 to 15 carbon atoms. q represents an integer of 0 to 7, w represents an integer of 1 to 2, x represents an integer of 0 to 1, and w+x=2.

In the general formula (4c), $R^{64}$ represents an alkyl group having 1 to 10 carbon atoms, a cycloalkyl group having 4 to 10 carbon atoms, an alkenyl group having 2 to 7 carbon atoms, or an aryl group having 6 to 15 carbon atoms, $R^{65}$ represents an alkyl group having 1 to 10 carbon atoms, a cycloalkyl group having 4 to 10 carbon atoms, an alkenyl group having 2 to 7 carbon atoms, or an aryl group having 6 to 15 carbon atoms. r represents an integer of 0 to 7, y represents an integer of 1 to 3, z represents an integer of 0 to 2, and y+z=3.

In the general formula (4a), $R^{61}$ is preferably an alkyl group having 1 to 6 carbon atoms, a cycloalkyl group having 4 to 7 carbon atoms, an alkenyl group having 2 to 4 carbon atoms, or an aryl group having 6 to 10 carbon atoms.

In the general formula (4b), $R^{62}$ and $R^{63}$ are preferably alkyl groups having 1 to 6 carbon atoms, cycloalkyl groups having 4 to 7 carbon atoms, alkenyl groups having 2 to 4 carbon atoms, or aryl groups having 6 to 10 carbon atoms.

In the general formula (4c), $R^{64}$ and $R^{65}$ are preferably alkyl groups having 1 to 6 carbon atoms, cycloalkyl groups having 4 to 7 carbon atoms, alkenyl groups having 2 to 4 carbon atoms, or aryl groups having 6 to 10 carbon atoms.

When the polysiloxane (A) includes an organosilane unit having a naphthyl group, formation of residues during developing is suppressed, and resolution after the development can be improved. This is because numerous silanol groups forming no siloxane crosslinking remain in the vicinity of a naphthyl group due to steric hindrance of the naphthyl group. It is also estimated that a dissolution contrast ratio of the exposed area and the unexposed area is improved since the naphthyl group has hydrophobicity. It is also possible to improve cracking resistance of a cured film during thermal curing and ion implantation. This reason is estimated that excessive siloxane crosslinking in the polysiloxane (A) is suppressed due to steric hindrance of the naphthyl group and thus shrinkage stress is reduced. It is also possible to reduce a change in pattern dimensional width to exposure dose during exposure and development. This reason is estimated that light scattering during exposure and reflected light from the substrate as a base are absorbed by the naphthyl group.

When the polysiloxane (A) has a naphthyl group, compatibility between the polysiloxane (A) and the below-mentioned (F) dissolution accelerating crosslinking agent is improved, thus making it possible to further enhance the effect of improving resolution, improving cracking resistance, and suppressing a change in pattern dimensional width.

When the polysiloxane (A) includes an organosilane unit having a naphthyl group, it is possible to improve resolution after the development and to improve cracking resistance during thermal curing or ion implantation. Therefore, it is preferred in view of applying a photosensitive resin composition including a polysiloxane (A) to the step of heating a pattern of the below-mentioned (1-1a) composition to 500 to 1,500° C. It is also preferred in view of applying the composition to the step of treating a pattern of the below-mentioned (3-A) composition at from 0° C. to lower than 300° C. The steps (1-1a) and (3-A) enable shortening of the step required to remove the pattern of the composition, thus making it possible to shorten the process time.

When positive photosensitivity is imparted to the photosensitive resin composition of the present invention, an organosilane including an organosilane unit represented by the general formula (2), an organosilane including an organosilane unit represented by the general formula (7), and an organosilane including an organosilane unit represented by the general formula (8) are particularly preferably organosilanes having an aromatic group. When the polysiloxane (A) has a structure derived from an organosilane having an aromatic group, it is possible to improve compatibility with the below-mentioned (C) compound having a naphthoquinone diazide structure, thus enabling formation of a uniform cured film without causing phase separation and deterioration of transparency.

When the positive photosensitivity is imparted to the photosensitive resin composition of the present invention, it is possible to use, as an organosilane including an organosilane unit represented by the general formula (2), an organosilane including an organosilane unit represented by the general formula (7), and an organosilane including an organosilane unit represented by the general formula (8), an organosilane having an epoxy group and/or a vinyl group. When the polysiloxane (A) has a structure derived from an organosilane having an epoxy group and/or a vinyl group, it is possible to improve adhesion of the cured film.

Examples of the organosilane including an organosilane unit, which is represented by the general formula (2), the general formula (7), or the general formula (8), and also has an epoxy group and/or a vinyl group, include a trifunctional silane such as 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, vinyltrimethoxysilane, or vinyltriethoxysilane; a difunctional silane such as (3-glycidoxypropyl)methyldimethoxysilane, (3-glycidoxypropyl)methyldiethoxysilane, methylvinyldimethoxysilane, or divinyldiethoxysilane; and a monofunctional silane such as (3-glycidoxypropyl)dimethylmethoxysilane or (3-glycidoxypropyl)dimethylethoxysilane. From the viewpoint of an improvement in adhesion of the cured film, the organosilane is preferably 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, vinyltrimethoxysilane, or vinyltriethoxysilane.

The content ratio of the organosilane unit, which is represented by the general formula (2), the general formula (7), or the general formula (8), and also has an epoxy group and/or a vinyl group, in the polysiloxane (A) is preferably 1 to 70 mol %, more preferably 3 to 60 mol %, still more preferably 5 to 50 mol %, and particularly preferably 10 to 50 mol %, in terms of a molar ratio of Si atoms. When the molar ratio of Si atoms derived from an organosilane unit, which is represented by the general formula (2), the general formula (7), or the general formula (8), and also has an epoxy group and/or a vinyl group, is within the above range, it is possible to improve adhesion of the cured film.

When negative photosensitivity is imparted to the photosensitive resin composition of the present invention, it is possible to use, as an organosilane including an organosilane unit represented by the general formula (2), an organosilane including an organosilane unit represented by the general formula (7), and an organosilane including an organosilane unit represented by the general formula (8), an organosilane having an ethylenically unsaturated double bond group. When the polysiloxane (A) has a structure derived from an organosilane having an ethylenically unsaturated double bond group, UV curing during exposure is accelerated, thus enabling an improvement in sensitivity. Also, crosslink density after thermal curing is improved, thus enabling an improvement in hardness of the cured film. As used herein, exposure is irradiation with active chemical rays (radiations) and includes, for example, irradiation with visible rays, ultraviolet rays, electron beams, or X-rays. From the viewpoint of a light source used generally, irradiation is preferably irradiation with an ultra-high pressure mercury lamp light source capable of emitting visible rays or ultraviolet rays, and more preferably irradiation with j-line (wavelength of 313 nm), i-line (wavelength of 365 nm), h-line (wavelength of 405 nm), or g-line (wavelength of 436 nm). Hereinafter, exposure refers to irradiation with active chemical rays (radiations).

Examples of the organosilane including an organosilane unit, which is represented by the general formula (2), the general formula (7), or the general formula (8), and also has an ethylenically unsaturated double bond group, include a trifunctional silane such as vinyltrimethoxysilane, vinyltriethoxysilane, 3-methacryloxypropyltrimethoxysilane, 3-methacryloxypropyltriethoxysilane, 3-methacryloxypropylmethyldimethoxysilane, 3-methacryloxypropylmethyldiethoxysilane, 3-acryloxypropyltrimethoxysilane, 3-acryloxypropyltriethoxysilane, 3-acryloxypropylmethyldimethoxysilane, 3-acryloxypropylmethyldiethoxysilane, or 4-styryltrimethoxysilane; or a difunctional silane such as methylvinyldimethoxysilane or divinyldiethoxysilane. From the viewpoint of an improvement in sensitivity during exposure and hardness of the cured film, the organosilane is preferably vinyltrimethoxysilane, 3-methacryloxypropyltrimethoxysilane, 3-methacryloxypropylmethyldimethoxysilane, 3-acryloxypropyltrimethoxysilane, 3-acryloxypropylmethyldimethoxysilane, or 4-styryltrimethoxysilane.

When using, as the organosilane including an organosilane unit represented by the general formula (2), the general formula (7), or the general formula (8), which imparts negative photosensitivity to the photosensitive resin composition of the present invention, an organosilane having an ethylenically unsaturated double bond group, a double bond equivalent of the polysiloxane (A) is preferably 150 to 10,000 g/mol, more preferably 200 to 5,000 g/mol, and still more preferably 250 to 2,000 g/mol. Herein, the double bond equivalent is the resin weight per 1 mol of the ethylenically unsaturated double bond group, and the unit is g/mol. The double bond equivalent can be calculated by measuring an iodine value. When the double bond equivalent of the polysiloxane (A) is within the above range, it is possible to improve sensitivity during exposure and hardness of the cured film. An organosilane having an acidic group is also preferable as an organosilane including an organosilane unit represented by the general formula (7) and/or an organosilane including an organosilane unit represented by the general formula (8). When the polysiloxane (A) has an acidic group derived from an organosilane, it is possible to improve patternability with an alkali developing solution, thus enabling suppression of formation of residues after the development and an improvement in resolution after the development. The acidic group is preferably a group exhibiting acidity of lower than pH 6. Examples of the group exhibiting acidity of lower than pH 6 include a carboxy group, a carboxylic anhydride group, a sulfonic acid group, a phenolic hydroxyl group, a hydroxyimide group, or a silanol group. From the viewpoint of an improvement in patternability with an alkali developing solution and resolution after the development, the acidic group is preferably a carboxy group or a carboxylic anhydride group.

Examples of the organosilane including an organosilane unit, which is represented by the general formula (7) or the general formula (8), and also has an acidic group, include a trifunctional silane such as 2-(3-trimethoxysilylpropyl)-4-(N-t-butyl)amino-4-oxabutanoic acid, 2-(3-triethoxysilylpropyl)-4-(N-t-butyl)amino-4-oxabutanoic acid, 3-(3-trimethoxysilylpropyl)-4-(N-t-butyl)amino-4-oxabutanoic acid, 3-(3-triethoxysilylpropyl)-4-(N-t-butyl)amino-4-oxabutanoic acid, 3-trimethoxysilylpropylsuccinic acid, 3-triethoxysilylpropylsuccinic acid, 3-trimethoxysilylpropionic acid, 3-triethoxysilylpropionic acid, 4-trimethoxysilylbutyric acid, 4-triethoxysilylbutyric acid, 5-trimethoxysilylvaleric acid, 5-triethoxysilylvaleric acid, 3-trimethoxysilylpropylsuccinic anhydride, 3-triethoxysilylpropylsuccinic anhydride, 4-(3-trimethoxysilylpropyl)cyclohexane-1,2-dicarboxylic anhydride, 4-(3-triethoxysilylpropyl)cyclohexane-1,2-dicarboxylic anhydride, 4-(3-trimethoxysilylpropyl)phthalic anhydride, 4-(3-triethoxysilylpropyl)phthalic anhydride, 4-hydroxyphenyltrimethoxysilane, 4-hydroxybenzyltrimethoxysilane, 1-(4-hydroxyphenyl)ethyltrimethoxysilane, 2-(4-hydroxyphenyl)ethyltrimethoxysilane, or 4-hydroxy-5-(4-hydroxyphenylcarbonyloxy)pentyltrimethoxysilane; or a monofunctional silane such as 3-dimethylmethoxysilylpropionic acid, 3-dimethylethoxysilylpropionic acid, 4-dimethylmethoxysilylbutyric acid, 4-dimethylethoxysilylbutyric acid, 5-dimethylmethoxysilylvaleric acid, 5-dimethylethoxysilylvaleric acid, 3-dimethylmethoxysilylpropylsuccinic anhydride, 3-dimethylethoxysilylpropylsuccinic anhydride, 4-(3-dimethylmethoxysilylpropyl)cyclohexane-1,2-dicarboxylic anhydride, 4-(3-dimethylethoxysilylpropyl)cyclohexane-1,2-dicarboxylic anhydride, 4-(3-dimethylmethoxysilylpropyl)phthalic anhydride, or 4-(3-dimethylethoxysilylpropyl)phthalic anhydride.

From the viewpoint of an improvement in patternability with an alkali developing solution, suppression of formation of residues after the development, and an improvement in resolution after the development, the organosilane is preferably a trifunctional silane such as 2-(3-trimethoxysilylpropyl)-4-(N-t-butyl)amino-4-oxabutanoic acid, 2-(3-triethoxysilylpropyl)-4-(N-t-butyl)amino-4-oxabutanoic acid, 3-(3-trimethoxysilylpropyl)-4-(N-t-butyl)amino-4-oxabutanoic acid, 3-(3-triethoxysilylpropyl)-4-(N-t-butyl)amino-4-oxabutanoic acid, 3-trimethoxysilylpropylsuccinic acid, 3-triethoxysilylpropylsuccinic acid, 3-trimethoxysilylpropionic acid, 3-triethoxysilylpropionic acid, 4-trimethoxysilylbutyric acid, 4-triethoxysilylbutyric acid, 5-trimethoxysilylvaleric acid, 5-triethoxysilylvaleric acid, 3-trimethoxysilylpropylsuccinic anhydride, 3-triethoxysilylpropylsuccinic anhydride, 4-(3-trimethoxysilylpropyl)cyclohexane-1,2-dicarboxylic anhydride, 4-(3-triethoxysilylpropyl)cyclohexane-1,2-dicarboxylic anhydride, 4-(3-trimethoxysilylpropyl)phthalic anhydride, or 4-(3-triethoxysilylpropyl)phthalic anhydride; or a monofunctional silane such as 3-dimethylmethoxysilylpropionic acid, 3-dimethylethoxysilylpropionic acid, 4-dimethylmethoxysilylbutyric acid, 4-dimethylethoxysilylbutyric acid, 5-dimethylmethoxysilylvaleric acid, 5-dimethylethoxysilylvaleric acid, 3-dimethylmethoxysilylpropylsuccinic anhydride, 3-dimethylethoxysilylpropylsuccinic anhydride, 4-(3-dimethylmethoxysilylpropyl)cyclohexane-1,2-dicarboxylic anhydride, 4-(3-dimethylethoxysilylpropyl)cyclohexane-1,2-dicarboxylic anhydride, 4-(3-dimethylmethoxysilylpropyl)phthalic anhydride, or 4-(3-dimethylethoxysilylpropyl)phthalic anhydride; and more preferably 2-(3-trimethoxysilylpropyl)-4-(N-t-butyl)amino-4-oxabutanoic acid, 2-(3-triethoxysilylpropyl)-4-(N-t-butyl)amino-4-oxabutanoic acid, 3-(3-trimethoxysilylpropyl)-4-(N-t-butyl)amino-4-oxabutanoic acid, 3-(3-triethoxysilylpropyl)-4-(N-t-butyl)amino-4-oxabutanoic acid, 3-trimethoxysilylpropylsuccinic acid, 3-triethoxysilylpropylsuccinic acid, 3-trimethoxysilylpropionic acid, 3-triethoxysilylpropionic acid, 4-trimethoxysilylbutyric acid, 4-triethoxysilylbutyric acid, 3-trimethoxysilylpropylsuccinic anhydride, 3-triethoxysilylpropylsuccinic anhydride, 4-(3-trimethoxysilylpropyl)cyclohexane-1,2-dicarboxylic anhydride, or 4-(3-triethoxysilylpropyl)cyclohexane-1,2-dicarboxylic anhydride.

When positive photosensitivity is imparted to the photosensitive resin composition of the present invention, the content ratio of an organosilane unit, which is represented by the general formula (7) or the general formula (8), and also has an acidic group, in the polysiloxane (A) is preferably 0.01 to 20 mol %, more preferably 0.02 to 15 mol %, and still more preferably 0.03 to 10 mol %, in terms of a molar ratio of Si atoms. When the molar ratio of Si atoms derived from the organosilane unit, which is represented by the general formula (7) or the general formula (8), and also has an acidic group, is within the above range, it is possible to suppress formation of residues after the development and to improve resolution after the development.

When negative photosensitivity is imparted to the photosensitive resin composition of the present invention, a carboxylic acid equivalent of the polysiloxane (A) is preferably 280 to 1,400 g/mol, more preferably 300 to 1,100 g/mol, and still more preferably 350 to 950 g/mol. Herein, the carboxylic acid equivalent is the resin weight per 1 mol of the carboxy group, and the unit is g/mol. The number of carboxy groups in the resin can be determined from the value of the carboxylic acid equivalent. When the carboxylic acid equivalent of the polysiloxane (A) is within the above range, it is possible to suppress formation of residues after the development and to improve resolution after the development The content ratio of various organosilane units in the polysiloxane (A) can be determined by using $^{1}$H-NMR, $^{13}$C-NMR, $^{29}$Si-NMR, IR, TOF-MS, an elemental analysis method, and measurement of ash content in combination.

The weight average molecular weight (hereinafter referred to as "Mw") of the polysiloxane (A) is preferably 500 to 100,000, more preferably 500 to 50,000, and still more preferably 500 to 20,000, in terms of polystyrene measured by gel permeation chromatography (hereinafter referred to as "GPC"). When Mw of polysiloxane (A) is within the above preferred range, it is possible to improve leveling property during coating, patternability with an alkali developing solution, and storage stability of a coating solution. The polysiloxane (A) used in the photosensitive resin composition of the present invention is a polysiloxane having Mw of 500 or more.

The method for hydrolyzing an organosilane, followed by dehydration condensation includes, for example, a method in which a solvent and water and, if necessary, a catalyst are added to a mixture containing an organosilane, followed by heating and stirring at 50 to 150° C., and preferably 90 to 130° C., for about 0.5 to 100 hours. During heating and stirring, a hydrolysis by-product (alcohol such as methanol) and a condensation by-product (water) can be optionally distilled off by distillation.

Examples of the solvent used in hydrolysis of the organosilane and dehydration condensation include those which are the same as the below-mentioned solvents. The addition amount of the solvent is preferably 10 to 1,000 parts by weight based on 100 parts by weight of the total of the amount of an organosilane and the amount of the below-mentioned inorganic particles (B) to be reacted with the organosilane. The addition amount of water is preferably from 0.5 to 2 mols based on 1 mol of a hydrolyzable group.

The catalyst to be optionally added is preferably an acid catalyst or a base catalyst. Examples of the acid catalyst include hydrochloric acid, nitric acid, sulfuric acid, hydrofluoric acid, phosphoric acid, acetic acid, trifluoroacetic acid, formic acid, polyhydric carboxylic acid, an anhydride thereof, or an ion exchange resin. Examples of the base catalyst include triethylamine, tri-n-propylamine, tri-n-butylamine, tri-n-pentylamine, tri-n-hexylamine, tri-n-heptylamine, tri-n-octylamine, diethylamine, triethanolamine, diethanolamine, sodium hydroxide, potassium hydroxide, alkoxysilane having an amino group, or an ion exchange resin. The addition amount of the catalyst is preferably 0.01 to 10 parts by weight based on 100 parts by weight of the total of the amount of an organosilane and the amount of inorganic particles (B) to be reacted with the organosilane.

From the viewpoint of storage stability of the photosensitive resin composition of the present invention, it is preferred that the polysiloxane solution does not contain the above catalyst after hydrolysis and dehydration condensation, and the catalyst can be removed in an ex-post facto manner. A treatment with water rinsing and/or an ion exchange resin is preferable in view of simplicity of operation and removability. Water rinsing is a method in which a polysiloxane solution (A) is diluted with an appropriate hydrophobic solvent and rinsed with water several times, and then the obtained organic layer is concentrated by an evaporator or the like. The treatment with an ion exchange resin is a method in which a polysiloxane solution (A) is brought into contact with an appropriate ion exchange resin.

The photosensitive resin composition of the present invention includes (B) inorganic particles. Here, in the present invention, the fact that the photosensitive resin composition includes inorganic particles (B) includes, in addition to a mode in which a polysiloxane (A) and inorganic particles (B) are separately included, a mode in which a polysiloxane (A) is bonded to inorganic particles (B) in a photosensitive resin composition, and both modes.

<(A1) Inorganic Particle-Containing Polysiloxane>

The polysiloxane (A) is preferably a polysiloxane in which a polysiloxane (A) includes an organosilane unit to which inorganic particles (B) are bonded (hereinafter referred to as "(A1) an inorganic particle-containing polysiloxane"). It is preferred to use, as the inorganic particle-containing polysiloxane (A1), a polysiloxane obtained by hydrolyzing at least an organosilane including an organosilane unit represented by the general formula (2) and an organosilane including an organosilane unit represented by the general formula (3) in the presence of inorganic particles (B), followed by dehydration condensation. Use of the inorganic particle-containing polysiloxane (A1) thus obtained leads to an improvement in alkali solubility of inorganic particles (B), thus enabling suppression of deterioration of patternability with an alkali developing solution. Because of its small shrinkage ratio during thermal curing, inorganic particles (B) enables suppression of the production of shrinkage stress, leading to an improvement in cracking resistance of a cured film obtained from the photosensitive resin composition of the present invention during thermal curing and ion implantation.

It is possible to confirm whether or not inorganic particles (B) is bonded to a polysiloxane (A) by using $^{13}$C-NMR, $^{29}$Si-NMR, and IR in combination. For example, in $^{29}$Si-NMR, a spectrum of inorganic particles (B), a spectrum of the polysiloxane (A), and a spectrum of an inorganic particle-containing polysiloxane (A1) are compared. Since peak derived from Si atoms bonded to inorganic particles (B) of the inorganic particle-containing polysiloxane (A1) becomes a peak having a chemical shift which does not exist in the spectrum of the polysiloxane (A), it is possible to confirm whether or not inorganic particles (B) are bonded to the polysiloxane (A).

Likewise, since a peak derived from Si atoms in the inorganic particle-containing polysiloxane (A1) becomes a peak having a wave number different from that of the spectrum of the polysiloxane (A), it is also possible to confirm, by IR, whether or not inorganic particles (B) are bonded to the polysiloxane (A).

It is also possible to confirm by observing the boundary portion between the inorganic particles (B) and the polysiloxane (A), using a scanning electron microscope (hereinafter referred to as "SEM") or a transmission electron microscope (hereinafter referred to as "TEM"). When the inorganic particles (B) are bonded to the polysiloxane (A), a state where they are integrated with each other is observed, so that the boundary portion between the inorganic particles (B), or the boundary portion between the inorganic particles (B) and the polysiloxane (A) becomes unclear. Meanwhile, when the inorganic particles (B) are not bonded to the polysiloxane (A), a state where they are not integrated with each other is observed, so that the boundary portion between the inorganic particles (B), or the boundary portion between the inorganic particles (B) and the polysiloxane (A) becomes clear, and particles having the size corresponding to a number average particle diameter of the inorganic particles (B) are clearly observed.

<(B) Inorganic Particles>

The following description is common with both of inorganic particles included separately for the polysiloxane (A), and inorganic particles bonded to the polysiloxane (A).

The inorganic particles (B) are particles made of a metal compound or a semiconductor compound. Examples of the metal or semiconductor include elements selected from the group consisting of silicon, lithium, sodium, magnesium, potassium, calcium, strontium, barium, and lantern. Examples of the metal compound or semiconductor compound include halide, oxide, nitride, hydroxide, carbonate, sulfate, nitrate, or metasilicate of the metal compound or semiconductor compound.

Use of inorganic particles (B) having a number average particle diameter in a specific range is important from the viewpoint of an improvement in patternability with an alkali developing solution and an improvement in resolution after the development, and an improvement in cracking resistance of a cured film obtained from the photosensitive resin composition of the present invention during thermal curing and ion implantation.

The number average particle diameter of inorganic particles (B) is preferably 1 nm or more, more preferably 5 nm or more, still more preferably 15 nm or more, particularly preferably 20 nm or more, and most preferably 25 nm or more. When the number average particle diameter of inorganic particles (B) is within the above range, it is possible to improve cracking resistance of a cured film obtained from the photosensitive resin composition of the present invention during thermal curing and ion implantation. Meanwhile, the number average particle diameter is preferably 200 nm or less, more preferably 70 nm or less, still more preferably 60 nm or less, particularly preferably 55 nm or less, and most preferably 45 nm or less. When the number average particle diameter is within the above range, it is possible to improve patternability with an alkali developing solution and resolution after the development.

Herein, the number average particle diameter of inorganic particles (B) can be determined by measuring laser scattering due to Brownian motion of inorganic particles (B) in a solution (dynamic light scattering method) using a submicron particle size distribution analyzer (N4-PLUS; manufactured by Beckman Coulter, Inc.). The number average particle diameter of inorganic particles (B) in a cured film obtained from the photosensitive resin composition of the present invention can be measured by using SEM and TEM. The number average particle diameter of inorganic particles (B) is directly measured at a magnification of 50,000 to 200,000 times. When inorganic particles (B) are true spheres, the diameter of true sphere is measured and regarded as a number average particle diameter. When inorganic particles (B) are not true spheres, a longest diameter (hereinafter referred to as a "major axis diameter") and a longest diameter in a direction perpendicular to the major axis diameter (hereinafter referred to as a "minor axis diameter") are measured, and then the major axis diameter and the minor axis diameter are averaged to obtain a biaxial average diameter, which is regarded as a number average particle diameter.

Specific examples of inorganic particles (B) include silica particles, lithium fluoride particles, lithium chloride particles, lithium bromide particles, lithium oxide particles, lithium carbonate particles, lithium sulfate particles, lithium nitrate particles, lithium metasilicate particles, lithium hydroxide particles, sodium fluoride particles, sodium chloride particles, sodium bromide particles, sodium carbonate particles, sodium hydrogen carbonate particles, sodium sulfate particles, sodium nitrate particles, sodium metasilicate particles, sodium hydroxide particles, magnesium fluoride particles, magnesium chloride particles, magnesium bromide particles, magnesium oxide particles, magnesium carbonate particles, magnesium sulfate particles, magnesium nitrate particles, magnesium hydroxide particles, potassium fluoride particles, potassium chloride particles, potassium bromide particles, potassium carbonate particles, potassium sulfate particles, potassium nitrate particles, calcium fluoride particles, calcium chloride particles, calcium bromide particles, calcium oxide particles, calcium carbonate particles, calcium sulfate particles, calcium nitrate particles, calcium hydroxide particles, strontium fluoride particles, barium fluoride particles, or lanthanum fluoride particles. From the viewpoint of compatibility with the polysiloxane (A), silica particles are preferable.

In order to make the reaction with a resin as a matrix easier, inorganic particles (B) preferably have a functional group capable of reacting with a resin, such as a hydroxy group, on a surface of each particle. When inorganic particles (B) have satisfactory reactivity with a resin as a matrix, inorganic particles (B) are incorporated into a resin during thermal curing, thus suppressing the production of shrinkage stress during thermal curing, leading to an improvement in cracking resistance of a cured film obtained from the photosensitive resin composition of the present invention during thermal curing and ion implantation.

Specific examples of silica particles include methanol silica sol having a number average particle diameter (hereinafter referred to as a "particle diameter") of 10 to 20 nm in which methanol (MA) is used as a dispersion medium, IPA-ST having a particle diameter of 10 to 20 nm in which isopropyl alcohol (IPA) is used as a dispersion medium, EG-ST having a particle diameter of 10 to 20 nm in which ethylene glycol (EG) is used as a dispersion medium, NPC-ST-30 having a particle diameter of 10 to 20 nm in which n-propylcellosolve (NPC) is used as a dispersion medium, DMAC-ST having a particle diameter of 10 to 20 nm in which dimethylacetamide (DMAC) is used as a dispersion medium, MEK-ST having a particle diameter of 10 to 20 nm in which methyl ethyl ketone (MEK) is used as a dispersion medium, MIBK-ST having a particle diameter of 10 to 20 nm in which methyl isobutyl ketone (MIBK) is used as a dispersion medium, XBA-ST having a particle diameter of 10 to 20 nm in which a mixed solvent of xylene (Xy) and n-butanol (nBA) is used as a dispersion medium, PMA-ST having a particle diameter of 10 to 20 nm in which propylene glycol monomethyl ether acetate (PGMEA) is used as a dispersion medium, PGM-ST having a particle diameter of 10 to 20 nm in which propylene glycol monomethyl ether (PGME) is used as a dispersion medium, MA-ST-S having a particle diameter of 8 to 11 nm in which MA is used as a dispersion medium, MA-ST-M having a particle diameter of 20 to 30 nm in which MA is used as a dispersion medium, MA-ST-L having a particle diameter of 40 to 50 nm in which MA is used as a dispersion medium, MA-ST-ZL having a particle diameter of 70 to 100 nm in which MA is used as a dispersion medium, IPA-ST-S having a particle diameter of 8 to 11 nm in which IPA is used as a dispersion medium, IPA-ST-M having a particle diameter of 20 to 30 nm in which IPA is used as a dispersion medium, IPA-ST-L having a particle diameter of 40 to 50 nm in which IPA is used as a dispersion medium, IPA-ST-ZL having a particle diameter of 70 to 100 nm in which IPA is used as a dispersion medium, "SNOWTEX" (registered trademark) OXS having a particle diameter of 4 to 6 nm in which a dispersion solution is water, "SNOWTEX" (registered trademark) OS having a particle diameter of 8 to 11 nm in which a dispersion solution is water, "SNOWTEX" (registered trademark) 0 having a particle diameter of 10 to 20 nm in which a dispersion solution is water, "SNOWTEX" (registered trademark) 0-40 having a particle diameter of 20 to 30 nm in which a dispersion solution is water, "SNOWTEX" (registered trademark) OL having a particle diameter of 40 to 50 nm in which a dispersion solution is water, "SNOWTEX" (registered trademark) XL having a particle diameter of 40 to 60 nm in which a dispersion solution is water, "SNOWTEX" (registered trademark) YL having a particle diameter of 50 to 80 nm in which a dispersion solution is water, "SNOWTEX" (registered trademark) ZL having a particle diameter of 70 to 100 nm in which a dispersion solution is water, "SNOWTEX" (registered trademark) MP-1040 having a particle diameter of about 100 nm in which a dispersion solution is water, or "SNOWTEX" (registered trademark) MP-2040 having a particle diameter of about 200 nm in which a dispersion solution is water (all of which are manufactured by Nissan Chemical Industries, Ltd.); "OSCAL" (registered trademark)-1421 having a particle diameter of 5 to 10 nm in which IPA is used as a dispersion medium, "OSCAL" (registered trademark)-1432 having a particle diameter of 10 to 20 nm in which IPA is used as a dispersion medium, "OSCAL" (registered trademark)-1132" having a particle diameter of 10 to 20 nm in which MA is used as a dispersion medium, "OSCAL" (registered trademark)-1632 having a particle diameter of 10 to 20 nm in which ethylene glycol monomethyl ether (EGME) is used as a dispersion medium, "OSCAL" (registered trademark)-1842 having a particle diameter of 10 to 20 nm in which MIBK is used as a dispersion medium, "OSCAL" (registered trademark)-101 having a particle diameter of 10 to 20 nm in which γ-butyrolactone (GBL) is used as a dispersion medium, "OSCAL" (registered trademark)-1727BM having a particle diameter of 110 to 130 nm in which EG is used as a dispersion medium, "OSCAL" (registered trademark)-1727TH having a particle diameter of 150 to 170 nm in which EG is used as a dispersion medium, or "CATALOID" (registered trademark)-S having a particle diameter of 5 to 80 nm in which a dispersion solution is water (all of which are manufactured by JGC Catalysts and Chemicals Ltd.); "Quartron" (registered trademark) PL-06L having a particle diameter of 5 to 10 nm in which a dispersion solution is water, "Quartron" (registered trademark) PL-1 having a particle diameter of 10 to 15 nm in which a dispersion solution is water, "Quartron" (registered trademark) PL-2L having a particle diameter of 15 to 20 nm in which a dispersion solution is water, "Quartron" (registered trademark) PL-2 having a particle diameter of 20 to 30 nm in which a dispersion solution is water, "Quartron" (registered trademark) PL-3 having a particle diameter of 30 to 40 nm in which a dispersion solution is water, "Quartron" (registered trademark) PL-3L having a particle diameter of 30 to 40 nm in which a dispersion solution is water, "Quartron" (registered trademark) PL-3H having a particle diameter of 30 to 40 nm in which a dispersion solution is water, "Quartron" (registered trademark) PL-5 having a particle diameter of 50 to 60 nm in which a dispersion solution is water, "Quartron" (registered trademark) PL-7 having a particle diameter of 70 to 85 nm in which a dispersion solution is water, "Quartron" (registered trademark) PL-10H having a particle diameter of 80 to 100 nm in which a dispersion solution is water, "Quartron" (registered trademark) PL-1-IPA having a particle diameter of 10 to 15 nm in which IPA is used as a dispersion medium, "Quartron" (registered trademark) PL-2L-IPA having a particle diameter of 15 to 20 nm in which IPA is used as a dispersion medium, "Quartron" (registered trademark) PL-2L-MA having a particle diameter of 15 to 20 nm in which MA is used as a dispersion medium, "Quartron" (registered trademark) PL-2L-PGME having a particle diameter of 15 to 20 nm in which PGME is used as a dispersion medium, "Quartron" (registered trademark) PL-3-PGME having a particle diameter of 30 to 40 nm in which PGME is used as a dispersion medium, "Quartron" (registered trademark) PL-3L-PGME having a particle diameter of 30 to 40 nm in which PGME is used as a dispersion medium, "Quartron" (registered trademark) PL-2L-DAA having a particle diameter of 15 to 20 nm in which diacetone alcohol (DAA) is used as a dispersion medium, "Quartron" (registered trademark) PL-2L-BL having a particle diameter of 15 to 20 nm in which GBL is used as a dispersion medium, or "Quartron" (registered trademark) PL-2L-TOL having a particle diameter of 15 to 20 nm in which toluene (TOL) is used as a dispersion medium (all of which are manufactured by Fuso Chemical Co., Ltd.); Silica ($SiO_2$) SG-SO100 (manufactured by KCM Corporation) having a particle diameter of 100 nm, or "REOLOSIL" (registered trademark) (manufactured by Tokuyama Corporation) having a particle diameter of 5 to 50 nm.

From the viewpoint of an improvement in cracking resistance of a cured film obtained from the photosensitive resin composition of the present invention during thermal curing and ion implantation without causing deterioration of patternability with an alkali developing solution, silica particles are preferably methanol silica sol, IPA-ST, EG-ST, NPC-ST-30, MEK-ST, PMA-ST, PGM-ST, MA-ST-S, MA-ST-M, MA-ST-L, IPA-ST-S, IPA-ST-M, IPA-ST-L, "SNOWTEX" (registered trademark) OXS, "SNOWTEX" OS, "SNOWTEX" 0, "SNOWTEX" 0-40, "SNOWTEX" OL, "SNOWTEX" XL, "SNOWTEX" YL, or "SNOWTEX" ZL (all of which are manufactured by Nissan Chemical Industries Ltd.), "OSCAL" (registered trademark)-1421, "OSCAL"-1432, "OSCAL"-1132, or "OSCAL"-1632 (all of which are manufactured by JGC Catalysts and Chemicals Ltd.), or "Quartron" (registered trademark) PL-06L, "Quartron" PL-1, "Quartron" PL-2L, "Quartron" PL-2, "Quartron" PL-3, "Quartron" PL-3L, "Quartron" PL-3H, "Quartron" PL-5, "Quartron" PL-1-IPA, "Quartron" PL-2L-IPA, "Quartron" PL-2L-MA, "Quartron" PL-2L-PGME, "Quartron" PL-3-PGME, "Quartron" PL-3L-PGME, or "Quartron" PL-2L-DAA (all of which are manufactured by Fuso Chemical Co., Ltd.), and more preferably MA-ST-M, MA-ST-L, IPA-ST-M, IPA-ST-L, "SNOWTEX" (registered trademark) O-40, "SNOWTEX" OL, or "SNOWTEX" XL (all of which are manufactured by Nissan Chemical Industries Ltd.), or "Quartron" (registered trademark) PL-2, "Quartron" PL-3, "Quartron" PL-3L, "Quartron" PL-3H, "Quartron" PL-5, "Quartron" PL-3-PGME, or "Quartron" PL-3L-PGME (all of which are manufactured by Fuso Chemical Co., Ltd.).

Examples of silica-lithium oxide composite particles include Lithium Silicate 45 (manufactured by Nissan Chemical Industries, Ltd.).

The content of inorganic particles (B) in the solid component of the photosensitive resin composition of the present invention, except for a solvent, is preferably 5 to 80% by weight, more preferably 7 to 70% by weight, still more preferably 10 to 60% by weight, and particularly preferably 15 to 50% by weight. When the content of inorganic particles (B) is within the above range, it is possible to improve cracking resistance of a cured film obtained from the photosensitive resin composition of the present invention during thermal curing and ion implantation without causing deterioration of patternability with an alkali developing solution. The content of inorganic particles (B) is the total amount of inorganic particles (B) constituting the inorganic particle-containing polysiloxane (A1) and other inorganic particles (B).

When the polysiloxane (A) includes inorganic particles (B) having a number average particle diameter within a specific range, it is possible to improve resolution after the development and to improve cracking resistance during thermal curing or ion implantation. Therefore, it is preferred in view of applying a photosensitive resin composition including a polysiloxane (A) to the below-mentioned step (1-1a) of heating a pattern of the composition to 500 to 1,500° C. In addition, it is preferred in view of applying the composition to the below-mentioned step (3-A) of treating a pattern of the composition at from 0° C. to lower than 300° C. The steps (1-1a) and (3-A) enable shortening of the step required to remove a pattern of the composition, leading to shortening of the process time.

<Positive Photosensitivity>

The photosensitive resin composition of the present invention is a photosensitivity composition having positive or negative photosensitivity, and preferably has positive photosensitivity. When the photosensitive resin composition has positive photosensitivity, it is possible to obtain a pattern having excellent resolution after the development.

<Positive Photosensitivity; (C) Compound Having Naphthoquinone Diazide Structure>

When positive photosensitivity is imparted to the photosensitive resin composition of the present invention, it is preferred that a compound having a naphthoquinone diazide structure (C) is included in the photosensitive resin composition. The compound having a naphthoquinone diazide structure (C) is a compound which causes a photoreaction under exposure and a structural change to generate indenecarboxylic acid having alkali solubility. Only the exposed area is dissolved in an alkali developing solution as a result of the generation of this indenecarboxylic acid.

Meanwhile, in the unexposed area, a quinonediazide site of the compound having a naphthoquinone diazide structure (C) in the photosensitive resin composition of the present invention acts. A quinonediazide site is coordinated with a silanol group remaining in the polysiloxane (A) and interacted, thus suppressing solubility in an alkali developing solution due to a residual silanol in the polysiloxane (A).

Accordingly, when the photosensitive resin composition of the present invention includes a compound having a naphthoquinone diazide structure (C), a difference in solubility in an alkali developing solution between the exposed area and the unexposed area increases, leading to an improvement in dissolution contrast.

The compound having a naphthoquinone diazide structure (C) includes, for example, a compound in which a naphthoquinonediazidesulfonic acid is ester-bonded to a compound having a phenolic hydroxyl group. It is preferred that the ortho- and para-positions of a phenolic hydroxyl group in a compound having a naphthoquinone diazide structure (C) each independently hydrogen, a hydroxy group, or a substituent represented by any one of the general formulas (9) to (11).

[Chemical Formula 14]

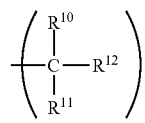

(9)

(10)

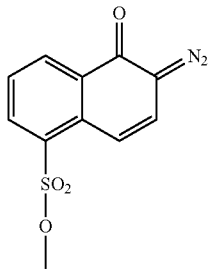

(11)

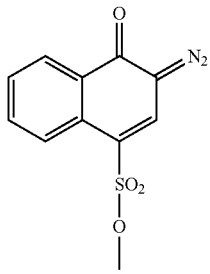

$R^{10}$ to $R^{12}$ each independently represents hydrogen, an alkyl group having 1 to 10 carbon atoms, a cycloalkyl group having 4 to 10 carbon atoms, an aryl group having 6 to 15 carbon atoms, or a carboxy group, and at least two substituents of $R^{10}$ to $R^{12}$ may form a ring.

$R^{10}$ to $R^{12}$ each independently is preferably an alkyl group having 1 to 6 carbon atoms, a cycloalkyl group having 4 to 7 carbon atoms, an aryl group having 6 to 10 carbon atoms, or a carboxy group.

The alkyl group, the cycloalkyl group, the aryl group, and the carboxy group may be either a non-substitution product or a substitution product.

The ring formed by at least two substituents of $R^{10}$ to $R^{12}$ includes, for example, a cyclopentane ring, a cyclohexane ring, a norbornene ring, an adamantane ring, or a fluorene ring.

When the substituent at the ortho-position and the para-position of the phenolic hydroxyl group each independently is a substituent represented by any one of the general formulas (9) to (11), oxidative decomposition is less likely to be caused during thermal curing and a conjugated compound typified by a quinoid structure is less likely to be formed. Therefore, a cured film is less likely to be colored and transparency of the cured film is improved. These compounds having a naphthoquinone diazide structure (C) can be synthesized by a known esterification reaction between a compound having a phenolic hydroxyl group and naphLhoquinonediazidesulfonic acid chloride.

Examples of the compound having a phenolic hydroxyl group include the following compounds (all of which are manufactured by Honshu Chemical Industry Co., Ltd.).

[Chemical Formula 15]

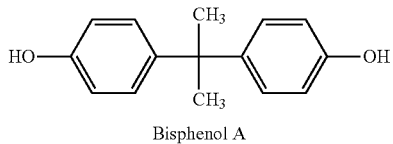

Bisphenol A

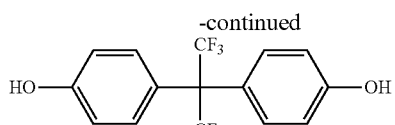

BisP-AF

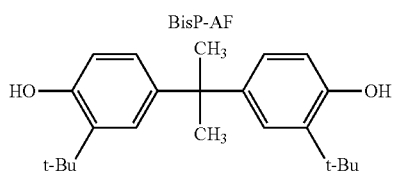

BisOTBP-A

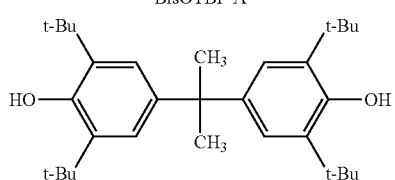

Bis26B-A

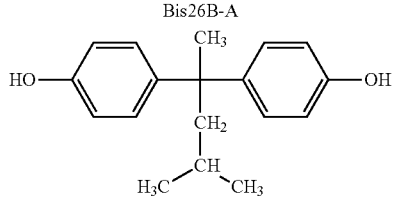

BisP-MIBK

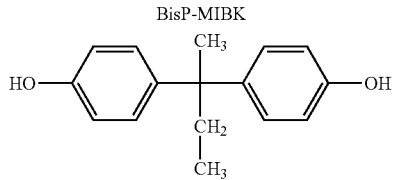

BisP-B

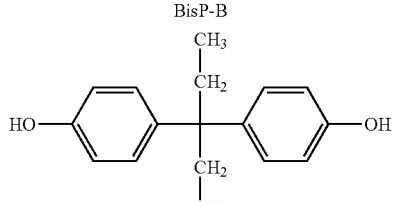

BisP-DEK

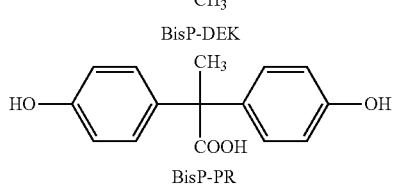

BisP-PR

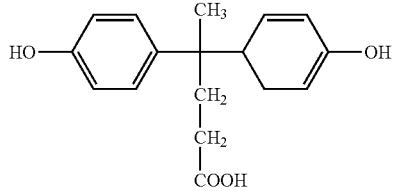

BisP-LV

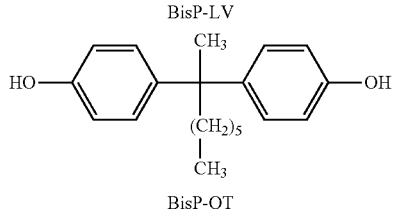

BisP-OT

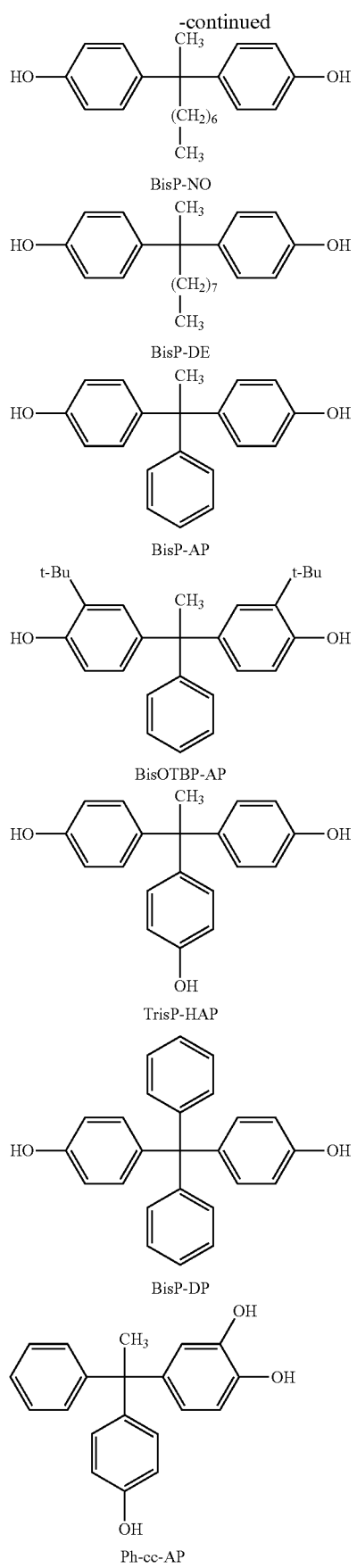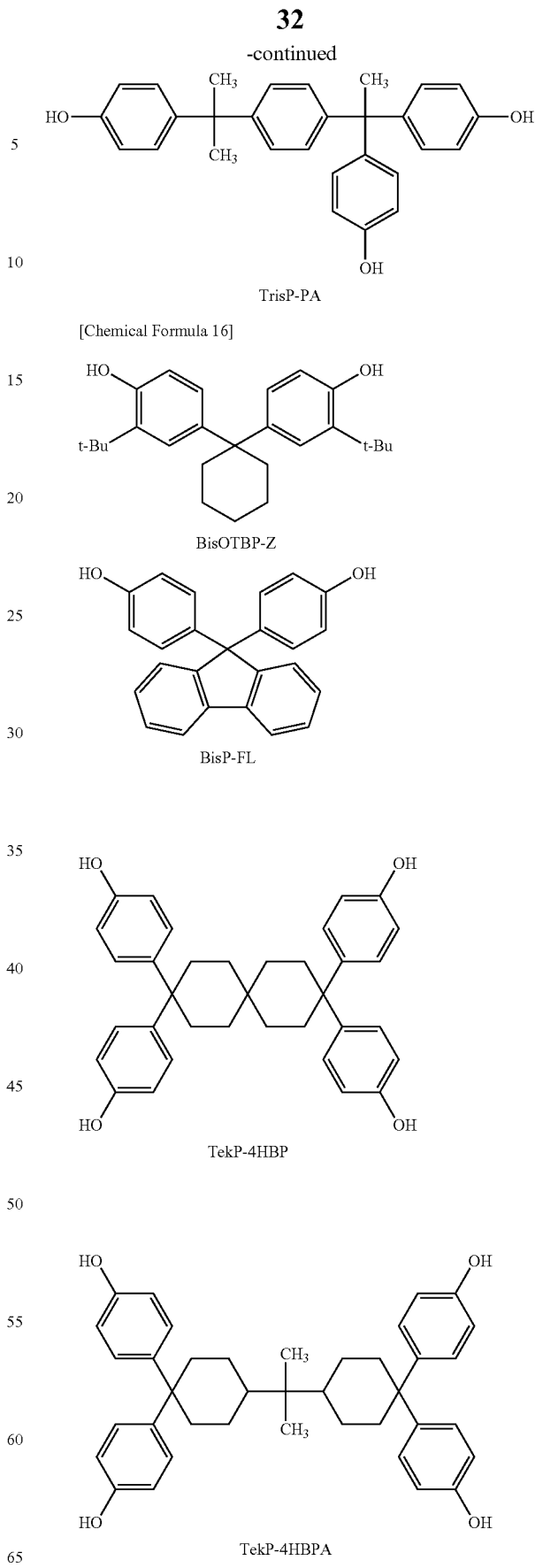

-continued

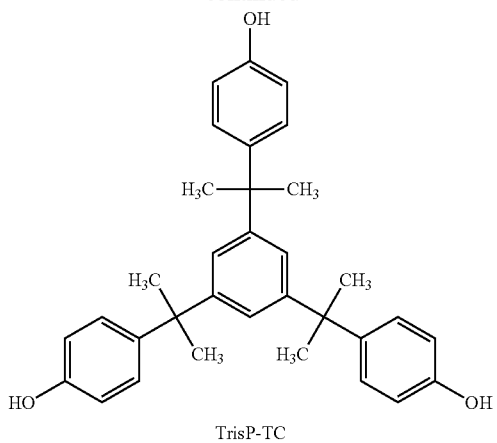

TrisP-TC

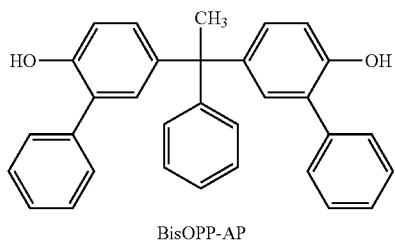

BisOPP-AP

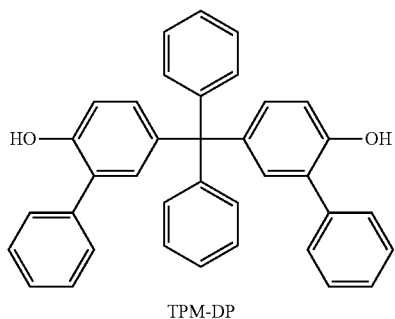

TPM-DP

Examples of the naphthoquinonediazidesulfonic acid chloride include 4-naphthoquinonediazidesulfonic acid chloride or 5-naphthoquinonediazidesulfonic acid chloride. A 4-naphthoquinonediazidesulfonic acid ester compound is suited for i-line exposure because of having absorption in the i-line (wavelength of 365 nm) region. 5-Naphthoquinonediazidesulfonic acid ester compound is suited for exposure in a wide wavelength range since absorption exists in a wide wavelength range.

The compound having a naphthoquinone diazide structure (C) includes, for example, a compound represented by the general formula (12). Use of a compound having a naphthoquinone diazide structure (C) represented by the general formula (12) enables an improvement in sensitivity during exposure and resolution after the development.

[Chemical Formula 17]

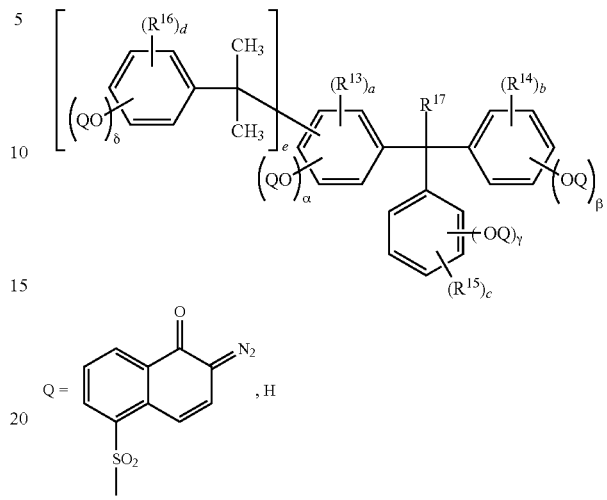

$R^{13}$ to $R^{16}$ each independently represents hydrogen, an alkyl group having 1 to 10 carbon atoms, a cycloalkyl group having 4 to 10 carbon atoms, an alkoxy group having 1 to 8 carbon atoms, an ester group having 1 to 8 carbon atoms, an aryl group having 6 to 15 carbon atoms, or a carboxy group, and $R^{17}$ represents hydrogen, an alkyl group having 1 to 10 carbon atoms, or an aryl group having 6 to 15 carbon atoms. Q represents a 5-naphthoquinone diazidesulfonyl group or hydrogen, and any one of Q(s) is a 5-naphthoquinone diazidesulfonyl group. a, b, c, d, e, α, β, γ, and δ each independently represents an integer of 0 to 4, and α+β+γ+δ≥2.

$R^{13}$ to $R^{16}$ each independently is preferably hydrogen, an alkyl group having 1 to 6 carbon atoms, a cycloalkyl group having 4 to 7 carbon atoms, an alkoxy group having 1 to 6 carbon atoms, an ester group having 1 to 6 carbon atoms, or an aryl group having 6 to 10 carbon atoms, or a carboxy group, and $R^{17}$ is preferably hydrogen, an alkyl group having 1 to 6 carbon atoms, or an aryl group having 6 to 10 carbon atoms. The alkyl group, the cycloalkyl group, the alkoxy group, the ester group, the aryl group, and the carboxy group may be either a non-substitution product or a substitution product.

The content of a compound having a naphthoquinone diazide structure (C) in the photosensitive resin composition of the present invention is preferably 2 to 30 parts by weight, and more preferably 3 to 15 parts by weight, based on 100 parts by weight of the polysiloxane (A). When the content of a compound having a naphthoquinone diazide structure (C) is within the above range, it is possible to improve a dissolution contrast during the development and to suppress formation of residues after the development. When the polysiloxane (A) is an inorganic particle-containing polysiloxane (A1), the amount is set at 100 parts by weight including the weight of inorganic particles (B) constituting the inorganic particle-containing polysiloxane (A1).

<Negative Photosensitivity>

When negative photosensitivity is imparted to the photosensitive resin composition of the present invention, it is preferred that the photosensitive resin composition includes one or more selected from the group consisting of (D) a photopolymerization initiator, (E1) a photoacid generator, and (E2) a photobase generator. The photopolymerization initiator (D) is a compound which causes bond cleavage and/or reaction under exposure to generate a radical. The photoacid generator (E1) is a compound which causes bond cleavage under exposure to generate an acid. The photobase generator (E2) is a compound which causes bond cleavage under exposure to generate a base.

<Negative Photosensitivity; (D) Photopolymerization Initiator>

When the photosensitive resin composition of the present invention include (D) a photopolymerization initiator, UV curing during exposure is accelerated, thus enabling an improvement in sensitivity. Also, crosslink density of the composition after thermal curing is improved, thus enabling an improvement in hardness of the cured film.

Examples of the photopolymerization initiator (D) include an α-aminoalkylphenone compound such as 2-methyl-1-[4-(methylthio)phenyl]-2-morpholinopropan-1-one, 2-dimethylamino-2-(4-methylbenzyl)-1-(4-morpholinophenyl)-butan-1-one, 2-benzyl-2-dimethylamino-1-(4-morpholinophenyl)-butanon-1-one, or 3,6-bis(2-methyl-2-morpholinopropionyl)-9-octyl-9H-carbazole; an acylphosphine oxide compound such as 2,4,6-trimethylbenzoyl-diphenylphosphine oxide, bis(2,4,6-trimethylbenzoyl)-phenylphosphine oxide, or bis(2,6-dimethoxybenzoyl)-(2,4,4-trimethylpentyl)phosphine oxide; an oxime ester compound such as 1-phenylpropane-1,2-dione-2-(O-ethoxycarbonyl)oxime, 1-[4-(phenylthio)phenyl]octane-1,2-dione-2-(O-benzoyl)oxime, 1-phenylbutane-1,2-dione-2-(O-methoxycarbonyl)oxime, 1,3-diphenylpropane-1,2,3-trione-2-(O-ethoxycarbonyl)oxime, 1-[9-ethyl-6-(2-methylbenzoyl)-9H-carbazol-3-yl]ethanone-1-(O-acetyl)oxime, or 1-[9-ethyl-6-[2-methyl-4-[1-(2,2-dimethyl-1,3-dioxolan-4-yl)methyloxy]benzoyl]-9H-carbazol-3-yl]ethanone-1-(O-acetyl)oxime; a benzophenone derivative such as benzophenone, 4,4'-bis(dimethylamino)benzophenone, 4,4'-bis(diethylamino)benzophenone, 4-phenylbenzophenone, 4,4-dichlorobenzophenone, 4-hydroxybenzophenone, alkylated benzophenone, 3,3',4,4'-tetrakis(t-butylperoxycarbonyl)benzophenone, 4-methylbenzophenone, dibenzylketone, or fluorenone; a benzoic acid ester compound such as ethyl 4-dimethylaminobenzoate, (2-ethyl)hexyl 4-dimethylaminobenzoate, ethyl 4-diethylaminobenzoate, or methyl 2-benzoylbenzoate; an aromatic ketone compound such as 2,2-diethoxyacetophenone, 2,3-diethoxyacetophenone, 4-t-butyldichloroacetophenone, 2-hydroxy-2-methyl-1-phenylpropan-1-one, 2,2-dimethoxy-1,2-diphenylethan-1-one, 1-hydroxycyclohexyl phenyl ketone, 1-(4-isopropylphenyl)-2-hydroxy-2-methylpropan-1-one, 1-[4-(2-hydroxyethoxy)phenyl]-2-hydroxy-2-methylpropan-1-one, 2-hydroxy-1-[4-[4-(2-hydroxy-2-methylpropionyl)benzyl]phenyl]-2-methylpropan-1-one, benzalacetophenone, or 4-azidebenzalacetophenone; a thioxanthone compound such as thioxanthone, 2-methylthioxanthone, 2-chlorothioxanthone, 2-isopropylthioxanthone, 2,4-dimethylthioxanthone, 2,4-diethylthioxanthone, or 2,4-dichlorothioxanthone; benzylmethoxyethylacetal, benzoin, benzoinmethyl ether, benzoinethyl ether, benzoinisopropyl ether, benzoinisobutyl ether, 4-benzoyl-N,N-dimethyl-N-[2-(1-oxo-2-propenyloxy)ethyl]benzenemethanaminium bromide, (4-benzoylbenzyl)trimethylammonium chloride, 2-hydroxy-3-(4-benzoylphenoxy)-N,N,N-trimethyl-1-propeneaminium chloride monohydrate, 2-hydroxy-3-(3,4-dimethyl-9-oxo-9H-thioxanthen-2-yloxy)-N,N,N-trimethyl-1-propanaminium chloride, naphthalenesulfonyl chloride, quinolinesulfonyl chloride, 2,2'-bis(2-chlorophenyl)-4,5,4',5'-tetraphenyl-1,2-biimidazole, 10-n-butyl-2-chloroacridone, N-phenylthioacridone, 1,7-bis(acridin-9-yl)-n-heptane, anthraquinone, 2-ethylanthraquinone, 2-t-butylanthraquinone, 2-aminoanthraquinone, p-chloroanthraquinone, anthrone, benzanthrone, methyleneanthrone, 9,10-phenanthrenequinone, camphorquinone, dibenzsuberon, methylphenylglyoxyester, η5-cyclopentadienyl-η6-cumenyl-iron (1+)-hexafluorophosphate(1-), 4-benzoyl-4'-methyl-diphenylsulfide, diphenylsulfide derivative, bis(η5-2,4-cyclopentadien-1-yl)-bis(2,6-difluoro-3-(1H-pyrrol-1-yl)-phenyl)titanium, 2,6-bis(4-azidobenzylidene)cyclohexane, 2,6-bis(4-azidobenzylidene)-4-methylcyclohexanone, benzthiazole disulfide, triphenylphosphine, carbon tetrabromide, tribromophenylsulfone, or benzoyl peroxide or eosin, or a combination of a photo-reducing pigment such as methylene blue with a reducing agent such as ascorbic acid or triethanolamine.

From the viewpoint of an improvement in sensitivity during exposure and an improvement in hardness of a cured film, the photopolymerization initiator is preferably an α-aminoalkylphenone compound, an acylphosphineoxide compound, an oxime ester compound, a benzophenone compound having an amino group, or a benzoic acid ester compound having an amino group. Examples of the benzophenone compound having an amino group include 4,4'-bis(dimethylamino)benzophenone or 4,4'-bis(diethylamino) benzophenone. Examples of the benzoic acid ester compound having an amino group include ethyl 4-dimethylaminobenzoate, (2-ethylhexyl) 4-dimethylaminobenzoate, or ethyl 4-diethylaminobenzoate.

The content of the photopolymerization initiator (D) in the photosensitive resin composition of the present invention is preferably 0.1 to 20 parts by weight, and more preferably 1 to 10 parts by weight, when the total amount of the polysiloxane (A) and the below-mentioned radical polymerizable compound is 100 parts by weight. When the content of the photopolymerization initiator (D) is within the above range, it is possible to improve sensitivity during exposure and hardness of the cured film. When the polysiloxane (A) is an inorganic particle-containing polysiloxane (A1), the amount is set at 100 parts by weight, including the weight of inorganic particles (B) constituting the inorganic particle-containing polysiloxane (A1).

<Negative Photosensitivity; (E1) Photoacid Generator>

When the photosensitive resin composition of the present invention includes (E1) a photoacid generator, UV curing during exposure is accelerated, thus enabling an improvement in sensitivity. Also, crosslink density after thermal curing of the composition is improved, thus enabling an improvement in hardness of the cured film.

The photoacid generator (E1) includes an ionic compound and a nonionic compound. The ionic compound is preferably a compound containing neither heavy metals nor halogen ions, and more preferably a triorganosulfonium salt-based compound. Examples of the triorganosulfonium salt-based compound include methanesulfonate, trifluoromethanesulfonate, camphorsulfonate, or 4-toluenesulfonate of triphenylsulfonium; methanesulfonate, trifluoromethanesulfonate, camphorsulfonate, or 4-toluenesulfonate of dimethyl-1-naphthylsulfonium; methanesulfonate, trifluoromethanesulfonate, camphorsulfonate, or 4-toluenesulfonate of dimethyl(4-hydroxy-1-naphthyl)sulfonium; methanesulfonate, trifluoromethanesulfonate, camphorsulfonate, or 4-toluenesulfonate of dimethyl(4,7-dihydroxy-1-naphthyl)sulfonium; or methanesulfonate, trifluoromethanesulfonate, camphorsulfonate, or 4-toluenesulfonate of diphenyliodonium.

Examples of the nonionic photoacid generator (E1) include a halogen-containing compound, a diazomethane compound, a sulfone compound, a sulfonic acid ester compound, a carboxylic acid ester compound, a sulfonimide compound, a phosphoric acid ester compound, or a sulfonebenzotriazole compound.

Examples of the halogen-containing compound include a haloalkyl group-containing hydrocarbon compound or a haloalkyl group-containing heterocyclic compound. The halogen-containing compound is preferably 1,1-bis(4-chlorophenyl)-2,2,2-trichloroethane, 2-phenyl-4,6-bis(trichloromethyl)-s-triazine, or 2-naphthyl-4,6-bis(trichloromethyl)-s-triazine.

Examples of the diazomethane compound include bis(trifluoromethylsulfonyl)diazomethane, bis(cyclohexylsulfonyl)diazomethane, bis(phenylsulfonyl)diazomethane, bis(4-tolylsulfonyl)diazomethane, bis(2,4-xylylsulfonyl)diazomethane, bis(4-chlorophenylsulfonyl)diazomethane, methylsulfonyl-4-tolylsulfonyldiazomethane, cyclohexylsulfonyl(1,1-dimethylethylsulfonyl)diazomethane, bis(1,1-dimethylethylsulfonyl)diazomethane, or phenylsulfonyl(benzoyl)diazomethane.

Examples of the sulfone compound include a β-ketosulfone compound, a β-sulfonylsulfone compound, or a diaryldisulfone compound. The sulfone compound is preferably 4-tolylphenacylsulfone, mesitylphenacylsulfone, bis(phenylsulfonyl)methane, or a 4-chlorophenyl-4-tolyldisulfone compound.

Examples of the sulfonic acid ester compound include an alkylsulfonic acid ester, a haloalkylsulfonic acid ester, an arylsulfonic acid ester, or an iminosulfonic acid ester compound. The sulfonic acid ester compound is preferably benzoin-4-tolylsulfonate, pyrogallol tris(methylsulfonate), nitrobenzyl-9,10-diethoxyanthryl-2-sulfonate, or 2,6-(dinitrobenzyl)phenylsulfonate.

Examples of the iminosulfonic acid ester compound include benzylmonoxime-4-tolylsulfonate, benzylmonoxime-4-dodecylphenylsulfonate, benzylmonoximehexadecylsulfonate, 4-nitroacetophenoneoxime-4-tolylsulfonate, 4,4'-dimethylbenzylmonoxime-4-tolylsulfonate, 4,4'-dimethylbenzylmonoxime-4-dodecylphenylsulfonate, dibenzyl ketoneoxime-4-tolylsulfonate, α-(4-tolyloxy)imino-α-cyanoethyl acetate, furylmonoxime-4-(aminocarbonyl)phenylsulfonate, acetoneoxime-4-benzoylphenylsulfonate, 3-(benzylsulfonyloxy)iminoacetylacetone, bis(benzylmonoxide)dioctylnaphthyldisulfonate, α-(4-tolylsulfonyloxy)iminobenzylcyanide, α-(4-tolylsulfonyloxy)imino-4-methoxybenzylcyanide, α-(10-camphorsulfonyloxy)imino-4-methoxybenzylcyanide, or 5-(4-tolylsulfonyloxy)imino-5H-thiophen-2-ylidene-(2-methylph enyl)acetonitrile.

Examples of the carboxylic acid ester compound include a carboxylic acid 2-nitrobenzyl ester.

Examples of the sulfonimide compound include N-(trifluoromethylsulfonyloxy)succinimide, N-(10-camphorsulfonyloxy)succinimide, N-(4-tolylsulfonyloxy)succinimide, N-(2-trifluoromethylphenylsulfonyloxy)succinimide, N-(4-fluorophenylsulfonyloxy)succinimide, N-(trifluoromethylsulfonyloxy)phthalimide, N-(10-camphorsulfonyloxy)phthalimide, N-(2-trifluoromethylphenylsulfonyloxy)phthalimide, N-(2-fluorophenylsulfonyloxy)phthalimide, N-(trifluoromethylsulfonyloxy)diphenylmaleimide, N-(10-camphorsulfonyloxy)diphenylmaleimide, N-(4-tolylsulfonyloxy)diphenylmaleimide, N-(2-trifluoromethylphenylsulfonyloxy)diphenylmaleimide, N-(4-fluorophenylsulfonyloxy)diphenylmaleimide, N-(4-fluorophenylsulfonyloxy)diphenylmaleimide, N-(trifluoromethylsulfonyloxy)bicyclo[2.2.1]hept-5-ene-2,3-dicarboxyimide, N-(10-camphorsulfonyloxy)bicyclo[2.2.1]hept-5-ene-2,3-dicarboxyimide, N-(camphorsulfonyloxy)-7-oxabicyclo[2.2.1]hept-5-ene-2,3-dicarboxyimide, N-(trifluoromethylsulfonyloxy)-7-oxabicyclo[2.2.1]hept-5-ene-2,3-dicarboxyimide, N-(4-tolylsulfonyloxy)bicyclo[2.2.1]hept-5-ene-2,3-dicarboxyimide, N-(4-tolylsulfonyloxy)-7-oxabicyclo[2.2.1]hept-5-ene-2,3-dicarboxyimide, N-(2-trifluoromethylphenylsulfonyloxy)bicyclo[2.2.1]hept-5-ene-2,3-dicarboxyimide, N-(2-trifluoromethylphenylsulfonyloxy)-7-oxabicyclo[2.2.1]hept-5-ene-2,3-dicarboxyimide, N-(4-fluorophenylsulfonyloxy)bicyclo[2.2.1]hept-5-ene-2,3-dicarboxyimide, N-(4-fluorophenylsulfonyloxy)-7-oxabicyclo[2.2.1]hept-5-ene-2,3-dicarboxyimide, N-(trifluoromethylsulfonyloxy)bicyclo[2.2.1]heptane-5,6-oxy-2,3-dicarboxyimide, N-(10-camphorsulfonyloxy)bicyclo[2.2.1]heptane-5,6-oxy-2,3-di carboxyimide, N-(4-tolylsulfonyloxy)bicyclo[2.2.1]heptane-5,6-oxy-2,3-dicarboxyimide, N-(2-trifluoromethylphenylsulfonyloxy)bicyclo[2.2.1]heptane-5,6-oxy-2,3-dicarboxyimide, N-(4-fluorophenylsulfonyloxy)bicyclo[2.2.1]heptane-5,6-oxy-2,3-dicarboxyimide, N-(trifluoromethylsulfonyloxy)naphthyldicarboxyimide, N-(10-camphorsulfonyloxy)naphthyldicarboxyimide, N-(4-tolylsulfonyloxy)naphthyldicarboxyimide, N-(2-trifluoromethylphenylsulfonyloxy)naphthyldicarboxyimide, N-(4-fluorophenylsulfonyloxy)naphthyldicarboxyimide, N-(pentafluoroethylsulfonyloxy)naphthyldicarboxyimide, N-(heptafluoropropylsulfonyloxy) naphthyldicarboxyimide, N-(nonafluorobutylsulfonyloxy) naphthyldicarboxyimide, N-(ethylsulfonyloxy) naphthyldicarboxyimide, N-(propylsulfonyloxy) naphthyldicarboxyimide, N-(butylsulfonyloxy) naphthyldicarboxyimide, N-(pentylsulfonyloxy) naphthyldicarboxyimide, N-(hexylsulfonyloxy) naphthyldicarboxyimide, N-(heptylsulfonyloxy) naphthyldicarboxyimide, N-(octylsulfonyloxy) naphthyldicarboxyimide, or N-(nonylsulfonyloxy) naphthyldicarboxyimide.

Among these, the nonionic compound is more preferable than the ionic compound from the viewpoint of solubility and insulation performance of the cured film. From the viewpoint of the strength of the acid, those capable of generating benzenesulfonic acid, 4-toluenesulfonic acid, perfluoroalkylsulfonic acid, or phosphoric acid are more preferable. From the viewpoint of high sensitivity due to high quantum yield to j-line (wavelength of 313 nm), i-line (wavelength of 365 nm), h-line (wavelength of 405 nm), or g-line (wavelength of 436 nm) and transparency of the cured film, a sulfonic acid ester compound, a sulfonimide compound, an iminosulfonic acid ester compound are still more preferable.

<Negative Photosensitivity; (E2) Photobase Generator>

When the photosensitive resin composition of the present invention includes (E2) a photobase generator, UV curing during exposure is accelerated, thus enabling an improvement in sensitivity. Also, crosslink density after thermal curing of the composition is improved, thus enabling an improvement in hardness of the cured film.

The photobase generator (E2) includes those which generate an organic base under exposure, and those which generate an inorganic base under exposure. From the viewpoint of generation efficiency of a base under exposure and solubility, a photobase generator (E2) capable of generating amines is more preferable. Examples of the type of amines to be generated under exposure include aliphatic amines or aromatic amines.

Examples of amines to be generated under exposure include ammonia, methylamine, ethylamine, n-propylamine, isopropylamine, n-butylamine, t-butylamine, n-hexylamine, n-octylamine, n-decylamine, n-cetylamine, cyclopentylamine, cyclohexylamine, dimethylamine, diethylamine, di-n-propylamine, diisopropylamine, dicyclohexylamine, trimethylamine, triethylamine, dicyclohexylmethylamine, tetramethylenediamine, hexamethylenediamine, benzylamine, aniline, 1-naphthylamine, 2-naphthylamine, dibenzylamine, diphenylamine, 1,2-phenylenediamine, 1,3-phenylenediamine, 1,4-phenylenediamine, 2,4-tolylenediamine, 2,6-tolylenediamine, 4,4'-diaminodiphenylmethane, hydrazine, hexamethylenetetramine, 1,4-diazabicyclo[2.2.2]octane, 1,5-diazabicyclo[4.3.0]-5-nonene, 1,8-diazabicyclo[5.4.0]-7-undecene, piperidine, piperazine, morpholine, imidazole, or pyrazole.

Examples of the photobase generator (E2) capable of generating amines under exposure include an ortho-nitrobenzyl carbamate compound, an α,α-dimethyl-3,5-dimethoxybenzyl carbamate compound, or an acyloxyimino compound.

Examples of the ortho-nitrobenzyl carbamate compound include N-(2-nitrobenzyloxy)carbonyl-N-methylamine, N-(2-nitrobenzyloxy)carbonyl-N-n-propylamine, N-(2-nitrobenzyloxy)carbonyl-N-n-hexylamine, N-(2-nitrobenzyloxy)carbonyl-N-cyclohexylamine, N-(2-nitrobenzyloxy)carbonylaniline, N-(2-nitrobenzyloxy)carbonylpiperidine, N,N'-bis[(2-nitrobenzyloxy)carbonyl]-1,6-hexamethylenediamine, N,N'-bis[(2-nitrobenzyloxy)carbonyl]-1,4-phenylenediamine, N,N'-bis[(2-nitrobenzyloxy)carbonyl]-2,4-tolylenediamine, N,N'-bis[(2-nitrobenzyloxy)carbonyl]-4,4'-diaminodiphenylmethane, N,N'-bis[(2-nitrobenzyloxy)carbonyl]piperazine, N-(2,6-dinitrobenzyloxy)carbonyl-N-methylamine, N-(2,6-dinitrobenzyloxy)carbonyl-N-n-propylamine, N-(2,6-dinitrobenzyloxy)carbonyl-N-n-hexylamine, N-(2,6-dinitrobenzyloxy)carbonyl-N-cyclohexylamine, N-(2,6-dinitrobenzyloxy)carbonylaniline, N-(2,6-dinitrobenzyloxy)carbonylpiperidine, N,N'-bis[(2,6-dinitrobenzyloxy)carbonyl]-1,6-hexamethylenediamine, N,N'-bis[(2,6-dinitrobenzyloxy)carbonyl]-1,4-phenylenediamine N,N'-bis[(2,6-dinitrobenzyloxy)carbonyl]-2,4-tolylenediamine, N,N'-bis[(2,6-dinitrobenzyloxy)carbonyl]-4,4-diaminodiphenylm ethane, or N,N'-bis[(2,6-dinitrobenzyloxy)carbonyl]piperazine Examples of the α,α-dimethyl-3,5-dimethoxybenzyl carbamate compound include N-(α,α-dimethyl-3,5-dimethoxybenzyloxy)carbonyl-N-methylamine, N-(α,α-dimethyl-3,5-dimethoxybenzyloxy)carbonyl-N-n-propylamine, N-(α,α-dimethyl-3,5-dimethoxybenzyloxy)carbonyl-N-n-hexylamine, N-(α,α-dimethyl-3,5-dimethoxybenzyloxy)carbonyl-N-cyclohexylamine, N-(α,α-dimethyl-3,5-dimethoxybenzyloxy)carbonylaniline, N-(α,α-dimethyl-3,5-dimethoxybenzyloxy)carbonylpiperidine, N,N'-bis[(α,α-dimethyl-3,5-dimethoxybenzyloxy)carbonyl]-1,6-hexamethylenediamine, N,N'-bis[(α,α-dimethyl-3,5-dimethoxybenzyloxy)carbonyl]-1,4-phenylenediamine, N,N'-bis[(α,α-dimethyl-3,5-dimethoxybenzyloxy)carbonyl]-2,4-tolylenediamine, N,N'-bis[(α,α-dimethyl-3,5-dimethoxybenzyloxy)carbonyl]-4,4'-diaminodiphenylmethane, or N,N'-bis[(α,α-dimethyl-3,5-dimethoxybenzyloxy)carbonyl]piperazine.

Examples of the acyloxyimino compound include acetophenone-O-propanoyl oxime, benzophenone-O-propanoyl oxime, acetone-O-propanoyl oxime, acetophenone-O-butanoyl oxime, benzophenone-O-butanoyl oxime, acetone-O-butanoyl oxime, bis(acetophenone)-O,O'-hexane-1,6-dioyl oxime, bis(benzophenone)-O,O'-hexane-1,6-dioyl oxime, bis(acetone)-O,O'-hexane-1,6-dioyl oxime, acetophenone-O-acryloyl oxime, benzophenone-O-acryloyl oxime, or acetone-O-acryloyl oxime.

Among these, N-(2-nitrobenzyloxy)carbonyl-N-cyclohexylamine, N,N'-bis[(2-nitrobenzyloxy)carbonyl]-1,6-hexamethylenediamine, or N,N'-bis[(α,α-dimethyl-3,5-dimethoxybenzyloxy)carbonyl]-1,6-hexamethylenediamine is preferable.

When the photosensitive resin composition of the present invention has negative photosensitivity, the content of the photoacid generator (E1) and/or the photobase generator (E2) in the photosensitive resin composition is preferably 0.01 to 15 parts by weight, and more preferably 0.1 to 10 parts by weight, when the total amount of the polysiloxane (A) and the below-mentioned radical polymerizable compound is set at 100 parts by weight. When the content of the photoacid generator (E1) and/or the photobase generator (E2) is within the above range, it is possible to improve sensitivity during exposure and hardness of the cured film. When the polysiloxane (A) is an inorganic particle-containing polysiloxane (A1), the amount is set at 100 parts by weight including the weight of inorganic particles (B) constituting the inorganic particle-containing polysiloxane (A1).

<Positive Photosensitivity; (E1) Photoacid Generator and (E2) Photobase Generator>

Meanwhile, even when the photosensitive resin composition of the present invention has positive photosensitivity, it is preferred that the photosensitive resin composition further includes (E1) a photoacid generator and/or (E2) a photobase generator. Inclusion of the photoacid generator (E1) and/or the photobase generator (E2) leads to satisfactory pattern shape after thermal curing, thus obtaining a pattern having a shape similar to the rectangular shape. This is because a large amount of an acid and/or a base is/are generated from the compound during breaching exposure after patterning by the development, so that a pattern shape after thermal curing becomes satisfactory by acceleration of dehydration condensation of a residual silanol in the polysiloxane (A) during thermal curing, thus obtaining a pattern having a shape similar to the rectangular shape.

The photoacid generator (E1) and the photobase generator (E2) are preferably those which do not inhibit a function of a compound having a naphthoquinone diazide structure (C), which is capable of imparting positive photosensitivity to the photosensitive resin composition of the present invention. Selection of appropriate photoacid generator (E1) and photobase generator (E2) and control of the content make a pattern shape after thermal curing satisfactory without causing deterioration of patternability with an alkali developing solution.

When the photosensitive resin composition of the present invention has positive photosensitivity, the content of the photoacid generator (E1) and/or the photobase generator (E2) in the photosensitive resin composition is preferably 0.01 to 15 parts by weight, and more preferably 0.1 to 10 parts by weight, when the amount of the polysiloxane (A) is set at 100 parts by weight. When the content of the photoacid generator (E1) and/or the photobase generator (E2) is within the above range, a pattern shape after thermal curing becomes satisfactory without causing deterioration of patternability with an alkali developing solution. When the polysiloxane (A) is an inorganic particle-containing polysiloxane (A1), the amount is set at 100 parts by weight, including the weight of inorganic particles (B) constituting the inorganic particle-containing polysiloxane (A1).

<Thermal Acid Generator (E3) and Thermal Base Generator (E4)>

It is preferred that the photosensitive resin composition of the present invention further includes (E3) a thermal acid generator and/or (E4) a thermal base generator (E4). The thermal acid generator (E3) is a compound which causes bond cleavage under heat to generate an acid. The thermal base generator (E4) is a compound which causes bond cleavage under heat to generate a base.

Inclusion of the thermal acid generator (E3) and/or the thermal base generator (E4) enables an improvement in cracking resistance of a cured film obtained from the photosensitive resin composition of the present invention during thermal curing and ion implantation. This reason is estimated that crosslinking sufficiently proceeds before raising to high temperature by an acid and/or a base generated from the compound during thermal curing, so that quick crosslinking of siloxane does not proceed during temperature rise, leading to suppression of the generation of shrinkage stress and an improvement in cracking resistance.

The thermal acid generator (E3) and the thermal base generator (E4) are preferably those in which an acid or a base is not generated or a small amount of an acid or a base is generated by heat during prebaking after coating the photosensitive resin composition of the present invention. For example, when the prebaking temperature is 100° C., a compound capable of generating an acid or a base at a temperature higher than 100° C. When using a compound capable of generating an acid or a base at a temperature higher than a prebaking temperature of the thermal acid generator (E3) and the thermal base generator (E4), dehydration condensation of a residual silanol in a polysiloxane (A) is not accelerated during prebaking, thus suppressing deterioration of sensitivity during exposure and formation of residues after the development.

Examples of the thermal acid generator (E3) include "San-Aid" (registered trademark) SI-60, "San-Aid" (registered trademark) SI-80", "San-Aid" (registered trademark) SI-100, "San-Aid" (registered trademark) SI-200, "San-Aid" (registered trademark) SI-110, "San-Aid" (registered trademark) SI-145, "San-Aid" (registered trademark) SI-150", "San-Aid" (registered trademark) SI-60L, "San-Aid" (registered trademark) SI-80L, "San-Aid" (registered trademark) SI-100L, "San-Aid" (registered trademark) SI-110L, "San-Aid" (registered trademark) SI-145L, "San-Aid" (registered trademark) SI-150L, "San-Aid" (registered trademark) SI-160L, or "San-Aid" (registered trademark) SI-180L (all of which are manufactured by SANSHIN CHEMICAL INDUSTRY CO., LTD.); 4-hydroxyphenyldimethylsulfonium trifluoromethanesulfonate, benzyl-4-hydroxyphenylmethylsulfonium trifluoromethanesulfonate, 2-methylbenzyl-4-hydroxyphenylmethylsulfonium trifluoromethanesulfonate, 4-acetoxyphenyldimethylsulfonium trifluoromethanesulfonate, 4-acetoxyphenylbenzylmethylsulfonium trifluoromethanesulfonate, 4-(methoxycarbonyloxy)phenyldimethylsulfonium trifluoromethanesulfonate, or benzyl-4-(methoxycarbonyloxy)phenylmethylsulfonium trifluoromethanesulfonate.

Examples of the thermal base generator (E4) include "U-CAT" (registered trademark) SAI, "U-CAT" (registered trademark) SA102, "U-CAT" (registered trademark) SA102-50, "U-CAT" (registered trademark) SA106, "U-CAT" (registered trademark) SA112, "U-CAT" (registered trademark) SA506, "U-CAT" (registered trademark) SA603, "U-CAT" (registered trademark) 1000, "U-CAT" (registered trademark) 1102, "U-CAT" (registered trademark) 2000, "U-CAT" (registered trademark) 2024, "U-CAT" (registered trademark) 2026, "U-CAT" (registered trademark) 2030, "U-CAT" (registered trademark) 2110, "U-CAT" (registered trademark) 2313, "U-CAT" (registered trademark) 651M, "U-CAT" (registered trademark) 660M, "U-CAT" (registered trademark) 18X, (registered trademark) 201G, "U-CAT" (registered trademark) 202, "U-CAT" (registered trademark) 420A, "U-CAT" (registered trademark) 130, "POLYCAT" (registered trademark) 8, "POLYCAT" (registered trademark) 9, "POLYCAT" (registered trademark) 12, "POLYCAT" (registered trademark) 41, or TMED (all of which are manufactured by San-Apro Ltd.)

The content of the thermal acid generator (E3) and/or the thermal base generator (E4) in the photosensitive resin composition of the present invention is preferably 0.01 to 10 parts by weight, and more preferably 0.1 to 5 parts by weight, when the amount of the polysiloxane (A) is set at 100 parts by weight. When the content of the thermal acid generator (E3) and/or the thermal base generator (E4) is within the above range, it is possible to improve cracking resistance of a cured film obtained from the photosensitive resin composition of the present invention during thermal curing and ion implantation. When the polysiloxane (A) is an inorganic particle-containing polysiloxane (A1), the amount is set at 100 parts by weight, including the weight of inorganic particles (B) constituting the inorganic particle-containing polysiloxane (A1).

<(F) Dissolution Accelerating Crosslinking Agent>

It is preferred that the photosensitive resin composition of the present invention further includes (F) a dissolution accelerating crosslinking agent. The dissolution accelerating crosslinking agent (F) is a compound having a hydrophilic group or an alkali-soluble group and a crosslinkable group. The dissolution accelerating crosslinking agent (F) is a compound which has a site capable of reacting with a silanol group in a polysiloxane (A) or an aromatic ring in a naphthoquinone diazide compound during thermal curing. When the polysiloxane (A) has an aromatic group, particularly a naphthyl group, compatibility with the polysiloxane (A) is improved by the aromatic group possessed by the compound, thus making it possible to enhance the effect of improving resolution, improving cracking resistance, and suppressing change in pattern dimensional width.

Inclusion of the dissolution accelerating crosslinking agent (F) enables an improvement in solubility in an alkali developing solution, and also introduction of a crosslinking structure into the cured film thus obtained. Therefore, formation of residues after the development is suppressed, thus enabling an improvement in resolution after the development. This reason is estimated that solubility of the polysiloxane (A) in an alkali developing solution is improved by a hydrophilic group or an alkali-soluble group possessed by the compound which is compatible with the polysiloxane (A) during the development. It is also possible to improve cracking resistance of the cured film during thermal curing and ion implantation. This reason is estimated that the crosslinking structure introduced by the compound is formed between siloxane crosslinking chains in the polysiloxane (A), so that internal stress caused by a siloxane crosslinking structure was reduced by the crosslinking structure. It is also possible to reduce a change in pattern dimensional width to an exposure dose during exposure and development. This reason is estimated that light scattering during exposure and reflected light from the substrate as a base are absorbed by the aromatic group possessed by the compound.

The dissolution accelerating crosslinking agent (F) is preferably one or more compounds selected from the group consisting of a compound represented by the general formula (14), a compound represented by the general formula (15), and a compound represented by the general formula (16).

[Chemical Formula 18]

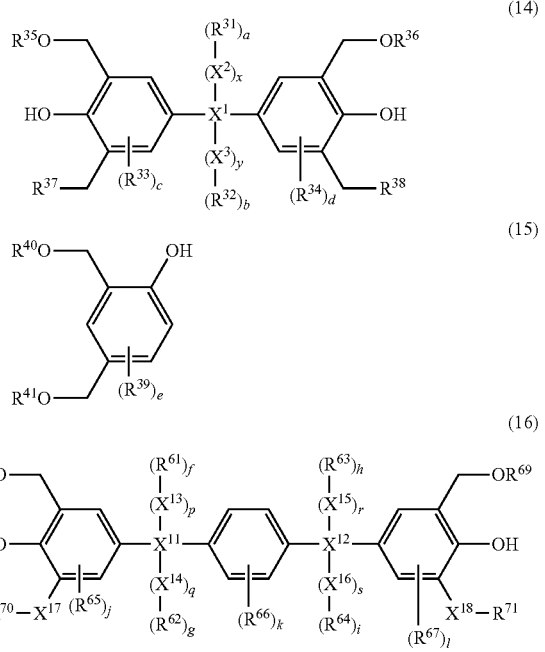

In the general formula (14), $R^{35}$ and $R^{36}$ each independently represents hydrogen or an alkyl group having 1 to 6 carbon atoms, and $R^{37}$ and $R^{38}$ each independently represents hydrogen, an alkyl group having 1 to 6 carbon atoms, an alkoxy group having 1 to 6 carbon atoms, or a hydroxy group. $X^1$ represents a direct bond or an alkylene chain having 1 to 6 carbon atoms. When $X^1$ is a direct bond, a, b, x, and y are 0. When $X^1$ is not a direct bond, $X^2$ and $X^3$ each independently represents a direct bond or an alkylene chain having 1 to 6 carbon atoms, $R^{31}$ and $R^{32}$ each independently represents hydrogen, an alkyl halide group having 1 to 6 carbon atoms, or a halogen atom, $R^{33}$ and $R^{34}$ each independently represents an alkyl group having 1 to 10 carbon atoms, a cycloalkyl group having 4 to 10 carbon atoms, or an aryl group having 6 to 15 carbon atoms. c and d represent an integer of 0 to 2. When $X^1$ is not a direct bond, x and y represent 1, and a and b represent an integer of 1 to 6.

In the general formula (15), $R^{39}$ represents an alkyl group having 1 to 10 carbon atoms, a cycloalkyl group having 4 to 10 carbon atoms, or an aryl group having 6 to 15 carbon atoms, and $R^{40}$ and $R^{41}$ each independently represents hydrogen or an alkyl group having 1 to 6 carbon atoms. e represents an integer of 0 to 3.

In the general formula (16), $X^{17}$ and $X^{18}$ each independently represents a direct bond or an alkylene chain having 1 to 6 carbon atoms, $R^{65}$ to $R^{67}$ each independently represents an alkyl group having 1 to 10 carbon atoms, a cycloalkyl group having 4 to 10 carbon atoms, or an aryl group having 6 to 15 carbon atoms, $R^{68}$ and $R^{69}$ each independently represents hydrogen or an alkyl group having 1 to 6 carbon atoms, $R^{70}$ and $R^{71}$ each independently represents hydrogen, an alkyl group having 1 to 6 carbon atoms, an alkoxy group having 1 to 6 carbon atoms, or a hydroxy group. $X^{11}$ and $X^{12}$ each independently represents a direct bond or an alkylene chain having 1 to 6 carbon atoms. When $X^{11}$ is a direct bond, f, g, p, and q are 0. When $X^{12}$ is a direct bond, h, i, r, and s are 0. When $X^{11}$ or $X^{12}$ is not a direct bond, $X^{13}$, $X^{14}$, $X^{15}$, and $X^{16}$ each independently represents a direct bond or an alkylene chain having 1 to 6 carbon atoms, and $R^{61}$ to $R^{64}$ each independently represents hydrogen, an alkyl halide group having 1 to 6 carbon atoms, or a halogen atom. j, k, and l represents an integer of 0 to 2. When $X^{11}$ and $X^{12}$ are not direct bonds, p, q, r, and s are 1, and f, g, h, and i represents an integer of 1 to 6.

In the general formula (14), $X^1$ is preferably a direct bond or an alkylene chain having 1 to 4 carbon atoms. When $X^1$ is not a direct bond, $X^2$ and $X^3$ each independently is preferably a direct bond or an alkylene chain having 1 to 4 carbon atoms. $R^{31}$ and $R^{32}$ each independently is preferably hydrogen, an alkyl halide group having 1 to 4 carbon atoms, or a halogen atom. $R^{33}$ and $R^{34}$ each independently is preferably an alkyl group having 1 to 6 carbon atoms, a cycloalkyl group having 4 to 7 carbon atoms, or an aryl group having 6 to 10 carbon atoms. $R^{35}$ and $R^{36}$ each independently is preferably hydrogen or an alkyl group having 1 to 4 carbon atoms. $R^{37}$ and $R^{38}$ each independently is preferably hydrogen, an alkyl group having 1 to 4 carbon atoms, an alkoxy group having 1 to 4 carbon atoms, or a hydroxy group.

In the general formula (15), $R^{39}$ is preferably an alkyl group having 1 to 6 carbon atoms, a cycloalkyl group having 4 to 7 carbon atoms, or an aryl group having 6 to 10 carbon atoms. $R^{40}$ and $R^{41}$ each independently is preferably hydrogen or an alkyl group having 1 to 4 carbon atoms.

In the general formula (16), $X^{11}$ and $X^{12}$ each independently is preferably a direct bond, or an alkylene chain having 1 to 4 carbon atoms. When $X^{11}$ or $X^{12}$ is not a direct bond, $X^{13}$, $X^{14}$, $X^{15}$, $X^{16}$, $X^{17}$, and $X^{18}$ each independently represents a direct bond or an alkylene chain having 1 to 4 carbon atoms. $R^{61}$ to $R^{64}$ each independently is preferably hydrogen, an alkyl halide group having 1 to 4 carbon atoms, or a halogen atom. $R^{65}$ to $R^{67}$ each independently is preferably an alkyl group having 1 to 6 carbon atoms, a cycloalkyl group having 4 to 7 carbon atoms, or an aryl group having 6 to 10 carbon atoms. $R^{68}$ and $R^{69}$ each independently is preferably hydrogen or an alkyl group having 1 to 4 carbon atoms. $R^{70}$ and $R^{71}$ each independently is preferably hydrogen, an alkyl group having 1 to 4 carbon atoms, an alkoxy group having 1 to 4 carbon atoms, or a hydroxy group.

Examples of the dissolution accelerating crosslinking agent (F) include bis(4-hydroxy-3-hydroxymethyl-5-methylphenyl)methane, bis(4-hydroxy-3-methoxymethyl-5-methylphenyl)methane, 2,2-bis(4-hydroxy-3-hydroxymethyl-5-methylphenyl)propane, 2,2-bis(4-hydroxy-3-methoxymethyl-5-methylphenyl)propane, 2,2-bis(4-hydroxy-3-hydroxymethyl-5-methylphenyl)hexafluoropropane, 2,2-bis(4-hydroxy-3-methoxymethyl-5-methylphenyl)hexafluoropropane, bis[4-hydroxy-3,5-bis(hydroxymethyl)phenyl]methane, bis[4-hydroxy-3,5-bis(methoxymethyl)phenyl]methane, 2,2-bis[4-hydroxy-3,5-bis(hydroxymethyl)phenyl]propane, 2,2-bis[4-hydroxy-3,5-bis(methoxymethyl)phenyl]propane, 2,2-bis[4-hydroxy-3,5-bis(ethoxymethyl)phenyl]propane, 2,2-bis[4-hydroxy-3,5-bis(hydroxymethyl)phenyl]hexafluoropropane, 2,2-bis[4-hydroxy-3,5-bis(methoxymethyl)phenyl]hexafluoropropane, 2,2-bis[4-hydroxy-3,5-bis(ethoxymethyl)phenyl]hexafluoropropane, 3,3',5,5'-tetrakis (hydroxymethyl)-4,4'-biphenol, 3,3',5,5'-tetrakis (methoxymethyl)-4,4'-biphenol2,4-bis(hydroxymethyl)-6-methylphenol, 2,4-bis(methoxymethyl)-6-methylphenol, 2,4-bis(hydroxymethyl)-6-ethylphenol, 2,4-bis(methoxymethyl)-6-ethylphenol, 2,4-bis(hydroxymethyl)-6-isopropylphenol, 2,4-bis(methoxymethyl)-6-isopropylphenol, 2,4-bis(hydroxymethyl)-6-cyclohexylphenol, 2,4-bis(methoxy)methyl-6-cyclohexylphenol, 2-(4-hydroxy-3-hydroxymethyl-5-methyl)phenyl-2-[4-(4-hydroxy-3-hydroxymethyl-5-methyl)phenyl]propane, 2-(4-hydroxy-3-methoxymethyl-5-methyl)phenyl-2-[4-(4-hydroxy-3-methoxymethyl-5-methyl)phenyl]propane, 2-[4-hydroxy-3,5-bis(hydroxymethyl)phenyl]-2-[4-[4-hydroxy-3, 5-bis(hydroxymethyl)]phenyl]propane, or 2-[4-hydroxy-3,5-bis(methoxymethyl)phenyl]-2-[4-[4-hydroxy-3, 5-bis(methoxymethyl)]phenyl]propane.

The content of the dissolution accelerating crosslinking agent (F) in the photosensitive resin composition of the present invention is preferably 0.01 to 15 parts by weight, more preferably 0.1 to 10 parts by weight, still more preferably 0.3 to 5 parts by weight, and particularly preferably 0.5 to 3 parts by weight, when the amount of the polysiloxane (A) is set at 100 parts by weight.

When the content of the dissolution accelerating crosslinking agent (F) is within the above range, it is possible to suppress formation of residues after the development and to improve resolution after the development, and to improve cracking resistance of the cured film during thermal curing and ion implantation. It is also possible to reduce a change in pattern dimensional width to an exposure dose during exposure and development. When the polysiloxane (A) is an inorganic particle-containing polysiloxane (A1), the amount is set at 100 parts by weight, including the weight of inorganic particles (B) constituting the inorganic particle-containing polysiloxane (A1).

When the polysiloxane (A) includes the dissolution accelerating crosslinking agent (F), it is possible to improve resolution after the development and to improve cracking resistance during thermal curing or ion implantation. Therefore, it is preferred in view of applying a photosensitive resin composition including a polysiloxane (A) to the below-mentioned step (1-1a) of heating a pattern of the composition to 500 to 1,500° C. In addition, it is preferred in view of applying the composition to the below-mentioned step (3-A) of treating a pattern of the composition at from 0° C. to lower than 300° C. The steps (1-1a) and (3-A) enable shortening of the step required to remove a pattern of the composition, leading to shortening of the process time.

<(G) Dissolution Accelerator>

It is preferred that the photosensitive resin composition of the present invention further includes (G) a dissolution accelerator. The dissolution accelerator (G) is a compound having a hydrophilic group or an alkali-soluble group.

Inclusion of the dissolution accelerator (G) leads to an improvement in solubility in an alkali developing solution, thus enabling suppression of formation of residues after the development and an improvement in resolution after the development. This reason is estimated that solubility of the polysiloxane (A) in an alkali developing solution is improved by a hydrophilic group or an alkali-soluble group possessed by the compound which is compatible with the polysiloxane (A) during the development.

The dissolution accelerator (G) is preferably (G1) a compound represented by the general formula (17) or a compound represented by the general formula (18), and/or, (G2) an acrylic resin including a structural unit represented by the general formula (19).

[Chemical Formula 19]

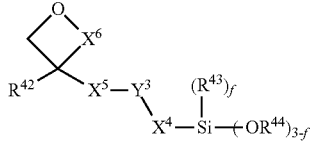  (17)

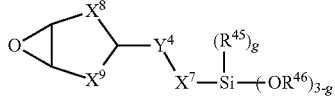  (18)

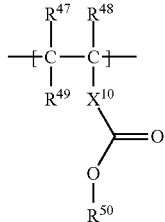  (19)

In the general formula (17), $X^4$ and $X^5$ each independently represents a direct bond, an alkylene chain having 1 to 10 carbon atoms, a cycloalkylene chain having 4 to 10 carbon atoms, or an arylene chain having 6 to 15 carbon atoms, $X^6$ represents a direct bond or a methylene chain, $Y^3$ represents a direct bond or an oxygen atom, $R^{42}$ represents hydrogen, an alkyl group having 1 to 6 carbon atoms, a cycloalkyl group having 4 to 7 carbon atoms, or an aryl group having 6 to 10 carbon atoms, and $R^{43}$ and $R^{44}$ each independently represents hydrogen, an alkyl group having 1 to 6 carbon atoms, an acyl group having 2 to 6 carbon atoms, or an aryl group having 6 to 15 carbon atoms. f represents an integer of 0 to 2.

In the general formula (18), $X^7$ represents a direct bond, an alkylene chain having 1 to 10 carbon atoms, a cycloalkylene chain having 4 to 10 carbon atoms, or an arylene chain having 6 to 15 carbon atoms, $X^8$ and $X^9$ each independently represents an alkylene chain having 1 to 6 carbon atoms, $Y^4$ represents a direct bond or an oxygen atom, and $R^{45}$ and $R^{46}$ each independently represents hydrogen, an alkyl group having 1 to 6 carbon atoms, an acyl group having 2 to 6 carbon atoms, or an aryl group having 6 to 15 carbon atoms. g represents an integer of 0 to 2.

In the general formula (19), $R^{47}$ and $R^{48}$ represent hydrogen or an alkyl group having 1 to 4 carbon atoms, $R^{49}$ and $R^{50}$ represent an alkyl group having 1 to 6 carbon atoms, a cycloalkyl group having 4 to 7 carbon atoms, or an aryl group having 6 to 10 carbon atoms, each having a structural unit represented by the general formula (20), and $X^{10}$ represents a direct bond, an alkylene chain having 1 to 6 carbon atoms, a cycloalkylene chain having 4 to 7 carbon atoms, or an arylene chain having 6 to 10 carbon atoms.

In the general formula (17), $X^4$ and $X^5$ each independently is preferably a direct bond, an alkylene chain having 1 to 6 carbon atoms, a cycloalkylene chain having 4 to 7 carbon atoms, or an arylene chain having 6 to 10 carbon atoms. $R^{43}$ and $R^{44}$ each independently represents hydrogen, an alkyl group having 1 to 4 carbon atoms, an acyl group having 2 to 4 carbon atoms, or an aryl group having 6 to 10 carbon atoms. f is preferably 0.

In the general formula (18), $X^7$ is preferably a direct bond, an alkylene chain having 1 to 6 carbon atoms, a cycloalkylene chain having 4 to 7 carbon atoms, or an arylene chain having 6 to 10 carbon atoms. $X^8$ and $X^9$ each independently is preferably an alkylene chain having 1 to 4 carbon atoms. $R^{45}$ and $R^{46}$ each independently is preferably hydrogen, an alkyl group having 1 to 4 carbon atoms, an acyl group having 2 to 4 carbon atoms, or an aryl group having 6 to 10 carbon atoms. g is preferably 0.

In the general formula (19), $R^{47}$ and $R^{48}$ are preferably hydrogens, methyl groups, or ethyl groups. $R^{49}$ and $R^{50}$ are preferably alkyl groups having 1 to 4 carbon atoms or cycloalkyl groups having 4 to 6 carbon atoms, each having a structural unit represented by the general formula (20). $X^{10}$ is preferably a direct bond, an alkylene chain having 1 to 4 carbon atoms, or a cycloalkylene chain having 4 to 6 carbon atoms.

[Chemical Formula 20]

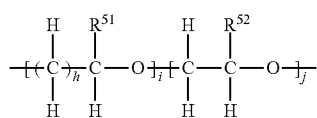

(20)

In the general formula (20), $R^{51}$ represents hydrogen, an alkyl group having 1 to 4 carbon atoms, or an alkyl group having 1 to 4 carbon atoms which has a hydroxy group, and $R^{52}$ represents hydrogen or an alkyl group having 1 to 4 carbon atoms which has a hydroxy group. h represents an integer of 1 to 4, i represents an integer of 0 to 30, and j represents an integer of 1 to 100.

In the general formula (20), $R^{51}$ is preferably hydrogen, a methyl group, an ethyl group, or a methyl group or an ethyl group, each having a hydroxy group. $R^{52}$ is preferably hydrogen, a methyl group, an ethyl group, or a methyl group or an ethyl group, each having a hydroxy group. g is preferably 1 or 2. h is preferably an integer of 0 to 10, and more preferably an integer of 0 to 5. i is preferably an integer of 2 to 60, and more preferably an integer of 3 to 30.

Inclusion of the compound represented by the general formula (17) or the compound represented by the general formula (18) (G1) enables suppression of formation of residues after the development and an improvement in resolution after the development, and an improvement in adhesion with the substrate as a base during alkali development. This reason is estimated that the compound reacts with a silanol group in the polysiloxane (A) by a ring-opening reaction, and thus a hydrophilic hydroxy group is separated and an alkoxysilyl group in the compound enhances an interaction with the substrate as a base.

Examples of the compound represented by the general formula (17) or the compound represented by the general formula (18) (G1) include a trifunctional silane such as 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, 3-[(3-ethyl-3-oxetanyl)methoxy]propyltrimethoxysilane, or 3-[(3-ethyl-3-oxetanyl)methoxy]propyltriethoxysilane; a difunctional silane such as 3-glycidoxypropylmethyldimethoxysilane, 2-(3,4-epoxycyclohexyl)ethylmethyldimethoxysilane, or 3-[(3-ethyl-3-oxetanyl)methoxy]propylmethyldimethoxysilane; or a monofunctional silane such as 3-glycidoxypropyldimethylmethoxysilane, 2-(3,4-epoxycyclohexyl)ethyldimethylmethoxysilane, or 3-[(3-ethyl-3-oxetanyl)methoxy]propyldimethylmethoxysilane. From the viewpoint of an improvement in resolution after the development and an improvement in adhesion with the substrate as a base, the compound is preferably 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, 3-[(3-ethyl-3-oxetanyl)methoxy]propyltrimethoxysilane, or 3-[(3-ethyl-3-oxetanyl)methoxy]propyltriethoxysilane. From the viewpoint of an improvement in adhesion with the substrate as a base, the compound is preferably 3-[(3-ethyl-3-oxetanyl)methoxy]propyltrimethoxysilane or 3-[(3-ethyl-3-oxetanyl)methoxy]propyltriethoxysilane.

The content of the compound represented by the general formula (17) or the compound represented by the general formula (18) (G1) in the photosensitive resin composition of the present invention is preferably 0.01 to 15 parts by weight, more preferably 0.1 to 10 parts by weight, and still more preferably 0.3 to 5 parts by weight, when the amount of the polysiloxane (A) is set at 100 parts by weight. When the content of the compound represented by the general formula (17) or the compound represented by the general formula (18) (G1) is within the above range, it is possible to suppress formation of residues after the development and to improve resolution after the development, and to improve adhesion with the substrate as a base during alkali development. When the polysiloxane (A) is an inorganic particle-containing polysiloxane (A1), the amount is set at 100 parts by weight, including the weight of inorganic particles (B) constituting the inorganic particle-containing polysiloxane (A1).

The acrylic resin including a structural unit represented by the general formula (19) (G2) is preferably a resin obtained by radical polymerization of a copolymerization component including a structural unit represented by the general formula (20), a copolymerization component of a (meth)acrylic compound having a carboxy group or a carboxylic anhydride group, a copolymerization component derived from a (meth)acrylic acid ester, or other copolymerization components; or a resin obtained by further reacting the resin obtained by the above method with a compound including a structural unit represented by the general formula (20).

Also, the acrylic resin is preferably a resin obtained by further reacting a resin, which is obtained by radical copolymerization of a copolymerization component of a (meth)acrylic compound having a carboxy group or a carboxylic anhydride group, a copolymerization component derived from a (meth)acrylic acid ester, or other copolymerization components, with a compound including a structural unit represented by the general formula (20) and an epoxy group by ring-opening addition reaction; or a resin obtained by esterifying a resin, which is obtained by radical copolymerization of a copolymerization component of a (meth)acrylic compound having a carboxy group or a carboxylic anhydride group, a copolymerization component derived from a (meth)acrylic acid ester, or other copolymerization components, with a compound including a structural unit represented by the general formula (20) and a hydroxy group.

The content ratio of the copolymerization component including a structural unit represented by the general formula (19) in the structural unit derived from whole copolymerization components in the acrylic resin including a structural unit represented by the general formula (19) (G2) is preferably 30 mol % or more, more preferably 40 mol % or more, and still more preferably 50 mol % or more. When the content ratio is within the above range, it is possible to improve heat resistance of the cured film. Meanwhile, the content ratio is preferably 80 mol % or less, more preferably 75 mol % or less, and still more preferably 70 mol % or less.

When the content ratio is within the above range, it is possible to suppress film reduction during alkali development.

Examples of the structural unit represented by the general formula (20) include an ethylene glycol structural unit, a 1-hydroxymethylethylene glycol structural unit, a 1-hydroxyethylethylene glycol structural unit, a propylene glycol-ethylene glycol structural unit, a butylene glycol-ethylene glycol structural unit, a polyethylene glycol structural unit, a propylene glycol-polyethylene glycol structural unit, or a polypropylene glycol-polyethylene glycol structural unit.

Examples of the copolymerization component or compound including a structural unit represented by the general formula (20), the compound including a structural unit represented by the general formula (20) and an epoxy group, or the compound including a structural unit represented by the general formula (20) and a hydroxy group include 2-hydroxyethyl (meth)acrylate, 2-methoxyethyl (meth)acrylate, 2-(2-hydroxy)ethoxyethyl (meth)acrylate, 2-(2-methoxy)ethoxyethyl (meth)acrylate, 2-[2-(2-hydroxy)ethoxy]ethoxyethyl (meth)acrylate, 2-[2-(2-methoxy)ethoxy]ethoxyethyl (meth)acrylate, polyethylene glycol ester (meth)acrylate, polypropylene glycol (meth)acrylate-polyethylene glycol ester, ethylene glycol monoglycidyl ether, ethylene glycol diglycidyl ether, diethylene glycol monoglycidyl ether, diethylene glycol diglycidyl ether, triethylene glycol monoglycidyl ether, triethylene glycol diglycidyl ether, polyethylene glycol monoglycidyl ether, polyethylene glycol diglycidyl ether, polypropylene glycol-polyethylene glycol monoglycidyl ether, polypropylene glycol-polyethylene glycol monoglycidyl ether, ethylene glycol, ethylene glycol monomethyl ether, diethylene glycol, diethylene glycol monomethyl ether, triethylene glycol, triethylene glycol monomethyl ether, polyethylene glycol, polyethylene glycol monomethyl ether, polypropylene glycol, or polypropylene glycol-polyethylene glycol monomethyl ether.

It is preferred that the acrylic resin including a structural unit represented by the general formula (19) (G2) has a carboxy group or a carboxylic anhydride group. By having a carboxy group or a carboxylic anhydride group at a side chain branched from a main chain of the resin, these groups function as an alkali-soluble group, thus enabling suppression of formation of residues after the development and an improvement in resolution after the development.

Examples of the acrylic resin including a structural unit represented by the general formula (19) (G2) include DISPERBYK-2000, DISPERBYK-2001, DISPERBYK-2008, DISPERBYK-2009, DISPERBYK-2010, DISPERBYK-2012, DISPERBYK-2015, DISPERBYK-2022, DISPERBYK-2025, DISPERBYK-2050, BYK-381, BYK-3440, or BYK-3441 (all of which are manufactured by BYK Japan KK.).

The content ratio of structural units derived from various copolymerization components in the acrylic resin including a structural unit represented by the general formula (19) (G2) can be determined by using $^{1}$H-NMR, $^{13}$C-NMR, $^{29}$Si-NMR, IR, TOF-MS, elemental analysis method, and measurement of ash content in combination.

Mw of the acrylic resin including a structural unit represented by the general formula (19) (G2) is preferably 1,000 or more, more preferably 3,000 or more, and still more preferably 5,000 or more, in terms of polystyrene measured by GPC. When Mw is within the above range, it is possible to suppress film reduction during alkali development. Meanwhile, Mw is preferably 100,000 or less, more preferably 50,000 or less, and still more preferably 20,000 or less. When Mw is within the above range, it is possible to improve resolution after the development.

Examples of the radical polymerization initiator used in radical copolymerization include an azo compound such as 2,2'-azobis(isobutyronitrile) or 2,2'-azobis(2,4-dimethylvaleronitrile), or an organic peroxide such as lauroyl peroxide, di-t-butyl peroxide, bis(4-t-butylcyclohexan-1-yl)peroxodicarbonate, t-butyl 2-ethylperoxyhexanoate, methylethyl ketone peroxide, benzoyl peroxide, or cumene hydroperoxide.

The conditions of radical copolymerization are preferably as follows. After sufficiently replacing the inside of a reaction vessel by bubbling or evacuation by nitrogen, a copolymerization component and a radical polymerization initiator are added in a reaction solvent, followed by a reaction at 60 to 110° C. for 30 to 500 minutes. When using, as the copolymerization component, a (meth)acrylic compound having a carboxylic anhydride group, it is preferred that a theoretical amount of water is added, followed by a reaction at 30 to 60° C. for 30 to 60 minutes. If necessary, a chain transfer agent such as a thiol compound can be used.

The content of the acrylic resin including a structural unit represented by the general formula (19) (G2) in the photosensitive resin composition of the present invention is preferably 0.005 to 3 parts by weight, more preferably 0.01 to 2 parts by weight, and still more preferably 0.03 to 1 part by weight, when the amount of the polysiloxane (A) is set at 100 parts by weight. When the content of the acrylic resin including a structural unit represented by the general formula (19) (G2) is within the above range, it is possible to suppress formation of residues after the development and to improve resolution after the development. When the polysiloxane (A) is an inorganic particle-containing polysiloxane (A1), the amount is set at 100 parts by weight, including the weight of inorganic particles (B) constituting the inorganic particle-containing polysiloxane (A1).

<Negative Photosensitivity; Radical Polymerizable Compound>

When the photosensitive resin composition of the present invention has negative photosensitivity, the photosensitive resin composition can further include a radical polymerizable compound. The radical polymerizable compound is a compound having a plurality of ethylenically unsaturated double bond groups in the molecule. Polymerization of a radical polymerizable compound proceeds by a radical generated from the above-mentioned photopolymerization initiator under exposure, and the exposed area of the composition including a polysiloxane is made insoluble in an alkali developing solution, thus enabling formation of a negative pattern.

Inclusion of the radical polymerizable compound leads to promotion of UV curing during exposure, thus enabling an improvement in sensitivity. Also, crosslink density of the composition after thermal curing is improved, thus enabling an improvement in hardness of the cured film.

The radical polymerizable compound is preferably a radical polymerizable compound having a (meth)acrylic group, radical polymerization of which proceeds easily. From the viewpoint of an improvement in sensitivity during exposure and an improvement in hardness of the cured film, a double bond equivalent of the radical polymerizable compound is preferably 80 to 400 g/mol.

Examples of the radical polymerizable compound include diethylene glycol di(meth)acrylate, triethylene glycol di(meth)acrylate, tetraethylene glycol di(meth)acrylate, propylene glycol di(meth)acrylate, trimethylolpropane di(meth)acrylate, trimethylolpropane tri(meth)acrylate, ethoxylated trimethylolpropane tri(meth)acrylate, ditrimethylolpropane tetra(meth)acrylate, 1,3-butanediol di(meth)acrylate, neopentyl glycol di(meth)acrylate, 1,4-butanediol di(meth)acrylate, 1,6-hexanediol di(meth)acrylate, 1,9-nonanediol di(meth)acrylate, 1,10-decanediol di(meth)acrylate, dimethylol-tricyclodecane di(meth)acrylate, ethoxylated glycerin tri(meth)acrylate, pentaerythritol tri(meth)acrylate, pentaerythritol tetra(meth)acrylate, ethoxylated pentaerythritol tetra(meth)acrylate, dipentaerythritol penta(meth)acrylate, dipentaerythritol hexa(meth)acrylate, tripentaerythritol hepta(meth)acrylate, tripentaerythritol octa(meth)acrylate, tetrapentaerythritol nona(meth)acrylate, tetrapentaerythritol deca(meth)acrylate, pentapentaerythritol undeca(meth)acrylate, pentapentaerythritol dodeca(meth)acrylate, ethoxylated bisphenol A di(meth)acrylate, 1,3,5-tris((meth)acryloxyethyl)isocyanuric acid, or 1,3-bis((meth)acryloxyethyl)isocyanuric acid. From the viewpoint of an improvement in sensitivity during exposure and an improvement in hardness of the cured film, the radical polymerizable compound is preferably trimethylolpropane tri(meth)acrylate, ditrimethylolpropane tetra(meth)acrylate, pentaerythritol tri(meth)acrylate, pentaerythritol tetra(meth)acrylate, dipentaerythritol penta(meth)acrylate, dipentaerythritol hexa(meth)acrylate, tripentaerythritol hepta(meth)acrylate, tripentaerythritol octa(meth)acrylate, 1,3,5-tris((meth)acryloxyethyl)isocyanuric acid, or 1,3-bis((meth)acryloxyethyl)isocyanuric acid.

The content of the radical polymerizable compound in the photosensitive resin composition of the present invention is preferably 0 to 30% by weight, more preferably 0 to 20% by weight, and still more preferably 0 to 10% by weight, when the total amount of the polysiloxane (A) and the radical polymerizable compound is set at 100% by weight. When the content of the radical polymerizable compound is within the above range, it is possible to improve sensitivity during exposure and hardness of the cured film. When the polysiloxane (A) is an inorganic particle-containing polysiloxane (A1), the amount is set at 100 parts by weight, including the weight of inorganic particles (B) constituting the inorganic particle-containing polysiloxane (A1).

<Silane Coupling Agent>

The photosensitive resin composition of the present invention can further include a silane coupling agent. Inclusion of the silane coupling agent leads to an increase in interaction at an interface between a cured film and a substrate, and an improvement in adhesion and chemical resistance of the cured film.

Examples of the silane coupling agent include a trifunctional silane such as methyltrimethoxysilane, methyltriethoxysilane, methyltri-n-propoxysilane, methyltriisopropoxysilane, methyltri-n-butoxysilane, ethyltrimethoxysilane, ethyltriethoxysilane, ethyltri-n-propoxysilane, ethyltriisopropoxysilane, ethyltri-n-butoxysilane, n-propyltrimethoxysilane, n-propyltriethoxysilane, isopropyltrimethoxysilane, isopropyltriethoxysilane, n-butyltrimethoxysilane, n-butyltriethoxysilane, n-hexyltrimethoxysilane, n-hexyltriethoxysilane, n-octyltrimethoxysilane, n-decyltrimethoxysilane, cyclopentyltrimethoxysilane, cyclohexyltrimethoxysilane, vinyltrimethoxysilane, vinyltriethoxysilane, 3-methacryloxypropyltrimethoxysilane, 3-methacryloxypropyltriethoxysilane, 3-acryloxypropyltrimethoxysilane, 3-acryloxypropyltriethoxysilane, phenyltrimethoxysilane, phenyltriethoxysilane, 4-tolyltrimethoxysilane, 4-hydroxyphenyltrimethoxysilane, 4-methoxyphenyltrimethoxysilane, 4-t-butylphenyltrimethoxysilane, 1-naphthyltrimethoxysilane, 2-naphthyltrimethoxysilane, 4-styryltrimethoxysilane, 2-phenylethyltrimethoxysilane, 4-hydroxybenzyltrimethoxysilane, 1-(4-hydroxyphenyl)ethyltrimethoxysilane, 2-(4-hydroxyphenyl)ethyltrimethoxysilane, 4-hydroxy-5-(4-hydroxyphenylcarbonyloxy)pentyltrimethoxysilane, 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, 2-(3-trimethoxysilylpropyl)-4-(N-t-butyl)amino-4-oxabutanoic acid, 2-(3-triethoxysilylpropyl)-4-(N-t-butyl)amino-4-oxabutanoic acid, 3-(3-trimethoxysilylpropyl)-4-(N-t-butyl)amino-4-oxabutanoic acid, 3-(3-triethoxysilylpropyl)-4-(N-t-butyl)amino-4-oxabutanoic acid, 3-trimethoxysilylpropylsuccinic acid, 3-triethoxysilylpropylsuccinic acid, 3-trimethoxysilylpropionic acid, 3-triethoxysilylpropionic acid, 4-trimethoxysilylbutyric acid, 4-triethoxysilylbutyric acid, 5-trimethoxysilylvaleric acid, 5-triethoxysilylvaleric acid, 3-trimethoxysilylpropylsuccinic anhydride, 3-triethoxysilylpropylsuccinic anhydride, 4-(3-trimethoxysilylpropyl)cyclohexane-1,2-dicarboxylic anhydride, 4-(3-triethoxysilylpropyl)cyclohexane-1,2-dicarboxylic anhydride, 4-(3-trimethoxysilylpropyl)phthalic anhydride, 4-(3-triethoxysilylpropyl)phthalic anhydride, trifluoromethyltrimethoxysilane, trifluoromethyltriethoxysilane, 3,3,3-trifluoropropyltrimethoxysilane, 3-[(3-ethyl-3-oxetanyl)methoxy]propyltrimethoxysilane, 3-[(3-ethyl-3-oxetanyl)methoxy]propyltriethoxysilane, 3-aminopropyltrimethoxysilane, 3-aminopropyltriethoxysilane, N-(2-aminoethyl)-3-aminopropyltrimethoxysilane, N-(2-aminoethyl)-3-aminopropyltriethoxysilane, N-phenyl-3-aminopropyltrimethoxysilane, N-(vinylbenzyl)-2-aminoethyl-3-aminopropyltrimethoxysilane hydrochloride, 3-(4-aminophenyl)propyltrimethoxysilane, 1-[4-(3-trimethoxysilylpropyl)phenyl]urea, 1-(3-trimethoxysilylpropyl)urea, 1-(3-triethoxysilylpropyl)urea, 3-trimethoxysilyl-N-(1,3-dimethylbutylidene)propylamine, 3-triethoxysilyl-N-(1,3-dimethylbutylidene)propylamine, 3-mercaptopropyltrimethoxysilane, 3-mercaptopropyltriethoxysilane, 3-isocyanate propyltrimethoxysilane, 3-isocyanate propyltriethoxysilane, 1,3,5-tris(3-trimethoxysilylpropyl)isocyanuric acid, 1,3,5-tris(3-triethoxysilylpropyl)isocyanuric acid, N-t-butyl-2-(3-trimethoxysilylpropyl)succinic acid imide, or N-t-butyl-2-(3-triethoxysilylpropyl)succinic acid imide; a difunctional silane such as dimethyldimethoxysilane, dimethyldiethoxysilane, dimethyldiacetoxysilane, diethyldimethoxysilane, diethyldiethoxysilane, di-n-propyldimethoxysilane, di-n-propyldiethoxysilane, diisopropyldimethoxysilane, diisopropyldiethoxysilane, di-n-butyldimethoxysilane, diisobutyldimethoxysilane, dicyclopentyldimethoxysilane, cyclohexylmethyldimethoxysilane, methylvinyldimethoxysilane, divinyldiethoxysilane, 3-methacryloxypropylmethyldimethoxysilane, 3-methacryloxypropylmethyldiethoxysilane, 3-acryloxypropylmethyldimethoxysilane, 3-acryloxypropylmethyldiethoxysilane, diphenyldimethoxysilane, diphenyldiethoxysilane, 3-glycidoxypropylmethyldimethoxysilane, 3-glycidoxypropylmethyldiethoxysilane, N-(2-aminoethyl)-3-aminopropylmethyldimethoxysilane, 3-mercaptopropylmethyldimethoxysilane, or 3-isocyanate propylmethyldiethoxysilane; a monofunctional silane such as trimethylmethoxysilane, trimethylethoxysilane, triethylmethoxysilane, triethylethoxysilane, tri-n-propyltrimethoxysilane, tri-n-propyltriethoxysilane, tri-n-butyltrimethoxysilane, tri-n-butyltriethoxysilane, (3-glycidoxypropyl)dimethylmethoxysilane, (3-glycidoxypropyl)dimethylethoxysilane, 3-dimethylmethoxysilylpropionic acid, 3-dimethylethoxysilylpropionic acid, 4-dimethylmethoxysilylbutyric acid, 4-dimethylethoxysilylbutyric acid, 5-dimethylmethoxysilylvaleric acid, 5-dimethylethoxysilylvaleric acid, 3-dimethylmethoxysilylpropylsuccinic anhydride, 3-dimethylethoxysilylpropylsuccinic anhydride, 4-(3-dimethylmethoxysilylpropyl)cyclohexane-1,2-dicarboxylic anhydride, 4-(3-dimethylethoxysilylpropyl)cyclohexane-1,2-dicarboxylic anhydride, 4-(3-dimethylmethoxysilylpropyl)phthalic anhydride, or 4-(3-dimethylethoxysilylpropyl)phthalic anhydride, or an organosilane represented by the general formula (13).

[Chemical Formula 21]

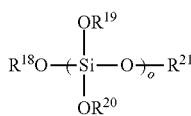

(13)

In the general formula (13), $R^{18}$ to $R^{21}$ each independently represents hydrogen, an alkyl group, an acyl group, or an aryl group, and o represents an integer of 1 to 15.

In the general formula (13), $R^{18}$ to $R^{21}$ each independently is preferably hydrogen, an alkyl group having 1 to 6 carbon atoms, an acyl group having 2 to 6 carbon atoms, or an aryl group having 6 to 15 carbon atoms, and more preferably hydrogen, an alkyl group having 1 to 4 carbon atoms, an acyl group having 2 to 4 carbon atoms, or an aryl group having 6 to 10 carbon atoms.

The alkyl group, the acyl group, and the aryl group may be either a non-substitution product or a substitution product.

Examples of the organosilane represented by the general formula (13) include a tetrafunctional silane such as tetramethoxysilane, tetraethoxysilane, tetra-n-propoxysilane, tetraisopropoxysilane, tetra-n-butoxysilane, or tetraacetoxysilane; Methyl Silicate 51 (manufactured by Fuso Chemical Co., Ltd.), M Silicate 51, Silicate 40, or Silicate 45 (all of which are manufactured by Tama Chemicals Co., Ltd.); or Methyl Silicate 51, Methyl Silicate 53A, Ethyl Silicate 40, or Ethyl Silicate 48 (all of which are manufactured by COLCOAT CO., Ltd.).

When the photosensitive resin composition of the present invention has positive photosensitivity, from the viewpoint of an improvement in adhesion of the cured film and chemical resistance, the silane coupling agent is preferably 1-naphthyltrimethoxysilane, 2-naphthyltrimethoxysilane, 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, 3-[(3-ethyl-3-oxetanyl)methoxy]propyltrimethoxysilane, 3-[(3-ethyl-3-oxetanyl)methoxy]propyltriethoxysilane, 1-[4-(3-trimethoxysilylpropyl)phenyl]urea, 1-(3-trimethoxysilylpropyl)urea, 1-(3-triethoxysilylpropyl)urea, 1,3,5-tris(3-trimethoxysilylpropyl)isocyanuric acid, 1,3,5-tris(3-triethoxysilylpropyl)isocyanuric acid, N-t-butyl-2-(3-trimethoxysilylpropyl)succinic acid imide, N-t-butyl-2-(3-triethoxysilylpropyl)succinic acid imide, tetramethoxysilane, tetraethoxysilane, tetra-n-propoxysilane, tetraisopropoxysilane, tetra-n-butoxysilane, or tetraacetoxysilane, Methyl Silicate 51 (manufactured by Fuso Chemical Co., Ltd.), M Silicate 51, Silicate 40, or Silicate 45 (all of which are manufactured by Tama Chemicals Co., Ltd.); or Methyl Silicate 51, Methyl Silicate 53A, Ethyl Silicate 40, or Ethyl Silicate 48 (all of which are manufactured by COLCOAT CO., Ltd.).

When the photosensitive resin composition of the present invention has negative photosensitivity, from the viewpoint of adhesion of the cured film and chemical resistance, the silane coupling agent is preferably vinyltrimethoxysilane, vinyltriethoxysilane, 3-methacryloxypropyltrimethoxysilane, 3-methacryloxypropyltriethoxysilane, 3-acryloxypropyltrimethoxysilane, 3-acryloxypropyltriethoxysilane, 1-naphthyltrimethoxysilane, 2-naphthyltrimethoxysilane, 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, 3-[(3-ethyl-3-oxetanyl)methoxy]propyltrimethoxysilane, 3-[(3-ethyl-3-oxetanyl)methoxy]propyltriethoxysilane, 3-aminopropyltrimethoxysilane, 3-aminopropyltriethoxysilane, 1-[4-(3-trimethoxysilylpropyl)phenyl]urea, 1-(3-trimethoxysilylpropyl)urea, 1-(3-triethoxysilylpropyl)urea, 3-trimethoxysilyl-N-(1,3-dimethylbutylidene)propylamine, 3-triethoxysilyl-N-(1,3-dimethylbutylidene)propylamine, 3-isocyanate propyltrimethoxysilane, 3-isocyanate propyltriethoxysilane, 1,3,5-tris(3-trimethoxysilylpropyl)isocyanuric acid, 1,3,5-tris(3-triethoxysilylpropyl)isocyanuric acid, N-t-butyl-2-(3-trimethoxysilylpropyl)succinic acid imide, N-t-butyl-2-(3-triethoxysilylpropyl)succinic acid imide, tetramethoxysilane, tetraethoxysilane, tetra-n-propoxysilane, tetraisopropoxysilane, tetra-n-butoxysilane, or tetraacetoxysilane; Methyl Silicate 51 (manufactured by Fuso Chemical Co., Ltd.), M Silicate 51, Silicate 40, or Silicate 45 (all of which are manufactured by Tama Chemicals Co., Ltd.); Methyl Silicate 51, Methyl Silicate 53A, Ethyl Silicate 40, or Ethyl Silicate 48 (all of which are manufactured by COLCOAT CO., Ltd.).

The content of the silane coupling agent in the photosensitive resin composition of the present invention is preferably 0.01 to 15 parts by weight, and more preferably 0.1 to 10 parts by weight, when the amount of the polysiloxane (A) is set at 100 parts by weigh. When the content of the silane coupling agent is within the above range, it is possible to improve adhesion of the cured film and chemical resistance. When the polysiloxane (A) is an inorganic particle-containing polysiloxane (A1), the amount is set at 100 parts by weight, including the weight of inorganic particles (B) constituting the inorganic particle-containing polysiloxane (A1).

<Solvent>

The photosensitive resin composition of the present invention can further include a solvent. From the viewpoint of an improvement in transparency of the cured film thus obtained by uniform dissolution of each component, the solvent is preferably a compound having an alcoholic hydroxyl group, a compound having a carbonyl group, or a compound having three or more ether bonds, and more preferably a compound having a boiling point of 110 to 250° C. under the atmospheric pressure. By adjusting the boiling point to 110° C. or higher, the solvent is appropriately volatilized during coating and drying of the coating film proceeds, thus making it possible to obtain a satisfactory coating film with no uneven coating. Meanwhile, by adjusting the boiling point to 250° C. or lower, the amount of the residual solvent in the coating film can be suppressed and shrinkage of the film during thermal curing can be reduced, thus making it possible to obtain a cured film having satisfactory flatness.

Examples of the compound, which has an alcoholic hydroxyl group and a boiling point of 110 to 250° C. under the atmospheric pressure include hydroxyacetone, 4-hydroxy-2-butanone, 3-hydroxy-3-methyl-2-butanone, 4-hydroxy-3-methyl-2-butanone, 5-hydroxy-2-pentanone, 4-hydroxy-2-pentanone, 4-hydroxy-4-methyl-2-pentanone (diacetone alcohol), methyl lactate, ethyl lactate, n-propyl lactate, n-butyl lactate, ethylene glycol monomethyl ether, ethylene glycol monoethyl ether, ethylene glycol mono-n-propyl ether, ethylene glycol mono-n-butyl ether, propylene glycol monomethyl ether, propylene glycol monoethyl ether, propylene glycol mono-n-propyl ether, propylene glycol mono-n-butyl ether, propylene glycol mono-t-butyl ether, diethylene glycol monomethyl ether, diethylene glycol monoethyl ether, diethylene glycol mono-n-propyl ether, dipropylene glycol monomethyl ether, dipropylene glycol monoethyl ether, dipropylene glycol mono-n-propyl ether, 3-methoxy-1-butanol, 3-methoxy-3-methyl-1-butanol, tetrahydrofurfuryl alcohol, n-butanol, or n-pentanol. From the viewpoint of coatability, the compound is preferably diacetone alcohol, ethyl lactate, ethylene glycol monomethyl ether, propylene glycol monomethyl ether, diethylene glycol monomethyl ether, dipropylene glycol monomethyl ether, 3-methoxy-1-butanol, 3-methoxy-3-methyl-1-butanol, or tetrahydrofurfuryl alcohol.

Examples of the compound, which has a carbonyl group and a boiling point of 110 to 250° C. under the atmospheric pressure, include n-butyl acetate, isobutyl acetate, 3-methoxy-n-butyl acetate, 3-methyl-3-methoxy-n-butyl acetate, ethylene glycol monomethyl ether acetate, propylene glycol monomethyl ether acetate, methyl n-butyl ketone, methyl isobutyl ketone, diisobutyl ketone, 2-heptanone, acetylacetone, cyclopentanone, cyclohexanone, cycloheptanone, γ-butyrolactone, γ-valerolactone, δ-valerolactone, propylene carbonate, N-methyl-2-pyrrolidone, N,N'-dimethylformamide, N,N'-dimethylacetamide, or 1,3-dimethyl-2-imidazolidinone. From the viewpoint of coatability, the compound is preferably 3-methoxy-n-butyl acetate, propylene glycol monomethyl ether acetate, or γ-butyrolactone.

Examples of the compound, which has three or more ether bonds and a boiling point of 110 to 250° C. under the atmospheric pressure, include diethylene glycol dimethyl ether, diethylene glycol diethyl ether, diethylene glycol ethyl methyl ether, diethylene glycol di-n-propyl ether, dipropylene glycol dimethyl ether, dipropylene glycol diethyl ether, dipropylene glycol ethyl methyl ether, or dipropylene glycol di-n-propyl ether. From the viewpoint of coatability, the compound is preferably diethylene glycol dimethyl ether, diethylene glycol ethyl methyl ether, or dipropylene glycol dimethyl ether.

The content of the solvent in the photosensitive resin composition of the present invention can be appropriately adjusted according to the coating method, and is generally set at 50 to 95% by weight of the whole photosensitive resin composition when a coating film is formed by spin coating.

<Surfactant>

The photosensitive resin composition of the present invention can further include a surfactant. By including an appropriate amount of the surfactant, leveling property during coating is improved, thus enabling suppression of uneven coating to obtain a uniform coating film.

Examples of the surfactant include a fluorine-based surfactant, a silicone-based surfactant, a polyalkylene oxide-based surfactant, or a poly(meth)acrylate-based surfactant.

Examples of the fluorine-based surfactant include 1,1,2,2-tetrafluorooctyl(1,1,2,2-tetrafluoropropyl)ether, 1,1,2,2-tetrafluorooctylhexyl ether, octaethylene glycol bis(1,1,2,2-tetrafluorobutyl)ether, hexaethylene glycol (1,1,2,2,3,3-hexafluoropentyl)ether, octapropylene glycol bis(1,1,2,2-tetrafluorobutyl)ether, hexapropylene glycol bis(1,1,2,2,3,3-hexafluoropentyl)ether, perfluorododecylsulfonic acid sodium, 1,1,2,2,8,8,9,9,10,10-decafluorododecane, 1,1,2,2,3,3-hexafluorodecane, N-[3-(perfluorooctanesulfoneamide)propyl]-N,N'-dimethyl-N-carboxymethyleneammonium betaine, perfluoroalkylsulfoneamide propyltrimethylammonium salt, perfluoroalkyl-N-ethylsulfonyl glycine salt, or bis(N-perfluorooctylsulfonyl-N-ethylaminoethyl)phosphate. There is also exemplified a compound having a fluoroalkyl group or a fluoroalkylene chain at any one of an end, a main chain, and a side chain, such as monoperfluoroalkylethylphosphoric acid ester. Examples of such a compound include "Megafac" (registered trademark) F-142D, "Megafac" (registered trademark) F-172", "Megafac" (registered trademark) F-173, "Megafac" (registered trademark) F-183, "Megafac" (registered trademark) F-444, "Megafac" (registered trademark) F-445, "Megafac" (registered trademark) F-470, "Megafac" (registered trademark) F-475, "Megafac" (registered trademark) F-477, "Megafac" (registered trademark) F-555, or "Megafac" (registered trademark) F-559 (all of which are manufactured by Dainippon Ink & Chemical Industry Corporation); "EFTOP" (registered trademark) EF301, "EFTOP" (registered trademark) 303, or "EFTOP" (registered trademark) 352 (all of which are manufactured by Mitsubishi Materials Electronic Chemicals Co., Ltd.); "Flolard" (registered trademark) FC-430 or "Flolard" (registered trademark) FC-431 (all of which are manufactured by Sumitomo 3M Limited); "AsahiGuard" (registered trademark) AG710 (manufactured by ASAHI GLASS CO., LTD.); "SURFLON" (registered trademark) S-382, "SURFLON (registered trademark) SC-101, "SURFLON" (registered trademark) SC-102, "SURFLON" (registered trademark) SC-103, "SURFLON" (registered trademark) SC-104, "SURFLON" (registered trademark) SC-105, or "SURFLON" (registered trademark) SC-106 (all of which are manufactured by AGC SEIMI CHEMICAL CO., LTD.); "BM-1000" or "BM-1100" (all of which are manufactured by Yusho Co., Ltd.); "NBX-15", "FTX-218", or "DFX-218" (all of which are manufactured by Neos Corporation).

Examples of the silicone-based surfactant include SH28PA, SH7PA, SH21PA, SH30PA, or ST94PA (all of which are manufactured by Dow Corning Toray Co., Ltd.); or "BYK" (registered trademark)-301, "BYK" (registered trademark)-307, "BYK" (registered trademark)-331, "BYK" (registered trademark)-333, or "BYK" (registered trademark)-345 (all of which are manufactured by BYK Japan KK).

The content of the surfactant in the photosensitive resin composition of the present invention is preferably 0.0001 to 1% by weight of the whole photosensitive resin composition.

<Other Additives>

The photosensitive resin composition of the present invention can further include the other resin or precursors thereof. Examples of the resin or precursors thereof include a polyimide, an acrylic resin, an epoxy resin, a novolac resin, a urea resin, a polyamic acid, a polyamideimide, a polyamide, a polybenzoxazole, or a polyurethane, or precursors thereof.

The photosensitive resin composition of the present invention can further include one or more agents selected from the group consisting of a sensitizer capable of promoting a photoreaction, such as (C) a compound having a naphthoquinone diazide structure or (D) a photopolymerization initiator, a curing agent capable of promoting thermal curing of the photosensitive resin composition, and a crosslinking agent capable of improving crosslink density of a cured film of the photosensitive resin composition.

Examples of the sensitizer include an anthracene compound, an anthraquinone compound, or a coumarin compound. Examples of the curing agent include a nitrogen-containing organic compound, a silicone resincuring agent, a metal alkoxide, a methylol group-containing aromatic compound, a methylol group-containing melamine derivative, or a methylol group-containing urea derivative. Examples of the crosslinking agent include a methylol group-containing aromatic compound, a methylol group-containing melamine derivative, a methylol group-containing urea derivative, an epoxy group-containing compound, or an oxetanyl group-containing compound.

<Method for Manufacturing Photosensitive Resin Composition of the Present Invention>

A typical method for manufacturing a photosensitive resin composition of the present invention will be described. When a photosensitive resin composition having positive photosensitivity is manufactured, for example, (C) a compound having a naphthoquinone diazide structure, (E1) a photoacid generator, (E2) a photobase generator, (E3) a thermal acid generator, and (E4) a thermal base generator, and other additives are added to an optional solvent, and then dissolved by stirring. Thereafter, (A) a polysiloxane and (C) inorganic particles are added, followed by stirring for 20 minutes to 3 hours to obtain a uniform solution. After stirring, the obtained solution is filtered to obtain a photosensitive resin composition having positive photosensitivity of the present invention.

When a photosensitive resin composition having negative photosensitivity is manufactured, for example, (D) a photopolymerization initiator, (E1) a photoacid generator, (E2) a photobase generator, (E3) a thermal acid generator, (E4) a thermal base generator, and other additives are added to an optional solvent, and then dissolved by stirring. Thereafter, (A) a polysiloxane and (C) inorganic particles are added, followed by stirring for 20 minutes to 3 hours to obtain a uniform solution. After stirring, the obtained solution is filtered to obtain a photosensitive resin composition having negative photosensitivity of the present invention.

<Process Using Photosensitive Resin Composition of the Present Invention>

A description will be made on a process using a method for manufacturing a semiconductor device of the present invention with reference to FIG. 1 by way of, as an example, an ion implantation process using the photosensitive resin composition of the present invention as an ion implantation mask resist. First, (1) the photosensitive resin composition of the present invention is coated and prebaked on a silicon carbide semiconductor substrate 1 to form a polysiloxane film 2. Next, (2) the film is irradiated with active chemical rays 4 through a mask having a desired pattern 3. Then, (3) the film was patterned by development and optionally subjected to breaching exposure and middle baking to form a polysiloxane pattern 2a having a desired pattern. Next, (4) ions 5 are implanted through the polysiloxane pattern 2a as an ion implantation mask to form an impurity region 6 in a silicon carbide semiconductor substrate 1. Then, (5) the polysiloxane pattern 2a is removed from the silicon carbide semiconductor substrate 1.

As mentioned above, according to the method for manufacturing a semiconductor device of the present invention, it is possible to subject the fine pattern region to ion implantation, dopant exposure, dry etching, or wet etching at high temperature, leading to an improvement in yield and an improvement in performances in the manufacture of the semiconductor device. It is also possible to reduce the number of steps as compared with the method of using a SiO$_2$ film as an ion implantation mask, a dopant exposure mask, a dry etching mask, or a wet etching mask, thus enabling an improvement in productivity and shortening of cycle time. It also becomes possible to easily remove a cured film of the composition containing a polysiloxane deteriorated in the formation of ion impurity region without causing formation of residues, leading to an improvement in yield in the manufacture of a semiconductor device.

<Step of obtaining Pattern>

The method for manufacturing a semiconductor device of the present invention includes (1) the step of obtaining a pattern of the photosensitive resin composition of the present invention or a cured product thereof on a substrate. The step of obtaining a pattern of the photosensitive resin composition of the present invention includes, for example, the step of coating the photosensitive resin composition on the substrate to form a film, followed by patterning, or the step of coating the photosensitive resin composition in a pattern shape on the substrate to form a film.

It is possible to use, as the substrate, a substrate including one or more materials selected from the group consisting of silicon, silicon dioxide (SiO$_2$), silicon nitride (Si$_3$N$_4$), silicon carbide (SiC), gallium nitride (GaN), gallium phosphide (GaP), gallium arsenide (GaAs), aluminum gallium arsenide (GaAlAs), gallium indium nitrogen arsenide (GaInNAs), indium nitride (InN), indium phosphide (InP), indium tin oxide (ITO), indium zinc oxide (IZO), indium gallium arsenide (InGaAs), aluminium indium gallium phosphide (InGaAlP), indium zinc gallium oxide (IGZO), diamond, sapphire (Al$_2$O$_3$), aluminum zinc oxide (AZO). aluminum nitride (AlN), zinc oxide (ZnO), zinc selenide (ZnSe), cadmium sulfide (CdS), and cadmium telluride (CdTe), or a substrate in which ITO, metal (molybdenum, silver, copper, or aluminum) or carbon nano tube (CNT) is formed as an electrode or a wiring on glass.

<Step of Patterning after Coating to Form Film>

Examples of the method of coating the photosensitive resin composition of the present invention include a micro gravure coating method, a spin coating method, a dip coating method, a curtain flow coating method, a roll coating method, a spray coating method, or a slit coating method. The coating film thickness varies depending on the coating method, and the solid component concentration and the viscosity of the photosensitive resin composition of the present invention, and coating is usually performed so that the film thickness after coating and prebaking became 0.1 to 30 μm.

After coating the photosensitive resin composition of the present invention on the substrate, prebaking is preferably performed. It is possible to perform prebaking using an oven, a hot plate, infrared rays, a flash annealing device, or a laser annealing device. The prebaking temperature is preferably 50 to 150° C. The prebaking time is preferably 30 seconds to several hours. Prebaking can be performed in two or more stages, for example, prebaking is performed at 120° C. for 2 minutes after prebaking at 80° C. for 2 minutes. Examples of the patterning method include photolithography or etching.

<Method of Patterning by Photolithography>

The photosensitive resin composition of the present invention is coated and prebaked on the substrate, and then exposed using an aligner such as a stepper, a mirror projection mask aligner (MPA), or a parallel light mask aligner (PLA). Examples of active chemical rays for irradiation during exposure include ultraviolet rays, visible rays, electron beams, X-rays, KrF (wavelength of 248 nm) laser, or ArF (wavelength of 193 nm) laser. It is preferred to use j-line (wavelength of 313 nm), i-line (wavelength of 365 nm), h-line (wavelength of 405 nm), or g-line (wavelength of 436 nm) of a mercury lamp. The exposure dose is usually about 100 to 40,000 J/m$^2$ (10 to 4,000 mJ/cm$^2$) (value of i-line illuminometer), and exposure can be optionally performed through a mask having a desired pattern.

After exposure, post exposure baking can be performed. It is possible to expect the effect of improving resolution after the development or enhancing a permissible range of development conditions by performing post exposure baking. In the post exposure baking, it is possible to use an oven, a hot plate, infrared rays, a flash annealing device, or a laser annealing device. The post exposure baking temperature is preferably 50 to 180° C., and more preferably 60 to 150° C. The post exposure baking time is preferably 10 seconds to several hours. When the post exposure baking time is within the above range, the reaction sometimes proceeds satisfactorily, thus enabling shortening of the developing time.

After exposure, the development is performed using an automatic developing machine. When the photosensitive resin composition of the present invention has positive photosensitivity, after the development, the exposed area is removed with a developing solution, thus making it possible to obtain a relief pattern. When the photosensitive resin composition of the present invention has negative photosensitivity, after the development, the unexposed area is removed with a developing solution, thus making it possible to obtain a relief pattern.

An alkali developing solution is generally used as a developing solution. The alkali developing solution is preferably an organic alkali solution or an aqueous solution of a compound exhibiting alkalinity, and, from the environmental point of view, more preferably an aqueous solution of a compound exhibiting alkalinity, i.e. an aqueous alkali solution.

Examples of the organic alkali solution or the compound exhibiting alkalinity include 2-aminoethanol, 2-(dimethylamino)ethanol, 2-(diethylamino)ethanol, diethanolamine, methylamine, ethylamine, dimethylamine, diethylamine, triethylamine, (2-dimethylamino)ethyl acetate, (2-dimethylamino)ethyl (meth)acrylate, cyclohexylamine, ethylenediamine, hexamethylenediamine, ammonia, tetramethyl ammonium hydroxide, tetraethyl ammonium hydroxide, sodium hydroxide, potassium hydroxide, magnesium hydroxide, calcium hydroxide, barium hydroxide, sodium carbonate, or potassium carbonate.

It is possible to use, as the developing solution, an organic solvent. Examples of the organic solvent include the above-mentioned solvent, ethyl acetate, ethyl pyruvate, ethyl 3-methoxypropionate, ethyl 3-ethoxypropionate, N-methyl-2-pyrrolidone, dimethyl sulfoxide, or hexamethylphosphortriamide.

It is possible to use, as the developing solution, a mixed solution containing both of the organic solvent, and a poor solvent to the photosensitive resin composition of the present invention. Examples of the poor solvent to the photosensitive resin composition of the present invention include water, methanol, ethanol, isopropyl alcohol, toluene, or xylene.

Examples of the developing method include a method of coating the developing solution as it is on the exposed film, a method of spraying the developing solution in the form of a fine mist; a method of immersing the exposed film in the developing solution; or a method of irradiating the exposed film with ultrasonic waves after immersion in the developing solution. The exposed film is preferably brought into contact with a developing solution for 5 seconds to 10 minutes. After the development, the obtained relief pattern is preferably washed with a rinsing solution. When using an aqueous alkali solution as a developing solution, the rinsing solution is preferably water.

It is possible to use, as the rinsing solution, an aqueous solution of alcohols such as ethanol or isopropyl alcohol, an aqueous solution of esters such as propylene glycol monomethyl ether acetate, or an aqueous solution of a compound exhibiting acidity, such as a carbon dioxide gas, hydrochloric acid, or acetic acid.

It is possible to use, as the rinsing solution, an organic solvent. From the viewpoint of affinity with the developing solution, the organic solvent is preferably methanol, ethanol, isopropyl alcohol, ethyl acetate, ethyl lactate, ethyl pyruvate, propylene glycol monomethyl ether, propylene glycol monomethyl ether acetate, methyl 3-methoxypropionate, ethyl 3-ethoxypropionate, or 2-heptanone.

<Method of patterning by Etching>

After the photosensitive resin composition of the present invention is coated and prebaked on the substrate, a treatment of the below-mentioned thermal curing step can be optionally performed. Then, a photoresist is coated on the coating film of the photosensitive resin composition to form a film in the same manner as mentioned above. After coating, prebaking is preferably performed in the same manner as mentioned above.

By performing exposure and development in the same manner as mentioned above after a photoresist is coated and prebaked on the photosensitive resin composition of the present invention, a pattern of the photoresist can be formed on the coating film of the photosensitive resin composition by photolithography.

After the development, the obtained pattern is preferably allowed to undergo thermal curing. Thermal curing enables an improvement in chemical resistance and dry etching resistance of the cured film of the photoresist, and thus the pattern of the photoresist can be suitably used as an etching mask. Thermal curing can be performed using an oven, a hot plate, infrared rays, a flash annealing device, or a laser annealing device. The thermal curing temperature is preferably 70 to 200°. The thermal curing time is preferably 30 seconds to several hours. After development and thermal curing, the coating film of the photosensitive resin composition of the present invention of the lower layer of the pattern is allowed to undergo patterning through an etching mask as the pattern of the photoresist. Examples of the etching method include a wet etching method using an etching solution and a dry etching method using an etching gas. It is preferred to use, as the etching solution, an acidic or alkali etching solution, or an organic solvent.

Examples of the acidic etching solution include a solution of a compound exhibiting acidity, such as hydrofluoric acid, hydrochloric acid, hydrobromic acid, hydroiodic acid, perchloric acid, chloric acid, chlorous acid, hypochlorous acid, perbromic acid, bromic acid, bromous acid, hypobromic acid, periodic acid, iodic acid, iodous acid, hypoiodous acid, sulfuric acid, sulfurous acid, hyposulfurous acid, nitric acid, nitrous acid, phosphoric acid, phosphorous acid, hypophosphorous acid, phosphonic acid, phosphinic acid, hexafluorophosphoric acid, hexafluoroantimonic acid, boric acid, tetrafluoroboric acid, formic acid, acetic acid, propionic acid, butanoic acid, trifluoroacetic acid, oxalic acid, lactic acid, methanesulfonic acid, p-toluenesulfonic acid, trifluoromethanesulfonic acid, or fluorosulfonic acid.

The alkali etching solution is preferably an organic alkali solution, or an aqueous solution of a compound exhibiting alkalinity. Examples of the organic alkali solution or the compound exhibiting alkalinity include 2-aminoethanol, 2-(dimethylamino)ethanol, 2-(diethylamino)ethanol, diethanolamine, methylamine, ethylamine, dimethylamine, diethylamine, triethylamine, (2-dimethylamino)ethyl acetate, (2-dimethylamino)ethyl (meth)acrylate, cyclohexylamine, ethylenediamine, hexamethylenediamine, ammonia, tetramethyl ammonium hydroxide, tetraethyl ammonium hydroxide, sodium hydroxide, potassium hydroxide, magnesium hydroxide, calcium hydroxide, barium hydroxide, sodium carbonate, or potassium carbonate.

Examples of the organic solvent include the above-mentioned solvent, diethylene glycol mono-n-butyl ether, ethyl acetate, ethyl pyruvate, ethyl 3-methoxypropionate, ethyl 3-ethoxypropionate, N-methyl-2-pyrrolidone, dimethyl sulfoxide, hexamethylphosphortriamide, methanol, ethanol, isopropyl alcohol, toluene, or xylene.

It is possible to use, as the etching solution, a mixed solution containing both of an alkali etching solution and an organic solvent.

Examples of the method of wet etching include a method of coating the etching solution as it is on the substrate, on which the pattern of the photoresist is formed on the coating film of the photosensitive resin composition of the present invention; a method of spraying the etching solution in the form of a fine mist; a method of immersing the substrate, on which the pattern of the photoresist is formed on the coating film of the photosensitive resin composition of the present invention, in the etching solution; or a method of irradiating the substrate, on which the pattern of the photoresist is formed on the coating film of the photosensitive resin composition of the present invention, with ultrasonic waves after immersion in the etching solution.

The etching temperature, at which the substrate, on which the pattern of the photoresist is formed on the coating film of the photosensitive resin composition of the present invention, is brought into contact with the etching solution is preferably 10 to 180° C., more preferably 20 to 160° C., still more preferably 30 to 140° C., and particularly preferably 40 to 120° C. When a boiling point of the component in the etching solution is lower than 180° C., the etching temperature is preferably lower than a boiling point of the component.

The etching time, during which the substrate, on which the pattern of the photoresist is formed on the coating film of the photosensitive resin composition of the present invention, is brought into contact with the etching solution is preferably 10 seconds or more, more preferably 30 seconds or more, still more preferably 1 minute or more, particularly preferably 3 minutes or more, and most preferably 5 minutes or more. Meanwhile, from the viewpoint of cycle time, the etching time is preferably 60 minutes or less, more preferably 45 minutes or less, still more preferably 30 minutes or less, and particularly preferably 15 minutes or less.

After wet etching, the coating film of the photosensitive resin composition of the present invention allowed to undergo patterning by wet etching is preferably washed with a rinsing solution. Examples of the rinsing solution include water, methanol, ethanol, isopropyl alcohol, ethyl acetate, ethyl lactate, ethyl pyruvate, propylene glycol monomethyl ether, propylene glycol monomethyl ether acetate, methyl 3-methoxypropionate, ethyl 3-ethoxypropionate, or 2-heptanone. When using, as the etching solution, an acidic etching solution, or an aqueous solution of a compound exhibiting alkalinity, the rinsing solution is preferably a solution containing water.

Examples of the etching gas include fluoromethane, difluoromethane, trifluoromethane, tetrafluoromethane, chlorofluoromethane, chlorodifluoromethane, chlorotrifluoromethane, dichlorofluoromethane, dichlorodifluoromethane, trichlorofluoromethane, sulfur hexafluoride, xenon difluoride, oxygen, ozone, argon, or fluorine.

Examples of the method of dry etching include a method of reactive gas etching in which a substrate, on which a pattern of a photoresist is formed on a coating film of the photosensitive resin composition of the present invention, is exposed to the etching gas; a method of plasma etching in which a substrate, on which a pattern of a photoresist is formed on a coating film of the photosensitive resin composition of the present invention, is exposed to an etching gas ionized or radicalized by electromagnetic wave; or a method of reactive ion etching in which an etching gas ionized or radicalized by electromagnetic wave is accelerated by applying a bias and collided with a substrate, on which a pattern of a photoresist is formed on a coating film of the photosensitive resin composition of the present invention.

The etching temperature, at which the substrate, on which the pattern of the photoresist is formed on the coating film of the photosensitive resin composition of the present invention, is brought into contact with the etching gas is preferably 10 to 180° C., more preferably 20 to 160° C., still more preferably 30 to 140° C., and particularly preferably 40 to 120° C.

The etching time, during which the substrate, on which the pattern of the photoresist is formed on the coating film of the photosensitive resin composition of the present invention, is brought into contact with the etching gas is preferably 10 seconds or more, more preferably 30 seconds or more, still more preferably 1 minute or more, particularly preferably 3 minutes or more, and most preferably 5 minutes or more. Meanwhile, from the viewpoint of cycle time, the etching time is preferably 60 minutes or less, more preferably 45 minutes or less, still more preferably 30 minutes or less, and particularly preferably 15 minutes or less.

After etching, the photoresist remaining on the coating film of the photosensitive resin composition of the present invention is removed to obtain a pattern of the photosensitive resin composition of the present invention. Examples of the method of removing the photoresist include a method of removing using a resist peeling liquid, or a method of removing by ashing. It is preferred to use, as the resist peeling liquid, an acidic or alkaline resist peeling liquid, or an organic solvent. Examples of the acidic resist peeling liquid include an acidic solution, or a mixed solution of an acidic solution and an oxidizing agent. From the viewpoint of removability of the photoresist, a mixed solution of an acidic solution and an oxidizing agent is preferable.

Examples of the acidic solution include a solution of a compound exhibiting acidity, such as hydrofluoric acid, hydrochloric acid, hydrobromic acid, hydroiodic acid, perchloric acid, chloric acid, chlorous acid, hypochlorous acid, perbromic acid, bromic acid, bromous acid, hypobromic acid, periodic acid, iodic acid, iodous acid, hypoiodous acid, sulfuric acid, sulfurous acid, hyposulfurous acid, nitric acid, nitrous acid, phosphoric acid, phosphorous acid, hypophosphorous acid, phosphonic acid, phosphinic acid, hexafluorophosphoric acid, hexafluoroantimonic acid, boric acid, tetrafluoroboric acid, formic acid, acetic acid, propionic acid, butanoic acid, trifluoroacetic acid, oxalic acid, lactic acid, methanesulfonic acid, p-toluenesulfonic acid, trifluoromethanesulfonic acid, or fluorosulfonic acid. From the viewpoint of removability of the photoresist, the acidic solution is preferably hydrofluoric acid, hydrochloric acid, hydrobromic acid, sulfuric acid, nitric acid, formic acid, acetic acid, or propionic acid, and more preferably sulfuric acid.

Examples of the oxidizing agent include hydrogen peroxide, peracetic acid, m-chloroperbenzoic acid, benzoyl peroxide, di-t-butyl peroxide, t-butyl hydroperoxide, 1,4-benzoquinone, 1,2-benzoquinone, 2,3,5,6-tetrachloro-1,4-benzoquinone, 2,3,5,6-tetrabromo-1,4-benzoquinone, 3,4,5,6-tetrachloro-1,2-benzoquinone, potassium peroxymonosulfate, 2,2,6,6-tetramethylpiperidine-1-oxyl free radical, 2,6-dichloropyridine-N-oxide, [bis(trifluoroacetoxy)iodo]benzene, (diacetoxyiodo)benzene, 2-iodosobenzoic acid, sodium peroxide, potassium peroxide, sodium superoxide, or potassium superoxide. From the viewpoint of removability of the photoresist, the oxidizing agent is preferably hydrogen peroxide, peracetic acid, or m-chloroperbenzoic acid, and more preferably hydrogen peroxide.

An alkaline resist peeling liquid is preferably an organic alkali solution, or an aqueous solution of a compound exhibiting alkalinity. Examples of the organic alkali solution or the compound exhibiting alkalinity include 2-aminoethanol, 2-(dimethylamino)ethanol, 2-(diethylamino)ethanol, diethanolamine, methylamine, ethylamine, dimethylamine, diethylamine, triethylamine, (2-dimethylamino)ethyl acetate, (2-dimethylamino)ethyl (meth)acrylate, cyclohexylamine, ethylenediamine, hexamethylenediamine, ammonia, tetramethyl ammonium hydroxide, tetraethyl ammonium hydroxide, sodium hydroxide, potassium hydroxide, magnesium hydroxide, calcium hydroxide, barium hydroxide, sodium carbonate, or potassium carbonate.

Examples of the organic solvent include the above-mentioned solvent, diethylene glycol mono-n-butyl ether, ethyl acetate, ethyl pyruvate, ethyl 3-methoxypropionate, ethyl 3-ethoxypropionate, N-methyl-2-pyrrolidone, dimethyl sulfoxide, hexamethylphosphortriamide, methanol, ethanol, isopropyl alcohol, toluene, or xylene.

It is possible to use, as the resist peeling liquid, a mixed solution containing both of an alkali resist peeling liquid and an organic solvent. Examples of the removing method using a resist peel liquid include a method of coating the resist peeling liquid as it is or spraying the resist peeling liquid in the form of a fine mist on the substrate, on which the photoresist remains on the coating film of the photosensitive resin composition of the present invention; a method of immersing the substrate, on which the photoresist remains on the coating film of the photosensitive resin composition of the present invention, in the resist peeling liquid; or a method of irradiating the substrate, on which the photoresist remains on the coating film of the photosensitive resin composition of the present invention, with ultrasonic waves after immersion in the resist peeling liquid.

The temperature at which the substrate, on which the photoresist remains on the coating film of the photosensitive resin composition of the present invention, is brought into contact with the resist peeling liquid is preferably 10 to 180° C., more preferably 20 to 160° C., still more preferably 30 to 140° C., and particularly preferably 40 to 120° C. When a boiling point of the component in the resist peeling liquid is lower than 180° C., the immersion temperature is preferably a temperature lower than a boiling point of the component.

The time during which the substrate, on which the photoresist remains on the coating film of the photosensitive resin composition of the present invention, is brought into contact with the resist peeling liquid is preferably 10 seconds or more, more preferably 30 seconds or more, still more preferably 1 minute or more, particularly preferably 3 minutes or more, and most preferably 5 minutes or more. Meanwhile, from the viewpoint of cycle time, the time is preferably 60 minutes or less, more preferably 45 minutes or less, still more preferably 30 minutes or less, and particularly preferably 15 minutes or less.

After removing with the resist peeling liquid, the obtained pattern of the photosensitive resin composition of the present invention is preferably washed with a rinsing solution. Examples of the rinsing solution include water, methanol, ethanol, isopropyl alcohol, ethyl acetate, ethyl lactate, ethyl pyruvate, propylene glycol monomethyl ether, propylene glycol monomethyl ether acetate, methyl 3-methoxypropionate, ethyl 3-ethoxypropionate, or 2-heptanone. When using, as the resist peeling liquid, an acidic resist peeling liquid, or an aqueous solution of a compound exhibiting alkalinity, the rinsing solution preferably contains water.

Examples of the gas used to remove by ashing include a gas containing, as the component, one or more components selected from the group consisting of oxygen, ozone, argon, fluorine, or chlorine. From the viewpoint of removability of the photoresist, the gas preferably contains oxygen or ozone as the component.

Examples of the removing method using ashing include a photoexcitation ashing method in which the substrate, on which the photoresist remains on the coating film of the photosensitive resin composition of the present invention, is exposed to the gas and then irradiated with ultraviolet rays, or a plasma ashing method in which the substrate, on which the photoresist remains on the coating film of the photosensitive resin composition of the present invention, is exposed to the gas ionized or radicalized by electromagnetic wave.

The ashing temperature at which the substrate, on which the photoresist remains on the coating film of the photosensitive resin composition of the present invention, is brought into contact with the gas is preferably 10 to 300° C., more preferably 20 to 250° C., still more preferably 30 to 220° C., and particularly preferably 40 to 200° C.

The ashing time during which the substrate, on which the photoresist remains on the coating film of the photosensitive resin composition of the present invention, is brought into contact with the gas is preferably 10 seconds or more, more preferably 30seconds or more, still more preferably 1 minute or more, particularly preferably 3minutes or more, and most preferably 5 minutes or more. Meanwhile, from the viewpoint of cycle time, the etching time is preferably 60 minutes or less, more preferably 45 minutes or less, still more preferably 30 minutes or less, and particularly preferably 15 minutes or less.

<Step of coating Photosensitive Resin Composition on Substrate in Pattern Shape to Form Film>

Examples of the method of coating a photosensitive resin composition of the present invention in a pattern shape include a relief printing method, an intaglio printing method, a stencil printing method, a lithographic printing method, a screen printing method, an inkjet printing method, an offset printing method, or a laser printing method. The coating film thickness varies depending on the coating method, and the solid component concentration and the viscosity of the photosensitive resin composition of the present invention, and coating is usually performed so that the film thickness after coating and prebaking became 0.1 to 30 µm.

After the photosensitive resin composition of the present invention is coated in a pattern shape on the substrate, prebaking is preferably performed. It is possible to perform prebaking using an oven, a hot plate, infrared rays, a flash annealing device, or a laser annealing device. The prebaking temperature is preferably 50 to 150° C. The prebaking time is preferably 30 seconds to several hours. Prebaking can be performed in two or more stages, for example, prebaking is performed at 120° C. for 2 minutes after prebaking at 80° C. for 2 minutes. By coating and prebaking in a pattern shape on the substrate, a pattern of the photosensitive resin composition of the present invention is obtained.

After obtaining the photosensitive resin composition of the present invention by one or more methods selected from the group consisting of a photolithographic method, an etching method, or a method of coating in a pattern shape to form a film, breaching exposure can be performed. Breaching exposure makes a pattern shape after thermal curing satisfactory, thus obtaining a pattern having a shape similar to the rectangular shape. It is also possible to improve transparency of the cured film.

It is possible to use an aligner such as a stepper, a mirror projection mask aligner (MPA), or a parallel light mask aligner (PLA) in breaching exposure. Examples of active chemical rays used for irradiation during breaching exposure include ultraviolet rays, visible rays, electron beams, X-rays, KrF (wavelength of 248 nm) laser, or ArF (wavelength of 193 nm) laser. It is preferred to use j-line (wavelength of 313 nm), i-line (wavelength of 365 nm), h-line (wavelength of 405 nm), or g-line (wavelength of 436 nm) of a mercury lamp. The exposure dose is usually about 500 to 500,000 J/m$^2$ (50 to 50,000 mJ/cm$^2$) (value of i-line illuminometer), and exposure can be optionally performed through a mask having a desired pattern.

After obtaining a pattern of the composition including a polysiloxane, middle baking can be performed. Middle baking enables an improvement in resolution after thermal curing and control of a pattern shape after thermal curing. It is possible to perform middle baking using an oven, a hot plate, infrared rays, a flash annealing device, or a laser annealing device. The middle baking temperature is preferably 50 to 250° C., and more preferably 70 to 220° C. The middle baking time is preferably 10 seconds to several hours. Middle baking can be performed in two or more stages, for example, middle baking is performed at 150° C. for 5 minutes after middle baking at 100° C. for 5 minutes.

<Thermal Curing Step>

It is preferred that the method for manufacturing a semiconductor device of the present invention includes, as (1) the step of obtaining a pattern of the photosensitive resin composition of the present invention or a cured product thereof on a substrate, (1-1) the step of heating a pattern of the photosensitive resin composition of the present invention to 150 to 1,500° C. It is possible to perform thermal curing using an oven, a hot plate, a vertical furnace, a horizontal furnace, an electric furnace, a flash annealing device, a laser annealing device, or infrared rays. The coating film of the photosensitive resin composition of the present invention is allowed to undergo thermal curing by heating to 150 to 1,500° C., thereby, it is possible to improve ion suppression property, chemical resistance, and dry etching resistance of the cured film.

In the method for manufacturing a semiconductor device of the present invention, the thermal curing temperature of the step (1-1) is preferably 200° C. or higher, more preferably 250° C. or higher, still more preferably 300° C. or higher, and particularly preferably 400° C. or higher. When the thermal curing temperature is within the above range, it is possible to improve ion suppression property of the cured film. Meanwhile, from the viewpoint of suppression of the occurrence of cracking during thermal curing, the thermal curing temperature is preferably 800° C. or lower, more preferably 600° C. or lower, still more preferably 500° C. or lower, and particularly preferably 450° C. or lower.

In the method for manufacturing a semiconductor device of the present invention, the thermal curing time of the step (1-1) is preferably 1 to 300 minutes, more preferably 5 to 250 minutes, still more preferably 10 to 200 minutes, and particularly preferably 30 to 150 minutes. When the thermal curing times is within the above range, it is possible to suppress the occurrence of cracking during thermal curing and to improve transparency and ion suppression property of the cured film. Thermal curing can be performed in two or more stages, for example, thermal curing is performed at 400° C. for 30 minutes after thermal curing at 250° C. for 30 minutes.

In the method for manufacturing a semiconductor device of the present invention, it is difficult to remove the pattern of the composition containing a polysiloxane in the below-mentioned step of removing the pattern after the below-mentioned step of forming an impurity region, since numerous residues are sometimes formed or the cured film sometimes remains after a treatment with an acidic or alkali chemical solution.

This is because the pattern deteriorates due to ion implantation or ion doping of the composition containing a polysiloxane to the pattern in the ion implantation step or the ion doping step. Deterioration of the pattern leads to a decrease in solubility in the acidic or alkali chemical solution, and thus making it difficult to remove the pattern. Particularly, since positive or negative photosensitivity is imparted to the composition, numerous residues are sometimes formed and the cured film sometimes remains in the pattern of the photosensitive composition containing a photosensitive organic compound, after the step of forming an impurity region, for example, after a treatment with hydrofluoric acid.

Figure 3:
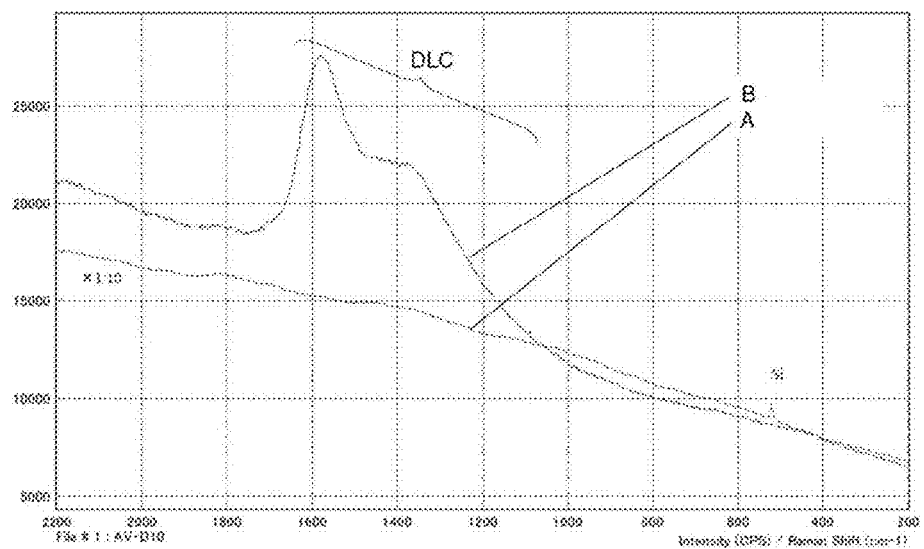
FIG. 3 is a Raman spectrum before and after ion implantation of a pattern of a photosensitive resin composition of the present invention.

A description will be made on deterioration of the pattern of the composition containing a polysiloxane before and after the ion implantation step with reference to FIG. 3. With respect to a pattern obtained by using a composition including a polysiloxane having an alkyl group and an aryl group, and a compound having a naphthoquinone diazide structure, oblique cutting Raman spectrometry of the pattern was performed before and after the ion implantation step. As a result, a spectrum shown in FIG. 3 was obtained. In FIG. 3, the symbol A denotes a spectrum before ion implantation, and the symbol B denotes a spectrum after ion implantation.

As shown in FIG. 3, after the ion implantation step, a peak of diamond-like carbon (hereinafter referred to as "DLC") was detected. A peak having a main peak at around 1,580 cm$^{-1}$ and a peak having a shoulder band at around 1,390 cm$^{-1}$ are peaks of DLC. Therefore, it is considered that an organic substance existing in the pattern deteriorates in the ion implantation step to form chemically stable DLC, thus making it difficult to remove with an acidic or alkali chemical solution.

Also in the ion doping step, a reaction between a gas or liquid of a compound including an element constituting an impurity region and a pattern of the composition including a polysiloxane and ion doping to the pattern causes deterioration of the pattern. After the ion doping step, deterioration of the pattern leads to a decrease in solubility with an acidic or alkali chemical solution, thus making it difficult to remove the pattern.

Therefore, it is more preferred that the method for manufacturing a semiconductor device of the present invention includes, as (1) the step of obtaining a pattern of the photosensitive resin composition of the present invention or a cured product thereof on a substrate, (1-1a) the step of heating a pattern of the photosensitive resin composition of the present invention to 500 to 1,500° C. The pattern is allowed to undergo thermal curing by heating to 500 to 1,500° C., thereby, it is possible to easily remove a cured film of the composition including a polysiloxane after formation of an impurity region to the below-mentioned semiconductor substrate without causing formation of residues, and thus making it possible to shorten the step required to remove the cured film.

The pattern is allowed to undergo thermal curing by heating to 500 to 1,500° C., thereby, a bond of an organic substance in the pattern is cleaved and thermal decomposition and volatilization of the organic substance proceed, and also the pattern is converted into $SiO_2$. Therefore, it becomes possible to easily remove the pattern without causing formation of residues after formation of an impurity region on the below-mentioned semiconductor substrate. Namely, since the pattern is converted into $SiO_2$, it becomes possible to easily remove the pattern without causing formation of residues in the step of forming the below-mentioned first impurity region, from the viewpoint of suppression of deterioration of the pattern of the composition including a polysiloxane.

The pattern is converted into $SiO_2$ by heating the pattern to 500 to 1,500° C. to undergo thermal curing, thus obtaining the same effect as that of the below-mentioned firing step. Therefore, the step (1-1a) can also serve as the below-mentioned firing step, thus enabling shortening of the step required to remove the pattern.

Figure 4:
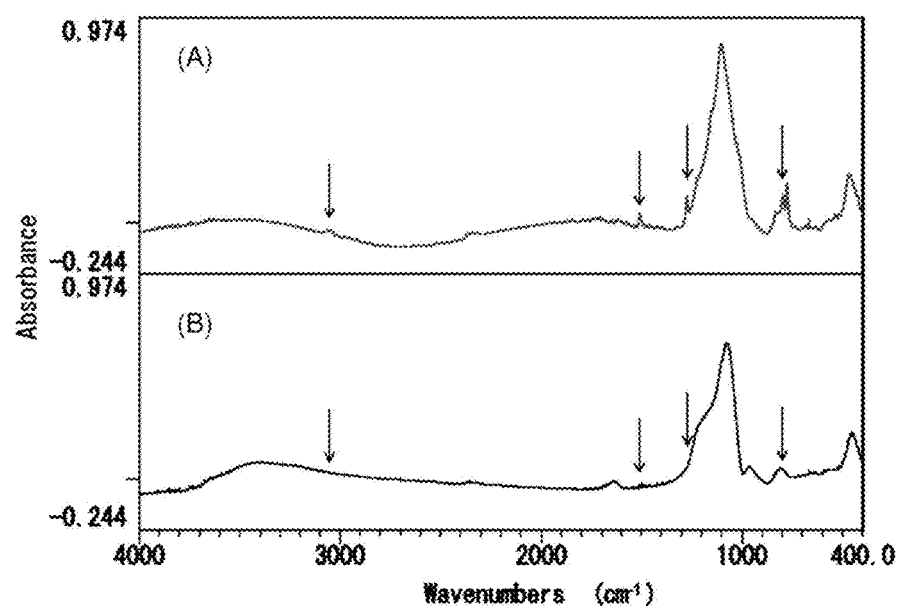
FIG. 4 is an infrared (IR) spectrum before and after firing of a pattern of a photosensitive resin composition of the present invention.

A description will be made on conversion of the pattern of the composition including a polysiloxane into $SiO_2$ before and after the step (1-1a) with reference to FIG. 4. With respect to a pattern obtained by using a composition including a polysiloxane having an alkyl group and an aryl group and a compound having a naphthoquinone diazide structure, an IR spectrum of the pattern was measured before and after the firing step of the pattern. As a result, a spectrum shown in FIG. 4 was obtained. FIG. 4(A) shows an IR spectrum of a pattern of the composition including a polysiloxane before the step (1-1a), and FIG. 4(B) shows an IR spectrum of a pattern of the composition including a polysiloxane after the step (1-1a)

A peak at around 3,050 $cm^{-1}$, a peak at around 1,500 $cm^{-1}$, a peak at around 1,290 $cm^{-1}$, and a peak having a shoulder band at around 800 $cm^{-1}$ are peaks of an organic substance, and disappeared after the step (1-1a). As seen from the above, it is possible to confirm that the pattern is converted into $SiO_2$ by disappearance of the peak of the organic substance after the step (1-1a).

In the step (1-1a), from the viewpoint of removability of the pattern of the composition including a polysiloxane and cycle time, it is preferred that the pattern is fired under an air or oxygen atmosphere at 500 to 1,500° C.

Examples of under the air or oxygen atmosphere include under air at normal pressure, under a gas containing 10 to 100% by weight of oxygen (hereinafter referred to as "oxygen-containing gas") at normal pressure, under airflow at a flow rate of 10 to 1,000 L/min, or under an oxygen-containing gas flow at a flow rate of 10 to 1,000 L/min. It is possible to use an oven, a hot plate, a vertical furnace, a horizontal furnace, an electric furnace, a flash lamp annealing device, a laser annealing device, or infrared rays in the step (1-1a).

In the method for manufacturing a semiconductor device of the present invention, from the viewpoint of cycle time, the thermal curing temperature of the step (1-1a) is preferably 550° C. or higher, more preferably 600° C. or higher, still more preferably 700° C. or higher, and particularly preferably 800° C. or higher. When the thermal curing temperature is within the above range, decomposition of the organic substance is promoted and conversion into $SiO_2$ proceeds easily, thus making it easier to remove the pattern. Conversion into $SiO_2$ proceeds by a treatment within a short time, thus making it possible to shorten cycle time.

In the method for manufacturing a semiconductor device of the present invention, from the viewpoint of removability of a pattern of the composition including a polysiloxane, the thermal curing time of the step (1-1a) is preferably 1 minute or more, more preferably 5 minutes or more, still more preferably 10 minutes or more, and particularly preferably 30 minutes or more. Meanwhile, from the viewpoint of cycle time, the thermal curing time is preferably 300 minutes or less, more preferably 240 minutes or less, still more preferably 180 minutes or less, and particularly preferably 120 minutes or less. Firing can be performed in two or more stages, for example, firing is performed at 600° C. for 30 minutes after firing at 400° C. for 30 minutes.

In the method for manufacturing a semiconductor device of the present invention, the thermal curing time of the step (1-1) is preferably 1 to 300 minutes, more preferably 5 to 250 minutes, still more preferably 10 to 200 minutes, and particularly preferably 30 to 150 minutes. When the thermal curing times is within the above range, it is possible to suppress the occurrence of cracking during thermal curing and to improve transparency and ion suppression property of the cured film. Thermal curing can be performed in two or more stages, for example, thermal curing is performed at 400° C. for 30 minutes after thermal curing at 250° C. for 30 minutes.

The effect of the step (1-1a) such as removability of the pattern or shortening of cycle time is not limited to the step of removing the pattern after the below-mentioned step of forming an impurity region. The effect of the step (1-1a) is to convert the pattern into $SiO_2$ by heating the pattern to 500 to 1,500° C. to undergo thermal curing. Therefore, in the below-mentioned step of patterning a substrate, specifically, the step of removing a pattern after the step of performing dry etching or the step of performing wet etching, it is possible to easily remove the pattern without causing formation of residues, thus making it possible to shorten the step required to remove the pattern.

<Step of Forming First Impurity Region and Step of Patterning Substrate>

The method for manufacturing a semiconductor device of the present invention includes (2) the step of forming an impurity region on a substrate, on which a pattern of the photosensitive resin composition of the present invention or a cured product thereof is formed and/or the step of patterning a substrate formed with the pattern.

Examples of (2) the step of forming an impurity region on a substrate, on which a pattern of the photosensitive resin composition of the present invention or a cured product thereof is formed, include (2-A) the step of implanting ions into the substrate formed with the pattern, or (2-B) the step of exposing the substrate formed with the pattern to dopants. Examples of (2) the step of patterning the substrate formed with the pattern include (2-C) the step of patterning the substrate formed with the pattern by dry etching, or (2-D) the step of patterning the substrate formed with the pattern by wet etching. It is preferred that the method for manufacturing a semiconductor device of the present invention includes, as the step (2), one or more steps selected from the group consisting of the steps (2-A), (2-B), (2-C), and (2-D).

<Step of Performing Ion Implantation>

By implanting ions into the substrate formed with the pattern using a pattern of the photosensitive resin composition of the present invention or a cured product thereof as an ion implantation mask, it is possible to form the pattern-shaped first impurity region in the substrate.

In the method for manufacturing a semiconductor device of the present invention, (2-A) the step of implanting ions into the substrate formed with a pattern of the photosensitive resin composition of the present invention or a cured product thereof is the step of ionizing an element constituting the impurity region from a compound containing the element, followed by collision with the substrate of the lower layer of the pattern using the pattern as an ion implantation mask to form the impurity region in the substrate.

In the method for manufacturing a semiconductor device of the present invention, examples of the element constituting an impurity region formed by ion implantation used in the step (2-A) include boron, aluminum, gallium, indium, nitrogen, phosphorus, arsenic, antimony, carbon, silicon, germanium, tin, oxygen, sulfur, selenium, tellurium, fluorine, chlorine, bromine, iodine, cadmium, zinc, titanium, tungsten, or iron.

Examples of the compound containing an element constituting an impurity region include boron trifluoride, boron trichloride, boron tribromide, trimethyl boronate, diborane, aluminum trichloride, gallium trichloride, indium trichloride, ammonia, nitrous oxide, nitrogen, phosphine, phosphorus trifluoride, phosphorus pentafluoride, phosphoryl chloride, phosphorus pentaoxide, phosphoric acid, arsine, arsenic trifluoride, antimony pentachloride, carbon tetrachloride, monosilane, disilane, trisilane, dichlorosilane, trichlorosilane, silicon tetrafluoride, silicon tetrachloride, germane, tin tetrachloride, oxygen, hydrogen sulfide, hydrogen selenide, hydrogen telluride, hydrogen fluoride, chlorofluorocarbon, fluorine, chlorine trifluoride, hydrogen chloride, chlorine, hydrogen bromide, bromine, hydrogen iodide, iodine, cadmium dichloride, zinc dichloride, titanium tetrachloride, tungsten hexafluoride, or iron trichloride.

In the method for manufacturing a semiconductor device of the present invention, it is preferred that ions are allowed to collide with the substrate while heating the substrate in the step (2-A). When ion implantation is performed, the ion implantation temperature is generally 10 to 1,000° C., preferably 100° C. or higher, more preferably 200° C. or higher, still more preferably 300° C. or higher, particularly preferably 400° C. or higher, and most preferably 500° C. or higher. When the ion implantation temperature is within the above range, it is possible to suppress damage to a crystal structure of the substrate during ion implantation.

In the method for manufacturing a semiconductor device of the present invention, it is preferred that ions are accelerated by applying a bias and allowed to collide with the substrate in the step (2-A). When ion implantation is performed, acceleration energy of ions is generally 1 to 10,000 keV. From the viewpoint of the depth of implantation of ions into the substrate is preferably 1 to 5,000 keV, more preferably 5 to 1,000 keV, and still more preferably 10 to 500 keV.

In the method for manufacturing a semiconductor device of the present invention, the ion dose of the step (2-A) is generally $1\times10^{10}$ to $1\times10^{20}$ cm$^{-2}$. From the viewpoint of suppression of damage to a crystal structure of the substrate and a depth of implantation of ions into the substrate, the ion dose is preferably $1\times10^{10}$ to $1\times10^{17}$ cm$^{-2}$, and more preferably $1\times10^{11}$ to $1\times10^{15}$ cm$^{-2}$.

<Step of Performing Dopant Exposure>

By exposing the substrate formed with the pattern to dopants using a pattern of the photosensitive resin composition of the present invention or a cured product thereof as a dopant exposure mask, it is possible to form the pattern-shaped first impurity region in the substrate.

In the method for manufacturing a semiconductor device of the present invention, (2-B) the step of exposing a substrate formed with a pattern of the photosensitive resin composition of the present invention or a cured product thereof to dopants is the step of exposing the substrate of the lower layer of the pattern to a compound containing an element constituting an impurity region using the pattern as a dopant exposure mask to form an impurity region in the substrate.

In the method for manufacturing a semiconductor device of the present invention, examples of the element constituting an impurity region by dopant exposure used in the step (2-B) include boron, aluminum, gallium, indium, nitrogen, phosphorus, arsenic, antimony, carbon, silicon, germanium, tin, oxygen, sulfur, selenium, tellurium, fluorine, chlorine, bromine, iodine, cadmium, zinc, titanium, tungsten, or iron.

Examples of the compound containing an element constituting an impurity region include boron trifluoride, boron trichloride, boron tribromide, trimethyl boronate, diborane, aluminum trichloride, gallium trichloride, indium trichloride, ammonia, nitrous oxide, nitrogen, phosphine, phosphorus trifluoride, phosphorus pentafluoride, phosphoryl chloride, phosphorus pentaoxide, phosphoric acid, arsine, arsenic trifluoride, antimony pentachloride, carbon tetrachloride, monosilane, disilane, trisilane, dichlorosilane, trichlorosilane, silicon tetrafluoride, silicon tetrachloride, germane, tin tetrachloride, oxygen, hydrogen sulfide, hydrogen selenide, hydrogen telluride, hydrogen fluoride, chlorofluorocarbon, fluorine, chlorine trifluoride, hydrogen chloride, chlorine, hydrogen bromide, bromine, hydrogen iodide, iodine, cadmium dichloride, zinc dichloride, titanium tetrachloride, tungsten hexafluoride, or iron trichloride.

In the method for manufacturing a semiconductor device of the present invention, it is preferred that a compound containing an element constituting an impurity region is heated by exposing to a substrate in the step (2-B). When performing dopant exposure, the dopant exposure temperature is generally 10 to 1,500° C., preferably 100° C. or higher, more preferably 200° C. or higher, still more preferably 300° C. or higher, particularly preferably 400° C. or higher, and most preferably 500° C. or higher. When the dopant exposure temperature is within the above range, it becomes easy for the element constituting the impurity region to diffuse into the substrate.

In the method for manufacturing a semiconductor device of the present invention, the dopant exposure times of the step (2-B) is preferably 1 minute or more, more preferably 5 minutes or more, still more preferably 10 minutes or more, and most preferably 30 minutes or more. When the dopant exposure time is within the above range, it becomes easy for the element constituting the impurity region to diffuse into the substrate. Meanwhile, from the viewpoint of cycle time, the dopant exposure time is preferably 300 minutes or less, more preferably 240 minutes or less, still more preferably 180 minutes or less, and particularly preferably 120 minutes or less.

<Step of Performing Dry Etching>

Using a pattern of the photosensitive resin composition of the present invention or a cured product thereof as a dry etching mask, by subjecting a substrate formed with the pattern to dry etching, the substrate can be formed into a pattern shape.

In the method for manufacturing a semiconductor device of the present invention, (2-C) the step of patterning a substrate formed with a pattern of the photosensitive resin composition of the present invention or a cured product thereof by dry etching is the step of patterning a substrate of the lower layer of the pattern using an etching gas, using the pattern as a dry etching mask.

Examples of the etching gas include fluoromethane, difluoromethane, trifluoromethane, tetrafluoromethane, chlorofluoromethane, chlorodifluoromethane, chlorotrifluoromethane, dichlorofluoromethane, dichlorodifluoromethane, trichlorofluoromethane, sulfur hexafluoride, xenon difluoride, oxygen, ozone, argon, fluorine, chlorine, or boron trichloride.

Examples of the method of dry etching include a method of a reactive gas etching in which a substrate formed with a pattern of the photosensitive resin composition of the present invention or a cured product thereof is exposed to the etching gas; a method of plasma etching in which a substrate formed with a pattern of the photosensitive resin composition of the present invention or a cured product thereof is exposed to an etching gas ionized or radicalized by electromagnetic wave; or a method of reactive ion etching in which an etching gas ionized or radicalized by electromagnetic wave is accelerated by applying a bias and collided with a substrate formed with a pattern of the photosensitive resin composition of the present invention or a cured product thereof.

In the method for manufacturing a semiconductor device of the present invention, the etching temperature of the step (2-C) is generally 10 to 400° C., preferably 20° C. or higher, more preferably 60° C. or higher, still more preferably 100° C. or higher, and particularly preferably 120° C. or higher. When the etching temperature is within the above range, it is possible to improve the etching rate. Meanwhile, from the viewpoint of suppression of an increase in pattern size due to side etching, the etching temperature is preferably 300° C. or lower, more preferably 250° C. or lower, still more preferably 200° C. or lower, and particularly preferably 150° C. or lower.

In the method for manufacturing a semiconductor device of the present invention, the etching time of the step (2-C) is preferably 10 seconds or more, more preferably 30 seconds or more, still more preferably 1 minute or more, particularly preferably 3 minutes or more, and most preferably 5 minutes or more. Meanwhile, from the viewpoint of cycle time, the etching time is preferably 60 minutes or less, more preferably 45 minutes or less, still more preferably 30 minutes or less, and particularly preferably 15 minutes or less.

<Step of Performing Wet Etching>

By wet etching of a substrate formed with the pattern using a pattern of the photosensitive resin composition of the present invention or a cured product thereof as a wet etching mask, the substrate can be formed into the pattern shape.

In the method for manufacturing a semiconductor device of the present invention, (2-D) the step of patterning a substrate formed with the pattern of the photosensitive resin composition of the present invention or a cured product thereof by wet etching is the step of patterning a substrate of the lower layer of the pattern by using the pattern as an etching mask using an etching solution. It is possible to use, as the etching solution, an acidic or alkali chemical solution.

Examples of the acidic etching solution include a solution of a compound exhibiting acidity, such as hydrofluoric acid, hydrochloric acid, hydrobromic acid, hydroiodic acid, perchloric acid, chloric acid, chlorous acid, hypochlorous acid, perbromic acid, bromic acid, bromous acid, hypobromic acid, periodic acid, iodic acid, iodous acid, hypoiodous acid, sulfuric acid, sulfurous acid, hyposulfurous acid, nitric acid, nitrous acid, phosphoric acid, phosphorous acid, hypophosphorous acid, phosphonic acid, phosphinic acid, hexafluorophosphoric acid, hexafluoroantimonic acid, boric acid, tetrafluoroboric acid, formic acid, acetic acid, propionic acid, butanoic acid, trifluoroacetic acid, oxalic acid, lactic acid, methanesulfonic acid, p-toluenesulfonic acid, trifluoromethanesulfonic acid, or fluorosulfonic acid.

The alkali etching solution is preferably an organic alkali solution, or an aqueous solution of a compound exhibiting alkalinity. Examples of the organic alkali solution or the compound exhibiting alkalinity include 2-aminoethanol, 2-(dimethylamino)ethanol, 2-(diethylamino)ethanol, diethanolamine, methylamine, ethylamine, dimethylamine, diethylamine, triethylamine, (2-dimethylamino)ethyl acetate, (2-dimethylamino)ethyl (meth)acrylate, cyclohexylamine, ethylenediamine, hexamethylenediamine, ammonia, tetramethyl ammonium hydroxide, tetraethyl ammonium hydroxide, sodium hydroxide, potassium hydroxide, magnesium hydroxide, calcium hydroxide, barium hydroxide, sodium carbonate, or potassium carbonate.

It is possible to use, as the etching solution, a mixed solution containing both of an alkali etching solution and an organic solvent. Examples of the organic solvent include the above-mentioned solvent, diethylene glycol mono-n-butyl ether, ethyl acetate, ethyl pyruvate, ethyl 3-methoxypropionate, ethyl 3-ethoxypropionate, N-methyl-2-pyrrolidone, dimethyl sulfoxide, hexamethylphosphortriamide, methanol, ethanol, isopropyl alcohol, toluene, or xylene.

Examples of the method of wet etching include a method of coating the etching solution as it is or spraying the etching solution in the form of a fine mist on a substrate formed with a pattern of the photosensitive resin composition of the present invention or a cured product thereof; a method of immersing the substrate formed with a pattern of the photosensitive resin composition of the present invention or a cured product thereof, in the etching solution; or a method of irradiating the substrate formed with a pattern of the photosensitive resin composition of the present invention or a cured product thereof, with ultrasonic waves after immersion in the etching solution.

In the method for manufacturing a semiconductor device of the present invention, the etching temperature of the step (2-D) is generally 10 to 400° C., preferably 20° C. or higher, more preferably 60° C. or higher, still more preferably 100° C. or higher, and particularly preferably 120° C. or higher. When the etching temperature is within the above range, it is possible to improve the etching rate. Meanwhile, from the viewpoint of suppression of an increase in pattern size due to side etching, the etching temperature is preferably 300° C. or lower, more preferably 250° C. or lower, still more preferably 200° C. or lower, and particularly preferably 150° C. or lower. The etching temperature is preferably a temperature lower than a boiling point of a component in the etching solution.

In the method for manufacturing a semiconductor device of the present invention, the etching time of the step (2-D) is preferably 10 seconds or more, more preferably 30 seconds or more, still more preferably 1 minute or more, particularly preferably 3 minutes or more, and most preferably 5 minutes or more. Meanwhile, from the viewpoint of cycle time, the etching time is preferably 60 minutes or less, more preferably 45 minutes or less, still more preferably 30 minutes or less, and particularly preferably 15 minutes or less.

After wet etching, a substrate patterned by wet etching is preferably washed with a rinsing solution. Examples of the rinsing solution include water, methanol, ethanol, isopropyl alcohol, ethyl acetate, ethyl lactate, ethyl pyruvate, propylene glycol monomethyl ether, propylene glycol monomethyl ether acetate, methyl 3-methoxypropionate, ethyl 3-ethoxypropionate, or 2-heptanone. When using, as the etching solution, an acidic etching solution, or an aqueous solution of a compound exhibiting alkalinity, the rinsing solution is preferably a solution containing water.

<Step of Removing Pattern>

The method for manufacturing a semiconductor device of the present invention includes (3) the step of removing a pattern of the photosensitive resin composition of the present invention or a cured product thereof.

<Firing Step>

The method for manufacturing a semiconductor device of the present invention can include, as (3) the step of removing a pattern of the photosensitive resin composition of the present invention or a cured product thereof, (3-1) the step of firing the pattern at 300 to 1,500° C. By firing the pattern at 300 to 1,500° C., bond cleavage of an organic substance in the pattern, thermal decomposition of an organic substance, and volatilization of an organic substance proceed, and also cracking occurs in the pattern, leading to promotion of penetration of a chemical solution into the pattern, thus making it possible to easily remove the pattern without causing formation of residues. By firing the pattern at 300 to 1,500° C., decomposition of a modified layer formed in the pattern during ion implantation also proceeds, thus making it possible to easily remove the pattern without causing formation of residues.

From the viewpoint of removability of a pattern of the composition including a polysiloxane and cycle time, it is preferred to fire the pattern under an air or oxygen atmosphere at 300 to 1,500° C. in the firing step.

Examples of under an air or oxygen atmosphere include under an air atmosphere at normal pressure, under a gas containing 10 to 100% by weight of oxygen (hereinafter referred to as "oxygen-containing gas") at normal pressure, under airflow at a flow rate of 10 to 1,000 L/min, or under an oxygen-containing gas flow at a flow rate of 10 to 1,000 L/min.

It is possible to use an oven, a hot plate, a vertical furnace, a horizontal furnace, an electric furnace, a flash lamp annealing device, a laser annealing device, or infrared rays in firing of a pattern.

In the method for manufacturing a semiconductor device of the present invention, from the viewpoint of cycle time, the firing temperature of the firing step is preferably 400° C. or higher, more preferably 500° C. or higher, still more preferably 600° C. or higher, and particularly preferably 800° C. or higher. When the firing temperature is within the above range, decomposition of the organic substance is promoted and conversion into $SiO_2$ proceeds easily, thus making it easier to remove the pattern. Conversion into $SiO_2$ proceeds by a treatment within a short time, thus making it possible to shorten cycle time.

In the method for manufacturing a semiconductor device of the present invention, from the viewpoint of removability of a pattern of the composition including a polysiloxane, the firing time of the firing step is preferably 1 minute or more, more preferably 5 minutes or more, still more preferably 10 minutes or more, and particularly preferably 30 minutes or more. Meanwhile, from the viewpoint of cycle time, the firing time is preferably 300 minutes or less, more preferably 240 minutes or less, still more preferably 180 minutes or less, and particularly preferably 120 minutes or less. Firing can be performed in two or more stages, for example, firing is performed at 600° C. for 30 minutes after firing at 400° C. for 30 minutes.

<Step of Treating Pattern at from 0° C. to Lower than 300° C.>

When the method for manufacturing a semiconductor device of the present invention includes, as (1) the step of obtaining a pattern of the photosensitive resin composition of the present invention or a cured product thereof on a substrate, (1-1a) the step of heating a pattern of the photosensitive resin composition of the present invention to 500 to 1,500° C., it is preferred that (3) the step of removing the pattern includes (3-A) the step of treating the pattern at from 0° C. to lower than 300° C.

In the step (1-1a), since the pattern is converted into $SiO_2$ by heating to 500 to 1,500° C., the step can also serve as the firing step, thus making it possible to easily remove the pattern without causing formation of residues and to shorten the step required to remove the pattern. Namely, process time can be shorted since the firing step can be omitted.

In the step (1-1a), since the pattern has already converted into $SiO_2$, the pattern can be easily removed without causing formation of residues even when the subsequent step is treated at 0 to 300° C., thus making it possible to shorten cycle time.

Examples of the step (3-A) include the step of immersing in the below-mentioned solution containing hydrofluoric acid, the step of performing an ultraviolet ray treatment, the step of performing a plasma treatment, or the step of immersing in a chemical solution containing one or more chemicals selected from the group consisting of an alkali solution, an organic solvent, an acidic solution, and an oxidizing agent.

In the method for manufacturing a semiconductor device of the present invention, from the viewpoint of shorting of cycle time, the treatment temperature of the step (3-A) is preferably 250° C. or lower, more preferably 200° C. or lower, still more preferably 150° C. or lower, and particularly preferably 100° C. or lower. Meanwhile, from the viewpoint of removability of the pattern, the treatment temperature is preferably 10° C. or higher, more preferably 20° C. or higher, still more preferably 40° C. or higher, and particularly preferably 60° C. or higher.

In the method for manufacturing a semiconductor device of the present invention, from the viewpoint of removability of a pattern, the treatment time of the step (3-A) is preferably 10 seconds or more, more preferably 30 seconds or more, still more preferably 1 minute or more, particularly preferably 3 minutes or more, and most preferably 5 minutes or more. Meanwhile, from the viewpoint of cycle time, the treatment time is preferably 60 minutes or less, more preferably 45 minutes or less, still more preferably 30 minutes or less, and particularly preferably 15 minutes or less.

<Step of Immersing in Solution Containing Hydrofluoric Acid>

The method for manufacturing a semiconductor device of the present invention can include, as (3) the step of removing a pattern of the photosensitive resin composition of the present invention or a cured product thereof, (3-2) the step of immersing the pattern in a solution containing hydrofluoric acid. Immersion in the solution containing hydrofluoric acid makes it possible to easily remove the pattern without causing formation of residues. When the solution contains hydrofluoric acid, it becomes possible to easily remove the pattern without causing formation of residues by effectively dissolving components derived from silicon in the pattern, such as a silane coupling agent, silicone, siloxane, silica particles, or silicon dioxide.

The solution containing hydrofluoric acid can include a compound capable of generating fluoride ions. Inclusion of the compound capable of generating fluoride ions leads to an improvement in lifetime of a solution containing hydrofluoric acid.

Examples of the compound capable of generating fluoride ions include ammonium fluoride, lithium fluoride, sodium fluoride, potassium fluoride, magnesium fluoride, calcium fluoride, strontium fluoride, barium fluoride, aluminum fluoride, or zinc fluoride.

The content of hydrofluoric acid in the solution containing hydrofluoric acid is preferably 10% by weight or more, more preferably 15% by weight or more, and still more preferably 20% by weight or more. When the content of hydrofluoric acid is within the above range, it becomes possible to shorten the time required to remove the pattern.

In the method for manufacturing a semiconductor device of the present invention, the immersion temperature of the step (3-2) for immersion in a solution containing hydrofluoric acid is preferably 10 to 40° C., more preferably, 12 to 35° C., and still more preferably 15 to 30° C. When the immersion temperature is within the above range, it becomes possible to shorten the time required to remove the pattern thus improving lifetime of the solution.

In the method for manufacturing a semiconductor device of the present invention, from the viewpoint of removability of the pattern, the immersion time of the step (3-2) for immersion in a solution containing hydrofluoric acid is preferably 10 seconds or more, more preferably 30 seconds or more, still more preferably 1 minute or more, particularly preferably 3 minutes or more, and most preferably 5 minutes or more. Meanwhile, from the viewpoint of cycle time, the immersion time is preferably 30 minutes or less, more preferably 20 minutes or less, still more preferably 10 minutes or less, and particularly preferably 5 minutes or less.

In the method for manufacturing a semiconductor device of the present invention, a solution containing hydrofluoric acid of the step (3-2) can further contain nitric acid and/or sulfuric acid. When the solution contains nitric acid as a strong acid having oxidizability, permeability of a chemical solution in the pattern is improved and bond cleavage in the pattern is promoted, thus making it possible to easily remove the pattern without causing formation of residues. When the solution contains sulfuric acid having strong oxidizability, decomposition of an organic substance in the pattern is promoted, thus enabling suppression of formation of residues after removal of the pattern.

The content of hydrofluoric acid in the solution containing hydrofluoric acid and nitric acid is preferably 10 to 65% by weight, more preferably 10 to 50% by weight, and still more preferably 10 to 45% by weight. When the content of hydrofluoric acid is within the above range, it becomes possible to shorten the time required to remove the pattern.

The content of nitric acid in the solution containing hydrofluoric acid and nitric acid is preferably 5 to 60% by weight, more preferably 10 to 55% by weight, and still more preferably 15 to 50% by weight. When the content of nitric acid is within the above range, it becomes possible to shorten the time required to remove the pattern.

The content of hydrofluoric acid in the solution containing hydrofluoric acid and sulfuric acid is preferably 10% by weight or more, more preferably 15% by weight or more, and still more preferably 20% by weight or more. When the content of hydrofluoric acid is within the above range, it becomes possible to shorten the time required to remove the pattern.

The content of sulfuric acid in the solution containing hydrofluoric acid and sulfuric acid is preferably 5 to 70% by weight, more preferably 10 to 65% by weight, and still more preferably 15 to 60% by weight. When the content of sulfuric acid is within the above range, it becomes possible to shorten the time required to remove the pattern.

The content of hydrofluoric acid in the solution containing hydrofluoric acid, nitric acid, and sulfuric acid is preferably 10 to 65% by weight, more preferably 10 to 50% by weight, and still more preferably 10 to 45% by weight. When the content of hydrofluoric acid is within the above range, it becomes possible to shorten the time required to remove the pattern.

The content of nitric acid in the solution containing hydrofluoric acid, nitric acid, and sulfuric acid is preferably 5 to 60% by weight, more preferably 10 to 55% by weight, and still more preferably 15 to 50% by weight. When the content of nitric acid is within the above range, it becomes possible to shorten the time required to remove the pattern.

The content of sulfuric acid in the solution containing hydrofluoric acid, nitric acid, and sulfuric acid is preferably 5 to 70% by weight, more preferably 10 to 65% by weight, and still more preferably 15 to 60% by weight. When the content of sulfuric acid is within the above range, it becomes possible to shorten the time required to remove the pattern.

After the step of immersing in a solution containing hydrofluoric acid, it is preferred to wash the substrate, from which the pattern is removed, with a rinsing solution.

Examples of the rinsing solution include water, methanol, ethanol, isopropyl alcohol, ethyl acetate, ethyl lactate, ethyl pyruvate, propylene glycol monomethyl ether, propylene glycol monomethyl ether acetate, methyl 3-methoxypropionate, ethyl 3-ethoxypropionate, or 2-heptanone. The rinsing solution preferably contains water.

<Step of Performing Additional Treatment>

The method for manufacturing a semiconductor device of the present invention includes, as (3) the step of removing a pattern of the photosensitive resin composition of the present invention or a cured product thereof, any one of the steps of (3-2) the step of immersing the pattern in a solution containing hydrofluoric acid, followed by (3-3) the step of subjecting to an ultraviolet ray treatment, (3-4) the step of performing a plasma treatment, and (3-5) the step of immersing in a chemical solution containing one or more selected from the group consisting of an alkali solution, an organic solvent, an acidic solution, and an oxidizing agent (hereinafter referred to as a "specific chemical solution"). These steps are introduced in place of shortening the immersion time of the step (3-2), and an object thereof is to shorten process time in total by using one or more steps selected from the group consisting of the steps (3-2), (3-3), (3-4), and (3-5).

<Step of Performing Ultraviolet Ray Treatment and Step of Performing Plasma Treatment>

In the method for manufacturing a semiconductor device of the present invention, examples of a gas used in (3-3) the step of performing an ultraviolet ray treatment or (3-4) the step of performing a plasma treatment include a gas containing, as the component, one or more components selected from the group consisting of oxygen, ozone, argon, fluorine, or chlorine. From the viewpoint of removability of the pattern of the photosensitive resin composition of the present invention or a cured product thereof, a gas containing oxygen or ozone as the component is preferable.

The step (3-3) includes, for example, the step of exposing a substrate formed with a pattern of the photosensitive resin composition of the present invention or a cured product thereof to the gas, followed by irradiation with ultraviolet rays. The wavelength of ultraviolet rays used in the step (3-3) is generally 10 to 450 nm, and is preferably 20 to 400 nm, and more preferably 50 to 350 nm from the viewpoint of removability of the pattern.

The step (3-4) includes, for example, the step of exposing a substrate formed with a pattern of the photosensitive resin composition of the present invention or a cured product thereof to the gas ionized or radicalized by electromagnetic wave.

In the method for manufacturing a semiconductor device of the present invention, from the viewpoint of removability of the pattern, the treatment temperature of the step (3-3) or (3-4) is preferably 10 to 300° C., more preferably 20 to 250° C., still more preferably 30 to 220° C., and particularly preferably 40 to 200° C.

In the method for manufacturing a semiconductor device of the present invention, from the viewpoint of removability of the pattern, the treatment time of the step (3-3) or (3-4) is preferably 10 seconds or more, more preferably 30 seconds or more, still more preferably 1 minute or more, particularly preferably 3 minutes or more, and most preferably 5 minutes or more.

<Step of Immersing in Other Chemical Solution>

In the method for manufacturing a semiconductor device of the present invention, it is preferred to select, as a chemical solution used in (3-5) the step of immersing in a specific chemical solution, a chemical solution capable of dissolving a component in the pattern of the photosensitive resin composition of the present invention or a cured product thereof to be removed, thus making it possible to shorten the time required to remove the pattern.

The alkali solution is preferably an organic alkali solution, or an aqueous solution of a compound exhibiting alkalinity. Examples of the organic alkali solution or the compound exhibiting alkalinity include 2-aminoethanol, 2-(dimethylamino)ethanol, 2-(diethylamino)ethanol, diethanolamine, methylamine, ethylamine, dimethylamine, diethylamine, triethylamine, (2-dimethylamino)ethyl acetate, (2-dimethylamino)ethyl (meth)acrylate, cyclohexylamine, ethylenediamine, hexamethylenediamine, ammonia, tetramethyl ammonium hydroxide, tetraethyl ammonium hydroxide, sodium hydroxide, potassium hydroxide, magnesium hydroxide, calcium hydroxide, barium hydroxide, sodium carbonate, or potassium carbonate. From the viewpoint of solubility of the pattern, 2-aminoethanol, 2-(diethylamino) ethanol, diethanolamine, diethylamine, triethylamine, ethylenediamine, hexamethylenediamine, ammonia, tetramethyl ammonium hydroxide, sodium hydroxide, potassium hydroxide, sodium carbonate, or potassium carbonate are preferable.

The content of the organic alkali solution or the compound exhibiting alkalinity in the alkali solution is preferably 0.01% by weight or more, more preferably 0.1% by weight or more, still more preferably 1% by weight or more, and particularly preferably 10% by weight or more. When the content of the organic alkali solution or the compound exhibiting alkalinity is within the above range, it becomes possible to shorten the time required to remove the pattern.

Examples of the organic solvent include hydroxyacetone, 4-hydroxy-2-butanone, 3-hydroxy-3-methyl-2-butanone, 4-hydroxy-3-methyl-2-butanone, 5-hydroxy-2-pentanone, 4-hydroxy-2-pentanone, 4-hydroxy-4-methyl-2-pentanone (diacetone alcohol), methyl lactate, ethyl lactate, n-propyl lactate, n-butyl lactate, ethylene glycol monomethyl ether, ethylene glycol monoethyl ether, ethylene glycol mono-n-propyl ether, ethylene glycol mono-n-butyl ether, propylene glycol monomethyl ether, propylene glycol monoethyl ether, propylene glycol mono-n-propyl ether, propylene glycol mono-n-butyl ether, propylene glycol mono-t-butyl ether, diethylene glycol monomethyl ether, diethylene glycol monoethyl ether, diethylene glycol mono-n-propyl ether, diethylene glycol mono-n-butyl ether, dipropylene glycol monomethyl ether, dipropylene glycol monoethyl ether, dipropylene glycol mono-n-propyl ether, 3-methoxy-1-butanol, 3-methoxy-3-methyl-1-butanol, tetrahydrofurfuryl alcohol, n-butanol, n-pentanol, methyl acetate, ethyl acetate, n-propyl acetate, n-butyl acetate, isobutyl acetate, 3-methoxy-n-butyl acetate, 3-methyl-3-methoxy-n-butyl acetate, ethylene glycol monomethyl ether acetate, propylene glycol monomethyl ether acetate, acetone, ethylmethyl ketone, methyl n-propyl ketone, methyl n-butyl ketone, methyl isobutyl ketone, diisobutyl ketone, 2-heptanone, acetylacetone, cyclopentanone, cyclohexanone, cycloheptanone, γ-butyrolactone, γ-valerolactone, δ-valerolactone, propylene carbonate, N-methylpyrrolidone, N,N'-dimethylformamide, N,N'-dimethylacetamide, 1,3-dimethyl-2-imidazolidinone, N,N'-dimethylpropylene urea, N,N,N',N'-tetramethyl urea, dimethyl sulfoxide, hexamethylphosphoric acid triamide, diethylene glycol dimethyl ether, diethylene glycol diethyl ether, diethylene glycol ethyl methyl ether, diethylene glycol di-n-propyl ether, dipropylene glycol dimethyl ether, dipropylene glycol diethyl ether, dipropylene glycol ethyl methyl ether, or dipropylene glycol di-n-propyl ether. From the viewpoint of solubility of the pattern, the organic solvent is preferably hydroxyacetone, 5-hydroxy-2-pentanone, 4-hydroxy-2-pentanone, diacetone alcohol, ethyl lactate, n-propyl lactate, n-butyl lactate, ethylene glycol monomethyl ether, ethylene glycol monoethyl ether, propylene glycol monomethyl ether, propylene glycol monoethyl ether, diethylene glycol monomethyl ether, diethylene glycol monoethyl ether, diethylene glycol mono-n-propyl ether, diethylene glycol mono-n-butyl ether, dipropylene glycol monomethyl ether, dipropylene glycol monoethyl ether, ethyl acetate, n-propyl acetate, n-butyl acetate, isobutyl acetate, ethylene glycol monomethyl ether acetate, propylene glycol monomethyl ether acetate, acetone, ethylmethyl ketone, methyl n-propyl ketone, methyl n-butyl ketone, methyl isobutyl ketone, 2-heptanone, acetylacetone, cyclohexanone, γ-butyrolactone, γ-valerolactone, propylene carbonate, N-methylpyrrolidone, N,N'-dimethylformamide, N,N'-dimethylacetamide, 1,3-dimethyl-2-imidazolidinone, N,N'-dimethylpropylene urea, N,N,N',N'-tetramethyl urea, dimethyl sulfoxide, hexamethylphosphoric acid triamide, diethylene glycol dimethyl ether, diethylene glycol diethyl ether, diethylene glycol ethyl methyl ether, diethylene glycol di-n-propyl ether, dipropylene glycol dimethyl ether, dipropylene glycol diethyl ether, dipropylene glycol ethyl methyl ether, or dipropylene glycol di-n-propyl ether.

The content of the organic alkali solution or the compound exhibiting alkalinity in the mixed solution of the alkali solution and the organic solvent is preferably 0.01% by weight or more, more preferably 0.1% by weight or more, still more preferably 1% by weight or more, and particularly preferably 10% by weight or more. When the content of the organic alkali solution or the compound exhibiting alkalinity is within the above range, it becomes possible to shorten the time required to remove the pattern.

The content of the organic solvent in the mixed solution of the alkali solution and the organic solvent is preferably 1% by weight or more, more preferably 3% by weight or more, still more preferably 5% by weight or more, and particularly preferably 10% by weight or more. When the content of the organic solvent is within the above range, it becomes possible to shorten the time required to remove the pattern. When the content of the organic solvent is lower than 1% by weight, the residual pattern cannot be sometimes completely removed and removal of the pattern sometimes requires a long time.

Examples of the acidic solution include a solution of a compound exhibiting acidity, such as hydrofluoric acid, hydrochloric acid, hydrobromic acid, hydroiodic acid, perchloric acid, chloric acid, chlorous acid, hypochlorous acid, perbromic acid, bromic acid, bromous acid, hypobromic acid, periodic acid, iodic acid, iodous acid, hypoiodous acid, sulfuric acid, sulfurous acid, hyposulfurous acid, nitric acid, nitrous acid, phosphoric acid, phosphorous acid, hypophosphorous acid, phosphonic acid, phosphinic acid, hexafluorophosphoric acid, hexafluoroantimonic acid, boric acid, tetrafluoroboric acid, formic acid, acetic acid, propionic acid, butanoic acid, trifluoroacetic acid, oxalic acid, lactic acid, methanesulfonic acid, p-toluenesulfonic acid, trifluoromethanesulfonic acid, or fluorosulfonic acid. From the viewpoint of solubility of the pattern, the acidic solution is preferably hydrofluoric acid, hydrochloric acid, hydrobromic acid, perchloric acid, chloric acid, chlorous acid, hypochlorous acid, sulfuric acid, nitric acid, hexafluorophosphoric acid, hexafluoroantimonic acid, tetrafluoroboric acid, formic acid, acetic acid, propionic acid, trifluoroacetic acid, oxalic acid, lactic acid, trifluoromethanesulfonic acid, or fluorosulfonic acid.

The content of the a compound exhibiting acidity in the acidic solution is preferably 0.01% by weight or more, more preferably 0.1% by weight or more, still more preferably 1% by weight or more, and particularly preferably 10% by weight or more. When the content of the compound exhibiting acidity is within the above range, it becomes possible to shorten the time required to remove the pattern.

Examples of the oxidizing agent include hydrogen peroxide, peracetic acid, m-chloroperbenzoic acid, benzoyl peroxide, di-t-butyl peroxide, t-butyl hydroperoxide, 1,4-benzoquinone, 1,2-benzoquinone, 2,3,5,6-tetrachloro-1,4-benzoquinone, 2,3,5,6-tetrabromo-1,4-benzoquinone, 3,4,5,6-tetrachloro-1,2-benzoquinone, potassium peroxymonosulfate, 2,2,6,6-tetramethylpiperidine-1-oxyl free radical, 2,6-dichloropyridine-N-oxide, [bis(trifluoroacetoxy)iodo]benzene, (diacetoxyiodo)benzene, 2-iodosobenzoic acid, sodium peroxide, potassium peroxide, sodium superoxide, or potassium superoxide. From the viewpoint of solubility of the pattern, the oxidizing agent is preferably hydrogen peroxide, peracetic acid, m-chloroperbenzoic acid, 1,4-benzoquinone, 2,3,5,6-tetrachloro-1,4-benzoquinone, potassium peroxymonosulfate, 2,2,6,6-tetramethylpiperidine-1-oxyl free radical, [bis(trifluoroacetoxy)iodo]benzene, or (diacetoxyiodo)benzene, and more preferably hydrogen peroxide.

The content of the compound exhibiting acidity in the mixed solution of the acidic solution and the oxidizing agent is preferably 0.01% by weight or more, more preferably 0.1% by weight or more, still more preferably 1% by weight or more, and particularly preferably 10% by weight or more. When the content of the compound exhibiting acidity is within the above range, it becomes possible to shorten the time required to remove the pattern.

The content of the oxidizing agent in the mixed solution of the acidic solution and the oxidizing agent is preferably 0.1 to 30% by weight, more preferably 0.5 to 25% by weight, and still more preferably 1 to 20% by weight. When the content of the oxidizing agent is within the above range, it becomes possible to shorten the time required to remove the pattern.

In the method for manufacturing a semiconductor device of the present invention, the immersion temperature of the step (3-5) for immersion in a specific chemical solution is preferably 10 to 180° C., more preferably 20 to 160° C., still more preferably 30 to 140° C., and particularly preferably 40 to 120° C. When the boiling point of the component in a specific chemical solution is lower than 180° C., the immersion temperature is preferably a temperature lower than the boiling point of the component. When the immersion temperature is within the above range, it becomes possible to shorten the time required to remove the pattern and to improve lifetime of a specific chemical solution.

In the method for manufacturing a semiconductor device of the present invention, from the viewpoint of removability of the pattern, the immersion time of the step (3-5) for immersion in a specific chemical solution is preferably 10 seconds or more, more preferably 30 seconds or more, still more preferably 1 minute or more, particularly preferably 3 minutes or more, and most preferably 5 minutes or more. Meanwhile, from the viewpoint of cycle time, the immersion time is preferably 30 minutes or less, more preferably 20 minutes or less, still more preferably 10 minutes or less, and particularly preferably 5 minutes or less.

After the step of immersing in a specific chemical solution, it is preferred to wash the substrate, from which the pattern is removed, with a rinsing solution. Examples of the rinsing solution include water, methanol, ethanol, isopropyl alcohol, ethyl acetate, ethyl lactate, ethyl pyruvate, propylene glycol monomethyl ether, propylene glycol monomethyl ether acetate, methyl 3-methoxypropionate, ethyl 3-ethoxypropionate, or 2-heptanone. The rinsing solution is preferably a solution containing water.

<Irradiation with Ultrasonic Waves>

In the method for manufacturing a semiconductor device of the present invention, (3-5) the step of immersing in a specific chemical solution can be (3-5') the step of irradiating with ultrasonic waves while being immersed in a specific chemical solution, or irradiating with ultrasonic waves after immersion. Irradiation with ultrasonic waves leads to acceleration of the molecule of a component in a specific chemical solution, and promotion of collision with a component in a pattern of the photosensitive resin composition of the present invention or a cured product thereof, thus making it easier to dissolve the pattern in the specific chemical solution. Therefore, irradiation with ultrasonic waves makes it possible to shorten the time required to remove the pattern.

The frequency of ultrasonic waves for irradiation is preferably 20 to 3,000 kHz, more preferably 25 to 500 kHz, still more preferably 25 to 150 kHz, and particularly preferably 25 to 70 kHz. When the frequency is within the above range, it becomes possible to shorten the time required to remove the pattern.

The method for manufacturing a semiconductor device of the present invention can include, as (3) the step of removing a pattern of the photosensitive resin composition of the present invention or a cured product thereof, (3-3) the step of performing an ultraviolet ray treatment, (3-4) the step of performing a plasma treatment, or (3-5) the step of immersing in a specific chemical solution, followed by (3-6) the step of immersing in a chemical solution which is a specific chemical solution and is different from that used in the step (3-5). This step is introduced in place of shortening the time of one or more steps selected from the group consisting of (3-2) the step of immersing the pattern in a solution containing hydrofluoric acid, the steps (3-3), (3-4), and (3-5). It is an object to shorten process time in total by using one or more steps selected from the group consisting of the steps (3-2), (3-3), (3-4), and (3-5) in combination with the step (3-6). It is preferred to select, as the chemical solution used in the step (3-6), a chemical solution which is different from that used in the step (3-5) and also can dissolve a component in the pattern to be removed. Use of the chemical solution different from that used in the (3-5) makes it possible to easily remove even a pattern of a composition including various and complicated components such as a hybrid of an organic substance and an inorganic substance without causing formation of residues, thereby, it becomes possible to shorten the time required to remove the pattern.

<Method for manufacturing Semiconductor Device>

Figure 2:
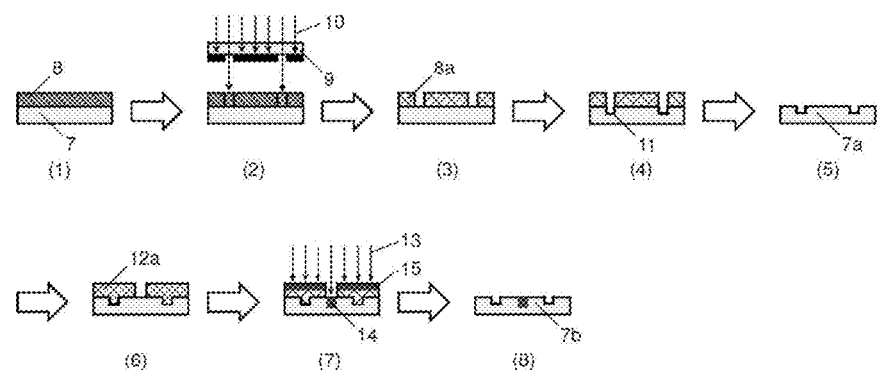
FIG. 2 is a schematic view of an etching process and an ion implantation process in the present invention.

With respect to a method for manufacturing a semiconductor device of the present invention, a description will be made on a method of forming an impurity region on a silicon carbide semiconductor substrate using the photosensitive resin composition of the present invention with reference to FIG. 2.

First, (1) the photosensitive resin composition of the present invention is coated and prebaked on a silicon carbide semiconductor substrate 7 to form a polysiloxane film 8. Next, (2) the film is irradiated with active chemical rays 10 through a mask having a desired pattern 9. Then, (3) patterning is performed by development, and thermal curing is optionally performed by breaching exposure and middle baking to form a polysiloxane pattern 8a having a desired pattern. Next, (4) the silicon carbide semiconductor substrate 7 is pattered by dry etching using a polysiloxane pattern 8a as an etching mask to form a pattern 11 in the silicon carbide semiconductor substrate 7. Then, (5) the polysiloxane pattern 8a is removed from the silicon carbide semiconductor substrate 7 in accordance with the method for manufacturing a semiconductor device of the present invention, thus obtaining a silicon carbide semiconductor substrate 7a formed with the pattern 11. Then, (6) a polysiloxane pattern 12a having a desired pattern is formed from the photosensitive resin composition of the present invention on the silicon carbide semiconductor substrate 7a in the same manner as mentioned above. Then, (7) ions 13 are implanted into the silicon carbide semiconductor substrate 7a using the polysiloxane pattern 12a as an ion implantation mask to form an impurity region 14 and to form a modified layer 15 in a polysiloxane pattern. Then, (8) the polysiloxane pattern 12a formed with the modified layer 15 is removed from the silicon carbide semiconductor substrate 7a in accordance with the method for manufacturing a semiconductor device of the present invention, thus obtaining a silicon carbide semiconductor substrate 7b including the impurity region 14.

<Cured Film Obtained by Thermal Curing>

The photosensitive resin composition of the present invention is a photosensitive resin composition which is capable of forming a pattern with high resolution and obtaining a cured film having excellent heat resistance and cracking resistance, and is also alkali developable. The cured film obtained by thermally curing the photosensitive resin composition has high transparency.

The cured film obtained from the photosensitive resin composition of the present invention is a polysiloxane-based cured film obtained by heating a coating film of the photosensitive resin composition to 150 to 1,000° C. to undergo thermal curing. The thermal curing temperature is preferably 200° C. or higher, more preferably 250° C. or higher, still more preferably 300° C. or higher, and particularly preferably 400° C. or higher. The thermal curing temperature within the above range enables an improvement in heat resistance of the cured film. From the viewpoint of suppression of the occurrence of cracking during thermal curing, the thermal curing temperature is preferably 800° C. or lower, more preferably 600° C. or lower, still more preferably 500° C. or lower, and particularly preferably 450° C. or lower. Therefore, the cured film obtained by thermally curing the photosensitive resin composition of the present invention is a polysiloxane-based cured film having high transparency and high heat resistance.

The cured film obtained from the photosensitive resin composition of the present invention can also be a fired film obtained by firing a coating film of the photosensitive resin composition under an air or oxygen atmosphere at 300 to 1,100° C. By firing a coating film of the photosensitive resin composition under an air or oxygen atmosphere at 300 to 1,100° C., bond cleavage of an organic substance in the coating film, thermal decomposition of the organic substance, and volatilization of the organic substance proceed, thus making it possible to obtain a silica-based fired film including less residual organic substance, similar to an $SiO_2$ film. Therefore, the fired film obtained by firing the photosensitive resin composition of the present invention is a silica-based fired film having high transparency and high heat resistance.

The cured film obtained by thermally curing the photosensitive resin composition of the present invention is a polysiloxane-based cured film or a silica-based fired film which is formed with a pattern with high resolution and has high transparency and high heat resistance. Therefore, the cured film can be suitably used in applications, for example, a gate insulating film, an interlayer insulating film, a protective film for metal wiring, an insulating film for metal wiring, or a flattened film for TFT.

According to the photosensitive resin composition of the present invention, it becomes possible to prepare a coating solution which is capable of forming a pattern with high resolution and obtaining a cured film having excellent heat resistance and cracking resistance.

According to the photosensitive resin composition of the present invention, it becomes possible to obtain a cured film which is suitably used in applications such as a gate insulating film, an interlayer insulating film, a protective film for metal wiring, an insulating film for metal wiring, or a flattened film for TFT. It also becomes possible to obtain an element provided with the cured film as applications such as the insulating film, the protective film, or the flattened film.

Furthermore, according to the method for manufacturing a semiconductor device of the present invention, it is possible to subject a fine pattern region to ion implantation, dopant exposure, dry etching, or wet etching at high temperature, leading to an improvement in yield and an improvement in performances in the manufacture of a semiconductor. It is possible to reduce the number of steps as compared with the method using a conventional $SiO_2$ film, thus enabling an improvement in productivity and a shortening in cycle time. Furthermore, according to the method for manufacturing a semiconductor device of the present invention, use of a cured film which is capable of forming a pattern with high resolution and has excellent heat resistance and cracking resistance enables shortening the step required to remove the cured film of the composition after formation of an impurity region on a semiconductor substrate, thus enabling shortening in process time.

EXAMPLES

The present invention will be described in more specifically below by way of Examples and Comparative Examples, but the present invention is not limited to these Examples. Names are shown below regarding compounds represented by abbreviations among compounds used.

46DMOC: "AV Light" (registered trademark) 46DMOC (manufactured by ASAHI ORGANIC CHEMICALS INDUSTRY CO., LTD.); 2,4-bis(methoxymethyl)-6-methylphenol)

AIBN: 2,2'-Azobis (isobutyronitrile)

BYK-3440: Water-soluble acrylic resin (manufactured by BYK Japan KK.)

$CF_4$: Tetrafluoromethane

DAA: Diacetone alcohol

Dimethylol-BisOC-F: 2-(4-Hydroxy-3-hydroxymethyl-5-methyl)phenyl-2-[4-(4-hydroxy-3-hydroxymethyl-5-methyl)phenyl]propane (manufactured by Honshu Chemical Industry Co., Ltd.)

EtOH: Ethanol

FPD: Flat panel display

HF: Hydrofluoric acid

HMDS: Hexamethyldisilazane

IPA: Isopropyl alcohol

KBM-04: Tetramethoxysilane (manufactured by Shin-Etsu Chemical Co., Ltd.)

KBM-303: 2-(3,4-Epoxycyclohexyl)ethyltrimethoxysilane (manufactured by Shin-Etsu Chemical Co., Ltd.)

KBM-403: 3-Glycidoxypropyltrimethoxysilane (manufactured by Shin-Etsu Chemical Co., Ltd.)

M-315: "ARONIX" (registered trademark) M-315 (manufactured by TOAGOSEI CO., LTD.; 1,3,5-tris((meth)acryloxyethyl)isocyanuric acid)

MA-ST-L: Silica particles having a particle diameter of 15 to 20 nm using methanol as dispersion medium (manufactured by Nissan Chemical Industries Lid.)

MB: 3-methoxy-1-butanol

MDT: N-trifluoromethylsulfonyloxy-5-norbornene-2,3-dicarboxyimide (manufactured by Heraeus)

MeOH: Methanol

NaOH: Sodium hydroxide

NMD-W: Aqueous 2.38 wt % tetramethyl ammonium hydroxide solution (manufactured by TOKYO OHKA KOGYO Co., Ltd.)

NMP: N-methyl-2-pyrrolidone NMR: Nuclear magnetic resonance

OXE-01: "IRGACURE" (registered trademark) OXE-01 (manufactured by BASF; 1-[4-(phenylthio)phenyl]octane-1, 2-dione-2-(O-benzoyl)oxime)

PAI-101: α-(4-Tolylsulfonyloxy)imino-4-methoxybenzylcyanide (manufactured by Midori Kagaku Co., Ltd.)

PGME: Propylene glycol monomethyl ether

PGMEA: Propylene glycol monomethyl ether acetate $PH_3$: Phosphine

Ph-cc-AP: 1-(3,4-Dihydroxyphenyl)-1-(4-hydroxyphenyl)-1-phenylethane (manufactured by Honshu Chemical Industry Co., Ltd.)

PL-2L-MA: "Quartron" (registered trademark) PL-2L-MA (manufactured by Fuso Chemical Co., Ltd.; silica particles having a particle diameter of 15 to 20 nm using methanol as dispersion medium)

PL-2L-PGME: "Quartron" (registered trademark) PL-2L-PGME (manufactured by Fuso Chemical Co., Ltd.; silica particles having a particle diameter of 15 to 20 nm using propylene glycol monomethyl ether as dispersion medium)

PL-3-PGME: "Quartron" (registered trademark) PL-3-PGME (manufactured by Fuso Chemical Co., Ltd.; silica particles having a particle diameter of 15 to 20 nm using propylene glycol monomethyl ether as dispersion medium)

RF: High frequency

RIE: Reactive ion etching

SI-200: "San-Aid" (registered trademark) SI-200 (manufactured by SANSHIN CHEMICAL INDUSTRY CO., LTD.; 4-(methoxycarbonyloxy)phenyldimethylsulfonium trifluoromethanesulfonate)

SiC: Silicon carbide

SR-8EGS: polyethylene glycol diglycidyl ether (manufactured by SAKAMOTO YAKUHIN KOGYO CO., LTD.)

TGA: Thermogravimetric analysis

THF: tetrahydrofuran

TM-BIP-A: "AV Light" (registered trademark) TM-BIP-A (manufactured by ASAHI ORGANIC CHEMICALS INDUSTRY CO., LTD.); 2,2-bis[4-hydroxy-3,5-bis(hydroxymethyl)phenyl]propane)

TMX-BIP-A: "AV Light" (registered trademark) TM-BIP-A (manufactured by ASAHI ORGANIC CHEMICALS INDUSTRY CO., LTD.); 2,2-bis[4-hydroxy-3,5-bis(methoxymethyl)phenyl]propane)

TMOM-BPAF: 2,2-Bis[4-hydroxy-3,5-bis(methoxymethyl)phenyl]propane (manufactured by Honshu Chemical Industry Co., Ltd.)

X-88-347: 3-[(3-Ethyl-3-oxetanyl)methoxy]propyltrimethoxysilane (manufactured by Shin-Etsu Chemical Co., Ltd.).

Synthesis Example 1: Synthesis of Polysiloxane Solution (A-1)

In a three-necked flask, 30.06 g (50 mol %) of dimethyldimethoxysilane, 19.03 g (25 mol %) of tetramethoxysilane, 17.03 g (25 mol %) of methyltrimethoxysilane, and 51.67 g of DAA were charged. Air was allowed to flow into the flask at 0.05 L/min and the mixed solution was heated to 40° C. in an oil bath while stirring. While further stirring the mixed solution, an aqueous phosphoric acid solution prepared by dissolving 0.331 g of phosphoric acid in 24.78 g of water was added over 10 minutes. After completion of the addition, a silane compound was hydrolyzed by stirring at 40° C. for 30 minutes. The bath temperature was set at 70° C. and, after stirring for 1 hour, the bath temperature was raised to 110° C. About 1 hour after initiation of temperature rise, the inner temperature of the solution reached 100° C., followed by heating and stirring for 1 to 3 hours (inner temperature is from 95 to 105° C.). After the resin solution obtained by heating and stirring for 1 to 3 hours was cooled by an ice bath, an anion exchange resin and a cation exchange resin were respectively added to the resin solution in the amount of 2% by weight, followed by stirring for 12 hours. After stirring, the anion exchange resin and the cation exchange resin were removed by filtration to obtain a polysiloxane solution (A-1). The solid component concentration of the obtained polysiloxane solution (A-1) was 38% by weight and Mw of the polysiloxane was 3,600.

Synthesis Example 2: Synthesis of Polysiloxane Solution (A-2)

Using 12.02 g (20 mol %) of dimethyldimethoxysilane, 7.61 g (10 mol %) of tetramethoxysilane, 47.68 g (70 mol %) of methyltrimethoxysilane, 50.87 g of DAA, 26.13 g of water, and 0.337 g of phosphoric acid, the polymerization was performed in the same manner as in Synthesis Example 1 to obtain a polysiloxane solution (A-2). The solid component concentration of the obtained polysiloxane solution (A-2) was 40% by weight and Mw of the polysiloxane was 4,000.

Synthesis Example 3: Synthesis of Polysiloxane Solution (A-3)

Using 24.04 g (40 mol %) of dimethyldimethoxysilane, 42.76 g (35 mol %) of diphenyldimethoxysilane, 19.03 g (25 mol %) of tetramethoxysilane, 85.57 g of DAA, 22.53 g of water, and 0.429 g of phosphoric acid, the polymerization was performed in the same manner as in Synthesis Example 1 to obtain a polysiloxane solution (A-3). The solid component concentration of the obtained polysiloxane solution (A-3) was 37% by weight and Mw of the polysiloxane was 3,400.

Synthesis Example 4: Synthesis of Polysiloxane Solution (A-4)

Using 24.04 g (40 mol %) of dimethyldimethoxysilane, 6.11 g (5 mol %) of diphenyldimethoxysilane, 11.42 g (15 mol %) of tetramethoxysilane, 39.66 g (40 mol %) of phenyltrimethoxysilane, 75.21 g of DAA, 24.33 g of water, and 0.406 g of phosphoric acid, the polymerization was performed in the same manner as in Synthesis Example 1 to obtain a polysiloxane solution (A-4). The solid component concentration of the obtained polysiloxane solution (A-4) was 38% by weight and Mw of the polysiloxane was 3,700.

Synthesis Example 5: Synthesis of Polysiloxane Solution (A-5)

Using 18.03 g (30 mol %) of dimethyldimethoxysilane, 7.61 g (10 mol %) of tetramethoxysilane, 59.49 g (60 mol %) of phenyltrimethoxysilane, 79.33 g of DAA, 25.23 g of water, and 0.426 g of phosphoric acid, the polymerization was performed in the same manner as in Synthesis Example 1 to obtain a polysiloxane solution (A-5). The solid component concentration of the obtained polysiloxane solution (A-5) was 38% by weight and Mw of the polysiloxane was 3,900.

Synthesis Example 6: Synthesis of Polysiloxane Solution (A-6)

Using 9.02 g (15 mol %) of dimethyldimethoxysilane, 3.81 g (5 mol %) of tetramethoxysilane, 59.49 g (60 mol %) of phenyltrimethoxysilane, 13.62 g (20 mol %) of methyltrimethoxysilane, 78.81 g of DAA, 26.13 g of water, and 0.430 g of phosphoric acid, the polymerization was performed in the same manner as in Synthesis Example 1 to obtain a polysiloxane solution (A-6). The solid component concentration of the obtained polysiloxane solution (A-6) was 40% by weight and Mw of the polysiloxane was 4,100.

Synthesis Example 7: Synthesis of Polysiloxane Solution (A-7)

Using 18.03 g (30 mol %) of dimethyldimethoxysilane, 24.44 g (20 mol %) of diphenyldimethoxysilane, 19.03 g (25 mol %) of tetramethoxysilane, 24.79 g (25 mol %) of phenyltrimethoxysilane, 81.92 g of DAA, 24.78 g of water, and 0.431 g of phosphoric acid, the polymerization was performed in the same manner as in Synthesis Example 1 to obtain a polysiloxane solution (A-7). The solid component concentration of the obtained polysiloxane solution (A-7) was 37% by weight and Mw of the polysiloxane was 3,600.

Synthesis Example 8: Synthesis of Polysiloxane Solution (A-8)

Using 18.03 g (30 mol %) of dimethyldimethoxysilane, 11.42 g (15 mol %) of tetramethoxysilane, 54.53 g (55 mol %) of phenyltrimethoxysilane, 76.74 g of DAA, 25.68 g of water, and 0.420 g of phosphoric acid, the polymerization was performed in the same manner as in Synthesis Example 1 to obtain a polysiloxane solution (A-8). The solid component concentration of the obtained polysiloxane solution (A-8) was 38% by weight and Mw of the polysiloxane was 3,800.

Synthesis Example 9: Synthesis of Polysiloxane Solution (A-9)

Using 6.01 g (10 mol %) of dimethyldimethoxysilane, 3.81 g (5 mol %) of tetramethoxysilane, 59.49 g (60 mol %) of phenyltrimethoxysilane, 17.03 g (25 mol %) of methyltrimethoxysilane, 78.54 g of DAA, 26.58 g of water, and 0.432 g of phosphoric acid, the polymerization was performed in the same manner as in Synthesis Example 1 to obtain a polysiloxane solution (A-9). The solid component concentration of the obtained polysiloxane solution (A-9) was 40% by weight and Mw of the polysiloxane was 4,200.

Synthesis Example 10: Synthesis of Polysiloxane Solution (A-10)

Using 18.03 g (30 mol %) of dimethyldimethoxysilane, 36.65 g (30 mol %) of diphenyldimethoxysilane, 30.44 g (40 mol %) of tetramethoxysilane, 79.33 g of DAA, 25.23 g of water, and 0.426 g of phosphoric acid, the polymerization was performed in the same manner as in Synthesis Example 1 to obtain a polysiloxane solution (A-10). The solid component concentration of the obtained polysiloxane solution (A-10) was 37% by weight and Mw of the polysiloxane was 3,600.

Synthesis Example 11: Synthesis of Polysiloxane Solution (A-11)

Using 18.03 g (30 mol %) of dimethyldimethoxysilane, 15.22 g (20 mol %) of tetramethoxysilane, 49.57 g (50 mol %) of phenyltrimethoxysilane, 74.15 g of DAA, and 26.13 g of water, 0.414 g of phosphoric acid, the polymerization was performed in the same manner as in Synthesis Example 1 to obtain a polysiloxane solution (A-11). The solid component concentration of the obtained polysiloxane solution (A-11) was 38% by weight and Mw of the polysiloxane was 3,900.

Synthesis Example 12: Synthesis of Polysiloxane Solution (A-12)

Using 14.58 g (30 mol % in terms of a molar ratio of Si atoms) of 1,1,3,3-tetramethyl-1,3-dimethoxydisiloxane, 24.44 g (20 mol %) of diphenyldimethoxysilane, 19.03 g (25 mol %) of tetramethoxysilane, 24.79 g (25 mol %) of phenyltrimethoxysilane, 81.92 g of DAA, 22.07 g of water, and 0.414 g of phosphoric acid, the polymerization was performed in the same manner as in Synthesis Example 1 to obtain a polysiloxane solution (A-12). The solid component concentration of the obtained polysiloxane solution (A-12) was 37% by weight and Mw of the polysiloxane was 3,600.

Synthesis Example 13: Synthesis of Polysiloxane Solution (A-13)

Using 18.03 g (30 mol %) of dimethyldimethoxysilane, 24.44 g (20 mol %) of diphenyldimethoxysilane, 14.71 g (25 mol % in terms of a molar ratio of Si atoms of M silicate 51, 24.79 g (25 mol %) of phenyltrimethoxysilane, 81.92 g of DAA, 21.40 g of water, and 0.410 g of phosphoric acid, the polymerization was performed in the same manner as in Synthesis Example 1 to obtain a polysiloxane solution (A-13). The solid component concentration of the obtained polysiloxane solution (A-13) was 37% by weight and Mw of the polysiloxane was 3,600.

Synthesis Example 14: Synthesis of Polysiloxane Solution (A-14)

Using 6.01 g (10 mol %) of dimethyldimethoxysilane, 3.81 g (5 mol %) of tetramethoxysilane, 69.40 g (70 mol %) of phenyltrimethoxysilane, 10.22 g (15 mol %) of methyltrimethoxysilane, 83.20 g of DAA, 26.58 g of water, and 0.447 g of phosphoric acid, the polymerization was performed in the same manner as in Synthesis Example 1 to obtain a polysiloxane solution (A-14). The solid component concentration of the obtained polysiloxane solution (A-14) was 39% by weight and Mw of the polysiloxane was 4,000.

Synthesis Example 15: Synthesis of Polysiloxane Solution (A-15)

Using 27.05 g (45 mol %) of dimethyldimethoxysilane, 6.11 g (5 mol %) of diphenyldimethoxysilane, 19.03 g (25 mol %) of tetramethoxysilane, 24.79 g (25 mol %) of phenyltrimethoxysilane, 67.96 g of DAA, 24.78 g of water, and 0.385 g of phosphoric acid, the polymerization was performed in the same manner as in Synthesis Example 1 to obtain a polysiloxane solution (A-15). The solid component concentration of the obtained polysiloxane solution (A-15) was 37% by weight and Mw of the polysiloxane was 3,700.

Synthesis Example 16: Synthesis of Polysiloxane Solution (A-16)

Using 30.06 g (50 mol %) of dimethyldimethoxysilane, 19.03 g (25 mol %) of tetramethoxysilane, 19.83 g (20 mol %) of phenyltrimethoxysilane, 3.41 g (5 mol %) of methyltrimethoxysilane, 60.98 g of DAA, 24.78 g of water, and 0.362 g of phosphoric acid, the polymerization was performed in the same manner as in Synthesis Example 1 to obtain a polysiloxane solution (A-16). The solid component concentration of the obtained polysiloxane solution (A-16) was 37% by weight and Mw of the polysiloxane was 3,700.

Synthesis Example 17: Synthesis of Polysiloxane Solution (A-17)

Using 18.03 g (30 mol %) of dimethyldimethoxysilane, 24.44 g (20 mol %) of diphenyldimethoxysilane, 19.03 g (25 mol %) of tetramethoxysilane, 62.09 g (25 mol %) of 1-naphthyltrimethoxysilane (50% by weight IPA solution), 91.31 g of DAA, 24.78 g of water, and 0.463 g of phosphoric acid, the polymerization was performed in the same manner as in Synthesis Example 1 to obtain a polysiloxane solution (A-17). The solid component concentration of the obtained polysiloxane solution (A-17) was 37% by weight and Mw of the polysiloxane was 3,500.

Synthesis Example 18: Synthesis of Polysiloxane Solution (A-18)

In a three-necked flask, 18.03 g (30 mol %) of dimethyldimethoxysilane, 24.44 g (20 mol %) of diphenyldimethoxysilane, 19.03 g (25 mol %) of tetramethoxysilane, 19.83 g (20 mol %) of phenyltrimethoxysilane, and 76.81 g of DAA were charged. Air was allowed to flow into the flask at 0.05 L/min and the mixed solution was heated to 40° C. in an oil bath while stirring. While further stirring the mixed solution, an aqueous phosphoric acid solution prepared by dissolving 0.439 g of phosphoric acid in 25.23 g of water was added over 10 minutes. After completion of the addition, a silane compound was hydrolyzed by stirring at 40° C. for 30 minutes. After completion of the hydrolysis, a solution prepared by dissolving 6.56 g (5 mol %) of 3-trimethoxysilylpropylsuccinic anhydride in 8.53 g of DAA was added. The bath temperature was set at 70° C. and, after stirring for 1 hour, the bath temperature was raised to 110° C. About 1 hour after initiation of temperature rise, the inner temperature of the solution reached 100° C., followed by heating and stirring for 1 to 3 hours (inner temperature is from 95 to 105° C.). After the resin solution obtained by heating and stirring for 1 to 3 hours was cooled by an ice bath, an anion exchange resin and a cation exchange resin were respectively added to the resin solution in the amount of 2% by weight, followed by stirring for 12 hours. After stirring, the anion exchange resin and the cation exchange resin were removed by filtration to obtain a polysiloxane solution (A-18). The solid component concentration of the obtained polysiloxane solution (A-18) was 38% by weight and Mw of the polysiloxane was 3,700.

Synthesis Example 19: Synthesis of Polysiloxane Solution (A-19)

Using 18.03 g (30 mol %) of dimethyldimethoxysilane, 24.44 g (20 mol %) of diphenyldimethoxysilane, 19.03 g (25 mol %) of tetramethoxysilane, 14.87 g (15 mol %) of phenyltrimethoxysilane, 79.88 g of DAA, 25.68 g of water, 0.447 g of phosphoric acid, 8.88 g of DAA, and 13.12 g (10 mol %) of 3-trimethoxysilylpropylsuccinic anhydride, the polymerization was performed in the same manner as in Synthesis Example 18 to obtain a polysiloxane solution (A-19). The solid component concentration of the obtained polysiloxane solution (A-19) was 38% by weight and Mw of the polysiloxane was 3,600.

Synthesis Example 20: Synthesis of Polysiloxane Solution (A-20)

In a three-necked flask, 9.02 g (30 mol %) of dimethyldimethoxysilane, 12.22 g (20 mol %) of diphenyldimethoxysilane, 9.51 g (25 mol %) of tetramethoxysilane, 9.91 g (20 mol %) of phenyltrimethoxysilane, 68.08 g of PL-2L-MA (22.5% by weight MeOH solution), and 59.08 g of DAA were charged. Air was allowed to flow into the flask at 0.05 L/min and the mixed solution was heated to 40° C. in an oil bath while stirring. While further stirring the mixed solution, an aqueous phosphoric acid solution prepared by dissolving 0.220 g of phosphoric acid in 12.61 g of water was added over 10 minutes. After completion of the addition, a silane compound was hydrolyzed by stirring at 40° C. for 30 minutes. After completion of the hydrolysis, a solution prepared by dissolving 3.28 g (5 mol %) of 3-trimethoxysilylpropylsuccinic anhydride in 6.56 g of DAA was added. The bath temperature was set at 70° C. and, after stirring for 1 hour, the bath temperature was raised to 110° C. About 1 hour after initiation of temperature rise, the inner temperature of the solution reached 100° C., followed by heating and stirring for 1 to 3 hours (inner temperature is from 95 to 105° C.). After the resin solution obtained by heating and stirring for 1 to 3 hours was cooled by an ice bath, an anion exchange resin and a cation exchange resin were respectively added to the resin solution in the amount of 2% by weight, followed by stirring for 12 hours. After stirring, the anion exchange resin and the cation exchange resin were removed by filtration to obtain a polysiloxane solution (A-20). The solid component concentration of the obtained polysiloxane solution (A-20) was 38% by weight and Mw of the polysiloxane was 1,200. This polysiloxane is an inorganic particle-containing polysiloxane and PL-2L-MA is included in the amount of 35% by weight based on the weight of the inorganic particle-containing polysiloxane.

Synthesis Example 21: Synthesis of Polysiloxane Solution (A-21)

Using 9.02 g (30 mol %) of dimethyldimethoxysilane, 5.71 g (15 mol %) of tetramethoxysilane, 24.79 g (50 mol %) of phenyltrimethoxysilane, 63.94 g of PL-2L-MA (22.5% by weight MeOH solution), 55.49 g of DAA, 13.06 g of water, 0.214 g of phosphoric acid, 6.17 g of DAA, and 3.28 g (5 mol %) of 3-trimethoxysilylpropylsuccinic anhydride, the polymerization was performed in the same manner as in Synthesis Example 20 to obtain a polysiloxane solution (A-21). The solid component concentration of the obtained polysiloxane solution (A-21) was 39% by weight and Mw of the polysiloxane was 1,200. This polysiloxane is an inorganic particle-containing polysiloxane and PL-2L-MA is included in the amount of 35% by weight based on the weight of the inorganic particle-containing polysiloxane.

Synthesis Example 22: Synthesis of Polysiloxane Solution (A-22)

Using 9.02 g (30 mol %) of dimethyldimethoxysilane, 12.22 g (20 mol %) of diphenyldimethoxysilane, 9.51 g (25 mol %) of tetramethoxysilane, 24.84 g (20 mol %) of 1-naphthyltrimethoxysilane (50% by weight IPA solution), 54.64 g of a methanol silica sol (30.5% by weight MeOH solution), 64.28 g of DAA, 12.61 g of water, 7.14 g of DAA, and 3.28 g (5 mol %) of 3-trimethoxysilylpropylsuccinic anhydride, the polymerization was performed in the same manner as in Synthesis Example 20 to obtain a polysiloxane solution (A-22). The solid component concentration of the obtained polysiloxane solution (A-22) was 38% by weight and Mw of the polysiloxane was 1,200. This polysiloxane is an inorganic particle-containing polysiloxane and the methanol silica sol is included in the amount of 35% by weight based on the weight of the inorganic particle-containing polysiloxane.

Synthesis Example 23: Synthesis of Polysiloxane Solution (A-23)

Using 14.43 g (30 mol %) of dimethyldimethoxysilane, 19.55 g (20 mol %) of diphenyldimethoxysilane, 15.22 g (25 mol %) of tetramethoxysilane, 15.86 g (20 mol %) of phenyltrimethoxysilane, 22.48 g of PL-2L-MA (22.5% by weight MeOH solution), 68.27 g of DAA, 20.18 g of water, 0.352 g of phosphoric acid, 7.59 g of DAA, and 5.25 g (5 mol %) of 3-trimethoxysilylpropylsuccinic anhydride, the polymerization was performed in the same manner as in Synthesis Example 20 to obtain a polysiloxane solution (A-23). The solid component concentration of the obtained polysiloxane solution (A-23) was 39% by weight and Mw of the polysiloxane was 1,600. This polysiloxane is an inorganic particle-containing polysiloxane and PL-2L-MA is included in the amount of 10% by weight based on the weight of the inorganic particle-containing polysiloxane.

Synthesis Example 24: Synthesis of Polysiloxane Solution (A-24)

Using 10.82 g (30 mol %) of dimethyldimethoxysilane, 14.66 g (20 mol %) of diphenyldimethoxysilane, 11.42 g (25 mol %) of tetramethoxysilane, 11.90 g (20 mol %) of phenyltrimethoxysilane, 37.93 g of PL-2L-MA (22.5% by weight MeOH solution), 57.60 g of DAA, 15.14 g of water, 0.264 g of phosphoric acid, 6.40 g of DAA, and 3.93 g (5 mol %) of 3-trimethoxysilylpropylsuccinic anhydride, the polymerization was performed in the same manner as in Synthesis Example 20 to obtain a polysiloxane solution (A-24). The solid component concentration of the obtained polysiloxane solution (A-24) was 38% by weight and Mw of the polysiloxane was 1,400. This polysiloxane is an inorganic particle-containing polysiloxane and PL-2L-MA is included in the amount of 20% by weight based on the weight of the inorganic particle-containing polysiloxane.

Synthesis Example 25: Synthesis of Polysiloxane Solution (A-25)

Using 7.21 g (30 mol %) of dimethyldimethoxysilane, 9.77 g (20 mol %) of diphenyldimethoxysilane, 7.61 g (25 mol %) of tetramethoxysilane, 7.93 g (20 mol %) of phenyltrimethoxysilane, 101.14 g of PL-2L-MA (22.5% by weight MeOH solution), 61.44 g of DAA, 10.09 g of water, 0.176 g of phosphoric acid, 6.83 g of DAA, and 2.62 g (5 mol %) of 3-trimethoxysilylpropylsuccinic anhydride, the polymerization was performed in the same manner as in Synthesis Example 20 to obtain a polysiloxane solution (A-25). The solid component concentration of the obtained polysiloxane solution (A-25) was 37% by weight and Mw of the polysiloxane was 1,200. This polysiloxane is an inorganic particle-containing polysiloxane and PL-2L-MA is included in the amount of 50% by weight based on the weight of the inorganic particle-containing polysiloxane.

Synthesis Example 26: Synthesis of Polysiloxane Solution (A-26)

In a three-necked flask, 9.02 g (30 mol %) of dimethyldimethoxysilane, 5.71 g (15 mol %) of tetramethoxysilane, 55.88 g (45 mol %) of 1-naphthyltrimethoxysilane (50% by weight IPA solution), 6.16 g (10 mol %) of 2-(3,4-epoxycyclohexyl)ethyltrimethoxysilane, 79.19 g of PL-2L-MA (22.5% by weight MeOH solution), and 76.36 g of DAA were charged. Air was allowed to flow into the flask at 0.05 L/min and the mixed solution was heated to 40° C. in an oil bath while stirring. While further stirring the mixed solution, an aqueous phosphoric acid solution prepared by dissolving 0.244 g of phosphoric acid in 13.29 g of water was added over 10 minutes. After completion of the addition, a silane compound was hydrolyzed by stirring at 40° C. for 30 minutes. The bath temperature was set at 70° C. and, after stirring for 1 hour, the bath temperature was raised to 110° C. About 1 hour after initiation of temperature rise, the inner temperature of the solution reached 100° C., followed by heating and stirring for 1 to 3 hours (inner temperature is from 95 to 105° C.). After the resin solution obtained by heating and stirring for 1 to 3 hours was cooled by an ice bath, an anion exchange resin and a cation exchange resin were respectively added to the resin solution in the amount of 2% by weight, followed by stirring for 12 hours. After stirring, the anion exchange resin and the cation exchange resin were removed by filtration to obtain a polysiloxane solution (A-26). The solid component concentration of the obtained polysiloxane solution (A-26) was 39% by weight and Mw of the polysiloxane was 1,200. This polysiloxane is an inorganic particle-containing polysiloxane and PL-2L-MA is included in the amount of 35% by weight based on the weight of the inorganic particle-containing polysiloxane.

Synthesis Example 27: Synthesis of Polysiloxane Solution (A-27)

In a three-necked flask, 18.03 g (30 mol %) of dimethyldimethoxysilane, 24.44 g (20 mol %) of diphenyldimethoxysilane, 19.03 g (25 mol %) of tetramethoxysilane, 24.84 g (10 mol %) of 1-naphthyltrimethoxysilane (50% by weight IPA solution), 11.12 g (15 mol %) of vinyltrimethoxysilane, and 80.05 g of DAA were charged. Nitrogen was allowed to flow into the flask at 0.05 L/min and the mixed solution was heated to 40° C. in an oil bath while stirring. While further stirring the mixed solution, an aqueous phosphoric acid solution prepared by dissolving 0.425 g of phosphoric acid in 24.78 g of water was added over 10 minutes. After completion of the addition, a silane compound was hydrolyzed by stirring at 40° C. for 30 minutes. The bath temperature was set at 70° C. and, after stirring for 1 hour, the bath temperature was raised to 110° C. About 1 hour after initiation of temperature rise, the inner temperature of the solution reached 100° C., followed by heating and stirring for 1 to 3 hours (inner temperature is from 95 to 105° C.). After the resin solution obtained by heating and stirring for 1 to 3 hours was cooled by an ice bath, an anion exchange resin and a cation exchange resin were respectively added to the resin solution in the amount of 2% by weight, followed by stirring for 12 hours. After stirring, the anion exchange resin and the cation exchange resin were removed by filtration to obtain a polysiloxane solution (A-27). The solid component concentration of the obtained polysiloxane solution (A-27) was 40% by weight, Mw of the polysiloxane was 4,700, and the double bond equivalent was 880.

Synthesis Example 28: Synthesis of Polysiloxane Solution (A-28)

In a three-necked flask, 9.02 g (30 mol %) of dimethyldimethoxysilane, 12.22 g (20 mol %) of diphenyldimethoxysilane, 9.51 g (25 mol %) of tetramethoxysilane, 6.21 g (5 mol %) of 1-naphthyltrimethoxysilane (50% by weight IPA solution), 5.56 g (15 mol %) of vinyltrimethoxysilane, 65.08 g of PL-2L-MA (22.5% by weight MeOH solution), and 56.48 g of DAA were charged. Nitrogen was allowed to flow into the flask at 0.05 L/min and the mixed solution was heated to 40° C. in an oil bath while stirring. While further stirring the mixed solution, an aqueous phosphoric acid solution prepared by dissolving 0.213 g of phosphoric acid in 12.61 g of water was added over 10 minutes. After completion of the addition, a silane compound was hydrolyzed by stirring at 40° C. for 30 minutes. After completion of the hydrolysis, a solution prepared by dissolving 3.28 g (5 mol %) of 3-trimethoxysilylpropylsuccinic anhydride in 6.28 g of DAA was added. The bath temperature was set at 70° C. and, after stirring for 1 hour, the bath temperature was raised to 110° C. About 1 hour after initiation of temperature rise, the inner temperature of the solution reached 100° C., followed by heating and stirring for 1 to 3 hours (inner temperature is from 95 to 105° C.). After the resin solution obtained by heating and stirring for 1 to 3 hours was cooled by an ice bath, an anion exchange resin and a cation exchange resin were respectively added to the resin solution in the amount of 2% by weight, followed by stirring for 12 hours. After stirring, the anion exchange resin and the cation exchange resin were removed by filtration to obtain a polysiloxane solution (A-28). The solid component concentration of the obtained polysiloxane solution (A-28) was 40% by weight, Mw of the polysiloxane was 2,200, the carboxylic acid equivalent was 1,330, and the double bond equivalent was 890. This polysiloxane is an inorganic particle-containing polysiloxane and PL-2L-MA is included in the amount of 35% by weight based on the weight of the inorganic particle-containing polysiloxane.

Synthesis Example 29: Synthesis of Polysiloxane Solution (A-29)

Using 24.04 g (40 mol %) of dimethyldimethoxysilane, 24.44 g (20 mol %) of diphenyldimethoxysilane, 11.42 g (15 mol %) of tetramethoxysilane, 24.79 g (25 mol %) of phenyltrimethoxysilane, 82.98 g of DAA, 22.98 g of water, and 0.423 g of phosphoric acid, the polymerization was performed in the same manner as in Synthesis Example 1 to obtain a polysiloxane solution (A-29). The solid component concentration of the obtained polysiloxane solution (A-29) was 36% by weight and Mw of the polysiloxane was 3,500.

Synthesis Example 30: Synthesis of polysiloxane solution (A-30)

Using 18.03 g (30 mol %) of dimethyldimethoxysilane, 22.83 g (30 mol %) of tetramethoxysilane, 39.66 s (40 mol %) of phenyltrimethoxysilane, 68.97 g of DAA, 27.03 g of water, and 0.403 g of phosphoric acid, the polymerization was performed in the same manner as in Synthesis Example 1 to obtain a polysiloxane solution (A-30). The solid component concentration of the obtained polysiloxane solution (A-30) was 38% by weight and Mw of the polysiloxane was 4,000.

Synthesis Example 31: Synthesis of Polysiloxane Solution (A-31)

Using 62.09 g (50 mol %) of 1-naphthyltrimethoxysilane (50% by weight IPA solution), 13.62 g (40 mol %) of methyltrimethoxysilane, 82.87 g of PL-2L-MA (22.5% by weight MeOH solution), 71.92 g of DAA, 13.97 g of water, 0.256 g of phosphoric acid, 7.99 g of DAA, and 6.56 g (10 mol %) of 3-trimethoxysilylpropylsuccinic anhydride, the polymerization was performed in the same manner as in Synthesis Example 20 to obtain a polysiloxane solution (A-31). The solid component concentration of the obtained polysiloxane solution (A-31) was 39% by weight and Mw of the polysiloxane was 1,300. This polysiloxane is an inorganic particle-containing polysiloxane and PL-2L-MA is included in the amount of 35% by weight based on the weight of the inorganic particle-containing polysiloxane.

Synthesis Example 32: Synthesis of Polysiloxane Solution (A-32)

Using 6.01 g (20 mol %) of dimethyldimethoxysilane, 62.09 g (50 mol %) of 1-naphthyltrimethoxysilane (50% by weight IPA solution), 8.51 g (25 mol %) of methyltrimethoxysilane, 79.13 g of PL-2L-MA (22.5% by weight MeOH solution), 68.67 g of DAA, 12.84 g of water, 0.244 g of phosphoric acid, 7.63 g of DAA, and 3.28 g (5 mol %) of 3-trimethoxysilylpropylsuccinic anhydride, the polymerization was performed in the same manner as in Synthesis Example 20 to obtain a polysiloxane solution (A-32). The solid component concentration of the obtained polysiloxane solution (A-32) was 38% by weight and Mw of the polysiloxane was 1,300. This polysiloxane is an inorganic particle-containing polysiloxane and PL-2L-MA is included in the amount of 35% by weight based on the weight of the inorganic particle-containing polysiloxane.

Synthesis Example 33: Synthesis of Polysiloxane Solution (A-33)

In a three-necked flask, 3.01 g (10 mol %) of dimethyldimethoxysilane, 1.90 g (5 mol %) of tetramethoxysilane, 6.81 g (20 mol %) of methyltrimethoxysilane, 29.74 g (60 mol %) of phenyltrimethoxysilane, 67.24 g of PL-2L-MA (22.5% by weight MeOH solution), and 58.35 g of DAA were charged. Air was allowed to flow into the flask at 0.10 L/min and the mixed solution was heated to 40° C. in an oil bath while stirring. While further stirring the mixed solution, an aqueous phosphoric acid solution prepared by dissolving 0.447 g of phosphoric acid in 13.52 g of water was added over 10 minutes. After completion of the addition, a silane compound was hydrolyzed by stirring at 40° C. for 30 minutes. After completion of the hydrolysis, a solution prepared by dissolving 3.28 g (5 mol %) of 3-trimethoxysilylpropylsuccinic anhydride in 6.48 g of DAA was added. The bath temperature was set at 70° C. and, after stirring for 1 hour, the bath temperature was raised to 110° C. About 1 hour after initiation of temperature rise, the inner temperature of the solution reached 100° C., followed by heating and stirring for 1 to 3 hours (inner temperature is from 95 to 105° C.). After the resin solution obtained by heating and stirring for 1 to 3 hours was cooled by an ice bath, an anion exchange resin and a cation exchange resin were respectively added to the resin solution in the amount of 2% by weight, followed by stirring for 12 hours. After stirring, the anion exchange resin and the cation exchange resin were removed by filtration to obtain a polysiloxane solution (A-33). The solid component concentration of the obtained polysiloxane solution (A-33) was 38% by weight and Mw of the polysiloxane was 1,400. This polysiloxane is an inorganic particle-containing polysiloxane and PL-2L-MA is included in the amount of 35% by weight based on the weight of the inorganic particle-containing polysiloxane.

Synthesis Example 34: Synthesis of Polysiloxane Solution (A-34)

Using 3.01 g (10 mol %) of dimethyldimethoxysilane, 1.90 g (5 mol %) of tetramethoxysilane, 6.81 g (20 mol %) of methyltrimethoxysilane, 29.74 g (60 mol %) of phenyltrimethoxysilane, 72.04 g of PL-3-PGME (21.0% by weight PGME solution), 58.35 g of DAA, 13.52 g of water, 0.447 g of phosphoric acid, 6.48 g of DAA, and 3.28 g (5 mol %) of 3-trimethoxysilylpropylsuccinic anhydride, the polymerization was performed in the same manner as in Synthesis Example 33 to obtain a polysiloxane solution (A-34). The solid component concentration of the obtained polysiloxane solution (A-34) was 40% by weight and Mw of the polysiloxane was 1,400. This polysiloxane is an inorganic particle-containing polysiloxane and PL-3-PGME is included in the amount of 35% by weight based on the weight of the inorganic particle-containing polysiloxane.

Synthesis Example 35: Synthesis of Polysiloxane Solution (A-35)

Using 3.01 g (10 mol %) of dimethyldimethoxysilane, 1.90 g (5 mol %) of tetramethoxysilane, 6.81 g (20 mol %) of methyltrimethoxysilane, 29.74 g (60 mol %) of phenyltrimethoxysilane, 37.35 g of MA-ST-L (40.5% by weight MeOH solution), 58.35 g of DAA, 13.52 g of water, 0.447 g of phosphoric acid, 6.48 g of DAA, and 3.28 g (5 mol %) of 3-trimethoxysilylpropylsuccinic anhydride, the polymerization was performed in the same manner as in Synthesis Example 33 to obtain a polysiloxane solution (A-35). The solid component concentration of the obtained polysiloxane solution (A-35) was 40% by weight and Mw of the polysiloxane was 1,400. This polysiloxane is an inorganic particle-containing polysiloxane and MA-ST-L is included in the amount of 35% by weight based on the weight of the inorganic particle-containing polysiloxane.

Synthesis Example 36: Synthesis of Polysiloxane Solution (A-36)

Using 3.01 g (10 mol %) of dimethyldimethoxysilane, 1.90 g (5 mol %) of tetramethoxysilane, 6.81 g (20 mol %) of methyltrimethoxysilane, 29.74 g (60 mol %) of phenyltrimethoxysilane, 133.79 g of PL-3-PGME (21.0% by weight PGME solution), 75.86 g of DAA, 13.52 g of water, 0.447 g of phosphoric acid, 8.43 g of DAA, and 3.28 g (5 mol %) of 3-trimethoxysilylpropylsuccinic anhydride, the polymerization was performed in the same manner as in Synthesis Example 33 to obtain a polysiloxane solution (A-36). The solid component concentration of the obtained polysiloxane solution (A-36) was 44% by weight and Mw of the polysiloxane was 1,200. This polysiloxane is an inorganic particle-containing polysiloxane and PL-3-PGME is included in the amount of 50% by weight based on the weight of the inorganic particle-containing polysiloxane.

Synthesis Example 37: Synthesis of Polysiloxane Solution (A-37)

Using 9.02 g (30 mol %) of dimethyldimethoxysilane, 6.11 g (10 mol %) of diphenylmethoxysilane, 7.61 g (20 mol %) of tetramethoxysilane, 17.35 g (35 mol %) of phenyltrimethoxysilane, 66.01 g of PL-2L-MA (22.5% by weight MeOH solution), 57.29 g of DAA, 12.84 g of water, 0.434 g of phosphoric acid, 6.37 g of DAA, and 3.28 g (5 mol %) of 3-trimethoxysilylpropylsuccinic anhydride, the polymerization was performed in the same manner as in Synthesis Example 33 to obtain a polysiloxane solution (A-37). The solid component concentration of the obtained polysiloxane solution (A-37) was 40% by weight and Mw of the polysiloxane was 1,500. This polysiloxane is an inorganic particle-containing polysiloxane and PL-2L-MA is included in the amount of 35% by weight based on the weight of the inorganic particle-containing polysiloxane.

Synthesis Example 38: Synthesis of Polysiloxane Solution (A-38)

Using 9.02 g (30 mol %) of dimethyldimethoxysilane, 6.11 g (10 mol %) of diphenylmethoxysilane, 7.61 g (20 mol %) of tetramethoxysilane, 17.35 g (35 mol %) of phenyltrimethoxysilane, 70.73 g of PL-3-PGME (21.0% by weight PGME solution), 57.29 g of DAA, 12.84 g of water, 0.434 g of phosphoric acid, 6.37 g of DAA, 3.28 g (5 mol %) of 3-trimethoxysilylpropylsuccinic anhydride, the polymerization was performed in the same manner as in Synthesis Example 33 to obtain a polysiloxane solution (A-38). The solid component concentration of the obtained polysiloxane solution (A-38) was 40% by weight and Mw of the polysiloxane was 1,500. This polysiloxane is an inorganic particle-containing polysiloxane and PL-3-PGME is included in the amount of 35% by weight based on the weight of the inorganic particle-containing polysiloxane.

Synthesis Example 39: Synthesis of Polysiloxane Solution (A-39)

Using 9.02 g (30 mol %) of dimethyldimethoxysilane, 6.11 g (10 mol %) of diphenylmethoxysilane, 7.61 g (20 mol %) of tetramethoxysilane, 17.35 g (35 mol %) of phenyltrimethoxysilane, 131.35 g of PL-3-PGME (21.0% by weight PGME solution), 74.47 g of DAA, 12.84 g of water, 0.434 g of phosphoric acid, 8.27 g of DAA, and 3.28 g (5 mol %) of 3-trimethoxysilylpropylsuccinic anhydride, the polymerization was performed in the same manner as in Synthesis Example 33 to obtain a polysiloxane solution (A-39). The solid component concentration of the obtained polysiloxane solution (A-39) was 42% by weight and Mw of the polysiloxane was 1,400. This polysiloxane is an inorganic particle-containing polysiloxane and PL-3-PGME is included in the amount of 50% by weight based on the weight of the inorganic particle-containing polysiloxane.

Synthesis Example 40: Synthesis of Polysiloxane Solution (A-40)

Using 3.01 g (10 mol %) of dimethyldimethoxysilane, 1.90 g (5 mol %) of tetramethoxysilane, 10.22 g (30 mol %) of methyltrimethoxysilane, 62.09 g (50 mol %) of 1-naphthyltrimethoxysilane (50% by weight IPA solution), 78.50 g of PL-2L-MA (22.5% by weight MeOH solution), 68.12 g of DAA, 13.52 g of water, 0.247 g of phosphoric acid, 7.57 g of DAA, and 3.28 g (5 mol %) of 3-trimethoxysilylpropylsuccinic anhydride, the polymerization was performed in the same manner as in Synthesis Example 33 to obtain a polysiloxane solution (A-40). The solid component concentration of the obtained polysiloxane solution (A-40) was 39% by weight and Mw of the polysiloxane was 1,300. This polysiloxane is an inorganic particle-containing polysiloxane and PL-2L-MA is included in the amount of 35% by weight based on the weight of the inorganic particle-containing polysiloxane.

Synthesis Example 41: Synthesis of Polysiloxane Solution (A-41)

Using 3.01 g (10 mol %) of dimethyldimethoxysilane, 1.90 g (5 mol %) of tetramethoxysilane, 10.22 g (30 mol %) of methyltrimethoxysilane, 62.09 g (50 mol %) of 1-naphthyltrimethoxysilane (50% by weight IPA solution), 84.10 g of PL-3-PGME (21.0% by weight PGME solution), 68.12 g of DAA, 13.52 g of water, 0.247 g of phosphoric acid, 7.57 g of DAA, and 3.28 g (5 mol %) of 3-trimethoxysilylpropylsuccinic anhydride, the polymerization was performed in the same manner as in Synthesis Example 33 to obtain a polysiloxane solution (A-41). The solid component concentration of the obtained polysiloxane solution (A-41) was 40% by weight and Mw of the polysiloxane was 1,300. This polysiloxane is an inorganic particle-containing polysiloxane and PL-3-PGME is included in the amount of 35% by weight based on the weight of the inorganic particle-containing polysiloxane.

Synthesis Example 42: Synthesis of Polysiloxane Solution (A-42)

Using 3.01 g (10 mol %) of dimethyldimethoxysilane, 1.90 g (5 mol %) of tetramethoxysilane, 10.22 g (30 mol %) of methyltrimethoxysilane, 62.09 g (50 mol %) of 1-naphthyltrimethoxysilane (50% by weight IPA solution), 43.61 g of MA-ST-L (40.5% by weight MeOH solution), 68.12 g of DAA, 13.52 g of water, 0.247 g of phosphoric acid, 7.57 g of DAA, and 3.28 g (5 mol %) of 3-trimethoxysilylpropylsuccinic anhydride, the polymerization was performed in the same manner as in Synthesis Example 33 to obtain a polysiloxane solution (A-42). The solid component concentration of the obtained polysiloxane solution (A-42) was 40% by weight and Mw of the polysiloxane was 1,300. This polysiloxane is an inorganic particle-containing polysiloxane and MA-ST-L is included in the amount of 35% by weight based on the weight of the inorganic particle-containing polysiloxane.

Synthesis Example 43: Synthesis of Polysiloxane Solution (A-43)

Using 3.01 g (10 mol %) of dimethyldimethoxysilane, 1.90 g (5 mol %) of tetramethoxysilane, 10.22 g (30 mol %) of methyltrimethoxysilane, 62.09 g (50 mol %) of 1-naphthyltrimethoxysilane (50% by weight IPA solution), 52.06 g of PL-3-PGME (21.0% by weight PGME solution), 59.04 g of DAA, 13.52 g of water, 0.247 g of phosphoric acid, 6.56 g of DAA, and 3.28 g (5 mol %) of 3-trimethoxysilylpropylsuccinic anhydride, the polymerization was performed in the same manner as in Synthesis Example 33 to obtain a polysiloxane solution (A-43). The solid component concentration of the obtained polysiloxane solution (A-43) was 38% by weight and Mw of the polysiloxane was 1,600. This polysiloxane is an inorganic particle-containing polysiloxane and PL-3-PGME is included in the amount of 25% by weight based on the weight of the inorganic particle-containing polysiloxane.

Synthesis Example 44: Synthesis of Polysiloxane Solution (A-44)

Using 3.01 g (10 mol %) of dimethyldimethoxysilane, 1.90 g (5 mol %) of tetramethoxysilane, 10.22 g (30 mol %) of methyltrimethoxysilane, 62.09 g (50 mol %) of 1-naphthyltrimethoxysilane (50% by weight IPA solution), 156.19 g of PL-3-PGME (21.0% by weight PGME solution), 88.56 g of DAA, 13.52 g of water, 0.247 g of phosphoric acid, 9.84 g of DAA, and 3.28 g (5 mol %) of 3-trimethoxysilylpropylsuccinic anhydride, the polymerization was performed in the same manner as in Synthesis Example 33 to obtain a polysiloxane solution (A-44). The solid component concentration of the obtained polysiloxane solution (A-44) was 42% by weight and Mw of the polysiloxane was 1,200. This polysiloxane is an inorganic particle-containing polysiloxane and PL-3-PGME is included in the amount of 35% by weight based on the weight of the inorganic particle-containing polysiloxane.

Synthesis Example 45: Synthesis of Polysiloxane Solution (A-45)

Using 9.02 g (30 mol %) of dimethyldimethoxysilane, 6.11 g (10 mol %) of diphenylmethoxysilane, 7.61 g (20 mol %) of tetramethoxysilane, 43.46 g (35 mol %) of 1-naphthyltrimethoxysilane (50% by weight IPA solution), 76.49 g of PL-2L-MA (22.5% by weight MeOH solution), 66.38 g of DAA, 12.84 g of water, 0.239 g of phosphoric acid, 7.38 g of DAA, and 3.28 g (5 mol %) of 3-trimethoxysilylpropylsuccinic anhydride, the polymerization was performed in the same manner as in Synthesis Example 33 to obtain a polysiloxane solution (A-45). The solid component concentration of the obtained polysiloxane solution (A-45) was 40% by weight and Mw of the polysiloxane was 1,500. This polysiloxane is an inorganic particle-containing polysiloxane and PL-2L-MA is included in the amount of 35% by weight based on the weight of the inorganic particle-containing polysiloxane.

Synthesis Example 46: Synthesis of Polysiloxane Solution (A-46)

Using 9.02 g (30 mol %) of dimethyldimethoxysilane, 6.11 g (10 mol %) of diphenylmethoxysilane, 7.61 g (20 mol %) of tetramethoxysilane, 43.46 g (35 mol %) of 1-naphthyltrimethoxysilane (50% by weight IPA solution), 81.96 g of PL-3-PGME (21.0% by weight PGME solution), 66.38 g of DAA, 12.84 g of water, 0.239 g of phosphoric acid, 7.38 g of DAA, and 3.28 g (5 mol %) of 3-trimethoxysilylpropylsuccinic anhydride, the polymerization was performed in the same manner as in Synthesis Example 33 to obtain a polysiloxane solution (A-46). The solid component concentration of the obtained polysiloxane solution (A-46) was 41% by weight and Mw of the polysiloxane was 1,500. This polysiloxane is an inorganic particle-containing polysiloxane and PL-3-PGME is included in the amount of 35% by weight based on the weight of the inorganic particle-containing polysiloxane.

Synthesis Example 47: Synthesis of Polysiloxane Solution (A-47)

Using 9.02 g (30 mol %) of dimethyldimethoxysilane, 6.11 g (10 mol %) of diphenylmethoxysilane, 7.61 g (20 mol %) of tetramethoxysilane, 43.46 g (35 mol %) of 1-naphthyltrimethoxysilane (50% by weight IPA solution), 42.50 g of MA-ST-L (40.5% by weight MeOH solution), 66.38 g of DAA, 12.84 g of water, 0.239 g of phosphoric acid, 7.38 g of DAA, and 3.28 g (5 mol %) of 3-trimethoxysilylpropylsuccinic anhydride, the polymerization was performed in the same manner as in Synthesis Example 33 to obtain a polysiloxane solution (A-47). The solid component concentration of the obtained polysiloxane solution (A-47) was 41% by weight and Mw of the polysiloxane was 1,500. This polysiloxane is an inorganic particle-containing polysiloxane and MA-ST-L is included in the amount of 35% by weight based on the weight of the inorganic particle-containing polysiloxane.

Synthesis Example 48: Synthesis of Polysiloxane Solution (A-48)

Using 9.02 g (30 mol %) of dimethyldimethoxysilane, 6.11 g (10 mol %) of diphenylmethoxysilane, 7.61 g (20 mol %) of tetramethoxysilane, 43.46 g (35 mol %) of 1-naphthyltrimethoxysilane (50% by weight IPA solution), 50.74 g of PL-3-PGME (21.0% by weight PGME solution), 57.53 g of DAA, 12.84 g of water, 0.239 g of phosphoric acid, 6.39 g of DAA, and 3.28 g (5 mol %) of 3-trimethoxysilylpropylsuccinic anhydride, the polymerization was performed in the same manner as in Synthesis Example 33 to obtain a polysiloxane solution (A-48). The solid component concentration of the obtained polysiloxane solution (A-48) was 39% by weight and Mw of the polysiloxane was 1,800. This polysiloxane is an inorganic particle-containing polysiloxane and PL-3-PGME is included in the amount of 25% by weight based on the weight of the inorganic particle-containing polysiloxane.

Synthesis Example 49: Synthesis of Polysiloxane Solution (A-49)

Using 9.02 g (30 mol %) of dimethyldimethoxysilane, 6.11 g (10 mol %) of diphenylmethoxysilane, 7.61 g (20 mol %) of tetramethoxysilane, 43.46 g (35 mol %) of 1-naphthyltrimethoxysilane (50% by weight IPA solution), 152.21 g of PL-3-PGME (21.0% by weight PGME solution), 86.30 g of DAA, 12.84 g of water, 0.239 g of phosphoric acid, 9.59 g of DAA, and 3.28 g (5 mol %) of 3-trimethoxysilylpropylsuccinic anhydride, the polymerization was performed in the same manner as in Synthesis Example 33 to obtain a polysiloxane solution (A-49). The solid component concentration of the obtained polysiloxane solution (A-49) was 41% by weight and Mw of the polysiloxane was 1,400. This polysiloxane is an inorganic particle-containing polysiloxane and PL-3-PGME is included in the amount of 50% by weight based on the weight of the inorganic particle-containing polysiloxane.

Synthesis Example 50: Synthesis of Compound Having a Naphthoquinone Diazide Structure (QD-1)

Under a dry nitrogen gas flow, 15.32 g (0.05 mol) of Ph-cc-AP and 37.62 g (0.14 mol) of 5-naphthoquinone diazide sulfonic acid chloride were weighed in a flask, and then dissolved in 450 g of 1,4-dioxane and the temperature was controlled to room temperature. To this was added dropwise a mixed solution of 50 g of 1,4-dioxane and 15.58 g (0.154 mol) of triethylamine while stirring so that the temperature in the system does not become 35° C. or higher. After completion of the dropwise addition, the mixed solution was stirred at 30° C. for 2 hours. After stirring, the precipitated triethylamine salt was removed by filtration and the filtrate was poured into water, followed by stirring. Thereafter, the precipitate thus obtained was collected by filtration. The obtained solid was dried by vacuum drying to obtain a compound (QD-1) having a naphthoquinone diazide structure of the following structure.

[Chemical Formula 22]

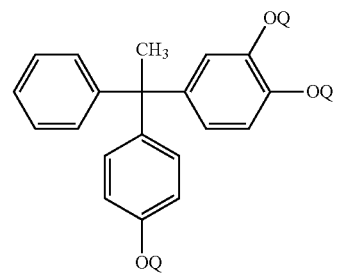

(QD-1)

-continued

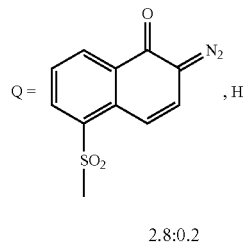

2.8:0.2

Synthesis Example 51: Synthesis of Acrylic Resin (AC-1)

In a flask, 0.821 g (1 mol %) of AIBN and 121.49 g of PGMEA were charged. Then, 10.01 g (20 mol %) of methyl methacrylate, 12.91 g (30 mol %) of methacrylic acid, and 58.07 g (50 mol %) of 2-[2-(2-methoxy)ethoxy]ethoxyethyl methacrylate were charged, followed by stirring at room temperature for a while. The atmosphere in the flask was sufficiently replaced by nitrogen by bubbling, followed by heating and stirring at 70° C. for 5 hours to obtain an acrylic resin solution (AC-1). To the acrylic resin solution (AC-1) thus obtained, PGMEA was added so that the solid component concentration became 35% by weight. The acrylic resin had Mw of 13,000.

Synthesis Example 52: Synthesis of Acrylic Resin (AC-2)

In a flask, 0.821 g (1 mol %) of AIBN and 27.11 g of PGMEA were charged. Then, 5.01 g (10 mol %) of methyl methacrylate, 17.22 g (40 mol %) of methacrylic acid, and 32.54 g (50 mol %) of 2-hydroxyethyl methacrylate were charged, followed by stirring at room temperature for awhile. The atmosphere in the flask was sufficiently replaced by nitrogen by bubbling, followed by heating and stirring at 70° C. for 5 hours. Then, 54.47 g (20 mol %) of SR-8EGS, 0.676 g (1 mol %) of dimethylbenzylamine, 0.186 g (0.3 mol %) of 4-methoxyphenol, and 55.03 g of PGMEA were added to the solution thus obtained, followed by heating and stirring at 90° C. for 4 hours to obtain an acrylic resin solution (AC-2). To the acrylic resin solution (AC-2) thus obtained, PGMEA was added so that the solid component concentration became 35% by weight. The acrylic resin had Mw of 20,000.

The compositions of Synthesis Examples 1 to 49 are collectively shown in Table 1 to Table 3.

TABLE 1

| | | Monomer [mol %] | | |
|---|---|---|---|---|
| Polymer | | Organosilane including organosilane unit represented by the general formula (2) | | Organosilane including organosilane unit represented by the general formula (3) |
| Synthesis Example 1 | Polysiloxane solution (A-1) | Dimethyldimethoxysilane (50) | — | Tetramethoxysilane (25) |
| Synthesis Example 2 | Polysiloxane solution (A-2) | Dimethyldimethoxysilane (20) | — | Tetramethoxysilane (10) |
| Synthesis Example 3 | Polysiloxane solution (A-3) | Dimethyldimethoxysilane (40) | Diphenyldimethoxysilane (35) | Tetramethoxysilane (25) |
| Synthesis Example 4 | Polysiloxane solution (A-4) | Dimethyldimethoxysilane (40) | Diphenyldimethoxysilane (5) | Tetramethoxysilane (15) |
| Synthesis Example 5 | Polysiloxane solution (A-5) | Dimethyldimethoxysilane (30) | — | Tetramethoxysilane (10) |
| Synthesis Example 6 | Polysiloxane solution (A-6) | Dimethyldimethoxysilane (15) | — | Tetramethoxysilane (5) |
| Synthesis Example 7 | Polysiloxane solution (A-7) | Dimethyldimethoxysilane (30) | Diphenyldimethoxysilane (20) | Tetramethoxysilane (25) |
| Synthesis Example 8 | Polysiloxane solution (A-8) | Dimethyldimethoxysilane (30) | — | Tetramethoxysilane (15) |
| Synthesis Example 9 | Polysiloxane solution (A-9) | Dimethyldimethoxysilane (10) | — | Tetramethoxysilane (5) |
| Synthesis Example 10 | Polysiloxane solution (A-10) | Dimethyldimethoxysilane (30) | Diphenyldimethoxysilane (30) | Tetramethoxysilane (40) |
| Synthesis Example 11 | Polysiloxane solution (A-11) | Dimethyldimethoxysilane (30) | — | Tetramethoxysilane (20) |
| Synthesis Example 12 | Polysiloxane solution (A-12) | 1,1,3,3-Tetramethyl-1,3-dimethoxydisiloxane (30) | Diphenyldimethoxysilane (20) | Tetramethoxysilane (25) |
| Synthesis Example 13 | Polysiloxane solution (A-13) | Dimethyldimethoxysilane (30) | Diphenyldimethoxysilane (20) | M silicate 51 (25) |
| Synthesis Example 14 | Polysiloxane solution (A-14) | Dimethyldimethoxysilane (10) | — | Tetramethoxysilane (5) |
| Synthesis Example 15 | Polysiloxane solution (A-15) | Dimethyldimethoxysilane (45) | Diphenyldimethoxysilane (5) | Tetramethoxysilane (25) |
| Synthesis Example 16 | Polysiloxane solution (A-16) | Dimethyldimethoxysilane (50) | — | Tetramethoxysilane (25) |
| Synthesis Example 17 | Polysiloxane solution (A-17) | Dimethyldimethoxysilane (30) | Diphenyldimethoxysilane (20) | Tetramethoxysilane (25) |

TABLE 1-continued

|  | Monomer [mol %] |  | (B) |
|---|---|---|---|
|  | Organosilane including organosilane unit represented by the general formula (7) or (8) |  | Inorganic particles [content] |
| Synthesis Example 1 | — | Methyltrimethoxysilane (25) | — |
| Synthesis Example 2 | — | Methyltrimethoxysilane (70) | — |
| Synthesis Example 3 | — | — | — |
| Synthesis Example 4 | Phenyltrimethoxysilane (40) | — | — |
| Synthesis Example 5 | Phenyltrimethoxysilane (60) | — | — |
| Synthesis Example 6 | Phenyltrimethoxysilane (60) | Methyltrimethoxysilane (20) | — |
| Synthesis Example 7 | Phenyltrimethoxysilane (25) | — | — |
| Synthesis Example 8 | Phenyltrimethoxysilane (55) | — | — |
| Synthesis Example 9 | Phenyltrimethoxysilane (60) | Methyltrimethoxysilane (25) | — |
| Synthesis Example 10 | — | — | — |
| Synthesis Example 11 | Phenyltrimethoxysilane (50) | — | — |
| Synthesis Example 12 | Phenyltrimethoxysilane (25) | — | — |
| Synthesis Example 13 | Phenyltrimethoxysilane (25) | — | — |
| Synthesis Example 14 | Phenyltrimethoxysilane (70) | Methyltrimethoxysilane (15) | — |
| Synthesis Example 15 | Phenyltrimethoxysilane (25) | — | — |
| Synthesis Example 16 | Phenyltrimethoxysilane (20) | Methyltrimethoxysilane (5) | — |
| Synthesis Example 17 | 1-Naphthyltrimethoxysilane (25) | — | — |

TABLE 2

|  |  | Monomer [mol %] | | |
|---|---|---|---|---|
|  | Polymer | Organosilane including organosilane unit represented by the general formula (2) | | Organosilane including organosilane unit represented by the general formula (3) |
| Synthesis Example 18 | Polysiloxane solution (A-18) | Dimethyldimethoxysilane (30) | Diphenyldimethoxysilane (20) | Tetramethoxysilane (25) |
| Synthesis Example 19 | Polysiloxane solution (A-19) | Dimethyldimethoxysilane (30) | Diphenyldimethoxysilane (20) | Tetramethoxysilane (25) |
| Synthesis Example 20 | Polysiloxane solution (A-20) | Dimethyldimethoxysilane (30) | Diphenyldimethoxysilane (20) | Tetramethoxysilane (25) |
| Synthesis Example 21 | Polysiloxane solution (A-21) | Dimethyldimethoxysilane (30) | — | Tetramethoxysilane (15) |
| Synthesis Example 22 | Polysiloxane solution (A-22) | Dimethyldimethoxysilane (30) | Diphenyldimethoxysilane (20) | Tetramethoxysilane (25) |
| Synthesis Example 23 | Polysiloxane solution (A-23) | Dimethyldimethoxysilane (30) | Diphenyldimethoxysilane (20) | Tetramethoxysilane (25) |
| Synthesis Example 24 | Polysiloxane solution (A-24) | Dimethyldimethoxysilane (30) | Diphenyldimethoxysilane (20) | Tetramethoxysilane (25) |
| Synthesis Example 25 | Polysiloxane solution (A-25) | Dimethyldimethoxysilane (30) | Diphenyldimethoxysilane (20) | Tetramethoxysilane (25) |
| Synthesis Example 26 | Polysiloxane solution (A-26) | Dimethyldimethoxysilane (30) | — | Tetramethoxysilane (15) |
| Synthesis Example 27 | Polysiloxane solution (A-27) | Dimethyldimethoxysilane (30) | Diphenyldimethoxysilane (20) | Tetramethoxysilane (25) |
| Synthesis Example 28 | Polysiloxane solution (A-28) | Dimethyldimethoxysilane (30) | Diphenyldimethoxysilane (20) | Tetramethoxysilane (25) |
| Synthesis Example 29 | Polysiloxane solution (A-29) | Dimethyldimethoxysilane (40) | Diphenyldimethoxysilane (20) | Tetramethoxysilane (15) |

TABLE 2-continued

| | | | | |
|---|---|---|---|---|
| Synthesis Example 30 | Polysiloxane solution (A-30) | Dimethyldimethoxysilane (30) | — | Tetramethoxysilane (30) |
| Synthesis Example 31 | Polysiloxane solution (A-31) | — | — | — |
| Synthesis Example 32 | Polysiloxane solution (A-32) | Dimethyldimethoxysilane (20) | — | — |

| | Monomer [mol %] | | | (B) Inorganic particles |
|---|---|---|---|---|
| | Organosilane including organosilane unit represented by the general formula (7) or (8) | | | [content] |
| Synthesis Example 18 | Phenyltrimethoxysilane (20) | 3-Trimethoxysilylpropylsuccinic anhydride (5) | — | — |
| Synthesis Example 19 | Phenyltrimethoxysilane (15) | 3-Trimethoxysilylpropylsuccinic anhydride (10) | — | — |
| Synthesis Example 20 | Phenyltrimethoxysilane (20) | 3-Trimethoxysilylpropylsuccinic anhydride (5) | — | PL-2L-MA (35 wt %) |
| Synthesis Example 21 | Phenyltrimethoxysilane (50) | 3-Trimethoxysilylpropylsuccinic anhydride (5) | — | PL-2L-MA (35 wt %) |
| Synthesis Example 22 | 1-Naphthyltrimethoxysilane (20) | 3-Trimethoxysilylpropylsuccinic anhydride (5) | — | Methanol silica sol (35 wt %) |
| Synthesis Example 23 | Phenyltrimethoxysilane (20) | 3-Trimethoxysilylpropylsuccinic anhydride (5) | — | PL-2L-MA (10 wt %) |
| Synthesis Example 24 | Phenyltrimethoxysilane (20) | 3-Trimethoxysilylpropylsuccinic anhydride (5) | — | PL-2L-MA (20 wt %) |
| Synthesis Example 25 | Phenyltrimethoxysilane (20) | 3-Trimethoxysilylpropylsuccinic anhydride (5) | — | PL-2L-MA (50 wt %) |
| Synthesis Example 26 | 1-Naphthyltrimethoxysilane (45) | 2-(3,4-Epoxycyclohexyl)ethyltrimethoxysilane (10) | — | PL-2L-MA (35 wt %) |
| Synthesis Example 27 | 1-Naphthyltrimethoxysilane (10) | Vinyltrimethoxysilane (15) | — | — |
| Synthesis Example 28 | 1-Naphthyltrimethoxysilane (5) | Vinyltrimethoxysilane (15) | 3-Trimethoxysilylpropylsuccinic anhydride (5) | PL-2L-MA (35 wt %) |
| Synthesis Example 29 | Phenyltrimethoxysilane (25) | — | — | — |
| Synthesis Example 30 | Phenyltrimethoxysilane (40) | — | — | — |
| Synthesis Example 31 | 1-Naphthyltrimethoxysilane (50) | 3-Trimethoxysilylpropylsuccinic anhydride (10) | Methyltrimethoxysilane (40) | PL-2L-MA (35 wt %) |
| Synthesis Example 32 | 1-Naphthyltrimethoxysilane (50) | 3-Trimethoxysilylpropylsuccinic anhydride (5) | Methyltrimethoxysilane (25) | PL-2L-MA (35 wt %) |

TABLE 3

| | | Monomer [mol %] | |
|---|---|---|---|
| | Polymer | Organosilane including organosilane unit represented by the general formula (2) | Organosilane including organosilane unit represented by the general formula (3) |
| Synthesis Example 33 | Polysiloxane solution (A-33) | Dimethyldimethoxysilane (10) | Tetramethoxysilane (5) |
| Synthesis Example 34 | Polysiloxane solution (A-34) | Dimethyldimethoxysilane (10) | Tetramethoxysilane (5) |
| Synthesis Example 35 | Polysiloxane solution (A-35) | Dimethyldimethoxysilane (10) | Tetramethoxysilane (5) |
| Synthesis Example 36 | Polysiloxane solution (A-36) | Dimethyldimethoxysilane (10) | Tetramethoxysilane (5) |
| Synthesis Example 37 | Polysiloxane solution (A-37) | Dimethyldimethoxysilane (30) Diphenyldimethoxysilane (10) | Tetramethoxysilane (20) |
| Synthesis Example 38 | Polysiloxane solution (A-38) | Dimethyldimethoxysilane (30) Diphenyldimethoxysilane (10) | Tetramethoxysilane (20) |
| Synthesis Example 39 | Polysiloxane solution (A-39) | Dimethyldimethoxysilane (30) Diphenyldimethoxysilane (10) | Tetramethoxysilane (20) |
| Synthesis Example 40 | Polysiloxane solution (A-40) | Dimethyldimethoxysilane (10) | Tetramethoxysilane (5) |
| Synthesis Example 41 | Polysiloxane solution (A-41) | Dimethyldimethoxysilane (10) | Tetramethoxysilane (5) |
| Synthesis Example 42 | Polysiloxane solution (A-42) | Dimethyldimethoxysilane (10) | Tetramethoxysilane (5) |
| Synthesis Example 43 | Polysiloxane solution (A-43) | Dimethyldimethoxysilane (10) | Tetramethoxysilane (5) |
| Synthesis Example 44 | Polysiloxane solution (A-44) | Dimethyldimethoxysilane (10) | Tetramethoxysilane (5) |

TABLE 3-continued

| | | | | |
|---|---|---|---|---|
| Synthesis Example 45 | Polysiloxane solution (A-45) | Dimethyldimethoxysilane (30) | Diphenyldimethoxysilane (10) | Tetramethoxysilane (20) |
| Synthesis Example 46 | Polysiloxane solution (A-46) | Dimethyldimethoxysilane (30) | Diphenyldimethoxysilane (10) | Tetramethoxysilane (20) |
| Synthesis Example 47 | Polysiloxane solution (A-47) | Dimethyldimethoxysilane (30) | Diphenyldimethoxysilane (10) | Tetramethoxysilane (20) |
| Synthesis Example 48 | Polysiloxane solution (A-48) | Dimethyldimethoxysilane (30) | Diphenyldimethoxysilane (10) | Tetramethoxysilane (20) |
| Synthesis Example 49 | Polysiloxane solution (A-49) | Dimethyldimethoxysilane (30) | Diphenyldimethoxysilane (10) | Tetramethoxysilane (20) |

| | Monomer [mol %] | | | (B) Inorganic particles [content] |
|---|---|---|---|---|
| | Organosilane including organosilane unit represented by the general formula (7) or (8) | | | |
| Synthesis Example 33 | Phenyltrimethoxysilane (60) | 3-Trimethoxysilylpropylsuccinic anhydride (5) | Methyltrimethoxysilane (20) | PL-2L-MA (35 wt %) |
| Synthesis Example 34 | Phenyltrimethoxysilane (60) | 3-Trimethoxysilylpropylsuccinic anhydride (5) | Methyltrimethoxysilane (20) | PL-3-PGME (35 wt %) |
| Synthesis Example 35 | Phenyltrimethoxysilane (60) | 3-Trimethoxysilylpropylsuccinic anhydride (5) | Methyltrimethoxysilane (20) | MA-ST-L (35 wt %) |
| Synthesis Example 36 | Phenyltrimethoxysilane (60) | 3-Trimethoxysilylpropylsuccinic anhydride (5) | Methyltrimethoxysilane (20) | PL-3-PGME (50 wt %) |
| Synthesis Example 37 | Phenyltrimethoxysilane (35) | 3-Trimethoxysilylpropylsuccinic anhydride (5) | — | PL-2L-MA (35 wt %) |
| Synthesis Example 38 | Phenyltrimethoxysilane (35) | 3-Trimethoxysilylpropylsuccinic anhydride (5) | — | PL-3-PGME (35 wt %) |
| Synthesis Example 39 | Phenyltrimethoxysilane (35) | 3-Trimethoxysilylpropylsuccinic anhydride (5) | — | PL-3-PGME (50 wt %) |
| Synthesis Example 40 | 1-Naphthyltrimethoxysilane (50) | 3-Trimethoxysilylpropylsuccinic anhydride (5) | Methyltrimethoxysilane (30) | PL-2L-MA (35 wt %) |
| Synthesis Example 41 | 1-Naphthyltrimethoxysilane (50) | 3-Trimethoxysilylpropylsuccinic anhydride (5) | Methyltrimethoxysilane (30) | PL-3-PGME (35 wt %) |
| Synthesis Example 42 | 1-Naphthyltrimethoxysilane (50) | 3-Trimethoxysilylpropylsuccinic anhydride (5) | Methyltrimethoxysilane (30) | MA-ST-L (35 wt %) |
| Synthesis Example 43 | 1-Naphthyltrimethoxysilane (50) | 3-Trimethoxysilylpropylsuccinic anhydride (5) | Methyltrimethoxysilane (30) | PL-3-PGME (25 wt %) |
| Synthesis Example 44 | 1-Naphthyltrimethoxysilane (50) | 3-Trimethoxysilylpropylsuccinic anhydride (5) | Methyltrimethoxysilane (30) | PL-3-PGME (50 wt %) |
| Synthesis Example 45 | 1-Naphthyltrimethoxysilane (35) | 3-Trimethoxysilylpropylsuccinic anhydride (5) | — | PL-2L-MA (35 wt %) |
| Synthesis Example 46 | 1-Naphthyltrimethoxysilane (35) | 3-Trimethoxysilylpropylsuccinic anhydride (5) | — | PL-3-PGME (35 wt %) |
| Synthesis Example 47 | 1-Naphthyltrimethoxysilane (35) | 3-Trimethoxysilylpropylsuccinic anhydride (5) | — | MA-ST-L (35 wt %) |
| Synthesis Example 48 | 1-Naphthyltrimethoxysilane (35) | 3-Trimethoxysilylpropylsuccinic anhydride (5) | — | PL-3-PGME (25 wt %) |
| Synthesis Example 49 | 1-Naphthyltrimethoxysilane (35) | 3-Trimethoxysilylpropylsuccinic anhydride (5) | — | PL-3-PGME (50 wt %) |

Evaluation methods in the respective Examples and Comparative Examples are shown below.

(1) Solid Component Concentration of Resin Solution

In an aluminum cup whose weight was measured, 1 g of a resin solution was weighed and then evaporated to dryness by heating at 250° C. for 30 minutes using a hot plate (HP-1SA; manufactured by AS ONE Corporation). After heating, the weight of the aluminum cup containing a solid component remaining therein was measured and the weight of the remaining solid component was calculated from a difference in weight before and after heating, thus determining the solid component concentration of the resin solution.

(2) Mw of Resin

Using a GPC analyzer (HLC-8220; manufactured by TOSOH CORPORATION) and using THF or NMP as a fluidized layer, GPC measurement was performed and then Mw of a resin was determined in terms of polystyrene.

(3) Carboxylic Acid Equivalent

Using an automatic potentiometric titrator (AT-510; manufactured by KYOTO ELECTRONICS MANUFACTURING CO., LTD.) and using a 0.1 mol/L NaOH/EtOH solution as a titrant, an acid value was measured by a potentiometric titration method in accordance with "JIS K2501(2003), followed by calculation.

(4) Double Bond Equivalent

An iodine value of a resin was measured in accordance with "JIS K0070 (1992)", followed by calculation.

(5) Content Ratio of Each Organosilane Unit in Polysiloxane $^{29}$Si-NMR measurement was performed and a ratio of an integrated value of Si derived from a specific organosilane unit to an integrated value of entire Si derived from an organosilane was calculated, and then a content ratio of each organosilane unit was calculated. A sample (liquid) was poured into a NMR sample tube having a diameter of 10 mm made of Teflon (registered trademark) and then used for the measurement. $^{29}$Si-NMR measurement conditions are shown below.

Apparatus: Nuclear magnetic resonance apparatus (JNM-GX270; manufactured by JEOL, Ltd.)
Measurement method: Gated coupling method
Resonance frequency: 53.6693 MHz ($^{29}$Si nuclei)
Spectrum width: 20,000 Hz
Pulse width: 12 μs (45° pulse)
Pulse repeating time: 30.0 s Solvent: Acetone-d6
Standard substance: Tetramethylsilane
Measurement temperature: 23° C.
Sample rotational speed: 0.0 Hz (6) Pretreatment of Substrate Using a hot plate (HP-1SA; manufactured by AS ONE Corporation), an Si wafer (manufactured by ELECTRONICS AND MATERIALS CORPORATION) and a 4H—SiC wafer (manufactured by Dow Corning Toray Co., Ltd.) were subjected to a dehydration baking treatment by heating at 130° C. for 2 minutes, and subjected to a surface hydrophobization treatment with HMDS at 100° C. for 50 seconds using an HMDS treatment device (manufactured by KANSAI TEK Co., Ltd.) and then used. A glass substrate with a single Cr layer formed thereon by sputtering (Single Cr Layer Substrate; manufactured by KURAMOTO CO., LTD., hereinafter referred to as a "Cr substrate") was used without being subjected to a pretreatment.

(7) Measurement of Film Thickness

Using a spectrometric film thickness measurement system (Lambda Ace VM-1030; manufactured by DAINIPPON SCREEN MFG. CO., LTD.), the film thickness was measured by setting refractive index at 1.55.

(8) Value of Film Thickness Loss of Unexposed Area

The value of a film thickness loss of the unexposed area during development was calculated in accordance with the following equation.

Value of film thickness loss of unexposed area=value of film thickness of unexposed area before development−value of film thickness of unexposed area after development (9) Eth Sensitivity (Limit Exposure Dose)

Using a double-face alignment one-face stepper (Mask Aligner PEM-6M; manufactured by UNION OPTICAL CO., LTD.), patterning exposure was performed by exposing to i-line (wavelength of 365 nm), h-line (wavelength of 405 nm), and g-line (wavelength of 436 nm) of a ultra-high pressure mercury lamp through a grayscale mask for measurement of sensitivity (MDRM MODEL 4000-5-FS; manufactured by Opto-Line International) in accordance with the below-mentioned method in Example 1, and then the development was performed using a portable developer for photolithography (AD-2000; manufactured by Takizawa Sangyo Co., Ltd.) to form a developed film of a composition. A resolution pattern of the developed film thus formed was observed using an FPD inspection microscope (MX-61L; manufactured by Olympus Corporation). An exposure dose capable of forming a line-and-space pattern having a line width of 30 μm at a ratio of 1:1 (value of i-line illuminometer) was regarded as Eth sensitivity.

(10) Eop Sensitivity (Optimum Exposure Dose)

Exposure and development were performed by the above-mentioned method in (9) to form a developed film of a composition. Using an FPD inspection microscope (MX-61L; manufactured by Olympus Corporation) and a field emission-type scanning electron microscope (S-4800; manufactured by Hitachi High-Technologies Corporation), a resolution pattern of the cured film thus formed was observed, and an exposure dose capable of forming a line-and-space pattern obtained without forming residue, having a minimum pattern size at a ratio of 1:1 (value of i-line illuminometer) was regarded as Eop sensitivity.

(11) Thermal Curing of Composition

Using a high temperature inert gas oven (INH-9CD-S; manufactured by Koyo Thermo Systems Co., Ltd.), a cured film of a composition was formed by the below-mentioned method in Example 1. The cured film of a composition was formed under the following thermal curing conditions. Under a nitrogen gas flow, the atmosphere in an oven was purged with nitrogen by maintaining at 50° C. for 30 minutes and then the temperature was raised to 450° C. at a temperature rise rate of 10° C./min, followed by thermal curing at 450° C. for 30 minutes to form a cured film of a composition.

(12) Resolution (Dot Pattern Resolution)

Figure 5:
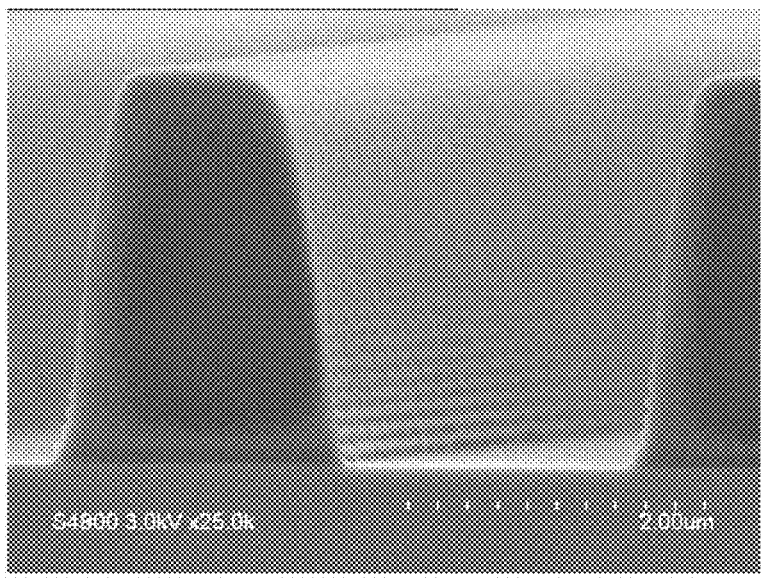
FIG. 5 is an observed image of a 2 μm dot pattern obtained from a photosensitive resin composition of the present invention.
Figure 6:
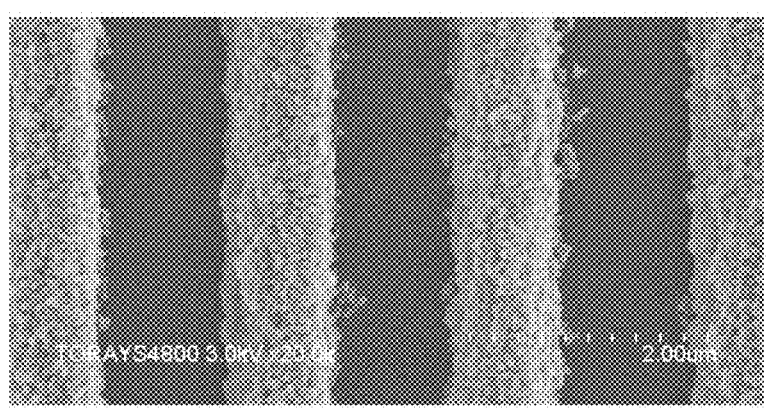
FIG. 6 is an observed image of a 1 μm line-and-space pattern obtained from a photosensitive resin composition of the present invention.

Using a reduced projection-type stepper (i-line Stepper NSR-2005i9C; manufactured by Nikon Corporation), patterning exposure was performed by the below-mentioned method in Example 1, and the development was performed using a portable developer for photolithography (AD-2000; manufactured by Takizawa Sangyo Co., Ltd.), and then a cured film of a composition was formed using a high temperature inert gas oven (INH-9CD-S; manufactured by Koyo Thermo Systems Co., Ltd.). A resolution pattern of the cured film thus formed was observed using a FPD inspection microscope (MX-61L; manufactured by Olympus Corporation) and a field emission-type scanning electron microscope (S-4800; manufactured by Hitachi High-Technologies Corporation). Exposure, development, and thermal curing were performed in the same manner as mentioned above, except that the exposure time were changed, and the size of a dot pattern obtained without forming residues or a minimum pattern of a line-and-space patterns was regarded as resolution. SEM micrograph of a 2 μm dot pattern obtained in Example 22 in Table 5-1 is shown in FIG. 5. SEM micrograph of a 1 μm line-and-space pattern obtained in Example 63 in Table 9-1 is shown in FIG. 6.

(13) Change in Pattern Dimensional Width (Permissible Exposure Dose)

Using a reduced projection-type stepper (i-line Stepper NSR-2005i9C; manufactured by Nikon Corporation), patterning exposure was performed by the below-mentioned method in Example 1, and the development was performed using a portable developer for photolithography (AD-2000; manufactured by Takizawa Sangyo Co., Ltd.) to form a developed film of a composition. A resolution pattern of a line-and-space pattern obtained without forming residues, having a minimum pattern size was observed using an ETD inspection microscope (MX-61L; manufactured by Olympus Corporation) and a field emission-type scanning electron microscope (S-4800; manufactured by Hitachi High-Technologies Corporation), and then a pattern dimensional width at an exposure dose of Eop sensitivity was measured. Exposure and development were performed in the same manner, except that exposure dose (exposure times) of Eop sensitivity was changed, and then a resolution pattern was observed in the same manner and a pattern dimensional width was measured. A change in pattern dimensional width was calculated in accordance with the following equation:

Change in pattern dimensional width=(B)−(A):

where (A) denotes a pattern dimensional width at an exposure dose which is 50 mJ/cm² smaller than an exposure dose of Eop sensitivity, and (B) denotes a pattern dimensional width at an exposure dose which is 50 mJ/cm² larger than an exposure dose of Eop sensitivity.

(14) Heat Resistance (1% Weight Loss Temperature)

A cured film of a composition was formed on a Cr substrate by the below-mentioned method in Example 1. The cured film thus obtained was shaved off from the substrate and about 10 mg of the cured film was put in an aluminum cell. Using a thermogravimeter (TGA-50; manufactured by Shimadzu Corporation), this aluminum cell was maintained in a nitrogen atmosphere at 30° C. for 10 minutes, and then thermogravimetric analysis was performed while raising the temperature to 800° C. at a temperature rise rate of 10° C./min. After measuring 1% weight-loss temperature (Td1%) at which a weight loss becomes 1%, each temperature Td1% was compared. The higher the Td1%, more satisfactory heat resistance is.

(15) Ion Implantation

Using a high temperature inert gas oven (INH-9CD-S; manufactured by Koyo Thermo Systems Co., Ltd.), a cured film of a composition, having the same film thickness as a cracking-resistant film thickness during ion implantation in (16) shown in Tables 7 to 10, was formed by the below-mentioned method in Example 1 at a thermal curing temperature of 450° C. After thermal curing, ions were implanted into a substrate formed with the cured film using an ion implantation apparatus (MODEL 2100 Ion Implanter; manufactured by Veeco Manufacturing, Inc.) under the following conditions.

Ion species: Al
Ion implantation temperature: 400° C.
Acceleration energy amount: 300 keV
Ion dose: 1.0E+14 ions/cm$^2$
Vacuum degree: 2.0E-6 Torr

(16) Cracking-Resistant Film Thickness during Ion Implantation

Using a high temperature inert gas oven (INH-9CD-S; manufactured by Koyo Thermo Systems Co., Ltd.), a cured film of a composition was formed on a Si wafer by the below-mentioned method in Example 1 in a thickness ranging from 1.0 to 3.0 μm. A cured film of a composition was formed at a thermal curing temperature of 450° C. After thermal curing, ions were implanted into a substrate formed with the cured film by the method mentioned in (15). After ion implantation, it was observed whether or not cracking occurs on a surface of the cured film using a FPD inspection microscope (MX-61L; manufactured by Olympus Corporation). The value of a maximum film thickness of the cracking-free cured film was regarded as a cracking-resistant film thickness (hereinafter referred to as "ion implantation cracking-resistant film thickness") during ion implantation, and then each cracking-resistant film thickness was compared. The larger the cracking-resistant film thickness, more satisfactory cracking resistance during ion implantation is. Samples having an ion implantation cracking-resistant film thickness of 1.0 μm or more were rated "Pass", and samples having an ion implantation cracking-resistant film thickness of 1.65 μm or more are excellent as an ion implantation mask resist.

(17) Presence or Absence of Cracking after Ion Implantation

A cured film of a composition was formed by the below-mentioned method in Example 1 using a high temperature inert gas oven (INH-9CD-S; manufactured by Koyo Thermo Systems Co., Ltd.). A cured film of a composition was formed at a thermal curing temperature of 450° C. After thermal curing, ions were implanted into a substrate formed with the cured film using an ion implanter (MODEL 2100 Ion Implanter; manufactured by Veeco Manufacturing, Inc.) under the same conditions as in (15).

After ion implantation, it was observed whether or not cracking occurs on a surface of the cured film subjected to ion implantation using a FPD inspection microscope (MX-61L; manufactured by Olympus Corporation). The case where cracking occurred was evaluated that cracking occurred. The case where no cracking occurred was evaluated as no cracking. No cracking exhibits satisfactory heat resistance and cracking resistance to ion implantation at 400° C.

(18) Presence or Absence of Cracking after Dopant Exposure

A cured film of a composition, having a film thickness of 1.0 μm was formed by the below-mentioned method in Example 1 using a high temperature inert gas oven (INH-9CD-S; manufactured by Koyo Thermo Systems Co., Ltd.). A cured film of a composition was formed at a thermal curing temperature of 450° C. After thermal curing, a substrate formed with the cured film was exposed to dopants using a horizontal diffusion furnace (MODEL 208; manufactured by Koyo Thermo Systems Co., Ltd.) under the following conditions.

Dopant: $PH_3$
Dopant exposure temperature: 800° C.
Dopant exposure time: 30 minutes After dopant exposure, it was observed whether or not cracking occurs on a surface of the cured film exposed to dopants using a FPD inspection microscope (MX-61L; manufactured by Olympus Corporation). The case where cracking occurred was evaluated that cracking occurred. The case where no cracking occurred was evaluated as no cracking. No cracking exhibits satisfactory heat resistance and cracking resistance to dopant exposure at 800° C.

(19) Presence or Absence of Cracking after Dry Etching

A cured film of a composition, having a film thickness shown in Tables 7 to 10 was formed by the below-mentioned method in Example 1 using a high temperature inert gas oven (INH-9CD-S; manufactured by Koyo Thermo Systems Co., Ltd.). A cured film of a composition was formed at a thermal curing temperature of 450° C. After thermal curing, a substrate formed with the cured film was treated by dry etching using a high throughput ashing/etching device (MAS-8220AT; manufactured by Canon Inc.) under the following conditions.

Etching gas: $CF_4/O_2$=75/25 (volume ratio)
RF power: 300 W
Etching temperature: 200° C.
Etching time: 30 seconds
Treatment pressure: 20 Pa
Gas flow rate: 50 sccm After dry etching, it was observed whether or not cracking occurs on a surface of the cured film subjected to dry etching using a FPD inspection microscope (MX-61L; manufactured by Olympus Corporation). The case where cracking occurred was evaluated that cracking occurred. The case where no cracking occurred was evaluated as no cracking. No cracking exhibits satisfactory heat resistance and cracking resistance to dry etching at 200° C.

(20) Presence or Absence of Cracking after Wet Etching

A cured film of a composition, having a film thickness shown in Tables 7 to 10 was formed by the below-mentioned method in Example 1 using a high temperature inert gas oven (INH-9CD-S; manufactured by Koyo Thermo Systems Co., Ltd.). A cured film of a composition was formed at a thermal curing temperature of 450° C. After thermal curing, a substrate formed with the cured film was treated by wet etching under the following conditions.

Etching solution: Phosphoric acid
Etching temperature: 100° C.
Etching time: 300 seconds
Rinsing solution: Water
Rinsing time: 120 seconds After wet etching, it was observed whether or not cracking occurs on a surface of the cured film subjected to wet etching using a FPD inspection microscope (MX-61L; manufactured by Olympus Corporation). The case where cracking occurred was evaluated that cracking occurred. The case where no cracking occurred was evaluated as no cracking. No cracking exhibits satisfactory heat resistance and cracking resistance to wet etching at 200° C.

(21) Removability of Cured Film

A cured film of a composition was formed by the below-mentioned method in Example 1, and then one or more treatments selected from the group consisting of ion implantation, dopant exposure, dry etching, and wet etching were applied onto a substrate formed with the cured film by the methods mentioned in (15), (18), (19), and (20).

After the treatment, firing was performed ned using a large-sized muffle furnace (FUW263PA; manufactured by ADVANTEC MFS, INC.). Firing conditions are as follows. The temperature was raised from 23° C. to 1,000° C. at a temperature rise rate of 10° C/min. Under airflow, firing was performed at 1,000° C. for 30 minutes. Subsequently, the cured film of a composition was removed by a chemical solution treatment under the following conditions.

Treatment chemical solution: 20% by weight hydrofluoric acid
Treatment temperature: 23° C.
Treatment time: 300 seconds
Rinsing solution: Water
Rinsing time: 120 seconds Using an FPD inspection microscope (MX-61L; manufactured by Olympus Corporation) and a field emission-type scanning electron microscope (S-4800; manufactured by Hitachi High-Technologies Corporation), a surface of the substrate was observed, and it was confirmed whether or not a residual film or residues of the cured film is/are formed. The case where a residual film or residues was/were formed was evaluated as the residual film or residues is/are formed. The case where no residue was formed was evaluated as no residue. No residue exhibits that it is possible to remove as a resist.

Example 1

Under yellow light, 0.333 g of PAI-101 was weighed, and 0.823 g of DAA and 6.300 g of PGMEA were added, and then the compound was dissolved by stirring. Next, 17.544 g of the polysiloxane solution (A-1) obtained in Synthesis Example 1 was added, followed by stirring to obtain a uniform solution. Thereafter, the obtained solution was filtered with a 0.2 μm filter to prepare a composition 1.

Using a spin coater (MS-A100; manufactured by MIKASA CO., LTD.), the composition 1 thus prepared was coated on a 4H—SiC wafer by spin coating at an optional rotational speed, and then prebaked at 95° C. for 195 seconds using a hot plate (SCW-636; manufactured by DAINIPPON SCREEN MFG. CO., LTD.) to form a prebaked film having a film thickness of about 1.9 μm.

The obtained prebaked film was allowed to undergo patterning exposure by exposing to i-line (wavelength of 365 nm), h-line (wavelength of 405 nm), and g-line (wavelength of 436 nm) of a ultra-high pressure mercury lamp through a grayscale mask for measurement of sensitivity (MDRM MODEL 4000-5-FS; manufactured by Opto-Line International) using a double-face alignment one-face stepper (Mask Aligner PEM-6M; manufactured by UNION OPTICAL CO., LTD.). After the exposure, the film was developed with NMD-W for 90 seconds using a portable developer for photolithography (AD-2000; manufactured by Takizawa Sangyo Co., Ltd.) and then rinsed with water for 30 seconds.

After the development, middle baking was performed by heating at 120° C. for 300 seconds using a hot plate (SCW-636; manufactured by DAINIPPON SCREEN MFG. CO., LTD.) and then a cured film having a film thickness of about 1.6 μm was formed by thermally curing at 450° C. using a high temperature inert gas oven (INH-9CD-S; manufactured by Koyo Thermo Systems Co., Ltd.). Thermal curing conditions are as follows. The atmosphere in an oven was purged with nitrogen by maintaining under a nitrogen gas flow at 50° C. for 30 minutes and the temperature was raised to 450° C. at a temperature rise rate of 10° C./min, followed by thermal curing at 450° C. for 30 minutes After thermal curing, a substrate formed with the cured film was subjected to one or more treatments selected from the group consisting of ion implantation, dopant exposure, dry etching, and wet etching.

Regarding ion implantation, Al ions as ion species were implanted into a substrate formed with the cured film at an ion implantation temperature of 400° C.

Regarding dopant exposure, a substrate formed with the cured film was exposed to $PH_3$ as dopants at a dopant exposure temperature of 800° C.

Regarding dry etching, a substrate formed with the cured film was treated at an etching temperature of 200° C. using $CF_4/O_2$=75/25 (volume ratio) as an etching gas.

Regarding wet etching, a substrate formed with the cured film was treated at an etching temperature of 100° C. using phosphoric acid as an etching solution.

After the treatment, firing was performed using a large-sized muffle furnace (FUW263PA; manufactured by ADVANTEC MFS, INC.). Firing conditions are as follows. Under airflow, the temperature was raised from 23° C. to 1,000° C. at a temperature rise rate of 10° C/min, followed by firing at 1,000° C. for 30 minutes. Subsequently, the cured film of the composition was removed by immersing in 20% by weight hydrofluoric acid at 23° C. for 300 seconds and rinsing with water for 120 seconds.

Thereafter, a surface of the substrate was observed using an FPD inspection microscope (MX-61L; manufactured by Olympus Corporation) and a field emission-type scanning electron microscope (S-4800; manufactured by Hitachi High-Technologies Corporation), and it was confirmed whether or not a residual film and residues of a cured film were formed.

Examples 2 to 91 and Comparative Examples 1 to 4

In the same manner as in Example 1, compositions 2 to 91 were prepared in accordance with formulations shown in Table 4-1 to Table 11-1. Using the obtained respective compositions, each composition was formed on a substrate in the same manner as in Example 1, and then photosensitivity and properties of the cured film were evaluated. The evaluation results are collectively shown in Table 4-2 to Table 11-2.

TABLE 4-1

| | Composition | Composition [parts by weight] | | | | | |
|---|---|---|---|---|---|---|---|
| | | (A) Polysiloxane | (B) Inorganic particles | (C) Compound having naphthoquinone diazide structure | (D) Photopolymerization initiator | (E1) Photoacid generator (E2) Photobase generator | (E3) Thermal acid generator (E4) Thermal base generator |
| Example 1 | 1 | A-1 (100) | — | — | — | PAI-101 (5) | — |
| Example 2 | 2 | A-2 (100) | — | — | — | PAI-101 (5) | — |
| Example 3 | 3 | A-3 (100) | — | — | — | PAI-101 (5) | — |
| Example 4 | 4 | A-3 (100) | — | QD-1 (9) | — | — | — |
| Example 5 | 5 | A-4 (100) | — | QD-1 (9) | — | — | — |
| Example 6 | 6 | A-5 (100) | — | QD-1 (9) | — | — | — |
| Example 7 | 7 | A-6 (100) | — | QD-1 (9) | — | — | — |
| Example 8 | 8 | A-7 (100) | — | QD-1 (9) | — | — | — |
| Example 9 | 9 | A-7 (100) | PL-2L-PGME (10) | QD-1 (9) | — | — | — |
| Example 10 | 10 | A-7 (100) | — | QD-1 (9) | — | MDT (1) | — |
| Example 11 | 11 | A-7 (100) | — | QD-1 (9) | — | — | SI-200 (1) |
| Example 12 | 12 | A-7 (100) | — | QD-1 (9) | — | — | — |

| | Composition [parts by weight] | | | | | Content of inorganic particles relative to total solid component [wt %] |
|---|---|---|---|---|---|---|
| | (F) Dissolution accelerating crosslinking agent | (G) Dissolution accelerator | Radical polymerizable compound | Silane coupling agent | Solvent | |
| Example 1 | — | — | — | — | DAA PGMEA | 0 |
| Example 2 | — | — | — | — | DAA PGMEA | 0 |
| Example 3 | — | — | — | — | DAA PGMEA | 0 |
| Example 4 | — | — | — | — | DAA PGMEA | 0 |
| Example 5 | — | — | — | — | DAA PGMEA | 0 |
| Example 6 | — | — | — | — | DAA PGMEA | 0 |
| Example 7 | — | — | — | — | DAA PGMEA | 0 |
| Example 8 | — | — | — | — | DAA PGMEA | 0 |
| Example 9 | — | — | — | — | DAA PGMEA | 8.4 |
| Example 10 | — | — | — | — | DAA PGMEA | 0 |
| Example 11 | — | — | — | — | DAA PGMEA | 0 |
| Example 12 | — | — | — | KBM-04 (5) | DAA PGMEA | 0 |

TABLE 4-2

| | Composition | Properties of photosensitive cured film | | | | | | | |
|---|---|---|---|---|---|---|---|---|---|
| | | Value of film thickness loss of unexposed area [μm] | Sensitivity [mJ/cm$^2$] | Thermal curing temperature [° C.] | Thermal curing time [min] | Resolution [μm] | Change in pattern dimensional width [μm] | 1% Weight loss temperature [° C.] | Firing temperature [° C.] |
| Example 1 | 1 | 0.05 | 80 | 450 | 30 | 5 | 0.34 | 495 | 1,000 |
| Example 2 | 2 | 0.03 | 80 | 450 | 30 | 6 | 0.34 | 485 | 1,000 |
| Example 3 | 3 | 0.03 | 80 | 450 | 30 | 5 | 0.29 | 500 | 1,000 |
| Example 4 | 4 | 0.06 | 50 | 450 | 30 | 3 | 0.29 | 500 | 1,000 |
| Example 5 | 5 | 0.05 | 50 | 450 | 30 | 3 | 0.29 | 495 | 1,000 |

TABLE 4-2-continued

| | | | | | | | | | |
|---|---|---|---|---|---|---|---|---|---|
| Example 6 | 6 | 0.04 | 50 | 450 | 30 | 3 | 0.29 | 490 | 1,000 |
| Example 7 | 7 | 0.01 | 50 | 450 | 30 | 3 | 0.29 | 485 | 1,000 |
| Example 8 | 8 | 0.05 | 50 | 450 | 30 | 3 | 0.29 | 495 | 1,000 |
| Example 9 | 9 | 0.05 | 50 | 450 | 30 | 4 | 0.29 | 500 | 1,000 |
| Example 10 | 10 | 0.05 | 50 | 450 | 30 | 3 | 0.29 | 495 | 1,000 |
| Example 11 | 11 | 0.05 | 50 | 450 | 30 | 3 | 0.29 | 495 | 1,000 |
| Example 12 | 12 | 0.05 | 50 | 450 | 30 | 3 | 0.29 | 495 | 1,000 |

| | Properties of photosensitive cured film | | | | | | |
|---|---|---|---|---|---|---|---|
| | Firing time [min] | Ion implantation cracking-resistant film thickness [μm] | Presence or absence of cracking after ion implantation | Presence or absence of cracking after dopant exposure | Presence or absence of cracking after dry etching | Presence or absence of cracking after wet etching | Removability of cured film |
| Example 1 | 30 | 1.55 | No cracking | No cracking | No cracking | No cracking | No residue |
| Example 2 | 30 | 1.40 | No cracking | No cracking | No cracking | No cracking | No residue |
| Example 3 | 30 | 1.80 | No cracking | No cracking | No cracking | No cracking | No residue |
| Example 4 | 30 | 1.80 | No cracking | No cracking | No cracking | No cracking | No residue |
| Example 5 | 30 | 1.75 | No cracking | No cracking | No cracking | No cracking | No residue |
| Example 6 | 30 | 1.70 | No cracking | No cracking | No cracking | No cracking | No residue |
| Example 7 | 30 | 1.57 | No cracking | No cracking | No cracking | No cracking | No residue |
| Example 8 | 30 | 1.75 | No cracking | No cracking | No cracking | No cracking | No residue |
| Example 9 | 30 | 1.80 | No cracking | No cracking | No cracking | No cracking | No residue |
| Example 10 | 30 | 1.75 | No cracking | No cracking | No cracking | No cracking | No residue |
| Example 11 | 30 | 1.77 | No cracking | No cracking | No cracking | No cracking | No residue |
| Example 12 | 30 | 1.75 | No cracking | No cracking | No cracking | No cracking | No residue |

TABLE 5-1

| | | Composition [parts by weight] | | | | | |
|---|---|---|---|---|---|---|---|
| | Composition | (A) Polysiloxane | (B) Inorganic particles | (C) Compound having naphthoquinone diazide structure | (D) Photopolymerization initiator | (E1) Photoacid generator (E2) Photobase generator | (E3) Thermal acid generator (E4) Thermal base generator |
| Example 13 | 13 | A-8 (100) | — | QD-1 (9) | — | — | — |
| Example 14 | 14 | A-9 (100) | — | QD-1 (9) | — | — | — |
| Example 15 | 15 | A-10 (100) | — | QD-1 (9) | — | — | — |
| Example 16 | 16 | A-11 (100) | — | QD-1 (9) | — | — | — |
| Example 17 | 17 | A-12 (100) | — | QD-1 (9) | — | — | — |
| Example 18 | 18 | A-13 (100) | — | QD-1 (9) | — | — | — |
| Example 19 | 19 | A-14 (100) | — | QD-1 (9) | — | — | — |
| Example 20 | 20 | A-15 (100) | — | QD-1 (9) | — | — | — |
| Example 21 | 21 | A-16 (100) | — | QD-1 (9) | — | — | — |
| Example 22 | 22 | A-17 (100) | — | QD-1 (9) | — | — | — |
| Example 23 | 23 | A-18 (100) | — | QD-1 (9) | — | — | — |
| Example 24 | 24 | A-19 (100) | — | QD-1 (9) | — | — | — |

TABLE 5-1-continued

| | | Composition [parts by weight] | | | | Content of inorganic particles |
|---|---|---|---|---|---|---|
| | (F) Dissolution accelerating crosslinking agent | (G) Dissolution accelerator | Radical polymerizable compound | Silane coupling agent | Solvent | relative to total solid component [wt %] |
| Example 13 | — | — | — | — | DAA PGMEA | 0 |
| Example 14 | — | — | — | — | DAA PGMEA | 0 |
| Example 15 | — | — | — | — | DAA PGMEA | 0 |
| Example 16 | — | — | — | — | DAA PGMEA | 0 |
| Example 17 | — | — | — | — | DAA PGMEA | 0 |
| Example 18 | — | — | — | — | DAA PGMEA | 0 |
| Example 19 | — | — | — | — | DAA PGMEA | 0 |
| Example 20 | — | — | — | — | DAA PGMEA | 0 |
| Example 21 | — | — | — | — | DAA PGMEA | 0 |
| Example 22 | — | — | — | — | DAA PGMEA | 0 |
| Example 23 | — | — | — | — | DAA PGMEA | 0 |
| Example 24 | — | — | — | — | DAA PGMEA | 0 |

TABLE 5-2

| | | Properties of photosensitive cured film | | | | | | | |
|---|---|---|---|---|---|---|---|---|---|
| | Composition | Value of film thickness loss of unexposed area [μm] | Sensitivity [mJ/cm$^2$] | Thermal curing temperature [° C.] | Thermal curing time [min] | Resolution [μm] | Change in pattern dimensional width [μm] | 1% Weight loss temperature [° C.] | Firing temperature [° C.] |
| Example 13 | 13 | 0.02 | 50 | 450 | 30 | 3 | 0.29 | 490 | 1,000 |
| Example 14 | 14 | 0.01 | 50 | 450 | 30 | 3 | 0.28 | 485 | 1,000 |
| Example 15 | 15 | 0.06 | 50 | 450 | 30 | 3 | 0.29 | 495 | 1,000 |
| Example 16 | 16 | 0.05 | 50 | 450 | 30 | 3 | 0.29 | 490 | 1,000 |
| Example 17 | 17 | 0.05 | 50 | 450 | 30 | 3 | 0.29 | 495 | 1,000 |
| Example 18 | 18 | 0.05 | 50 | 450 | 30 | 3 | 0.29 | 495 | 1,000 |
| Example 19 | 19 | 0.01 | 50 | 450 | 30 | 3 | 0.29 | 485 | 1,000 |
| Example 20 | 20 | 0.05 | 50 | 450 | 30 | 3 | 0.29 | 495 | 1,000 |
| Example 21 | 21 | 0.05 | 50 | 450 | 30 | 3 | 0.29 | 495 | 1,000 |
| Example 22 | 22 | 0.04 | 50 | 450 | 30 | 2 | 0.25 | 500 | 1,000 |
| Example 23 | 23 | 0.06 | 40 | 450 | 30 | 3 | 0.28 | 495 | 1,000 |
| Example 24 | 24 | 0.06 | 40 | 450 | 30 | 3 | 0.27 | 495 | 1,000 |

| | Properties of photosensitive cured film | | | | | | |
|---|---|---|---|---|---|---|---|
| | Firing time [min] | Ion implantation cracking-resistant film thickness [μm] | Presence or absence of cracking after ion implantation | Presence or absence of cracking after dopant exposure | Presence or absence of cracking after dry etching | Presence or absence of cracking after wet etching | Removability of cured film |
| Example 13 | 30 | 1.70 | No cracking | No cracking | No cracking | No cracking | No residue |
| Example 14 | 30 | 1.57 | No cracking | No cracking | No cracking | No cracking | No residue |
| Example 15 | 30 | 1.72 | No cracking | No cracking | No cracking | No cracking | No residue |
| Example 16 | 30 | 1.67 | No cracking | No cracking | No cracking | No cracking | No residue |

TABLE 5-2-continued

| | | | | | | | |
|---|---|---|---|---|---|---|---|
| Example 17 | 30 | 1.75 | No cracking | No cracking | No cracking | No cracking | No residue |
| Example 18 | 30 | 1.75 | No cracking | No cracking | No cracking | No cracking | No residue |
| Example 19 | 30 | 1.57 | No cracking | No cracking | No cracking | No cracking | No residue |
| Example 20 | 30 | 1.75 | No cracking | No cracking | No cracking | No cracking | No residue |
| Example 21 | 30 | 1.75 | No cracking | No cracking | No cracking | No cracking | No residue |
| Example 22 | 30 | 1.80 | No cracking | No cracking | No cracking | No cracking | No residue |
| Example 23 | 30 | 1.75 | No cracking | No cracking | No cracking | No cracking | No residue |
| Example 24 | 30 | 1.75 | No cracking | No cracking | No cracking | No cracking | No residue |

TABLE 6-1

| | | | | | | (E1) Photoacid generator (E2) Photobase generator | (E3) Thermal acid generator (E4) Thermal base generator |
|---|---|---|---|---|---|---|---|
| | Composition | (A) Polysiloxane | (B) Inorganic particles | (C) Compound having naphthoquinone diazide structure | (D) Photopolymerization initiator | | |
| Example 25 | 25 | A-20 (100) | — | QD-1 (9) | — | — | — |
| Example 26 | 26 | A-21 (100) | — | QD-1 (9) | — | — | — |
| Example 27 | 27 | A-22 (100) | — | QD-1 (9) | — | — | — |
| Example 28 | 28 | A-23 (100) | — | QD-1 (9) | — | — | — |
| Example 29 | 29 | A-24 (100) | — | QD-1 (9) | — | — | — |
| Example 30 | 30 | A-25 (100) | — | QD-1 (9) | — | — | — |
| Example 31 | 31 | A-26 (100) | — | QD-1 (9) | — | — | — |
| Example 32 | 32 | A-27 (100) | — | — | OXE-01 (5) | — | — |
| Example 33 | 33 | A-28 (100) | — | — | OXE-01 (5) | — | — |
| Example 34 | 34 | A-28 (100) | — | — | — | PAI-101 (5) | — |
| Example 35 | 35 | A-28 (100) | — | — | OXE-01 (5) | — | — |

| | (F) Dissolution accelerating crosslinking agent | (G) Dissolution accelerator | Radical polymerizable compound | Silane coupling agent | Solvent | Content of inorganic particles relative to total solid component [wt %] |
|---|---|---|---|---|---|---|
| Example 25 | — | — | — | — | DAA PGMEA | 32.1 |
| Example 26 | — | — | — | — | DAA PGMEA | 32.1 |
| Example 27 | — | — | — | — | DAA PGMEA | 32.1 |
| Example 28 | — | — | — | — | DAA PGMEA | 9.2 |
| Example 29 | — | — | — | — | DAA PGMEA | 18.3 |
| Example 30 | — | — | — | — | DAA PGMEA | 45.9 |
| Example 31 | — | — | — | — | DAA PGMEA | 32.1 |
| Example 32 | — | — | — | — | DAA PGMEA | 0 |
| Example 33 | — | — | — | — | DAA PGMEA | 33.3 |
| Example 34 | — | — | — | — | DAA PGMEA | 33.3 |
| Example 35 | — | — | M-315 (10) | — | DAA PGMEA | 30.4 |

TABLE 6-2

| | | Properties of photosensitive cured film | | | | | | |
|---|---|---|---|---|---|---|---|---|
| | Composition | Value of film thickness loss of unexposed area [μm] | Sensitivity [mJ/cm$^2$] | Thermal curing temperature [° C.] | Thermal curing time [min] | Resolution [μm] | Change in pattern dimensional width [μm] | 1% Weight loss temperature [° C.] | Firing temperature [° C.] |
| Example 25 | 25 | 0.05 | 40 | 450 | 30 | 3 | 0.29 | 505 | 1,000 |
| Example 26 | 26 | 0.04 | 40 | 450 | 30 | 3 | 0.28 | 500 | 1,000 |
| Example 27 | 27 | 0.05 | 40 | 450 | 30 | 2 | 0.25 | 510 | 1,000 |
| Example 28 | 28 | 0.06 | 40 | 450 | 30 | 3 | 0.28 | 500 | 1,000 |
| Example 29 | 29 | 0.05 | 40 | 450 | 30 | 3 | 0.28 | 500 | 1,000 |
| Example 30 | 30 | 0.04 | 40 | 450 | 30 | 3 | 0.30 | 505 | 1,000 |
| Example 31 | 31 | 0.04 | 50 | 450 | 30 | 3 | 0.26 | 505 | 1,000 |
| Example 32 | 32 | 0.03 | 80 | 450 | 30 | 5 | 0.26 | 495 | 1,000 |
| Example 33 | 33 | 0.04 | 70 | 450 | 30 | 5 | 0.25 | 505 | 1,000 |
| Example 34 | 34 | 0.04 | 70 | 450 | 30 | 5 | 0.25 | 505 | 1,000 |
| Example 35 | 35 | 0.04 | 65 | 450 | 30 | 5 | 0.25 | 500 | 1,000 |

| | Properties of photosensitive cured film | | | | | | |
|---|---|---|---|---|---|---|---|
| | Firing time [min] | Ion implantation cracking-resistant film thickness [μm] | Presence or absence of cracking after ion implantation | Presence or absence of cracking after dopant exposure | Presence or absence of cracking after dry etching | Presence or absence of cracking after wet etching | Removability of cured film |
| Example 25 | 30 | 1.85 | No cracking | No cracking | No cracking | No cracking | No residue |
| Example 26 | 30 | 1.80 | No cracking | No cracking | No cracking | No cracking | No residue |
| Example 27 | 30 | 1.90 | No cracking | No cracking | No cracking | No cracking | No residue |
| Example 28 | 30 | 1.80 | No cracking | No cracking | No cracking | No cracking | No residue |
| Example 29 | 30 | 1.82 | No cracking | No cracking | No cracking | No cracking | No residue |
| Example 30 | 30 | 1.90 | No cracking | No cracking | No cracking | No cracking | No residue |
| Example 31 | 30 | 1.85 | No cracking | No cracking | No cracking | No cracking | No residue |
| Example 32 | 30 | 1.75 | No cracking | No cracking | No cracking | No cracking | No residue |
| Example 33 | 30 | 1.85 | No cracking | No cracking | No cracking | No cracking | No residue |
| Example 34 | 30 | 1.85 | No cracking | No cracking | No cracking | No cracking | No residue |
| Example 35 | 30 | 1.80 | No cracking | No cracking | No cracking | No cracking | No residue |

TABLE 7-1

| | Composition [parts by weight] | | | | | | |
|---|---|---|---|---|---|---|---|
| | Composition | (A) Polysiloxane | (B) Inorganic particles | (C) Compound having naphthoquinone diazide structure | (D) Photopolymerization initiator | (E1) Photoacid generator (E2) Photobase generator | (E3) Thermal acid generator (E4) Thermal base generator |
| Example 36 | 40 | A-7 (100) | — | QD-1 (9) | — | — | — |
| Example 37 | 41 | A-7 (100) | — | QD-1 (9) | — | — | — |
| Example 38 | 42 | A-7 (100) | — | QD-1 (9) | — | — | — |
| Example 39 | 43 | A-7 (100) | — | QD-1 (9) | — | — | — |
| Example 40 | 44 | A-7 (100) | — | QD-1 (9) | — | — | — |
| Example 41 | 45 | A-7 (100) | — | QD-1 (9) | — | — | — |
| Example 42 | 46 | A-7 (100) | — | QD-1 (9) | — | — | — |
| Example 43 | 47 | A-7 (100) | — | QD-1 (9) | — | — | — |
| Example 44 | 48 | A-7 (100) | — | QD-1 (9) | — | — | — |

TABLE 7-1-continued

| | | | | | | | |
|---|---|---|---|---|---|---|---|
| Example 45 | 49 | A-7 (100) | — | QD-1 (9) | — | — | — |
| Example 46 | 50 | A-7 (100) | — | QD-1 (9) | — | — | — |
| Example 47 | 51 | A-7 (100) | — | QD-1 (9) | — | — | — |

| | Composition [parts by weight] | | | | | Content of inorganic particles relative to total solid component [wt %] |
|---|---|---|---|---|---|---|
| | (F) Dissolution accelerating crosslinking agent | (G) Dissolution accelerator | Radical polymerizable compound | Silane coupling agent | Solvent | |
| Example 36 | 46DMOC (1) | — | — | — | DAA PGMEA | 0 |
| Example 37 | TM-BIP-A (1) | — | — | — | DAA PGMEA | 0 |
| Example 38 | TMX-BIP-A (1) | — | — | — | DAA PGMEA | 0 |
| Example 39 | TMOM-BPAF (1) | — | — | — | DAA PGMEA | 0 |
| Example 40 | Dimethylol-BisOC-P (1) | — | — | — | DAA PGMEA | 0 |
| Example 41 | TM-BIP-A (0.5) | — | — | — | DAA PGMEA | 0 |
| Example 42 | TM-BIP-A (3) | — | — | — | DAA PGMEA | 0 |
| Example 43 | — | X-88-347 (3) | — | — | DAA PGMEA | 0 |
| Example 44 | — | KBM-303 (3) | — | — | DAA PGMEA | 0 |
| Example 45 | — | KBM-403 (3) | — | — | DAA PGMEA | 0 |
| Example 46 | — | X-88-347 (1) | — | — | DAA PGMEA | 0 |
| Example 47 | — | X-88-347 (5) | — | — | DAA PGMEA | 0 |

TABLE 7-2

| | | Properties of photosensitive cured film | | | | | | |
|---|---|---|---|---|---|---|---|---|
| | Composition | Value of film thickness loss of unexposed area [μm] | Sensitivity [mJ/cm²] | Thermal curing temperature [° C.] | Thermal curing time [min] | Resolution [μm] | Change in pattern dimensional width [μm] | 1% Weight loss temperature [° C.] | Firing temperature [° C.] |
| Example 36 | 40 | 0.04 | 40 | 450 | 30 | 2 | 0.17 | 500 | 1,000 |
| Example 37 | 41 | 0.04 | 40 | 450 | 30 | 2 | 0.15 | 500 | 1,000 |
| Example 38 | 42 | 0.04 | 40 | 450 | 30 | 2 | 0.14 | 500 | 1,000 |
| Example 39 | 43 | 0.03 | 40 | 450 | 30 | 2 | 0.13 | 500 | 1,000 |
| Example 40 | 44 | 0.04 | 40 | 450 | 30 | 2 | 0.15 | 500 | 1,000 |
| Example 41 | 45 | 0.04 | 40 | 450 | 30 | 2 | 0,18 | 500 | 1,000 |
| Example 42 | 46 | 0.04 | 30 | 450 | 30 | 2 | 0.14 | 500 | 1,000 |
| Example 43 | 47 | 0.05 | 50 | 450 | 30 | 2 | 0.30 | 495 | 1,000 |
| Example 44 | 48 | 0.05 | 50 | 450 | 30 | 2 | 0.30 | 495 | 1,000 |
| Example 45 | 49 | 0.05 | 50 | 450 | 30 | 2 | 0.30 | 495 | 1,000 |
| Example 46 | 50 | 0.05 | 50 | 450 | 30 | 2 | 0.29 | 495 | 1,000 |
| Example 47 | 51 | 0.05 | 40 | 450 | 30 | 2 | 0.30 | 495 | 1,000 |

| | Properties of photosensitive cured film | | | | | | |
|---|---|---|---|---|---|---|---|
| | Firing time [min] | Ion implantation cracking-resistant film thickness [μm] | Presence or absence of cracking after ion implantation | Presence or absence of cracking after dopant exposure | Presence or absence of cracking after dry etching | Presence or absence of cracking after wet etching | Removability of cured film |
| Example 36 | 30 | 1.80 | No cracking | No cracking | No cracking | No cracking | No residue |
| Example 37 | 30 | 1.80 | No cracking | No cracking | No cracking | No cracking | No residue |

TABLE 7-2-continued

| | | | | | | | |
|---|---|---|---|---|---|---|---|
| Example 38 | 30 | 1.80 | No cracking | No cracking | No cracking | No cracking | No residue |
| Example 39 | 30 | 1.80 | No cracking | No cracking | No cracking | No cracking | No residue |
| Example 40 | 30 | 1.80 | No cracking | No cracking | No cracking | No cracking | No residue |
| Example 41 | 30 | 1.80 | No cracking | No cracking | No cracking | No cracking | No residue |
| Example 42 | 30 | 1.80 | No cracking | No cracking | No cracking | No cracking | No residue |
| Example 43 | 30 | 1.75 | No cracking | No cracking | No cracking | No cracking | No residue |
| Example 44 | 30 | 1.75 | No cracking | No cracking | No cracking | No cracking | No residue |
| Example 45 | 30 | 1.75 | No cracking | No cracking | No cracking | No cracking | No residue |
| Example 46 | 30 | 1.75 | No cracking | No cracking | No cracking | No cracking | No residue |
| Example 47 | 30 | 1.75 | No cracking | No cracking | No cracking | No cracking | No residue |

TABLE 8-1

| | | | | Composition [parts by weight] | | | |
|---|---|---|---|---|---|---|---|
| | Composition | (A) Polysiloxane | (B) Inorganic particles | (C) Compound having naphthoquinone diazide structure | (D) Photopolymerization initiator | (E1) Photoacid generator (E2) Photobase generator | (E3) Thermal acid generator (E4) Thermal base generator |
| Example 48 | 52 | A-7 (100) | — | QD-1 (9) | — | — | — |
| Example 49 | 53 | A-7 (100) | — | QD-1 (9) | — | — | — |
| Example 50 | 54 | A-7 (100) | — | QD-1 (9) | — | — | — |
| Example 51 | 55 | A-7 (100) | — | QD-1 (9) | — | — | — |
| Example 52 | 56 | A-7 (100) | — | QD-1 (9) | — | — | — |
| Example 53 | 57 | A-7 (100) | — | QD-1 (9) | — | — | — |
| Example 54 | 58 | A-7 (100) | — | QD-1 (9) | — | — | — |
| Example 55 | 59 | A-33 (100) | — | QD-1 (9) | — | — | — |
| Example 56 | 60 | A-34 (100) | — | QD-1 (9) | — | — | — |
| Example 57 | 61 | A-35 (100) | — | QD-1 (9) | — | — | — |
| Example 58 | 62 | A-36 (100) | — | QD-1 (9) | — | — | — |
| Example 59 | 63 | A-37 (100) | — | QD-1 (9) | — | — | — |
| Example 60 | 64 | A-38 (100) | — | QD-1 (9) | — | — | — |
| Example 61 | 65 | A-39 (100) | — | QD-1 (9) | — | — | — |

| | Composition [parts by weight] | | | | | Content of inorganic particles relative to total solid component [wt %] |
|---|---|---|---|---|---|---|
| | (F) Dissolution accelerating crosslinking agent | (G) Dissolution accelerator | Radical polymerizable compound | Silane coupling agent | Solvent | |
| Example 48 | — | AC-1 (0.1) | — | — | DAA PGMEA | 0 |
| Example 49 | — | AC-2 (0.1) | — | — | DAA PGMEA | 0 |
| Example 50 | — | BYK-3440 (0.1) | — | — | DAA PGMEA | 0 |
| Example 51 | — | AC-2 (0.05) | — | — | DAA PGMEA | 0 |
| Example 52 | — | AC-2 (0.2) | — | — | DAA PGMEA | 0 |
| Example 53 | TM-BIP-A (1) | X-88-347 (3) | — | — | DAA PGMEA | 0 |
| Example 54 | TM-BIP-A (1) | AC-2 (0.1) | — | — | DAA PGMEA | 0 |
| Example 55 | — | — | — | — | DAA PGMEA | 32.1 |
| Example 56 | — | — | — | — | DAA PGMEA | 32.1 |

TABLE 8-1-continued

| | | | | | | | |
|---|---|---|---|---|---|---|---|
| Example 57 | — | — | — | — | DAA PGMEA | 32.1 |
| Example 58 | — | — | — | — | DAA PGMEA | 45.9 |
| Example 59 | — | — | — | — | DAA PGMEA | 32.1 |
| Example 60 | — | — | — | — | DAA PGMEA | 32.1 |
| Example 61 | — | — | — | — | DAA PGMEA | 45.9 |

TABLE 8-2

| | | Properties of photosensitive cured film | | | | | | |
|---|---|---|---|---|---|---|---|---|
| | Composition | Value of film thickness loss of unexposed area [µm] | Sensitivity [mJ/cm²] | Thermal curing temperature [° C.] | Thermal curing time [min] | Resolution [µm] | Change in pattern dimensional width [µm] | 1% Weight loss temperature [° C.] | Firing temperature [° C.] |
| Example 48 | 52 | 0.05 | 50 | 450 | 30 | 2 | 0.30 | 495 | 1,000 |
| Example 49 | 53 | 0.05 | 50 | 450 | 30 | 2 | 0.30 | 495 | 1,000 |
| Example 50 | 54 | 0.05 | 50 | 450 | 30 | 2 | 0.30 | 495 | 1,000 |
| Example 51 | 55 | 0.05 | 50 | 450 | 30 | 2 | 0.29 | 495 | 1,000 |
| Example 52 | 56 | 0.05 | 40 | 450 | 30 | 2 | 0.30 | 495 | 1,000 |
| Example 53 | 57 | 0.04 | 40 | 450 | 30 | 2 | 0.15 | 500 | 1,000 |
| Example 54 | 58 | 0.04 | 40 | 450 | 30 | 2 | 0.15 | 500 | 1,000 |
| Example 55 | 59 | 0.04 | 40 | 450 | 30 | 2 | 0.25 | 500 | 1,000 |
| Example 56 | 60 | 0.03 | 40 | 450 | 30 | 1 | 0.26 | 505 | 1,000 |
| Example 57 | 61 | 0.04 | 40 | 450 | 30 | 2 | 0.28 | 505 | 1,000 |
| Example 58 | 62 | 0.03 | 40 | 450 | 30 | 2 | 0.29 | 510 | 1,000 |
| Example 59 | 63 | 0.04 | 40 | 450 | 30 | 3 | 0.29 | 505 | 1,000 |
| Example 60 | 64 | 0.03 | 40 | 450 | 30 | 2 | 0.29 | 505 | 1,000 |
| Example 61 | 65 | 0.03 | 40 | 450 | 30 | 3 | 0.30 | 510 | 1,000 |

| | Properties of photosensitive cured film | | | | | | |
|---|---|---|---|---|---|---|---|
| | Firing time [min] | Ion implantation cracking-resistant film thickness [µm] | Presence or absence of cracking after ion implantation | Presence or absence of cracking after dopant exposure | Presence or absence of cracking after dry etching | Presence or absence of cracking after wet etching | Removability of cured film |
| Example 48 | 30 | 1.75 | No cracking | No cracking | No cracking | No cracking | No residue |
| Example 49 | 30 | 1.75 | No cracking | No cracking | No cracking | No cracking | No residue |
| Example 50 | 30 | 1.75 | No cracking | No cracking | No cracking | No cracking | No residue |
| Example 51 | 30 | 1.75 | No cracking | No cracking | No cracking | No cracking | No residue |
| Example 52 | 30 | 1.75 | No cracking | No cracking | No cracking | No cracking | No residue |
| Example 53 | 30 | 1.80 | No cracking | No cracking | No cracking | No cracking | No residue |
| Example 54 | 30 | 1.80 | No cracking | No cracking | No cracking | No cracking | No residue |
| Example 55 | 30 | 1.80 | No cracking | No cracking | No cracking | No cracking | No residue |
| Example 56 | 30 | 1.85 | No cracking | No cracking | No cracking | No cracking | No residue |
| Example 57 | 30 | 1.85 | No cracking | No cracking | No cracking | No cracking | No residue |
| Example 58 | 30 | 1.95 | No cracking | No cracking | No cracking | No cracking | No residue |
| Example 59 | 30 | 1.85 | No cracking | No cracking | No cracking | No cracking | No residue |
| Example 60 | 30 | 1.90 | No cracking | No cracking | No cracking | No cracking | No residue |
| Example 61 | 30 | 2.00 | No cracking | No cracking | No cracking | No cracking | No residue |

TABLE 9-1

| | Composition | Composition [parts by weight] | | | | | |
|---|---|---|---|---|---|---|---|
| | | (A) Polysiloxane | (B) Inorganic particles | (C) Compound having naphthoquinone diazide structure | (D) Photopolymerization initiator | (E1) Photoacid generator (E2) Photobase generator | (E3) Thermal acid generator (E4) Thermal base generator |
| Example 62 | 66 | A-40 (100) | — | QD-1 (9) | — | — | — |
| Example 63 | 67 | A-41 (100) | — | QD-1 (9) | — | — | — |
| Example 64 | 68 | A-42 (100) | — | QD-1 (9) | — | — | — |
| Example 65 | 69 | A-43 (100) | — | QD-1 (9) | — | — | — |
| Example 66 | 70 | A-44 (100) | — | QD-1 (9) | — | — | — |
| Example 67 | 71 | A-45 (100) | — | QD-1 (9) | — | — | — |
| Example 68 | 72 | A-46 (100) | — | QD-1 (9) | — | — | — |
| Example 69 | 73 | A-47 (100) | — | QD-1 (9) | — | — | — |
| Example 70 | 74 | A-48 (100) | — | QD-1 (9) | — | — | — |
| Example 71 | 75 | A-49 (100) | — | QD-1 (9) | — | — | — |

| | Composition [parts by weight] | | | | | Content of inorganic particles relative to total solid component [wt %] |
|---|---|---|---|---|---|---|
| | (F) Dissolution accelerating crosslinking agent | (G) Dissolution accelerator | Radical polymerizable compound | Silane coupling agent | Solvent | |
| Example 62 | — | — | — | — | DAA PGMEA | 32.1 |
| Example 63 | — | — | — | — | DAA PGMEA | 32.1 |
| Example 64 | — | — | — | — | DAA PGMEA | 32.1 |
| Example 65 | — | — | — | — | DAA PGMEA | 22.9 |
| Example 66 | — | — | — | — | DAA PGMEA | 45.9 |
| Example 67 | — | — | — | — | DAA PGMEA | 32.1 |
| Example 68 | — | — | — | — | DAA PGMEA | 32.1 |
| Example 69 | — | — | — | — | DAA PGMEA | 32.1 |
| Example 70 | — | — | — | — | DAA PGMEA | 22.9 |
| Example 71 | — | — | — | — | DAA PGMEA | 45.9 |

TABLE 9-2

| | Composition | Properties of photosensitive cured film | | | | | | | |
|---|---|---|---|---|---|---|---|---|---|
| | | Value of film thickness loss of unexposed area [μm] | Sensitivity [mJ/cm$^2$] | Thermal curing temperature [° C.] | Thermal curing time [min] | Resolution [μm] | Change in pattern dimensional width [μm] | 1% Weight loss temperature [° C.] | Firing temperature [° C.] |
| Example 62 | 66 | 0.03 | 40 | 450 | 30 | 1 | 0.20 | 505 | 1000 |
| Example 63 | 67 | 0.02 | 35 | 450 | 30 | 1 | 0.21 | 510 | 1000 |
| Example 64 | 68 | 0.03 | 40 | 450 | 30 | 1 | 0.23 | 510 | 1000 |
| Example 65 | 69 | 0.03 | 35 | 450 | 30 | 1 | 0.20 | 505 | 1000 |
| Example 66 | 70 | 0.02 | 30 | 450 | 30 | 1 | 0.25 | 515 | 1000 |
| Example 67 | 71 | 0.03 | 40 | 450 | 30 | 1 | 0.24 | 505 | 1000 |
| Example 68 | 72 | 0.03 | 40 | 450 | 30 | 1 | 0.24 | 510 | 1000 |
| Example 69 | 73 | 0.03 | 40 | 450 | 30 | 1 | 0.26 | 510 | 1000 |

TABLE 9-2-continued

| | | | | | | | | | |
|---|---|---|---|---|---|---|---|---|---|
| Example 70 | 74 | 0.03 | 40 | 450 | 30 | 1 | 0.22 | 510 | 1000 |
| Example 71 | 75 | 0.02 | 40 | 450 | 30 | 1 | 0.25 | 510 | 1000 |

| | Properties of photosensitive cured film | | | | | | |
|---|---|---|---|---|---|---|---|
| | Firing time [min] | Ion implantation cracking-resistant film thickness [µm] | Presence or absence of cracking after ion implantation | Presence or absence of cracking after dopant exposure | Presence or absence of cracking after dry etching | Presence or absence of cracking after wet etching | Removability of cured film |
| Example 62 | 30 | 1.85 | No cracking | No cracking | No cracking | No cracking | No residue |
| Example 63 | 30 | 1.95 | No cracking | No cracking | No cracking | No cracking | No residue |
| Example 64 | 30 | 1.95 | No cracking | No cracking | No cracking | No cracking | No residue |
| Example 65 | 30 | 1.85 | No cracking | No cracking | No cracking | No cracking | No residue |
| Example 66 | 30 | 2.05 | No cracking | No cracking | No cracking | No cracking | No residue |
| Example 67 | 30 | 1.90 | No cracking | No cracking | No cracking | No cracking | No residue |
| Example 68 | 30 | 2.00 | No cracking | No cracking | No cracking | No cracking | No residue |
| Example 69 | 30 | 2.00 | No cracking | No cracking | No cracking | No cracking | No residue |
| Example 70 | 30 | 1.95 | No cracking | No cracking | No cracking | No cracking | No residue |
| Example 71 | 30 | 2.00 | No cracking | No cracking | No cracking | No cracking | No residue |

TABLE 10-1

| | | Composition [parts by weight] | | | | | |
|---|---|---|---|---|---|---|---|
| | Composition | (A) Polysiloxane | (B) Inorganic particles | (C) Compound having naphthoquinone diazide structure | (D) Photopolymerization initiator | (E1) Photoacid generator (E2) Photobase generator | (E3) Thermal acid generator (E4) Thermal base generator |
| Example 72 | 76 | A-33(100) | — | QD-1 (9) | — | — | — |
| Example 73 | 77 | A-34 (100) | — | QD-1 (9) | — | — | — |
| Example 74 | 78 | A-35(100) | — | QD-1 (9) | — | — | — |
| Example 75 | 79 | A-36(100) | — | QD-1 (9) | — | — | — |
| Example 76 | 80 | A-37 (100) | — | QD-1 (9) | — | — | — |
| Example 77 | 81 | A-38 (100) | — | QD-1 (9) | — | — | — |
| Example 78 | 82 | A-39 (100) | — | QD-1 (9) | — | — | — |
| Example 79 | 83 | A-40 (100) | — | QD-1 (9) | — | — | — |
| Example 80 | 84 | A-41(100) | — | QD-1 (9) | — | — | — |
| Example 81 | 85 | A-44 (100) | — | QD-1 (9) | — | — | — |
| Example 82 | 86 | A-45(100) | — | QD-1 (9) | — | — | — |
| Example 83 | 87 | A-46(100) | — | QD-1 (9) | — | — | — |

| | Composition [parts by weight] | | | | | Content of inorganic particles relative to total solid component [wt %] |
|---|---|---|---|---|---|---|
| | (F) Dissolution accelerating crosslinking agent | (G) Dissolution accelerator | Radical polymerizable compound | Silane coupling agent | Solvent | |
| Example 72 | TM-BIP-A (1) | — | — | — | DAA PGMEA | 31.8 |
| Example 73 | TM-BIP-A (1) | — | — | — | DAA PGMEA | 31.8 |
| Example 74 | TM-BIP-A (1) | — | — | — | DAA PGMEA | 31.8 |

TABLE 10-1-continued

|  |  |  |  |  |  |  |  |
|---|---|---|---|---|---|---|---|
| Example 75 | TM-BIP-A (1) | — | — | — | DAA PGMEA | 45.5 |
| Example 76 | TM-BIP-A (1) | — | — | — | DAA PGMEA | 31.8 |
| Example 77 | TM-BIP-A (1) | — | — | — | DAA PGMEA | 31.8 |
| Example 78 | TM-BIP-A (1) | — | — | — | DAA PGMEA | 45.5 |
| Example 79 | TM-BIP-A (1) | — | — | — | DAA PGMEA | 31.8 |
| Example 80 | TM-BIP-A (1) | — | — | — | DAA PGMEA | 31.8 |
| Example 81 | TM-BIP-A (1) | — | — | — | DAA PGMEA | 45.5 |
| Example 82 | TM-BIP-A (1) | — | — | — | DAA PGMEA | 31.8 |
| Example 83 | TM-BIP-A (1) | — | — | — | DAA PGMEA | 31.8 |

TABLE 10-2

| | | Properties of photosensitive cured film | | | | | | |
|---|---|---|---|---|---|---|---|---|
| | Composition | Value of film thickness loss of unexposed area [μm] | Sensitivity [mJ/cm$^2$] | Thermal curing temperature [° C.] | Thermal curing time [min] | Resolution [μm] | Change in pattern dimensional width [μm] | 1% Weight loss temperature [° C.] | Firing temperature [° C.] |
| Example 72 | 76 | 0.03 | 30 | 450 | 30 | 1 | 0.12 | 505 | 1000 |
| Example 73 | 77 | 0.02 | 30 | 450 | 30 | 1 | 0.13 | 510 | 1000 |
| Example 74 | 78 | 0.03 | 30 | 450 | 30 | 1 | 0.14 | 510 | 1000 |
| Example 75 | 79 | 0.02 | 30 | 450 | 30 | 1 | 0.14 | 515 | 1000 |
| Example 76 | 80 | 0.03 | 30 | 450 | 30 | 2 | 0.14 | 510 | 1000 |
| Example 77 | 81 | 0.02 | 30 | 450 | 30 | 1 | 0.14 | 510 | 1000 |
| Example 78 | 82 | 0.02 | 30 | 450 | 30 | 2 | 0.15 | 515 | 1000 |
| Example 79 | 83 | 0.02 | 30 | 450 | 30 | 1 | 0.10 | 510 | 1000 |
| Example 80 | 84 | 0.01 | 25 | 450 | 30 | 1 | 0.11 | 515 | 1000 |
| Example 81 | 85 | 0.01 | 20 | 450 | 30 | 1 | 0.12 | 515 | 1000 |
| Example 82 | 86 | 0.02 | 30 | 450 | 30 | 1 | 0.12 | 510 | 1000 |
| Example 83 | 87 | 0.02 | 30 | 450 | 30 | 1 | 0.12 | 515 | 1000 |

| | Properties of photosensitive cured film | | | | | | |
|---|---|---|---|---|---|---|---|
| | Firing time [min] | Ion implantation cracking-resistant film thickness [μm] | Presence or absence of cracking after ion implantation | Presence or absence of cracking after dopant exposure | Presence or absence of cracking after dry etching | Presence or absence of cracking after wet etching | Removability of cured film |
| Example 72 | 30 | 1.85 | No cracking | No cracking | No cracking | No cracking | No residue |
| Example 73 | 30 | 1.90 | No cracking | No cracking | No cracking | No cracking | No residue |
| Example 74 | 30 | 1.90 | No cracking | No cracking | No cracking | No cracking | No residue |
| Example 75 | 30 | 2.00 | No cracking | No cracking | No cracking | No cracking | No residue |
| Example 76 | 30 | 1.90 | No cracking | No cracking | No cracking | No cracking | No residue |
| Example 77 | 30 | 1.95 | No cracking | No cracking | No cracking | No cracking | No residue |
| Example 78 | 30 | 2.05 | No cracking | No cracking | No cracking | No cracking | No residue |
| Example 79 | 30 | 1.95 | No cracking | No cracking | No cracking | No cracking | No residue |
| Example 80 | 30 | 2.05 | No cracking | No cracking | No cracking | No cracking | No residue |
| Example 81 | 30 | 2.15 | No cracking | No cracking | No cracking | No cracking | No residue |

TABLE 10-2-continued

| | | | | | | | |
|---|---|---|---|---|---|---|---|
| Example 82 | 30 | 2.00 | No cracking | No cracking | No cracking | No cracking | No residue |
| Example 83 | 30 | 2.10 | No cracking | No cracking | No cracking | No cracking | No residue |

TABLE 11-1

| | Composition [parts by weight] | | | | | | |
|---|---|---|---|---|---|---|---|
| | (A) Composition Polysiloxane | (B) Inorganic particles | (C) Compound having naphthoquinone diazide structure | (D) Photopolymerization initiator | (E1) Photoacid generator (E2) Photobase generator | (E3) Thermal acid generator (E4) Thermal base generator | |
| Example 84 | 88 | A-36 (100) | — | QD-1 (9) | — | — | — |
| Example 85 | 89 | A-36 (100) | — | QD-1 (9) | — | — | — |
| Example 86 | 90 | A-36 (100) | — | QD-1 (9) | — | — | — |
| Example 87 | 91 | A-36 (100) | — | QD-1 (9) | — | — | — |
| Example 88 | 8 | A-7 (100) | — | QD-1 (9) | — | — | — |
| Example 89 | 8 | A-7 (100) | — | QD-1 (9) | — | — | — |
| Example 90 | 8 | A-7 (100) | — | QD-1 (9) | — | — | — |
| Example 91 | 8 | A-7 (100) | — | QD-1 (9) | — | — | — |
| Comparative Example 1 | 36 | A-29 (100) | — | QD-1 (9) | — | — | — |
| Comparative Example 2 | 37 | A-30 (100) | — | QD-1 (9) | — | — | — |
| Comparative Example 3 | 38 | A-31 (100) | — | QD-1 (9) | — | — | — |
| Comparative Example 4 | 39 | A-32 (100) | — | QD-1 (9) | — | — | — |

| | Composition [parts by weight] | | | | | Content of |
|---|---|---|---|---|---|---|
| | (F) Dissolution accelerating crosslinking agent | (G) Dissolution accelerator | Radical polymerizable compound | Silane coupling agent | Solvent | inorganic particles relative to total solid component [wt %] |
| Example 84 | — | X-88-347 (3) | — | — | DAA PGMEA | 44.6 |
| Example 85 | — | AC-2 (0.1) | — | — | DAA PGMEA | 45.8 |
| Example 86 | TM-BIP-A (1) | X-88-347 (3) | — | — | DAA PGMEA | 44.2 |
| Example 87 | TM-BIP-A (1) | AC-2 (0.1) | — | — | DAA PGMEA | 45.4 |
| Example 88 | — | — | — | — | DAA PGMEA | 0 |
| Example 89 | — | — | — | — | DAA PGMEA | 0 |
| Example 90 | — | — | — | — | DAA PGMEA | 0 |
| Example 91 | — | — | — | — | DAA PGMEA | 0 |
| Comparative Example 1 | — | — | — | — | DAA PGMEA | 0 |
| Comparative Example 2 | — | — | — | — | DAA PGMEA | 0 |
| Comparative Example 3 | — | — | — | — | DAA PGMEA | 32.1 |
| Comparative Example 4 | — | — | — | — | DAA PGMEA | 32.1 |

TABLE 11-2

| | | Properties of photosensitive cured film | | | | | | | |
|---|---|---|---|---|---|---|---|---|---|
| | Composition | Value of film thickness loss of unexposed area [μm] | Sensitivity [mJ/cm$^2$] | Thermal curing temperature [° C.] | Thermal curing time [min] | Resolution [μm] | Change in pattern dimensional width [μm] | 1% Weight loss temperature [° C.] | Firing temperature [° C.] |
| Example 84 | 88 | 0.03 | 40 | 450 | 30 | 1 | 0.30 | 515 | 1000 |
| Example 85 | 89 | 0.03 | 40 | 450 | 30 | 1 | 0.30 | 515 | 1000 |
| Example 86 | 90 | 0.02 | 30 | 450 | 30 | 1 | 0.14 | 515 | 1000 |
| Example 87 | 91 | 0.02 | 30 | 450 | 30 | 1 | 0.14 | 515 | 1000 |
| Example 88 | 8 | 0.05 | 50 | 450 | 30 | 3 | 0.29 | 495 | 1000 |
| Example 89 | 8 | 0.05 | 50 | 450 | 30 | 3 | 0.29 | 495 | 1000 |
| Example 90 | 8 | 0.05 | 50 | 450 | 30 | 3 | 0.29 | 495 | 1000 |
| Example 91 | 8 | 0.05 | 50 | 450 | 30 | 3 | 0.29 | 495 | 1000 |
| Comparative Example 1 | 36 | 0.05 | 70 | 450 | 30 | 10 | 0.30 | 495 | 1000 |
| Comparative Example 2 | 37 | 0.05 | 50 | 450 | 30 | 3 | 0.30 | 490 | 1000 |
| Comparative Example 3 | 38 | 0.03 | 40 | 450 | 30 | 2 | 0.25 | 500 | 1000 |
| Comparative Example 4 | 39 | 0.01 | 60 | 450 | 30 | 4 | 0.26 | 510 | 1000 |

| | Properties of photosensitive cured film | | | | | | |
|---|---|---|---|---|---|---|---|
| | Firing time [min] | Ion implantation cracking-resistant film thickness [μm] | Presence or absence of cracking after ion implantation | Presence or absence of cracking after dopant exposure | Presence or absence of cracking after dry etching | Presence or absence of cracking after wet etching | Removability of cured film |
| Example 84 | 30 | 2.00 | No cracking | No cracking | No cracking | No cracking | No residue |
| Example 85 | 30 | 2.00 | No cracking | No cracking | No cracking | No cracking | No residue |
| Example 86 | 30 | 2.00 | No cracking | No cracking | No cracking | No cracking | No residue |
| Example 87 | 30 | 2.00 | No cracking | No cracking | No cracking | No cracking | No residue |
| Example 88 | 30 | 1.75 | No cracking | — | — | — | No residue |
| Example 89 | 30 | 1.75 | — | No cracking | — | — | No residue |
| Example 90 | 30 | 1.75 | — | — | No cracking | — | No residue |
| Example 91 | 30 | 1.75 | — | — | — | No cracking | No residue |
| Comparative Example 1 | 30 | 1.75 | No cracking | No cracking | No cracking | No cracking | No residue |
| Comparative Example 2 | 30 | 1.20 | Cracking occurred | Cracking occurred | Cracking occurred | No cracking | No residue |
| Comparative Example 3 | 30 | 1.45 | Cracking occurred | Cracking occurred | Cracking occurred | No cracking | No residue |
| Comparative Example 4 | 30 | 1.75 | No cracking | No cracking | No cracking | No cracking | No residue |

Example 92

Under yellow light, 0.578 g of the compound having a naphthoquinone diazide structure (QD-1) obtained in Synthesis Example 50 was weighed, and 1.932 g of DAA and 7.200 g of PGMEA were added, and then the compound was dissolved by stirring. Next, 15.291 g of the polysiloxane solution (A-44) obtained in Synthesis Example 44 was added, followed by stirring to obtain a uniform solution. Thereafter, the obtained solution was filtered with a 0.2 μm filter to prepare a composition 70.

Using a spin coater (MS-A100; manufactured by MIKASA CO., LTD.), the composition 70 thus prepared was coated on a 4H—SiC wafer by spin coating at an optional rotational speed, and then prebaked at 95° C. for 195 seconds using a hot plate (SCW-636; manufactured by DAINIPPON SCREEN MFG. CO., LTD.) to form a prebaked film having a film thickness of about 2.1 μm.

The obtained prebaked film was allowed to undergo patterning exposure by exposing to i-line (wavelength of 365 nm), h-line (wavelength of 405 nm), and g-line (wavelength of 436 nm) of a ultra-high pressure mercury lamp through a grayscale mask for measurement of sensitivity (MDRM MODEL 4000-5-FS; manufactured by Opto-Line International) using a double-face alignment one-face stepper (Mask Aligner PEM-6M; manufactured by UNION OPTICAL CO., LTD.). After the exposure, the film was developed with NMD-W for 90 seconds using a portable developer for photolithography (AD-2000; manufactured by Takizawa Sangyo Co., Ltd.) and then rinsed with water for 30 seconds. Alternatively, the prebaked film thus formed was allowed to undergo patterning exposure using a reduced projection-type stepper (i-line Stepper NSR-2005i9C; manufactured by Nikon Corporation). After the exposure, the film was developed with NMD-W for 90 seconds using a portable developer for photolithography (AD-2000; manufactured by Takizawa Sangyo Co., Ltd.) and then rinsed with water for 30 seconds.

After the development, middle baking was performed at 120° C. for 300 seconds using a hot plate (SCW-636; manufactured by DAINIPPON SCREEN MFG. CO., LTD.) and then thermal curing was performed under airflow at 1,000° C. for 30 minutes using a flash lamp annealing device (LA-3000-F; manufactured by SCREEN Semiconductor Solutions Co., Ltd.) to form a cured film having a film thickness of about 1.5 μm.

After thermal curing, a substrate formed with the cured film was subjected to one or more treatments selected from the group consisting of ion implantation, dopant exposure, dry etching, and wet etching.

Regarding ion implantation, Al ions as ion species were implanted into a substrate formed with the cured film at an ion implantation temperature of 500° C.

Regarding dopant exposure, a substrate formed with the cured film was exposed to $PH_3$ as dopants at a dopant exposure temperature of 800° C.

Regarding dry etching, a substrate formed with the cured film was treated at an etching temperature of 200° C. using $CF_4/O_2$=75/25 (volume ratio) as an etching gas.

Regarding wet etching, a substrate formed with the cured film was treated at an etching temperature of 100° C. using phosphoric acid as an etching solution.

After the treatment, the cured film of the composition was removed by immersing in 20% by weight hydrofluoric acid at 23° C. for 300 seconds and rinsing with water for 120 seconds.

Thereafter, a surface of the substrate was observed using an FPD inspection microscope (MX-61L; manufactured by Olympus Corporation) and a field emission-type scanning electron microscope (S-4800; manufactured by Hitachi High-Technologies Corporation), and it was confirmed whether or not a residual film and residues of a cured film were formed.

Examples 93 to 97 and Comparative Example 5

In the same manner as in Example 1, a composition 70 was prepared in accordance with formulations shown in Table 12-1. Using the obtained composition 70, the composition was formed on a substrate in the same manner as in Example 92, and then photosensitivity and properties of the cured film were evaluated. The evaluation results are collectively shown in Table 12-2.

TABLE 12-1

| | | Composition [parts by weight] | | | | | | |
|---|---|---|---|---|---|---|---|---|
| | Composition | (A) Polysiloxane | (B) Inorganic particles | (C) Compound having naphthoquinone diazide structure | (D) Photopolymerization initiator | (E1) Photoacid generator (E2) Photobase generator | (E3) Thermal acid generator (E4) Thermal base generator | |
| Example 92 | 70 | A-44 (100) | — | QD-1 (9) | — | — | — | |
| Example 93 | 70 | A-44 (100) | — | QD-1 (9) | — | — | — | |
| Example 94 | 70 | A-44 (100) | — | QD-1 (9) | — | — | — | |
| Example 95 | 70 | A-44 (100) | — | QD-1 (9) | — | — | — | |
| Example 96 | 70 | A-44 (100) | — | QD-1 (9) | — | — | — | |
| Example 97 | 70 | A-44 (100) | — | QD-1 (9) | — | — | — | |
| Comparative Example 5 | 70 | A-44 (100) | — | QD-1 (9) | — | — | — | |

| | Composition [parts by weight] | | | | | Content of inorganic particles relative to total solid component [wt %] |
|---|---|---|---|---|---|---|
| | (F) Dissolution accelerating crosslinking agent | (G) Dissolution accelerator | Radical polymerizable compound | Silane coupling agent | Solvent | |
| Example 92 | — | — | — | — | DAA PGMEA | 45.9 |
| Example 93 | — | — | — | — | DAA PGMEA | 45.9 |
| Example 94 | — | — | — | — | DAA PGMEA | 45.9 |
| Example 95 | — | — | — | — | DAA PGMEA | 45.9 |
| Example 96 | — | — | — | — | DAA PGMEA | 45.9 |
| Example 97 | — | — | — | — | DAA PGMEA | 45.9 |
| Comparative Example 5 | — | — | — | — | DAA PGMEA | 45.9 |

TABLE 12-2

| | | Properties of photosensitive cured film | | | | | | |
|---|---|---|---|---|---|---|---|---|
| | Composition | Value of film thickness loss of unexposed area [μm] | Sensitivity [mJ/cm$^2$] | Thermal curing temperature [° C.] | Thermal curing time [min] | Resolution [μm] | Change in pattern dimensional width [μm] | 1% Weight loss temperature [° C.] | Firing temperature [° C.] |
| Example 92 | 70 | 0.02 | 30 | 1000 | 30 | 1 | 0.25 | 515 | — |
| Example 93 | 70 | 0.02 | 30 | 600 | 30 | 1 | 0.25 | 515 | — |
| Example 94 | 70 | 0.02 | 30 | 800 | 30 | 1 | 0.25 | 515 | — |
| Example 95 | 70 | 0.02 | 30 | 1200 | 30 | 1 | 0.25 | 515 | — |
| Example 96 | 70 | 0.02 | 30 | 1000 | 15 | 1 | 0.25 | 515 | — |
| Example 97 | 70 | 0.02 | 30 | 1000 | 60 | 1 | 0.25 | 515 | — |
| Example 88 | 70 | 0.02 | 30 | 450 | 30 | 1 | 0.25 | 515 | — |

| | Properties of photosensitive cured film | | | | | | |
|---|---|---|---|---|---|---|---|
| | Firing time [min] | Ion implantation cracking-resistant film thickness [μm] | Presence or absence of cracking after ion implantation | Presence or absence of cracking after dopant exposure | Presence or absence of cracking after dry etching | Presence or absence of cracking after wet etching | Removability of cured film |
| Example 92 | — | 2.05 | No cracking | No cracking | No cracking | No cracking | No residue |
| Example 93 | — | 2.05 | No cracking | No cracking | No cracking | No cracking | No residue |
| Example 94 | — | 2.05 | No cracking | No cracking | No cracking | No cracking | No residue |
| Example 95 | — | 2.05 | No cracking | No cracking | No cracking | No cracking | No residue |
| Example 96 | — | 2.05 | No cracking | No cracking | No cracking | No cracking | No residue |
| Example 97 | — | 2.05 | No cracking | No cracking | No cracking | No cracking | No residue |
| Example 88 | — | 2.05 | No cracking | No cracking | No cracking | No cracking | Formation of residues |

REFERENCE SIGNS LIST

1: Silicon carbide semiconductor substrate
2: Polysiloxane film
2a: Polysiloxane pattern
3: Mask
4: Active chemical rays
5: Ions
6: Impurity region
7: Silicon carbide semiconductor substrate
7a: Silicon carbide semiconductor substrate
7b: Silicon carbide semiconductor substrate
8: Polysiloxane film
8a: Polysiloxane pattern
9: Mask
10: Active chemical rays
11: Pattern
12a: Polysiloxane pattern
13: Ions
14: Impurity region
15: Modified layer

The invention claimed is:

1. A photosensitive resin composition comprising a polysiloxane (A), wherein
the polysiloxane (A) is a polysiloxane represented by the general formula (1):

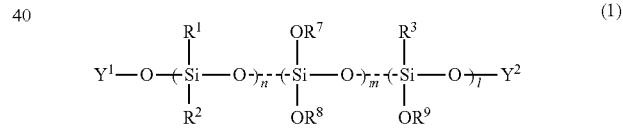

(1)

wherein, in the general formula (1),
R$^1$ to R$^3$ each independently represents hydrogen, an alkyl group, a cycloalkyl group, an alkenyl group, or an aryl group,
R$^7$ to R$^9$, Y$^1$, and Y$^2$ each independently represents hydrogen, an alkyl group, an acyl group, an aryl group, a polysiloxane group, or a substituent represented by the general formula (7),
n and m each independently represents an integer of 1 or more, and
l represents an integer of 0 or more:

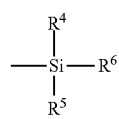

(7)

wherein, in the general formula (7),
R⁴ to R⁶ each independently represents hydrogen, an alkyl group, a cycloalkyl group, an alkenyl group, or an aryl group; and
wherein the content ratio of organosiloxane units represented by the general formula (2) in the polysiloxane (A) is (X) mol % in terms of a molar ratio of Si atoms, and the content ratio of organosiloxane units represented by the general formula (3) is (Y) mol % in terms of a molar ratio of Si atoms:

$$\begin{array}{c} R^1 \\ | \\ -(-Si-O-)- \\ | \\ R^2 \end{array} \quad (2)$$

$$\begin{array}{c} OR^7 \\ | \\ -(-Si-O-)- \\ | \\ OR^8 \end{array} \quad (3)$$

wherein, in the general formula (2),
R¹ and R² each independently represents hydrogen, an alkyl group, a cycloalkyl group, an alkenyl group, or an aryl group;
wherein, in the general formula (3),
R⁷ and R⁸ each independently represents hydrogen, an alkyl group, an acyl group, an aryl group, a polysiloxane group, or a substituent represented by the general formula (7); and
wherein (X) and (Y) are represented by the general formulas (4) to (6).

$$7.5 \leq (X) \leq 75 \quad (4)$$

$$2.5 \leq (Y) \leq 40 \quad (5)$$

$$1.5 \times (Y) \leq (X) \leq 3 \times (Y) \quad (6),$$

wherein the polysiloxane (A) includes organosiloxane units having an aromatic group, and the content ratio of the organosiloxane units having an aromatic group in the polysiloxane (A) is 15 to 80 mol % in terms of a molar ratio of Si atoms.

2. The photosensitive resin composition according to claim 1, wherein the polysiloxane (A) has a weight average molecular weight of 500 to 100,000.

3. The photosensitive resin composition according to claim 1, wherein the organosiloxane unit having an aromatic group is one or more unit(s) selected from the group consisting of an organosiloxane unit represented by the general formula (4a), an organosiloxane unit represented by the general formula (4b), and an organosiloxane unit represented by the general formula (4c):

(4a) [naphthalene structure with $(R^{61})_p$ substituents, connected to $-(SiO_{3/2})-$]

(4b) [naphthalene structure with $(R^{62})_q$ substituents, w repeat unit, connected to $-(SiO_{2/2})-$ with $(R^{63})_x$]

(4c) [naphthalene structure with $(R^{64})_r$ substituents, y repeat unit, connected to $-(SiO_{1/2})-(R^{65})_z$]

wherein, in the general formula (4a),
R⁶¹ represents an alkyl group having 1 to 10 carbon atoms, a cycloalkyl group having 4 to 10 carbon atoms, an alkenyl group having 2 to 7 carbon atoms, or an aryl group having 6 to 15 carbon atoms, and p represents an integer of 0 to 7;
wherein, in the general formula (4b),
R⁶² and R⁶³ each represents an alkyl group having 1 to 10 carbon atoms, a cycloalkyl group having 4 to 10 carbon atoms, an alkenyl group having 2 to 7 carbon atoms, or an aryl group having 6 to 15 carbon atoms,
q represents an integer of 0 to 7,
w represents an integer of 1 to 2,
x represents an integer of 0 to 1, and
w+x=2; and
wherein, in the general formula (4c),
R⁶⁴ and R⁶⁵ represents an alkyl group having 1 to 10 carbon atoms, a cycloalkyl group having 4 to 10 carbon atoms, an alkenyl group having 2 to 7 carbon atoms, or an aryl group having 6 to 15 carbon atoms,
r represents an integer of 0 to 7,
y represents an integer of 1 to 3,
z represents an integer of 0 to 2, and
y+z=3.

4. The photosensitive resin composition according to claim 1, further comprising (F) a dissolution accelerating crosslinking agent and the dissolution accelerating crosslinking agent (F) is one or more compound(s) selected from the group consisting of a compound represented by the general formula (14), a compound represented by the general formula (15), and a compound represented by the general formula (16):

(14) [chemical structure showing two phenol rings connected through X¹ with $R^{35}O$, $OR^{36}$, HO, OH, $R^{37}$, $R^{38}$, $(R^{31})_a$, $(R^{32})_b$, $(R^{33})_c$, $(R^{34})_d$, $(X^2)_x$, $(X^3)_y$ substituents]

-continued

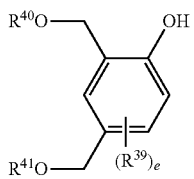
(15)

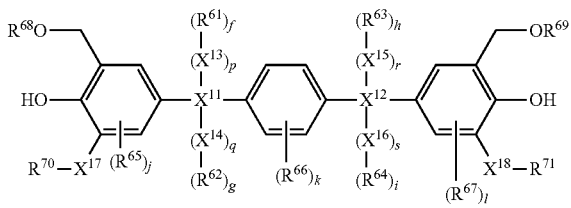
(16)

wherein, in the general formula (14),
$R^{35}$ and $R^{36}$ each independently represents hydrogen or an alkyl group having 1 to 6 carbon atoms,
$R^{37}$ and $R^{38}$ each independently represents hydrogen, an alkyl group having 1 to 6 carbon atoms, an alkoxy group having 1 to 6 carbon atoms, or a hydroxy group,
$X^1$ represents a direct bond or an alkylene chain having 1 to 6 carbon atoms, when $X^1$ is a direct bond, a, b, x, and y are 0, when $X^1$ is not a direct bond, $X^2$ and $X^3$ each independently represents a direct bond or an alkylene chain having 1 to 6 carbon atoms,
$R^{31}$ and $R^{32}$ each independently represents hydrogen, an alkyl halide group having 1 to 6 carbon atoms, or a halogen atom,
$R^{33}$ and $R^{34}$ each independently represents an alkyl group having 1 to 10 carbon atoms, a cycloalkyl group having 4 to 10 carbon atoms, or an aryl group having 6 to 15 carbon atoms,
c and d represent an integer of 0 to 2, and when $X^1$ is not a direct bond, x and y represent 1, and
a and b represent an integer of 1 to 6; and
wherein, in the general formula (15),
$R^{39}$ represents an alkyl group having 1 to 10 carbon atoms, a cycloalkyl group having 4 to 10 carbon atoms, or an aryl group having 6 to 15 carbon atoms,
$R^{40}$ and $R^{41}$ each independently represents hydrogen or an alkyl group having 1 to 6 carbon atoms, and
e represents an integer of 0 to 3; and
wherein, in the general formula (16),
$X^{17}$ and $X^{18}$ each independently represents a direct bond or an alkylene chain having 1 to 6 carbon atoms,
$R^{65}$ to $R^{67}$ each independently represents an alkyl group having 1 to 10 carbon atoms, a cycloalkyl group having 4 to 10 carbon atoms, or an aryl group having 6 to 15 carbon atoms,
$R^{68}$ and $R^{69}$ each independently represents hydrogen or an alkyl group having 1 to 6 carbon atoms,
$R^{70}$ and $R^{71}$ each independently represents hydrogen, an alkyl group having 1 to 6 carbon atoms, an alkoxy group having 1 to 6 carbon atoms, or a hydroxy group,
$X^{11}$ and $X^{12}$ each independently represents a direct bond or an alkylene chain having 1 to 6 carbon atoms, when $X^{11}$ is a direct bond, f, g, p, and q are 0, when $X^{12}$ is a direct bond, h, i, r, and s are 0, when $X^{11}$ or $X^{12}$ is not a direct bond, $X^{13}$, $X^{14}$, $X^{15}$, and $X^{16}$ each independently represents a direct bond or an alkylene chain having 1 to 6 carbon atoms,
$R^{61}$ to $R^{64}$ each independently represents hydrogen, an alkyl halide group having 1 to 6 carbon atoms, or a halogen atom,
j, k, and l represent an integer of 0 to 2, when $X^{11}$ and $X^{12}$ are not direct bonds, p, q, r, and s are 1, and
f, g, h, and i represent an integer of 1 to 6.

5. The photosensitive resin composition according to claim 1, wherein (X) and (Y) are represented by the general formulas (4') to (6')

$$24 \leq (X) \leq 75 \quad (4')$$

$$8 \leq (Y) \leq 40 \quad (5')$$

$$1.5 \times (Y) \leq (X) \leq 3 \times (Y) \quad (6').$$

6. The photosensitive resin composition according to claim 1, further comprising (B) inorganic particles.

7. The photosensitive resin composition according to claim 6, wherein the inorganic particles (B) are silica particles.

8. The photosensitive resin composition according to claim 6, wherein the polysiloxane (A) is (A1) inorganic particle-containing polysiloxane including an organosilane unit to which the inorganic particles (B) are bonded.

9. The photosensitive resin composition according to claim 6, wherein the inorganic particles (B) have a number average particle diameter of 20 to 55 nm.

10. The photosensitive resin composition according to claim 1, further comprising one or more compound(s) selected from the group consisting of (C) a compound having a naphthoquinone diazide structure, (D) a photopolymerization initiator, (E1) a photoacid generator, and (E2) a photobase generator.

11. The photosensitive resin composition according to claim 1, further comprising (G) a dissolution accelerator, the (G) dissolution accelerator being (G1) a compound represented by the general formula (17) or a compound represented by the general formula (18), and/or (G2) an acrylic resin including a structural unit represented by the general formula (19):

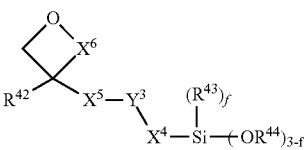
(17)

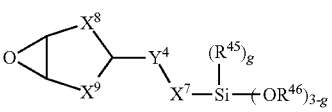
(18)

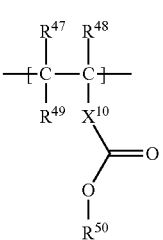
(19)

wherein, in the general formula (17),
$X^4$ and $X^5$ each independently represents a direct bond, an alkylene chain having 1 to 10 carbon atoms, a cycloalkylene chain having 4 to 10 carbon atoms, or an arylene chain having 6 to 15 carbon atoms, $X^6$ represents a direct bond or a methylene chain, $Y^3$ represents a direct bond or an oxygen atom, $R^{42}$ represents hydrogen, an alkyl group having 1 to 6 carbon atoms, a cycloalkyl group having 4 to 7 carbon atoms, or an aryl group having 6 to 10 carbon atoms, $R^{43}$ and $R^{44}$ each independently represents hydrogen, an alkyl group having 1 to 6 carbon atoms, an acyl group having 2 to 6 carbon atoms, or an aryl group having 6 to 15 carbon atoms, and f represents an integer of 0 to 2;

wherein, in the general formula (18), $X^7$ represents a direct bond, an alkylene chain having 1 to 10 carbon atoms, a cycloalkylene chain having 4 to 10 carbon atoms, or an arylene chain having 6 to 15 carbon atoms, $X^8$ and $X^9$ each independently represents an alkylene chain having 1 to 6 carbon atoms, $Y^4$ represents a direct bond or an oxygen atom, $R^{45}$ and $R^{46}$ each independently represents hydrogen, an alkyl group having 1 to 6 carbon atoms, an acyl group having 2 to 6 carbon atoms, or an aryl group having 6 to 15 carbon atoms, and g represents an integer of 0 to 2; and wherein, in the general formula (19), $R^{47}$ and $R^{48}$ represent hydrogen or an alkyl group having 1 to 4 carbon atoms, $R^{49}$ and $R^{50}$ each represent an alkyl group having 1 to 6 carbon atoms, a cycloalkyl group having 4 to 7 carbon atoms, or an aryl group having 6 to 10 carbon atoms, wherein each group represented by $R^{49}$ and $R^{50}$ is further substituted with a structural unit represented by the general formula (20), $X^{10}$ represents a direct bond, an alkylene chain having 1 to 6 carbon atoms, a cycloalkylene chain having 4 to 7 carbon atoms, or an arylene chain having 6 to 10 carbon atoms:

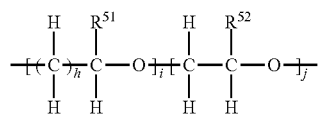

(20)

wherein, in the general formula (20), $R^{51}$ represents hydrogen, an alkyl group having 1 to 4 carbon atoms, or an alkyl group having 1 to 4 carbon atoms which has a hydroxy group, $R^{52}$ represents hydrogen or an alkyl group having 1 to 4 carbon atoms which has a hydroxy group, h represents an integer of 1 to 4, i represents an integer of 0 to 30, and j represents an integer of 1 to 100.

12. The photosensitive resin composition according to claim 1, wherein the polysiloxane (A) is a polysiloxane including an organosilane unit having an acidic group.

13. A cured film obtained by curing the photosensitive resin composition according to claim 1.

14. An element comprising a cured film obtained by curing the photosensitive resin composition according to claim 1.

15. A semiconductor device comprising a cured film obtained by curing the photosensitive resin composition according to claim 1.

16. A method for manufacturing a semiconductor device, which comprises the steps of:
(1) obtaining, on a substrate, a pattern of the photosensitive resin composition according to claim 1 or a cured product thereof,
(2) forming an impurity region on the substrate formed with the pattern and/or patterning on the substrate formed with the pattern, and
(3) removing the pattern, and
which comprises, as the step (2), one or more steps selected from the group consisting of the steps of:
(2-A) implanting ions into the substrate formed with the pattern,
(2-B) exposing the substrate formed with the pattern to dopants,
(2-C) patterning on the substrate formed with the pattern by dry etching, and
(2-D) patterning on the substrate formed with the pattern by wet etching.

17. The method for manufacturing a semiconductor device according to claim 16, which comprises, as the step (1), the step of (1-1) heating the pattern of the photosensitive resin composition to 150 to 1,500° C.

18. The method for manufacturing a semiconductor device according to claim 17, wherein the step (1-1) is the step of (1-1a) heating a pattern of the photosensitive resin composition to 500 to 1,500° C.

19. The method for manufacturing a semiconductor device according to claim 18, wherein the step (3) is the step of (3-A) treating the pattern at from 0° C. to lower than 300° C.

20. The method for manufacturing a semiconductor device according to claim 16, which comprises, as the step (2), one or more steps selected from the group consisting of the steps of:
(2-A1) implanting ions into the substrate while heating the substrate formed with the pattern to 200 to 1,000° C.,
(2-B1) exposing the substrate to dopants while heating the substrate formed with the pattern to 200 to 1,500° C.,
(2-C1) patterning by dry etching while heating the substrate formed with the pattern to 100 to 400° C., and
(2-D1) patterning by wet etching while heating the substrate formed with the pattern to 100 to 400° C.

21. The method for manufacturing a semiconductor device according to claim 16, wherein the substrate is a substrate including one or more compound(s) selected from the group consisting of silicon, silicon dioxide ($SiO_2$), silicon nitride ($Si_3N_4$), silicon carbide (SiC), gallium nitride (GaN), gallium phosphide (GaP), gallium arsenide (GaAs), aluminum gallium arsenide (GaAlAs), gallium indium nitrogen arsenide (GaInNAs), indium nitride (InN), indium phosphide (InP), indium tin oxide (ITO), indium zinc oxide (IZO), indium gallium arsenide (InGaAs), aluminum indium gallium phosphide (InGaAlP), indium zinc gallium oxide (IGZO), diamond, sapphire ($Al_2O_3$), aluminum zinc oxide (AZO), aluminum nitride (AlN), zinc oxide (ZnO), zinc selenide (ZnSe), cadmium sulfide (CdS), and cadmium telluride (CdTe).

22. A photosensitive resin composition comprising a polysiloxane (A), wherein
the polysiloxane (A) is a polysiloxane obtained by hydrolyzing an organosilane, followed by condensation, and the organosiloxane includes an organosiloxane represented by the general formula (21) and an organosiloxane represented by the general formula (22):

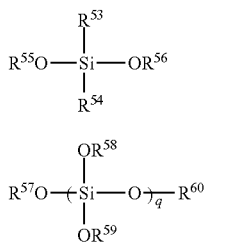
(21)

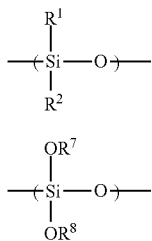
(22)

wherein, in the general formula (21),
R$^{53}$ and R$^{54}$ each independently represents hydrogen, an alkyl group, a cycloalkyl group, an alkenyl group, or an aryl group, and
R$^{55}$ and R$^{56}$ each independently represents hydrogen, an alkyl group, an acyl group, or an aryl group;

wherein, in the general formula (22),
R$^{57}$ to R$^{60}$ each independently represents hydrogen, an alkyl group, an acyl group, or an aryl group, and q represents an integer of 1 to 10; and wherein the content ratio of organosiloxane unit represented by the general formula (2) in the polysiloxane (A) is (X) mol % in terms of a molar ratio of Si atoms, and the content ratio of organosiloxane unit represented by the general formula (3) is (Y) mol % in terms of a molar ratio of Si atoms:

$$-(\underset{R^2}{\underset{|}{\overset{R^1}{\overset{|}{Si}}}}-O)-$$ (2)

$$-(\underset{OR^8}{\underset{|}{\overset{OR^7}{\overset{|}{Si}}}}-O)-$$ (3)

wherein, in the general formula (2),
R$^1$ and R$^2$ each independently represents hydrogen, an alkyl group, a cycloalkyl group, an alkenyl group, or an aryl group;

wherein, in the general formula (3),
R$^7$ and R$^8$ each independently represents hydrogen, an alkyl group, an acyl group, an aryl group, a polymer chain of a polysiloxane, or a substituent represented by the general formula (7);

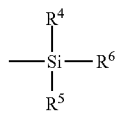
(7)

wherein, in the general formula (7),
R$^4$ to R$^6$ each independently represents hydrogen, an alkyl group, a cycloalkyl group, an alkenyl group, or an aryl group; and wherein (X) and (Y) are represented by the general formulas (4) to (6):

$$7.5 \leq (X) \leq 75 \qquad (4)$$

$$2.5 \leq (Y) \leq 40 \qquad (5)$$

$$1.5 \times (Y) \leq (X) \leq 3 \times (Y) \qquad (6),$$

wherein the polysiloxane (A) includes organosiloxane units having an aromatic group, and the content ratio of the organosiloxane units having an aromatic group in the polysiloxane (A) is 15 to 80 mol % in terms of a molar ratio of Si atoms.

\* \* \* \* \*